United States Patent
Kimura et al.

(10) Patent No.: US 11,726,373 B2
(45) Date of Patent: Aug. 15, 2023

(54) SEMICONDUCTOR DEVICE AND DISPLAY DEVICE

(71) Applicant: Semiconductor Energy Laboratory Co., Ltd., Kanagawa-ken (JP)

(72) Inventors: Hajime Kimura, Kanagawa (JP); Shunpei Yamazaki, Tokyo (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 17/972,144

(22) Filed: Oct. 24, 2022

(65) Prior Publication Data

US 2023/0046143 A1 Feb. 16, 2023

Related U.S. Application Data

(63) Continuation of application No. 17/128,531, filed on Dec. 21, 2020, now Pat. No. 11,520,193, which is a
(Continued)

(30) Foreign Application Priority Data

Apr. 28, 2005 (JP) .................................. 2005-133741

(51) Int. Cl.
*G02F 1/1345* (2006.01)
*G09G 3/20* (2006.01)
(Continued)

(52) U.S. Cl.
CPC ........ *G02F 1/13452* (2013.01); *G02F 1/1339* (2013.01); *G02F 1/1341* (2013.01);
(Continued)

(58) Field of Classification Search
CPC ......... H05K 1/02; H05K 1/0262–0265; H05K 2201/10136; H05K 2201/10166;
(Continued)

(56) References Cited

U.S. PATENT DOCUMENTS

| 4,753,820 A | 6/1988 | Cusack |
| 5,067,042 A | 11/1991 | Nagano |

(Continued)

FOREIGN PATENT DOCUMENTS

| EP | 0 971 564 A2 | 1/2000 |
| EP | 1 176 457 A2 | 1/2002 |

(Continued)

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(Continued)

*Primary Examiner* — Tuan T Dinh
(74) *Attorney, Agent, or Firm* — Husch Blackwell LLP

(57) ABSTRACT

An object of the present invention is to decrease the resistance of a power supply line, to suppress a voltage drop in the power supply line, and to prevent defective display. A connection terminal portion includes a plurality of connection terminals. The plurality of connection terminals is provided with a plurality of connection pads which is part of the connection terminal. The plurality of connection pads includes a first connection pad and a second connection pad having a line width different from that of the first connection pad. Pitches between the plurality of connection pads are equal to each other.

3 Claims, 80 Drawing Sheets

Related U.S. Application Data continuation of application No. 16/227,360, filed on Dec. 20, 2018, now Pat. No. 10,877,329, which is a continuation of application No. 15/229,838, filed on Aug. 5, 2016, now Pat. No. 10,162,235, which is a continuation of application No. 13/600,658, filed on Aug. 31, 2012, now Pat. No. 9,411,203, which is a continuation of application No. 12/765,084, filed on Apr. 22, 2010, now Pat. No. 8,259,463, which is a continuation of application No. 11/405,327, filed on Apr. 17, 2006, now Pat. No. 7,710,739.

(51) Int. Cl.

| | |
|---|---|
| H05K 1/11 | (2006.01) |
| H05K 3/36 | (2006.01) |
| G02F 1/133 | (2006.01) |
| G02F 1/1333 | (2006.01) |
| G02F 1/1335 | (2006.01) |
| G02F 1/1339 | (2006.01) |
| G02F 1/1341 | (2006.01) |
| G02F 1/1368 | (2006.01) |
| H01L 27/12 | (2006.01) |
| H05K 1/14 | (2006.01) |
| H05K 1/02 | (2006.01) |
| G09G 3/36 | (2006.01) |

(52) U.S. Cl.
CPC ........ *G02F 1/1368* (2013.01); *G02F 1/13306* (2013.01); *G02F 1/13394* (2013.01); *G02F 1/133345* (2013.01); *G02F 1/133512* (2013.01); *G02F 1/133514* (2013.01); *G09G 3/20* (2013.01); *G09G 3/2092* (2013.01); *H01L 27/1222* (2013.01); *H05K 1/117* (2013.01); *H05K 1/148* (2013.01); *H05K 3/361* (2013.01); *G09G 3/3614* (2013.01); *G09G 2300/0408* (2013.01); *G09G 2300/0426* (2013.01); *G09G 2300/0439* (2013.01); *G09G 2300/08* (2013.01); *G09G 2310/0264* (2013.01); *G09G 2320/043* (2013.01); *G09G 2330/021* (2013.01); *G09G 2330/08* (2013.01); *H01L 2924/0002* (2013.01); *H05K 1/0263* (2013.01); *H05K 1/0265* (2013.01); *H05K 2201/094* (2013.01); *H05K 2201/09727* (2013.01); *H05K 2201/10136* (2013.01); *H05K 2201/10166* (2013.01)

(58) Field of Classification Search
CPC ..... H05K 2201/094; G02F 1/13; G02F 1/133; G02F 1/1345; G02F 1/136; G02F 1/1341
USPC .............. 361/749, 760–767, 784, 803; 349/149–151; 174/250–262
See application file for complete search history.

(56) References Cited

U.S. PATENT DOCUMENTS

| | | | |
|---|---|---|---|
| 5,587,557 A | 12/1996 | Kurihara et al. | |
| 5,945,984 A | 8/1999 | Kuwashiro | |
| 5,982,470 A | 11/1999 | Nakahara et al. | |
| 6,111,357 A | 8/2000 | Fleming et al. | |
| 6,172,732 B1 | 1/2001 | Hayakawa et al. | |
| 6,239,854 B1 | 5/2001 | Hirakata et al. | |
| 6,294,274 B1 | 9/2001 | Kawazoe et al. | |
| 6,362,027 B1 | 3/2002 | Yamazaki et al. | |
| 6,531,815 B1 | 3/2003 | Okuyama et al. | |
| 6,567,145 B1 | 5/2003 | Kaneko et al. | |
| 6,583,845 B1 | 6/2003 | Chung et al. | |
| 6,587,176 B2 | 7/2003 | Kim | |
| 6,633,361 B1 | 10/2003 | Fujita | |
| 6,690,110 B1 | 2/2004 | Yamada et al. | |
| 6,734,940 B2 | 5/2004 | Hirabayashi | |
| 6,867,541 B2 | 3/2005 | Okuyama et al. | |
| 6,897,907 B2 | 5/2005 | Morimitsu | |
| 6,924,868 B2 | 8/2005 | Higuchi et al. | |
| 7,019,718 B2 | 3/2006 | Yamazaki et al. | |
| 7,061,014 B2 | 6/2006 | Hosono et al. | |
| 7,075,704 B2 | 7/2006 | Kurashina | |
| 7,116,390 B2 | 10/2006 | Murade | |
| 7,164,460 B2 | 1/2007 | Hagiwara | |
| 7,233,023 B2 | 6/2007 | Toya | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,453,065 B2 | 11/2008 | Saito et al. | |
| 7,462,862 B2 | 12/2008 | Hoffman et al. | |
| 7,528,544 B2 | 5/2009 | Kwak et al. | |
| 7,705,812 B2 | 4/2010 | Yuda et al. | |
| 8,456,603 B2 | 6/2013 | Takenaka | |
| 2002/0044242 A1 | 4/2002 | Kim | |
| 2002/0180686 A1 | 12/2002 | Yuda et al. | |
| 2003/0016508 A1 | 1/2003 | Kurumisawa | |
| 2003/0063248 A1 | 4/2003 | Komeno et al. | |
| 2003/0085855 A1 | 5/2003 | Tomita | |
| 2003/0103181 A1 | 6/2003 | Imayama et al. | |
| 2003/0117165 A1 | 6/2003 | Kim | |
| 2003/0181043 A1 | 9/2003 | Tanada et al. | |
| 2003/0183854 A1 | 10/2003 | Kato et al. | |
| 2003/0193056 A1 | 10/2003 | Takayama et al. | |
| 2003/0218171 A1 | 11/2003 | Isobe et al. | |
| 2003/0218222 A1 | 11/2003 | Wager, III et al. | |
| 2004/0012552 A1 | 1/2004 | Fujita | |
| 2004/0026696 A1 | 2/2004 | Yamazaki et al. | |
| 2004/0036833 A1 | 2/2004 | Monzen | |
| 2004/0109128 A1 | 6/2004 | Hirabayashi | |
| 2004/0119925 A1 | 6/2004 | Moon | |
| 2004/0189915 A1* | 9/2004 | Taguchi | G02F 1/1345 349/139 |
| 2004/0232420 A1 | 11/2004 | Lee et al. | |
| 2004/0233375 A1 | 11/2004 | Chung et al. | |
| 2005/0007356 A1 | 1/2005 | Eguchi | |
| 2005/0012454 A1* | 1/2005 | Yamazaki | H10K 50/824 313/506 |
| 2005/0017302 A1 | 1/2005 | Hoffman | |
| 2005/0029937 A1 | 2/2005 | Kim | |
| 2005/0039670 A1 | 2/2005 | Hosono et al. | |
| 2005/0048224 A1 | 3/2005 | Araya et al. | |
| 2005/0077524 A1* | 4/2005 | Ahn | H01L 29/66742 257/E27.111 |
| 2005/0199959 A1 | 9/2005 | Chiang et al. | |
| 2006/0043377 A1 | 3/2006 | Hoffman et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0197092 A1 | 9/2006 | Hoffman et al. | |
| 2007/0194379 A1 | 8/2007 | Hosono et al. | |
| 2008/0006877 A1 | 1/2008 | Mardilovich et al. | |
| 2008/0254569 A1 | 10/2008 | Hoffman et al. | |
| 2009/0039495 A1 | 2/2009 | Yamashita et al. | |
| 2009/0278122 A1 | 11/2009 | Hosono et al. | |
| 2009/0280600 A1 | 11/2009 | Hosono et al. | |
| 2013/0103181 A1 | 4/2013 | Ballabio et al. | |

FOREIGN PATENT DOCUMENTS

| | | |
|---|---|---|
| EP | 1 443 130 A1 | 8/2004 |
| EP | 1 503 422 A2 | 2/2005 |
| EP | 2 275 860 A2 | 1/2011 |
| JP | 63-142894 A | 6/1988 |
| JP | 03-029828 A | 3/1991 |
| JP | 04-171423 A | 6/1992 |
| JP | 05-079540 A | 10/1993 |
| JP | 06-202132 A | 7/1994 |
| JP | 07-175076 A | 7/1995 |

(56) References Cited

FOREIGN PATENT DOCUMENTS

| | | | |
|---|---|---|---|
| JP | 07-318966 A | 12/1995 |
| JP | 08-313922 A | 11/1996 |
| JP | 09-146112 A | 6/1997 |
| JP | 10-096944 A | 4/1998 |
| JP | 11-233777 A | 8/1999 |
| JP | 2000-036381 A | 2/2000 |
| JP | 2001-056477 A | 2/2001 |
| JP | 2001-102169 A | 4/2001 |
| JP | 2001-109395 A | 4/2001 |
| JP | 2001-255558 A | 9/2001 |
| JP | 2001-264799 A | 9/2001 |
| JP | 2001-313308 A | 11/2001 |
| JP | 2002-062819 A | 2/2002 |
| JP | 2002-110343 A | 4/2002 |
| JP | 2003-050402 A | 2/2003 |
| JP | 2003-152019 A | 5/2003 |
| JP | 2003-161957 A | 6/2003 |
| JP | 2003-195785 A | 7/2003 |
| JP | 2004-095996 A | 3/2004 |
| JP | 2004-103957 A | 4/2004 |
| JP | 2005-018031 A | 1/2005 |
| JP | 2005-049808 A | 2/2005 |
| JP | 2005-062354 A | 3/2005 |
| JP | 2005-063423 A | 3/2005 |
| JP | 2005-070723 A | 3/2005 |
| JP | 2005-115295 A | 4/2005 |
| JP | 2005-354035 A | 12/2005 |

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Office Action (Application No. 200610077831.4) dated Dec. 5, 2008.

Chinese Office Action (Application No. 201110125174.7) dated Dec. 19, 2011.

* cited by examiner

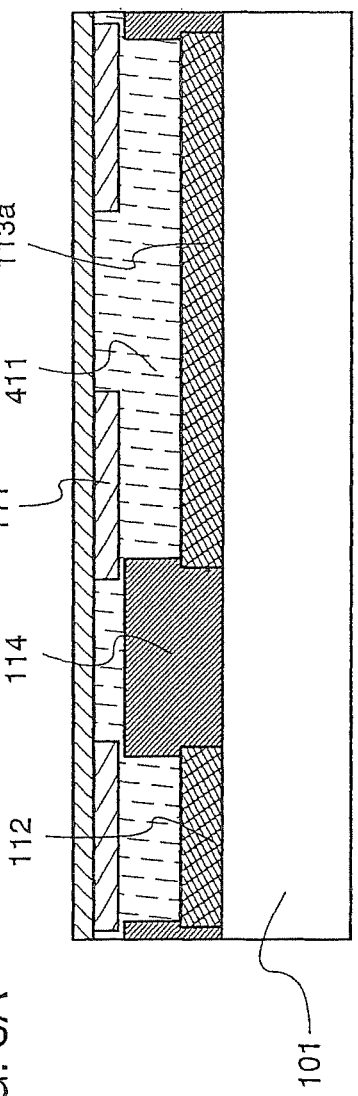
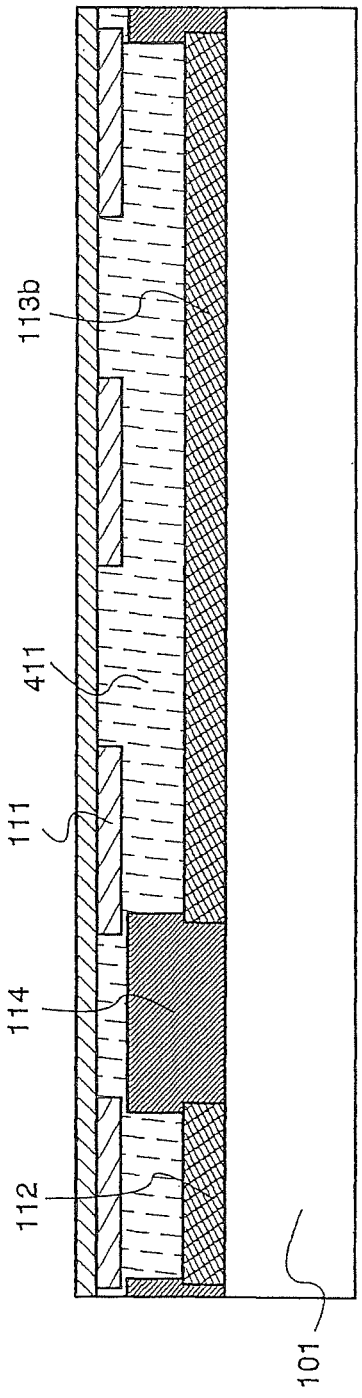

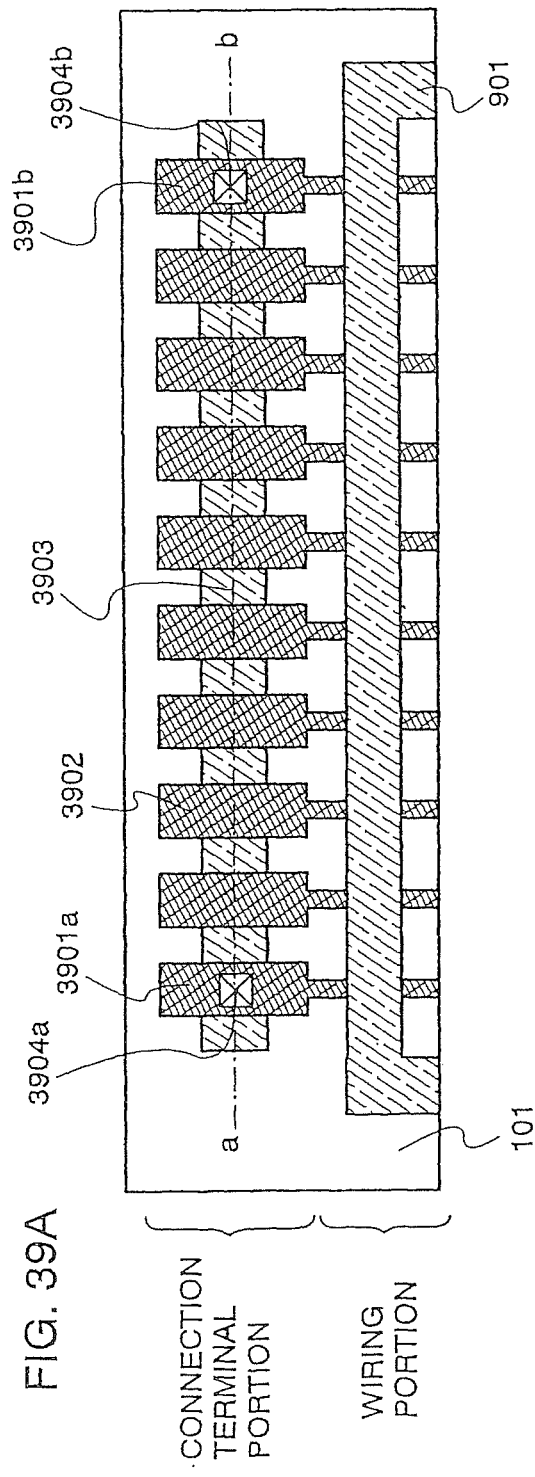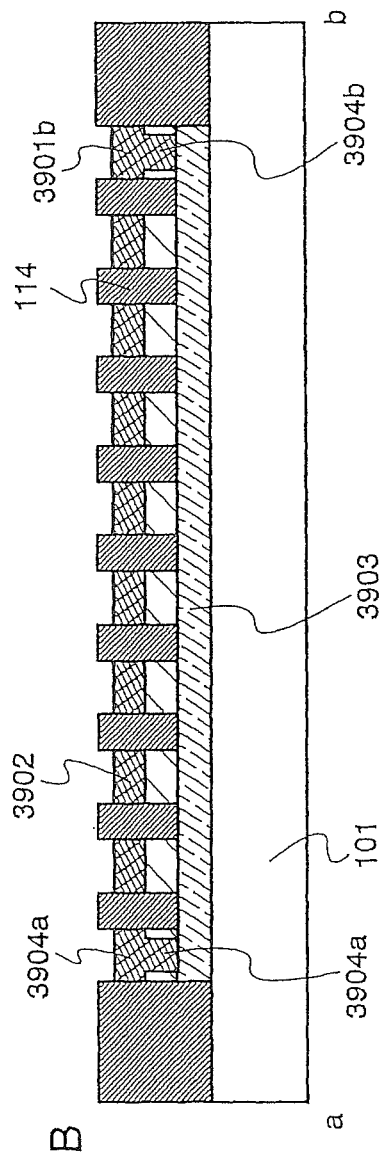
FIG. 39A
FIG. 39B

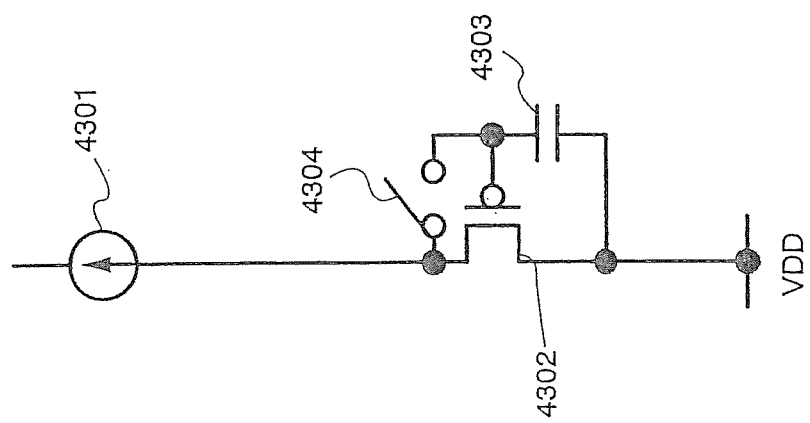
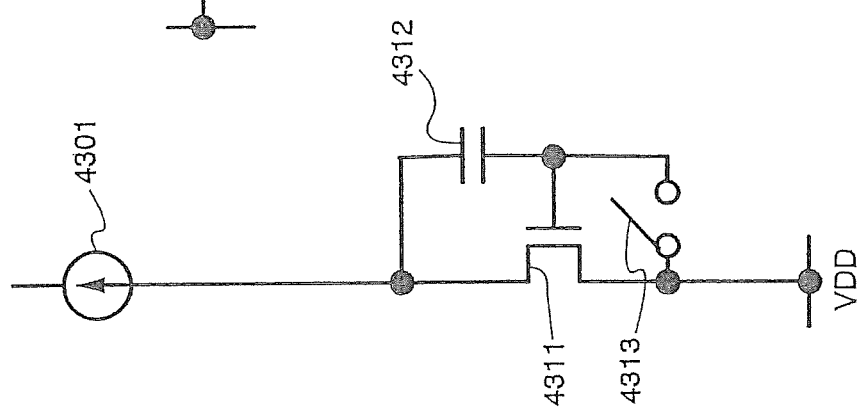
FIG. 43A
FIG. 43B
FIG. 43C

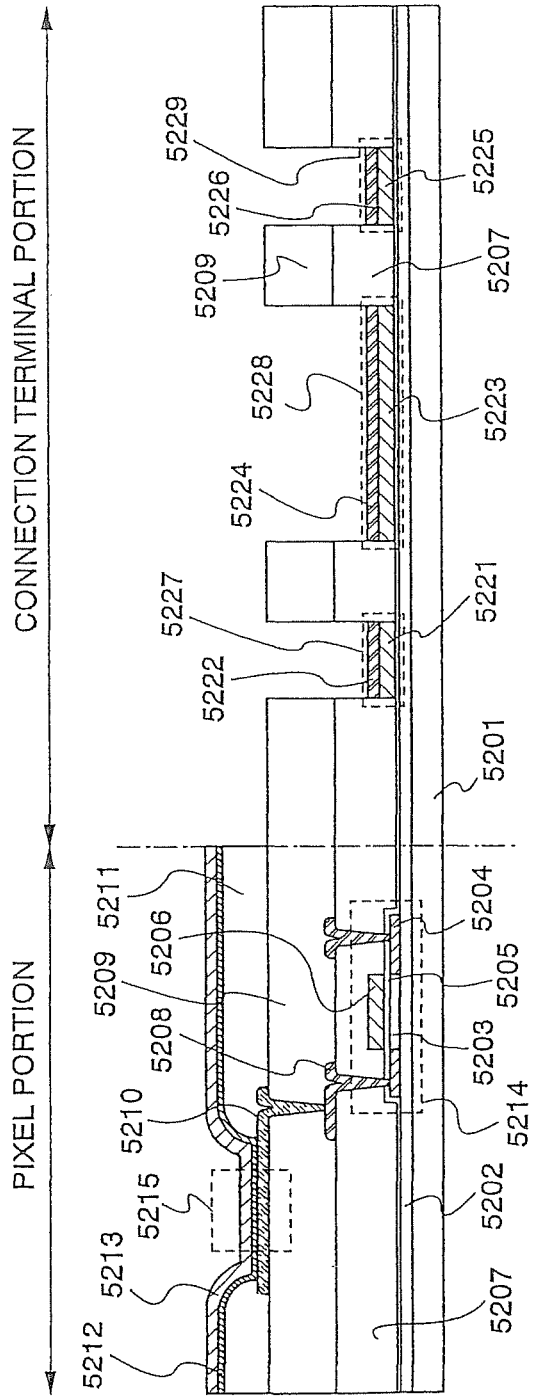
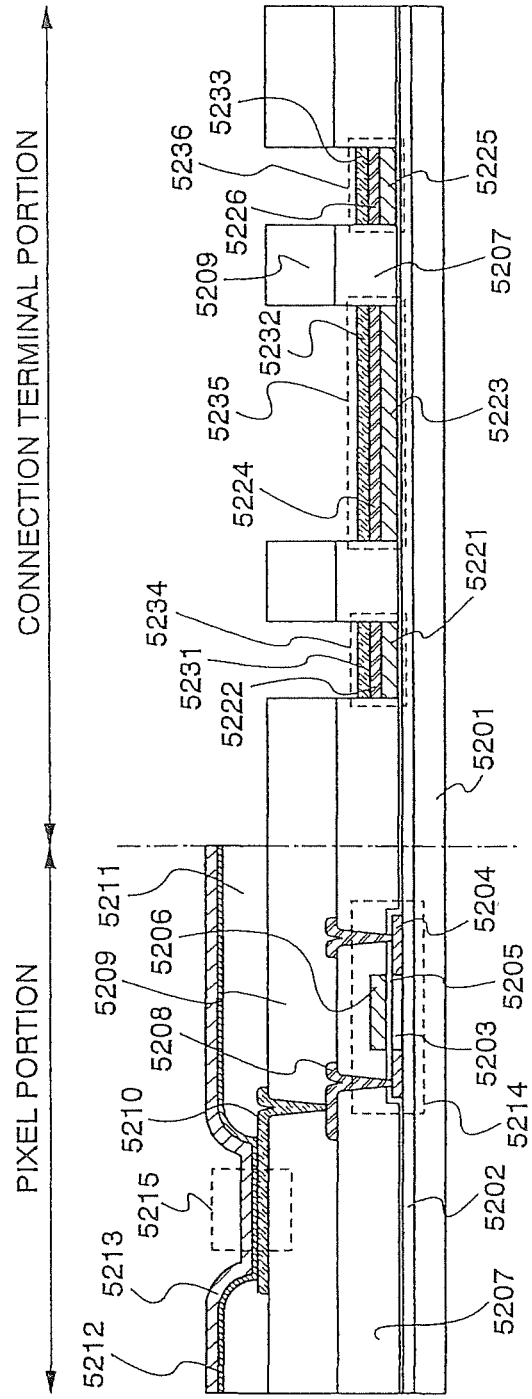

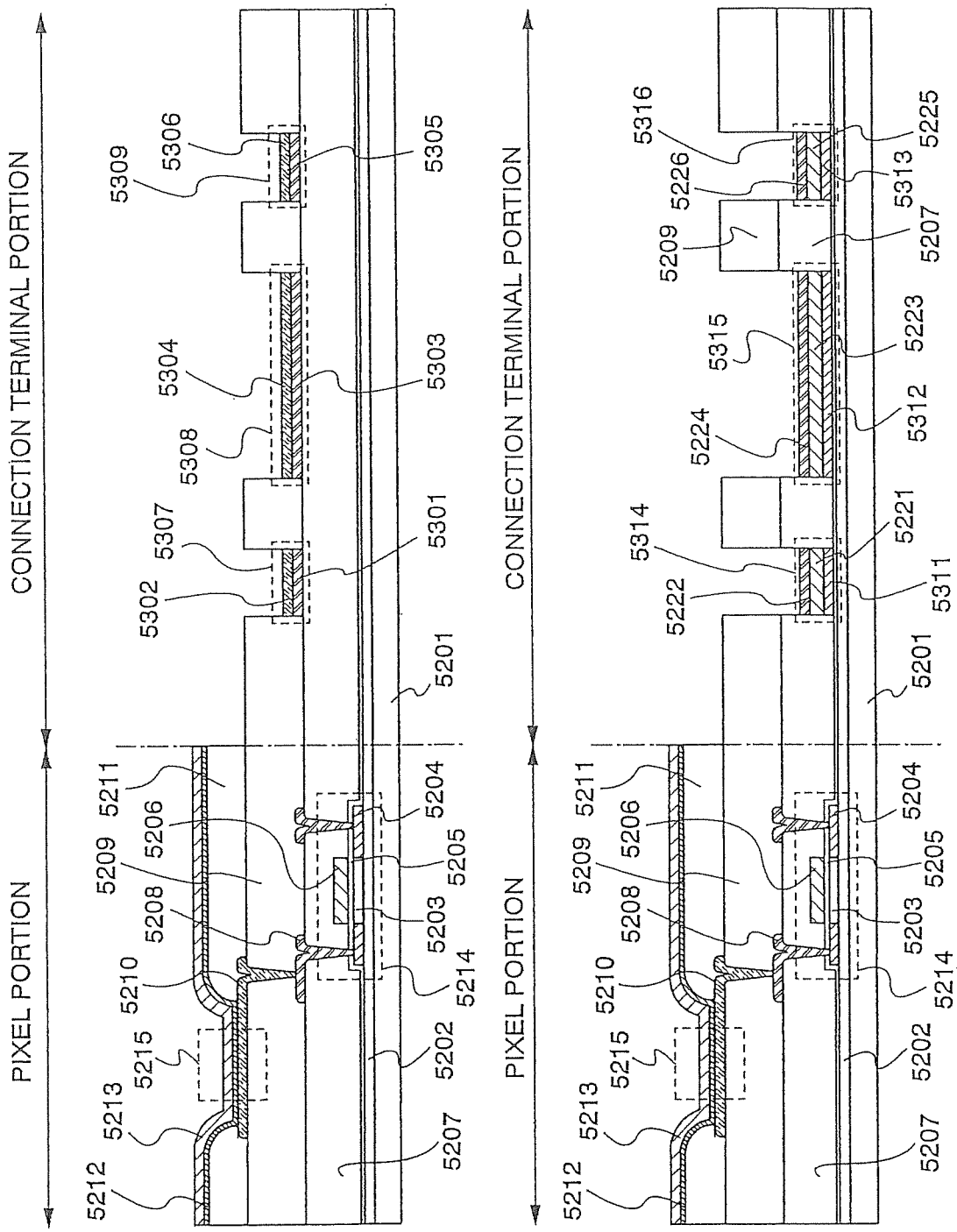

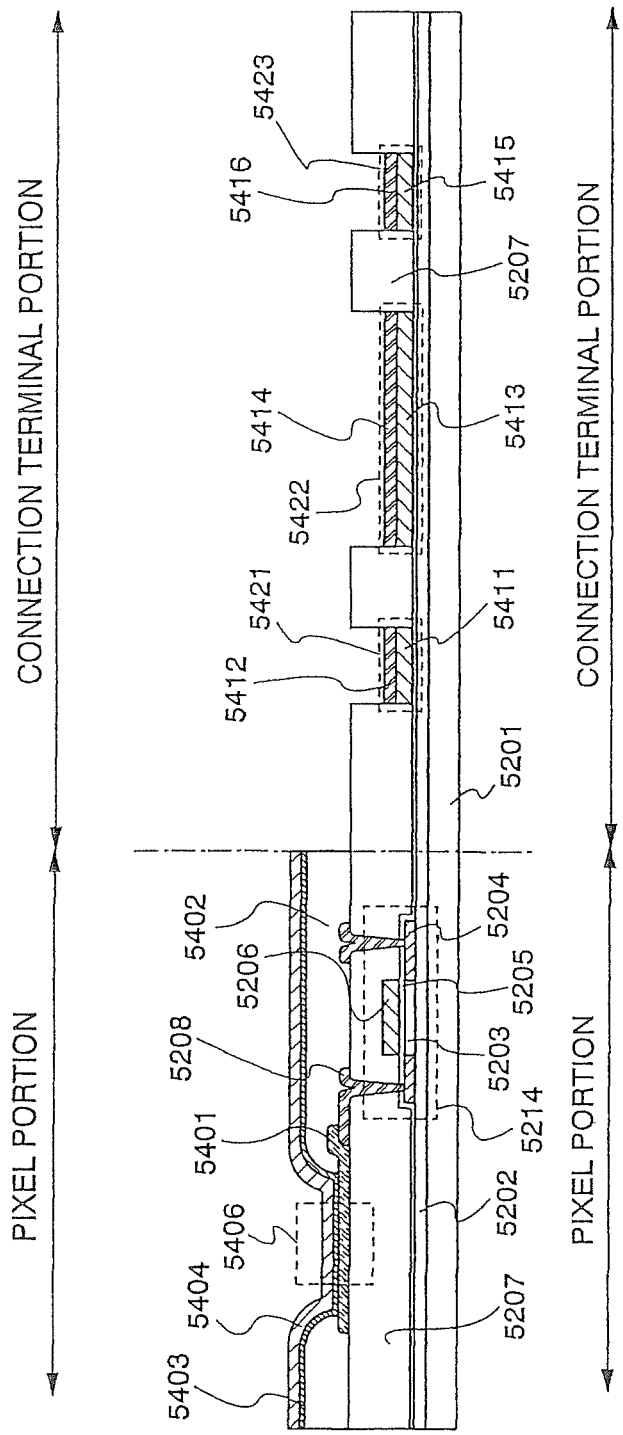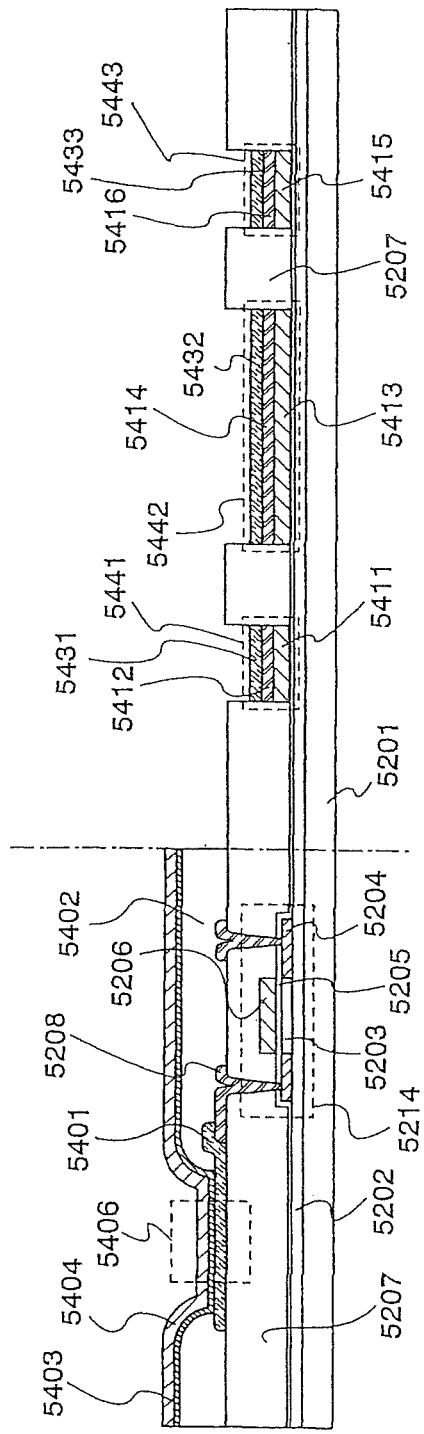
FIG. 54A
FIG. 54B

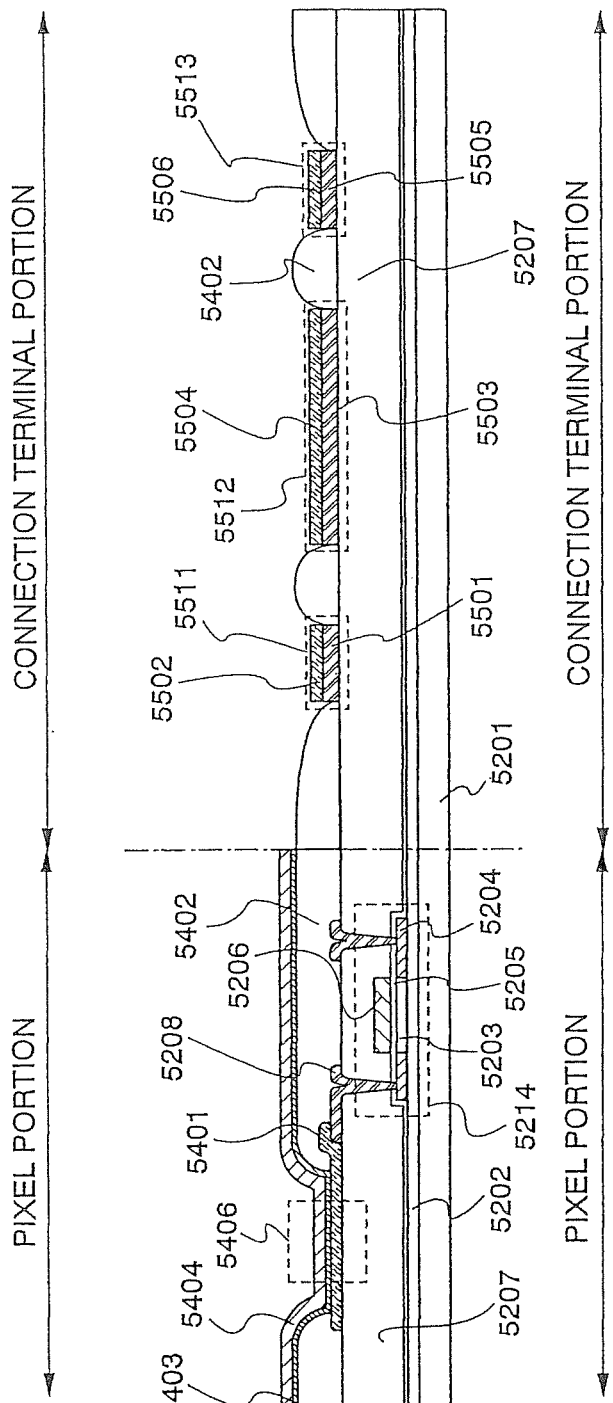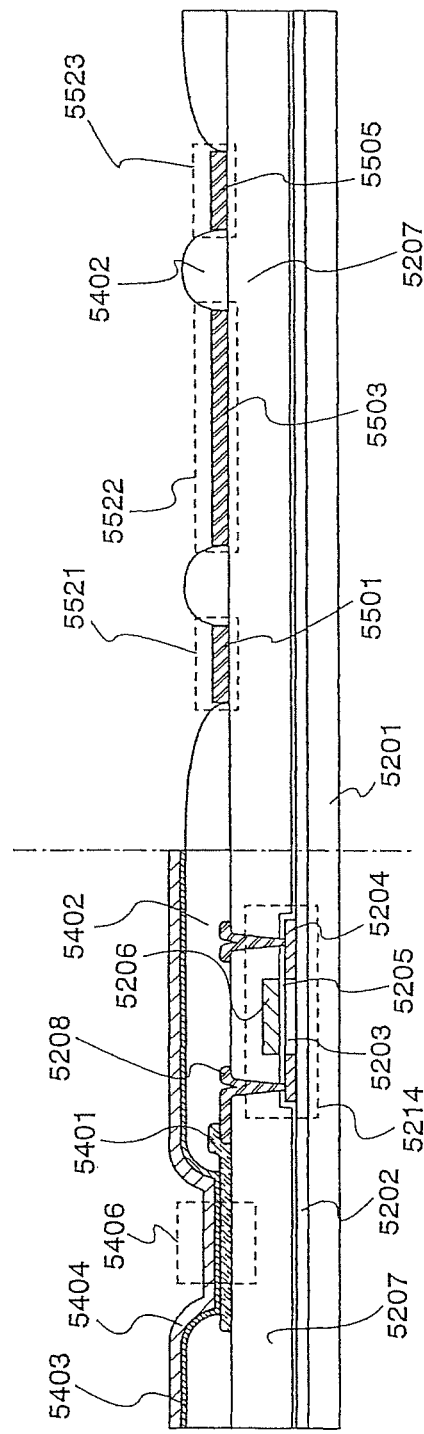
FIG. 55A
FIG. 55B

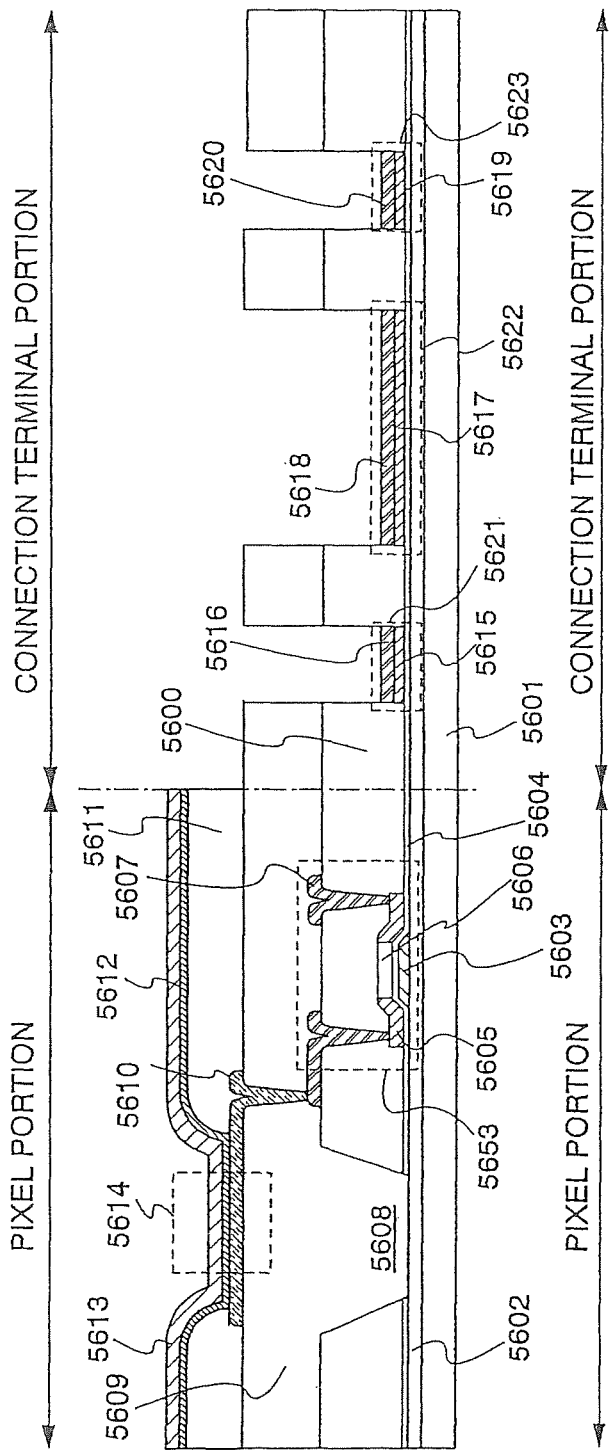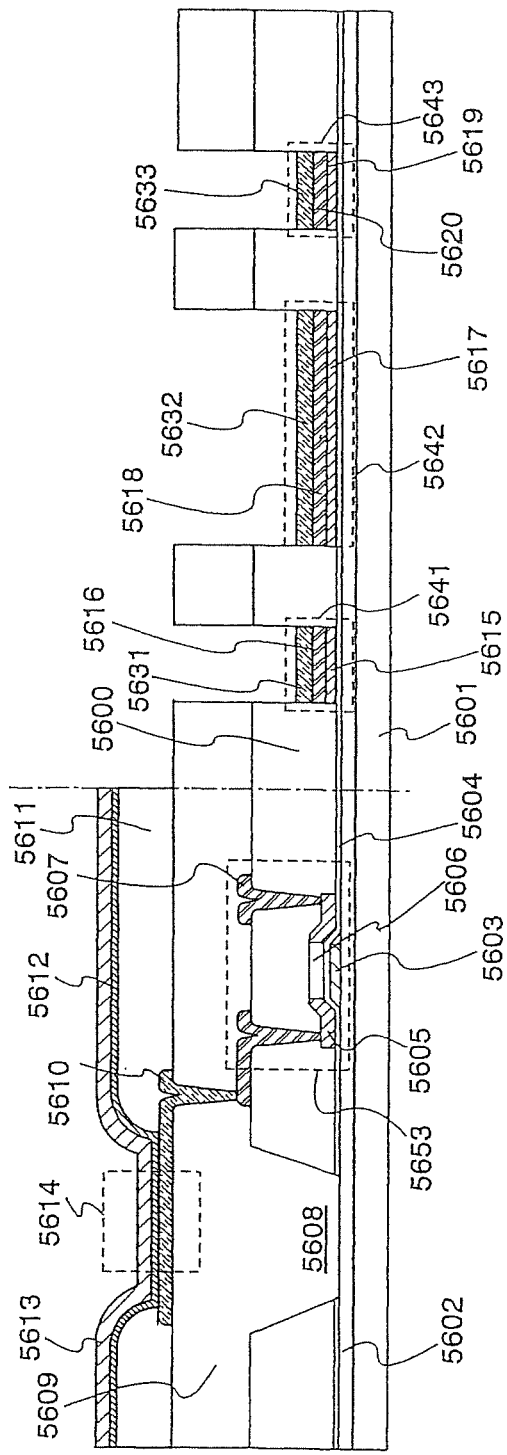
FIG. 56A
FIG. 56B

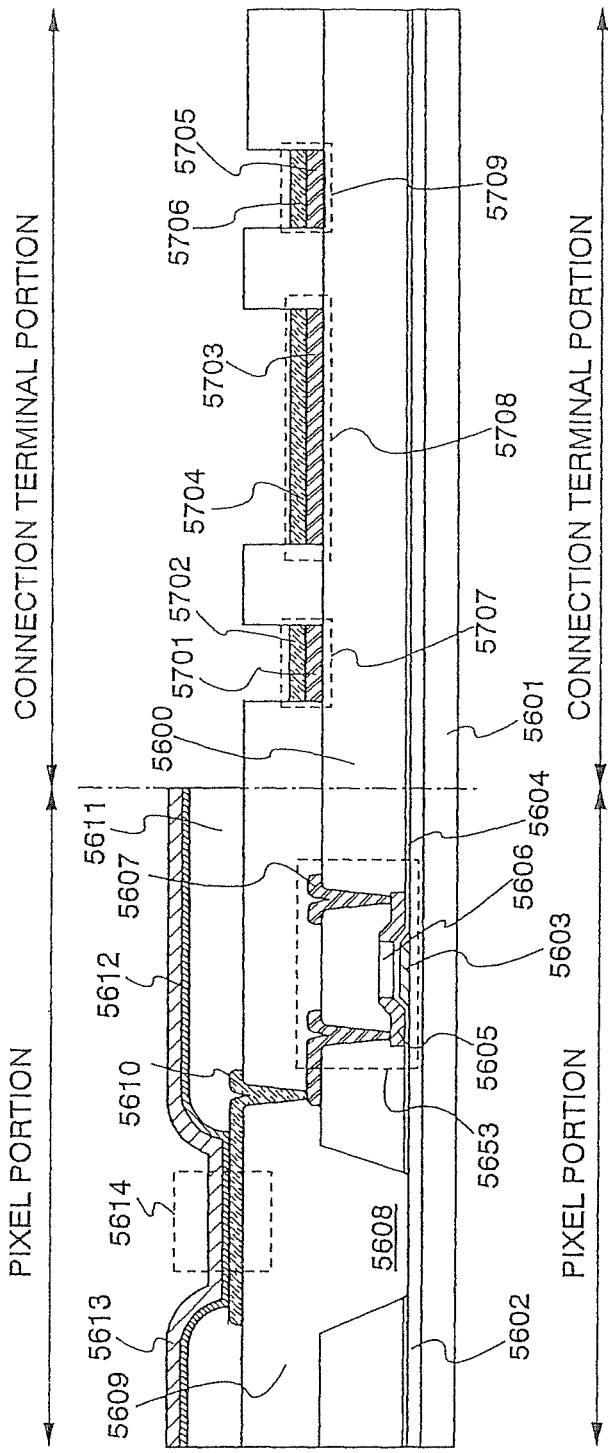
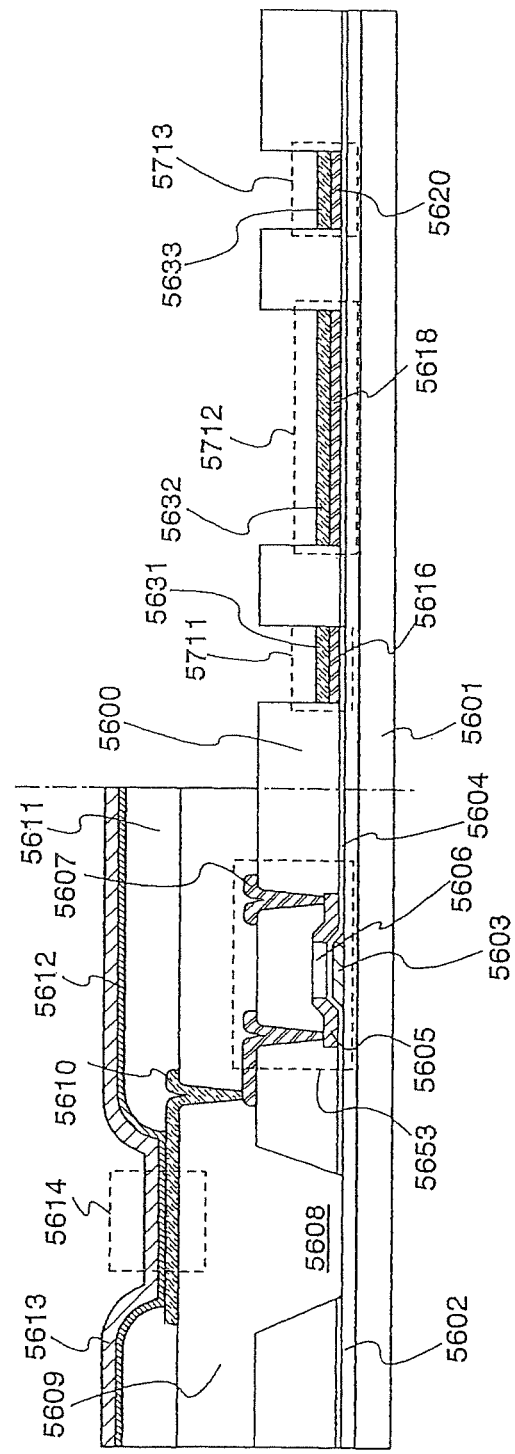
FIG. 57A
FIG. 57B

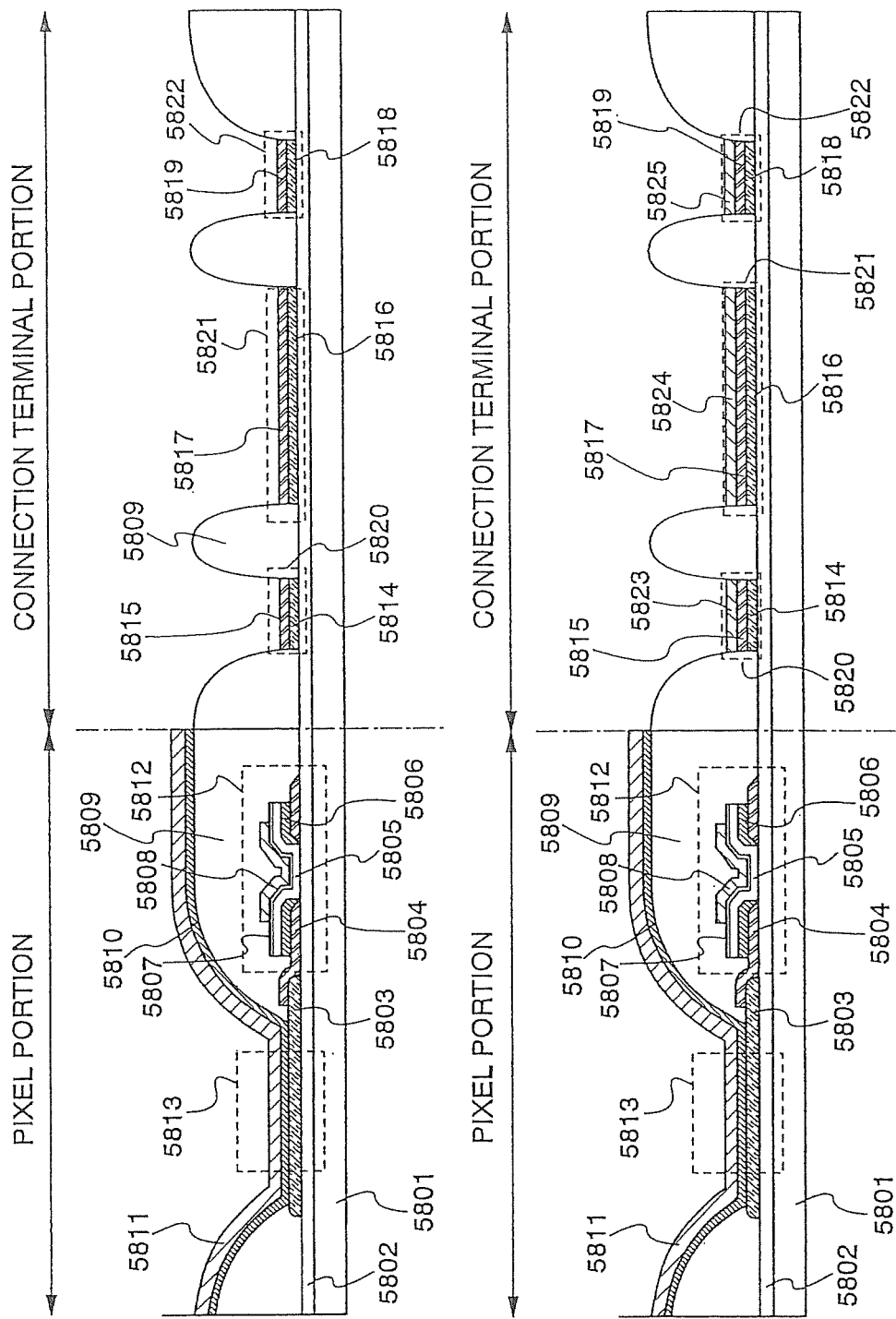

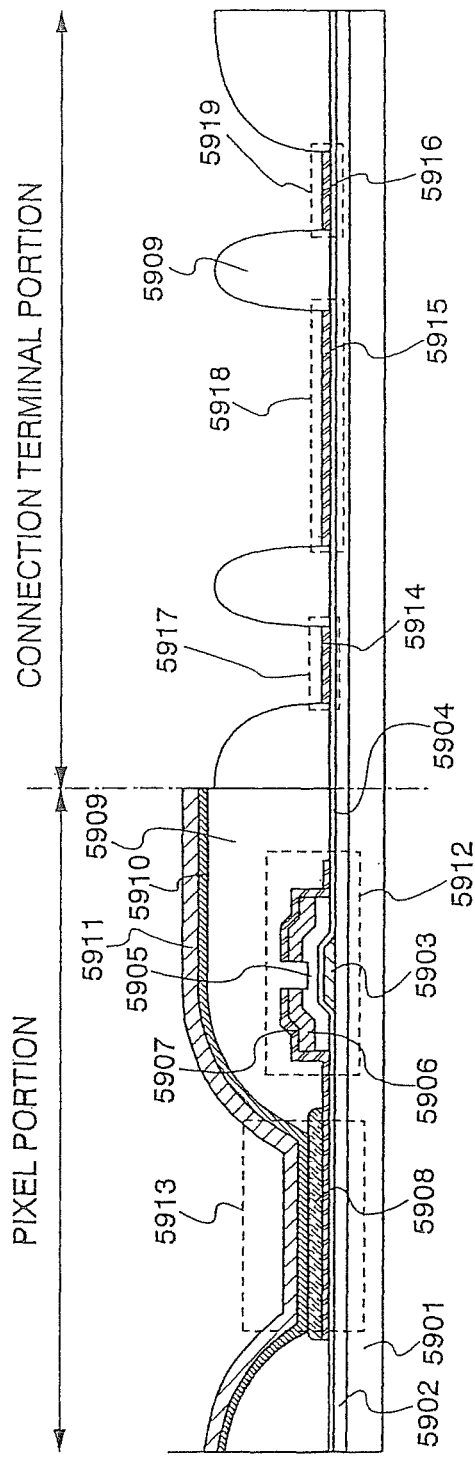
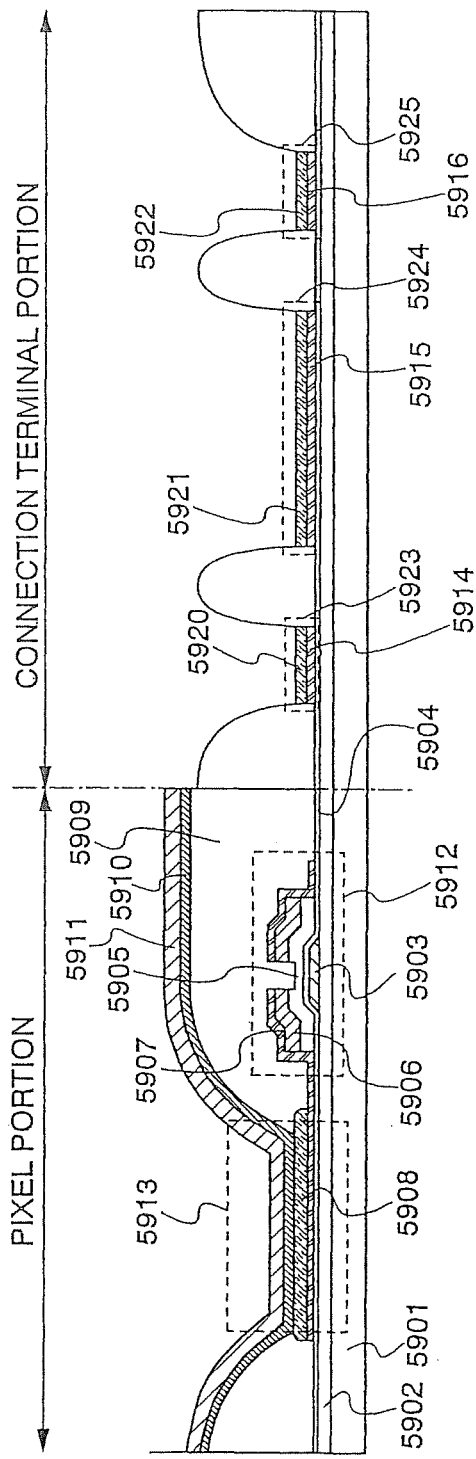
FIG. 59A
FIG. 59B

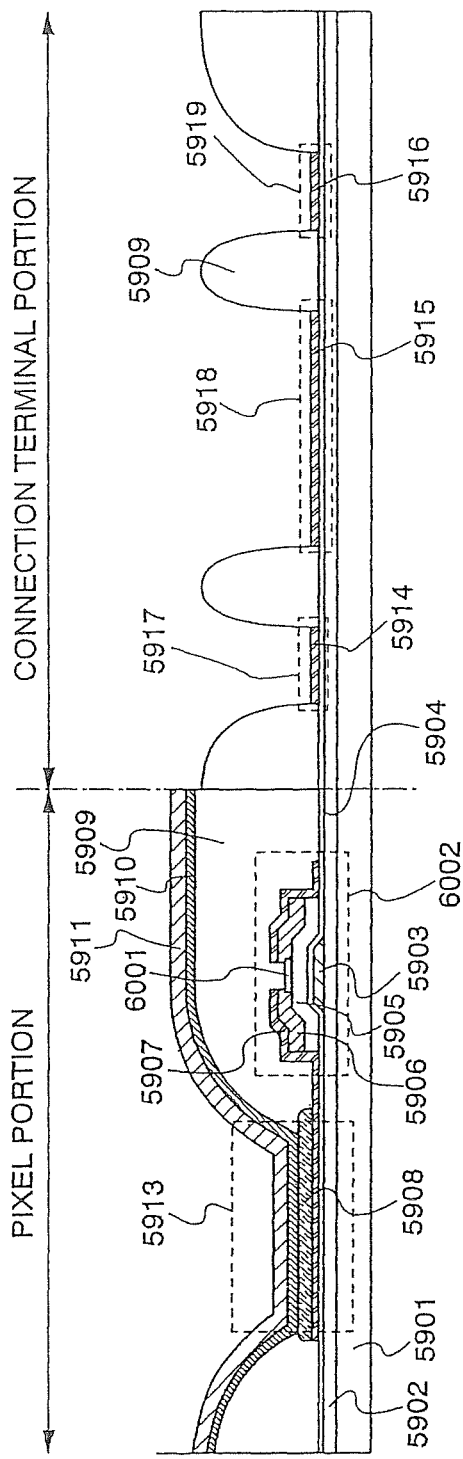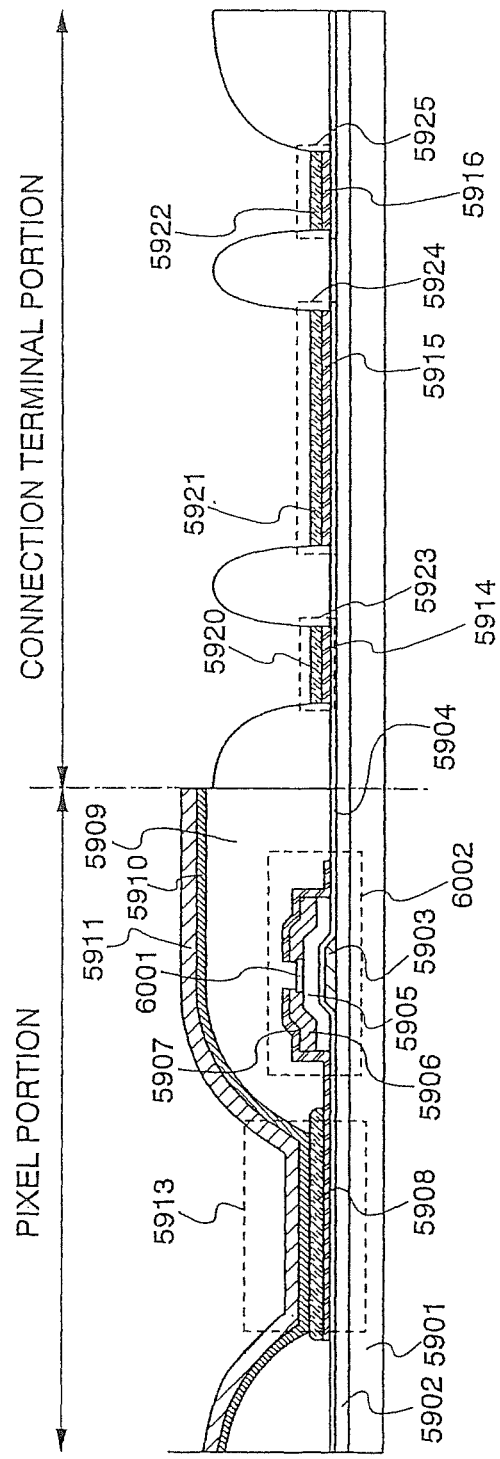

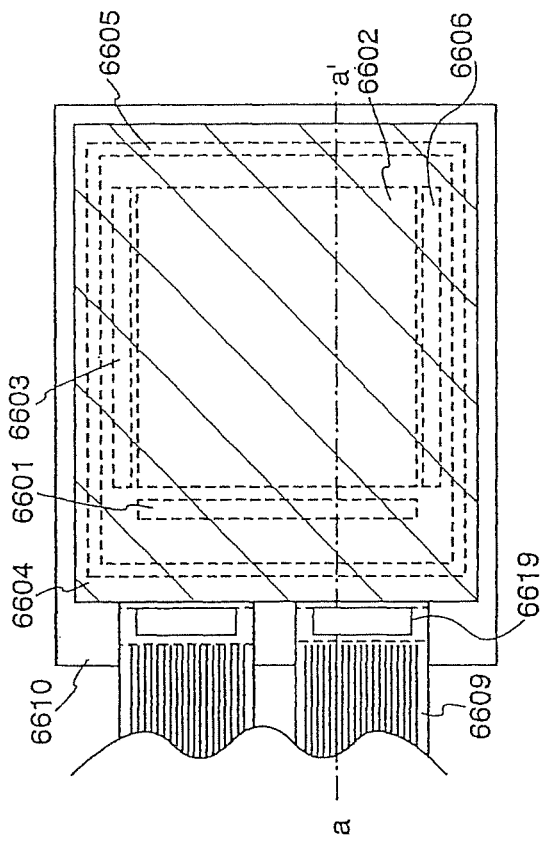
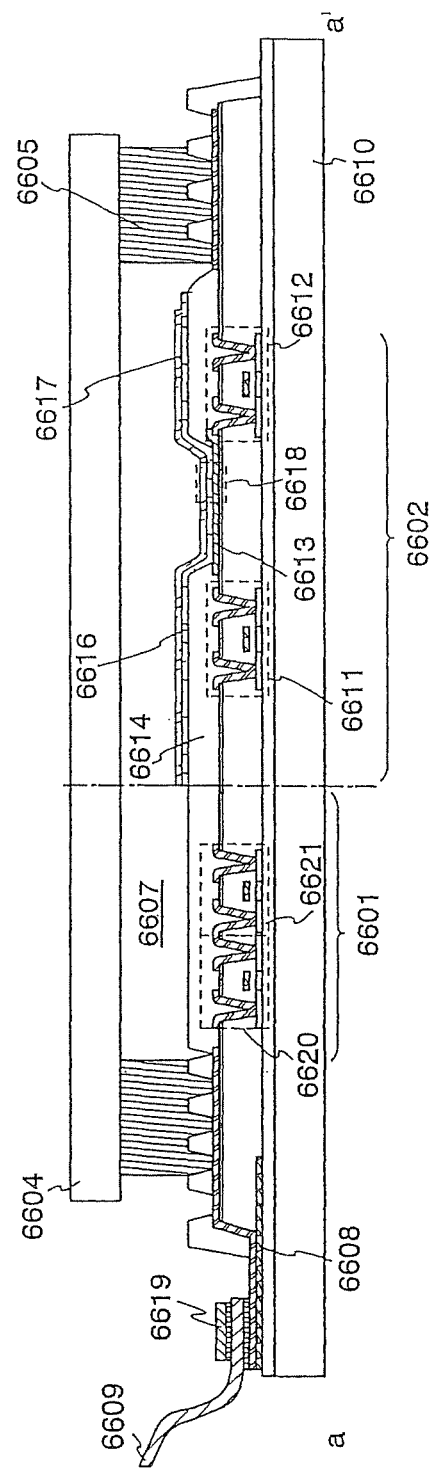
FIG. 66A
FIG. 66B

SEMICONDUCTOR DEVICE AND DISPLAY DEVICE

This application is a continuation of copending application Ser. No. 17/128,531 filed on Dec. 21, 2020 which is a continuation of application Ser. No. 16/227,360 filed on Dec. 20, 2018 (now U.S. Pat. No. 10,877,329 issued Dec. 29, 2020) which is a continuation of application Ser. No. 15/229,838 filed on Aug. 5, 2016 (now U.S. Pat. No. 10,162,235 issued Dec. 25, 2018) which is a continuation of application Ser. No. 13/600,658 filed on Aug. 31, 2012 (now U.S. Pat. No. 9,411,203 issued Aug. 9, 2016) which is a continuation of application Ser. No. 12/765,084 filed on Apr. 22, 2010 (now U.S. Pat. No. 8,259,463 issued Sep. 4, 2012) which is a continuation of application Ser. No. 11/405,327 filed on Apr. 17, 2006 (now U.S. Pat. No. 7,710,739 issued May 4, 2010), which are all incorporated herein by reference.

BACKGROUND OF THE INVENTION

1. Field of the Invention

The present invention relates to a semiconductor device including a connection terminal. In particular, the invention relates to a structure of a connection terminal of a display device including a pixel portion where pixels are arranged in matrix, and to a connection structure between an external terminal and a connection terminal of a display device.

2. Description of the Related Art

A display device may have a structure in which a flexible printed circuit is conductively connected to a display panel and a signal and power are supplied through the flexible printed circuit to the display panel.

For example, the display panel includes a pixel portion and a peripheral driver circuit for driving the pixel portion over a substrate, and the substrate is attached to an opposite substrate with a sealant in a sealing region. Then, at least the pixel portion is sealed with the substrate, the opposite substrate, and the sealant.

The substrate includes a region which is not overlapped with the opposite substrate, and a connection terminal portion is formed in that region. In the connection terminal portion, electrodes (connection pads) are arranged in stripes. Each of the electrodes is connected to a wire which is formed to extend outward from inside the sealing region.

As for the display panel, in the connection terminal portion, the electrode (connection pad) of a connection terminal is electrically connected to an electrode (FPC pad) of a flexible printed circuit terminal with an anisotropic conductive film or the like by thermocompression bonding.

Then, the signal and power supplied from the flexible printed circuit are supplied to a circuit over the substrate through each connection terminal and wire.

Here, a large amount of current flows through a power supply line (power supply path) including wires for supplying a power supply potential serving as a power source of the circuit over the substrate, a connection portion between the wires, a connection portion between the FPC terminal and the connection terminal over the substrate, and the like in order to operate the pixel, the peripheral driver circuit, and the like.

Therefore, there is a significant voltage drop in the power supply line if the resistance of the power supply line is high. Accordingly, the power supply potential supplied to the pixel and the peripheral driver circuit becomes lower than a desired power supply potential. As a result, a power supply potential inputted to the pixel and the peripheral driver circuit is decreased, which causes defective display.

Thus, References 1 and 2 disclose a structure in which power is supplied through a plurality of wires of a flexible printed circuit and wires connected to connection terminals to which a power supply potential serving as a power source of a circuit over a substrate is inputted, are connected to each other in a sealing region (Reference 1: Japanese Patent Laid-Open No. 2001-109395 and Reference 2: Japanese Patent Application Laid-Open No. 2001-102169).

However, even according to the above structure, if misalignment in a line width direction of the connection pad is caused in attachment of the substrate and the FPC, a connection area between the FPC terminal and the connection terminal becomes smaller and contact resistance is increased. In particular, an increase in contact resistance of the connection terminal to which a power supply potential serving as a power source is inputted is a cause of defective display.

SUMMARY OF THE INVENTION

In view of the above, it is an object of the present invention to decrease the resistance of a power supply line, to suppress a voltage drop in the power supply line, and to prevent defective display.

The constitution of the present invention is described hereinafter.

A semiconductor device of the present invention includes a connection terminal portion, and the connection terminal portion includes a plurality of connection terminals. The plurality of connection terminals are provided with a plurality of connection pads each of which is part of the connection terminal. The plurality of connection pads include a first connection pad and a second connection pad having a line width different from that of the first connection pad.

In addition, a semiconductor device of the present invention includes a connection terminal portion, and the connection terminal portion includes a plurality of connection terminals. The plurality of connection terminals are provided with a plurality of connection pads each of which is part of the connection terminal. The plurality of connection pads include a first connection pad and a second connection pad having a line width different from that of the first connection pad. Pitches between the plurality of connection pads are equal to each other.

In addition, a semiconductor device of the present invention includes a connection terminal portion. The connection terminal portion includes a connection terminal in which a plurality of connection pads having equal line widths are arranged equally spaced, and two or more of the plurality of connection pads are connected with each other with a wire led in the connection terminal portion.

In addition, a semiconductor device of the present invention includes a connection terminal portion. The connection terminal portion includes a connection terminal in which a plurality of connection pads having equal line widths are arranged equally spaced, and two or more of the plurality of connection pads are connected to each other with an electrode in a lower layer through contact holes.

In the semiconductor device of the invention according to the above configuration, a flexible printed circuit is connected to the connection terminal portion.

In the semiconductor device of the invention according to the above configuration, at least one connection terminal in the connection terminal portion is connected to a plurality of terminals of the flexible printed circuit, and a contact resistance between the connection terminal and the plurality of terminals of the flexible printed circuit is 5Ω or less.

A display device of the present invention includes a pixel portion, a peripheral driver circuit, and a connection terminal portion. The connection terminal portion includes a plurality of connection terminals. The plurality of connection terminals are provided with a plurality of connection pads each of which is part of the connection terminal. The plurality of connection pads include a first connection pad and a second connection pad having a line width different from that of the first connection pad.

In addition, a display device of the present invention includes a pixel portion, a peripheral driver circuit, and a connection terminal portion. The connection terminal portion includes a plurality of connection terminals. The plurality of connection terminals are provided with a plurality of connection pads each of which is part of the connection terminal. The plurality of connection pads include a first connection pad and a second connection pad having a line width different from that of the first connection pad. Pitches between the plurality of connection pads are equal to each other.

In addition, a display device of the present invention includes a pixel portion, a peripheral driver circuit, and a connection terminal portion. The connection terminal portion includes a connection terminal in which a plurality of connection pads having equal line widths are arranged equally spaced, and two or more of the plurality of connection pads are connected with each other with a wire led in the connection terminal portion.

In addition, a display device of the present invention includes a pixel portion, a peripheral driver circuit, and a connection terminal portion. The connection terminal portion includes a connection terminal in which a plurality of connection pads having equal line widths are arranged equally spaced, and two or more of the plurality of connection pads are connected to each other with an electrode in a lower layer through contact holes.

In the display device of the invention according to the above configuration, a flexible printed circuit is connected to the connection terminal portion.

In the display device of the invention according to the above configuration, at least one connection terminal in the connection terminal portion is connected to a plurality of terminals of the flexible printed circuit, and a contact resistance between the connection terminal and the plurality of terminals of the flexible printed circuit is 5Ω or less.

In addition, a display device of the present invention includes a pixel portion, a peripheral driver circuit, and a connection terminal portion. The connection terminal portion includes a plurality of connection terminals. The plurality of connection terminals are provided with a plurality of connection pads each of which is part of the connection terminal. Pitches between the plurality of connection pads are equal to each other. The plurality of connection pads include a first connection pad and a second connection pad having a line width larger than that of the first connection pad. A plurality of wires are electrically connected to the second connection pad. The plurality of wires are electrically connected to an opposite electrode of an element.

Note that a switch to be described in the present invention can be of various types, one example of which is an electric switch, a mechanical switch, or the like. In other words, any switch that can control current flow can be used, and various kinds of switches can be used without limitation to a specific switch. For example, the switch may be a transistor, a diode (such as a PN diode, a PIN diode, a Schottky diode, or a diode-connected transistor), or a logic circuit that is a combination thereof. In the case of using a transistor as the switch, the transistor operates as a mere switch. Therefore, the polarity (conductivity type) of the transistor is not particularly limited. However, in the case where less off-current is desired, it is desirable to use a transistor having a polarity with less off-current. As the transistor with small off-current, a transistor provided with an LDD region, a transistor having a multi-gate structure, or the like can be used. In addition, it is desirable to use an n-channel transistor in the case where a transistor to be operated as a switch operates in a state where a potential of a source terminal thereof is close to a lower potential side power source (such as Vss, GND, or 0V), whereas it is desirable to use a p-channel transistor in the case where a transistor operates in a state where a potential of a source terminal thereof is close to a higher potential side power source (such as Vdd). This is because an absolute value of a gate-source voltage can be increased, so that the transistor easily operates as a switch. Note that the switch may be of CMOS type using both an n-channel transistor and a p-channel transistor. If the switch is of CMOS type, it can operate appropriately even in the case where conditions vary, for example, a voltage to be outputted through the switch (in other words, an input voltage to the switch) is higher or lower than an output voltage.

Note that in this invention, the phrase "being connected" means the case of being electrically connected and the case of being directly connected. Therefore, in the constitution disclosed in the invention, another element (such as a switch, a transistor, a capacitor, an inductor, a resistor, or a diode) which enables electrical connection may be interposed in a predetermined connection. Alternatively, components may be directly connected in the arrangement without another element interposed therebetween. Note that only the case where components are directly connected without another element enabling electrical connection interposed therebetween, not including the case of being electrically connected, is referred to as "being directly connected". Note also that the phrase "being electrically connected" means both the case where components are electrically connected and the case where components are directly connected.

Note that as the transistor, transistors of various types can be employed in the invention. Therefore, there is no limitation on the kind of applicable transistor. Thus, a thin film transistor (TFT) using a non-single crystal semiconductor film typified by an amorphous silicon film or a polycrystalline silicon film, a MOS transistor formed using a semiconductor substrate or an SOI substrate, a junction transistor, a bipolar transistor, a transistor using a compound semiconductor such as ZnO or a-InGaZnO, a transistor using an organic semiconductor or a carbon nanotube, or another transistor can be used. Note that the non-single crystal semiconductor film may contain hydrogen or halogen. In addition, the transistor may be located over various kinds of substrates, and the kind of substrate is not limited to a specific one. Therefore, the transistor can be located over, for example, a single-crystal substrate, an SOI substrate, a glass substrate, a quartz substrate, a plastic substrate, a paper substrate, a cellophane substrate, a stone substrate, or the like. Further, the transistor may be formed over a certain substrate, and later, may be transferred to and located over another substrate.

Note that in the present invention, it is assumed that a pixel is the smallest unit of an image. Therefore, in the case of a full color display device including color elements R (red), G (green), and B (blue), it is assumed that a pixel includes a dot of the color element R, a dot of the color element and a dot of the color element B. Note that the color element is not limited to three colors, and may be more than three colors. For example, RGBW (W is white), RGB to which yellow, cyan, or magenta is added, and the like can be used. Note that one pixel may include a plurality of dots of a certain color element. In that case, the plurality of color elements may each have different sizes of regions that contribute to display. In addition, gradation may be expressed by individually controlling the plurality of dots of a certain color element. This is referred to as an area gray scale method. Alternatively, a viewing angle may be increased by supplying slightly different signals to respective dots of the plurality of dots of a certain color element.

Note that the phrase "pixels are arranged (arrayed) in matrix" includes the case of stripe arrangement in a so-called grid of a combination of vertical stripes and lateral stripes. It also includes the case of so-called delta arrangement of dots of three color elements (for example, RGB) in the case of performing full color display with the three color elements. Furthermore, it also includes the case of Bayer arrangement. Note that the color element is not limited to three colors, and may be more than three colors. For example, RGBW (W is white), RGB to which yellow, cyan, or magenta is added, and the like can be used. Furthermore, dots of color elements may each have different sizes of light emitting regions.

Note that in the invention, the term "semiconductor device" means a device having a circuit including a semiconductor element (such as a transistor or a diode). In addition, it may also mean a device in general that can operate by utilizing semiconductor characteristics. The term "display device" means a device including a display element (such as a liquid crystal element or a light emitting element). Note that it may also mean a main body of a display panel in which a plurality of pixels each including a display element such as a liquid crystal element or an EL element and a peripheral driver circuit for driving the pixels are formed over a substrate. Moreover, it may include a device to which a flexible printed circuit (FPC) or a printed wiring board (PWB) is attached (such as an IC, a resistor, a capacitor, an inductor, or a transistor). Further, it may also include an optical sheet such as a polarizing plate or a retardation film. Furthermore, it may include a backlight (which may include a light conducting plate, a prism sheet, a diffusion sheet, a reflection sheet, or a light source (such as an LED or a cold cathode tube)).

Defective display can be prevented by decreasing the resistance of a power supply line and suppressing a voltage drop in the power supply line.

BRIEF DESCRIPTION OF DRAWINGS

FIGS. 5A and 5B are diagrams explaining a connection terminal portion.

FIGS. 39A and 39B are diagrams explaining a connection terminal portion.

FIGS. 43A to 43C are diagrams explaining a current source circuit.

FIGS. 52A and 52B are cross-sectional views of a display device of the present invention.

FIGS. 53A and 53B are cross-sectional views of a display device of the present invention.

FIGS. 54A and 54B are cross-sectional views of a display device of the present invention.

FIGS. 55A and 55B are cross-sectional views of a display device of the present invention.

FIGS. 56A and 56B are cross-sectional views of a display device of the present invention.

FIGS. 57A and 57B are cross-sectional views of a display device of the present invention.

FIGS. 58A and 58B are cross-sectional views of a display device of the present invention.

FIGS. 59A and 59B are cross-sectional views of a display device of the present invention.

FIGS. 60A and 60B are cross-sectional views of a display device of the present invention.

FIGS. 66A and 66B are a schematic diagram showing a structure of a display panel of the present invention and a schematic diagram showing a structure of a display panel of the present invention, respectively.

DETAILED DESCRIPTION OF THE INVENTION

Figure 1:
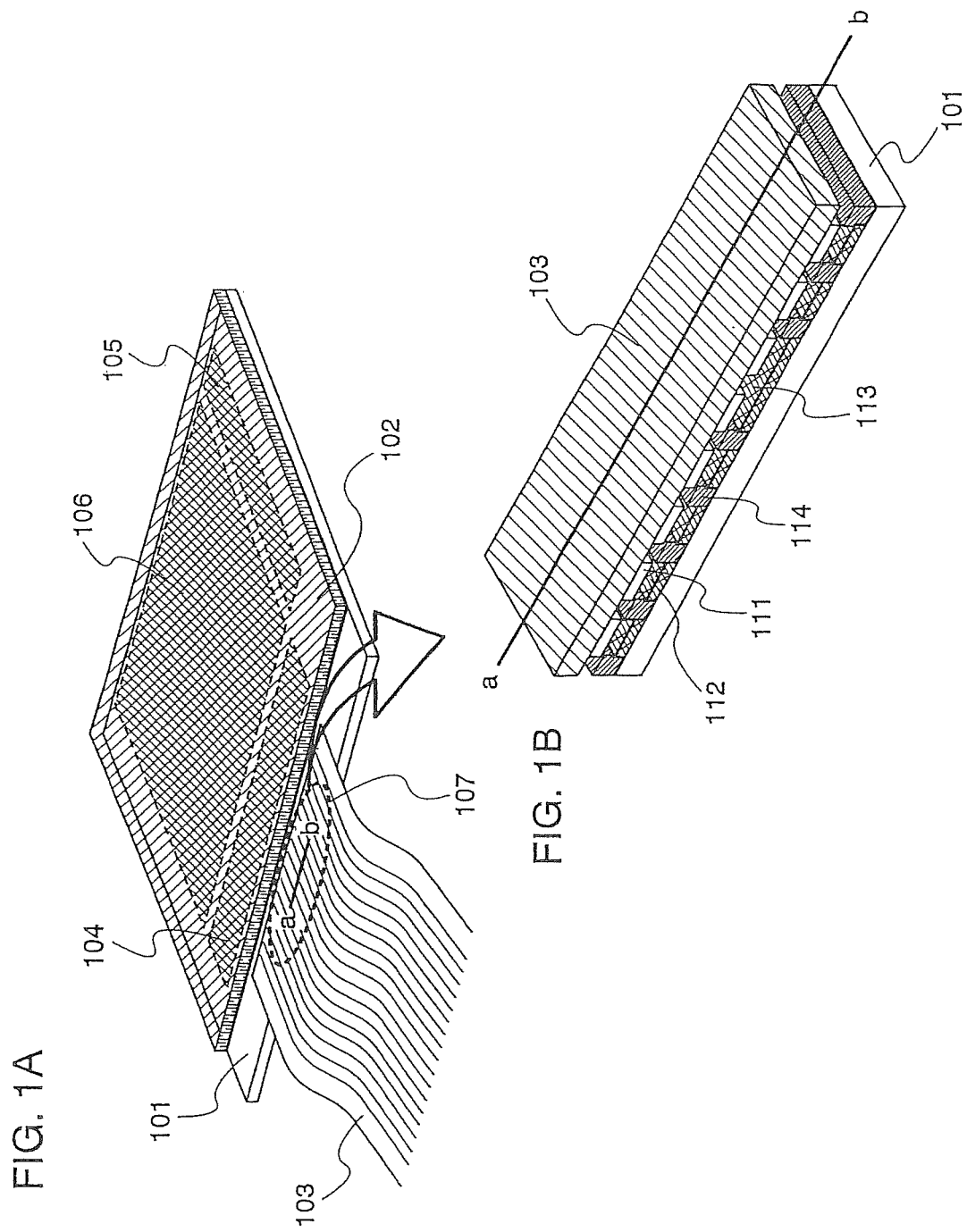
FIGS. 1A and 1B are a diagram showing a display panel of the present invention and a diagram explaining a connection terminal portion, respectively.

Hereinafter, embodiment modes of the present invention are explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiment modes.

A semiconductor device of the present invention, in which a circuit is formed over a substrate, includes a connection terminal portion to be connected to an FPC (Flexible Printed Circuit). The connection terminal portion includes a plurality of connection terminals, at least one of which is connected to a plurality of FPC terminals. Hereinafter, this connection terminal is referred to as a composite connection terminal. In addition, a connection terminal connected to one FPC terminal as a pair is hereinafter referred to as a reference connection terminal.

By connecting a plurality of FPC terminals and a composite connection terminal as described above, contact resistance can be decreased.

Note that in a connection terminal, a surface electrode to be connected to an FPC terminal is referred to as a connection pad. In other words, a surface electrode which is part of a connection terminal is referred to as the connection pad. In addition, a surface electrode of an FPC terminal to be connected to a connection terminal is referred to as an FPC pad. In other words, a surface electrode which is part of the ITC terminal is referred to as the ITC pad. Furthermore, the width between adjacent connection pads is referred to as a connection pitch, and the width between adjacent FPC pads is referred to as an FPC pitch.

Although connection pads in one connection terminal portion of the semiconductor device of the present invention are arranged to have equal connection pitches, it is not limited to the equal connection pitches.

Therefore, an ITC terminal array does not need to be changed, and an FPC can be used without any change in the specification. Thus, the FPC can be made versatile.

Note that in the above explanation, the FPC is connected, as an example, in the connection terminal portion of the semiconductor device; however, the present invention is not limited thereto. For example, an IC (semiconductor integrated circuit) chip, a printed wiring board (PWB), a programmable logic device (such as a field programmable gate array (FPGA) or a complex programmable logic device (CPLD)), or the like may be connected.

Embodiment Mode 1

In this embodiment mode, the case of applying the present invention to a display panel is explained. In addition, in this embodiment mode, a structure in which a composite connection terminal includes a composite connection pad is explained. In other words, explanation is made on a structure in which a composite connection terminal includes one connection pad (composite connection pad) and the composite connection pad is electrically connected to a plurality of FPC pads through an anisotropic conductive film.

First, a module in which a display panel is connected to an FPC in this embodiment mode is shown in NG 1A. Note that such a module and a main body of a display panel are collectively referred to as a display device in this specification.

A pixel portion 106 and peripheral driver circuits (a scan line driver circuit 105 and a signal line driver circuit 104) for driving the pixel portion 106 are formed over a substrate 101. Then, the substrate 101 is attached to an opposite substrate 102. In the pixel portion 106, a plurality of signal lines which extend in a column direction from the signal line driver circuit 104 is arranged in a row direction side by side. In addition, in the pixel portion 106, a plurality of scan lines that extend in a row direction from the scan line driver circuit 105 is arranged in a column direction side by side. In the pixel portion 106, a plurality of pixels including display elements are arranged.

Note that the display element can be of various types. For example, a display medium in which contrast varies by an electro-magnetic action can be employed, such as an EL element (an organic EL element, an inorganic EL element, or an EL element containing an organic material and an inorganic material), an electron emitting element, a liquid crystal element, electronic ink, an optical diffractive element, a discharge element, a digital micro-mirror device (DMD), a piezoelectric element, or a carbon nanotube. Note that examples of display devices using the above display elements are as follows: an EL display, as an EL-panel display device using an EL element; a field emission display (FED) or an SED flat-panel display (SED: surface-conduction electron-emitter display), as a display device using an electron emitting element; a liquid crystal display, as a liquid-crystal panel display device using a liquid crystal element; electronic paper, as a digital-paper display device using electronic ink; a grating light valve (GLV) display, as a display device using an optical diffractive element; a plasma display, as a PDP (Plasma Display Panel) display using a discharge element; a digital light processing (DLP) display device, as a DMD-panel display device using a digital micro-mirror device; a piezoelectric ceramic display, as a display device using a piezoelectric element; a nano emissive display (NED), as a display device using a carbon nanotube; and the like.

The substrate 101 is connected to an FPC 103 in a connection terminal portion. A signal and power which are necessary for the scan line driver circuit 105, the signal line driver circuit 104, and the pixel portion 106 are supplied through the FPC 103 to the display panel.

Subsequently, a schematic perspective view of a partial cross section showing a connection state between the substrate 101 and the FPC 103 in the vicinity of a dotted line 107 is shown in FIG. 1B. Note that a direction corresponding to a line a-b in FIG. 1A is indicated by a line a-b in FIG. 1B to make a cross-sectional direction easy to understand.

A plurality of connection pads are formed over the substrate 101. The plurality of connection pads include a reference connection pad 112 and a composite connection pad 113. The plurality of connection pads are arranged with partitions 114 having approximately equal widths interposed therebetween. Note that the order of the arrangement of the reference connection pad 112 and the composite connection pad 113 here is not limited to that shown in FIG. 1B.

The FPC 103 is provided with equally-spaced FPC pads 111 having approximately equal widths. Then, a surface of the substrate 101 over which the connection pads (the reference connection pad 112 and the composite connection pad 113) are formed is attached to a surface of the FPC 103 over which the ITC pads 111 are formed, so as to oppose each other.

Note that one corresponding FPC pad 111 is provided over the reference connection pad 112 as a pair so as to face the reference connection pad 112. In addition, a plurality of corresponding FPC pads 111 are provided over the composite connection pad 113 so as to face the composite connection pad 113. Furthermore, the connection pads (the reference connection pad 112 and the composite connection pad 113) and the FPC pads 111 are electrically connected to each other with an anisotropic conductive film. Note that the anisotropic conductive film is not shown here to make the structure easy to understand.

Figure 2:
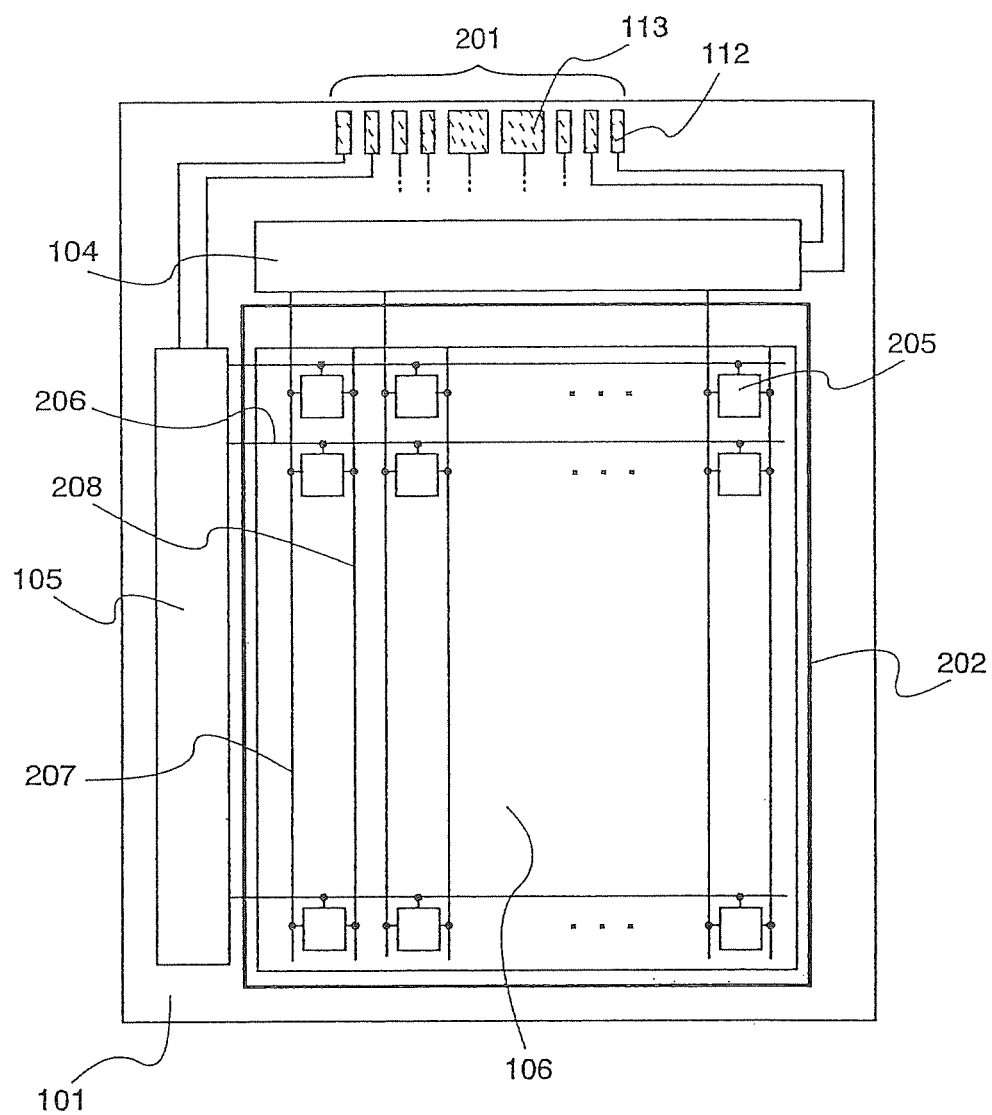
FIG. 2 is a schematic diagram of a display device of the present invention.

Subsequently, a schematic diagram of the structure of the display panel shown in FIGS. 1A and 1B is shown in FIG. 2. The scan line driver circuit 105, the signal line driver circuit 104, and the pixel portion 106 are formed over the substrate 101. In addition, a connection terminal portion 201 is formed over the substrate 101. The connection terminal portion 201 is provided with the reference connection pad 112 which is part of a reference connection terminal and the composite connection pad 113 which is part of a composite connection terminal. Note that in FIG. 2, the number and the array of the reference connection pads 112 and the composite connection pads 113 are not limited to those shown in the diagram.

A plurality of scan lines 206 are arranged in a row direction extending from the scan line driver circuit 105 to the pixel portion 106. In addition, a plurality of signal lines 207 are arranged in a column direction extending from the signal line driver circuit 104 to the pixel portion 106. In the pixel portion 106, a plurality of pixels 205 are arranged in matrix so as to correspond to the scan lines 206 and the signal lines 207. Note that the phrase "pixels are arranged in matrix" includes the case of delta array in which three color elements (for example, RGB) that are the smallest unit of an image are arranged in a so-called delta configuration in the case of performing full color display using three color elements, as well as the case of stripe array in which pixels are arranged in a grid of a combination of vertical stripes and lateral stripes.

Note that each of the pixels 205 is provided with a pixel electrode. An opposite electrode 202 is formed to cover the pixel portion 106. Then, a display element is formed by sandwiching a display medium between the pixel electrode and the opposite electrode 202. Further, the pixel portion 106 includes a power supply line 208, through which power is supplied to the pixel electrode of each pixel 205.

Since the connection terminal portion 201 is provided with the composite connection pad 113 which is part of the composite connection terminal, the display panel of this embodiment mode can reduce power consumption. Therefore, in particular, a connection terminal to which a power supply potential serving as a power source is inputted is preferably formed to be the composite connection terminal.

In addition, when a connection terminal to which a video signal for controlling lighting and non-lighting of the pixel 205 is inputted is also formed to be the composite connection terminal, defective display can be prevented.

Figure 3:
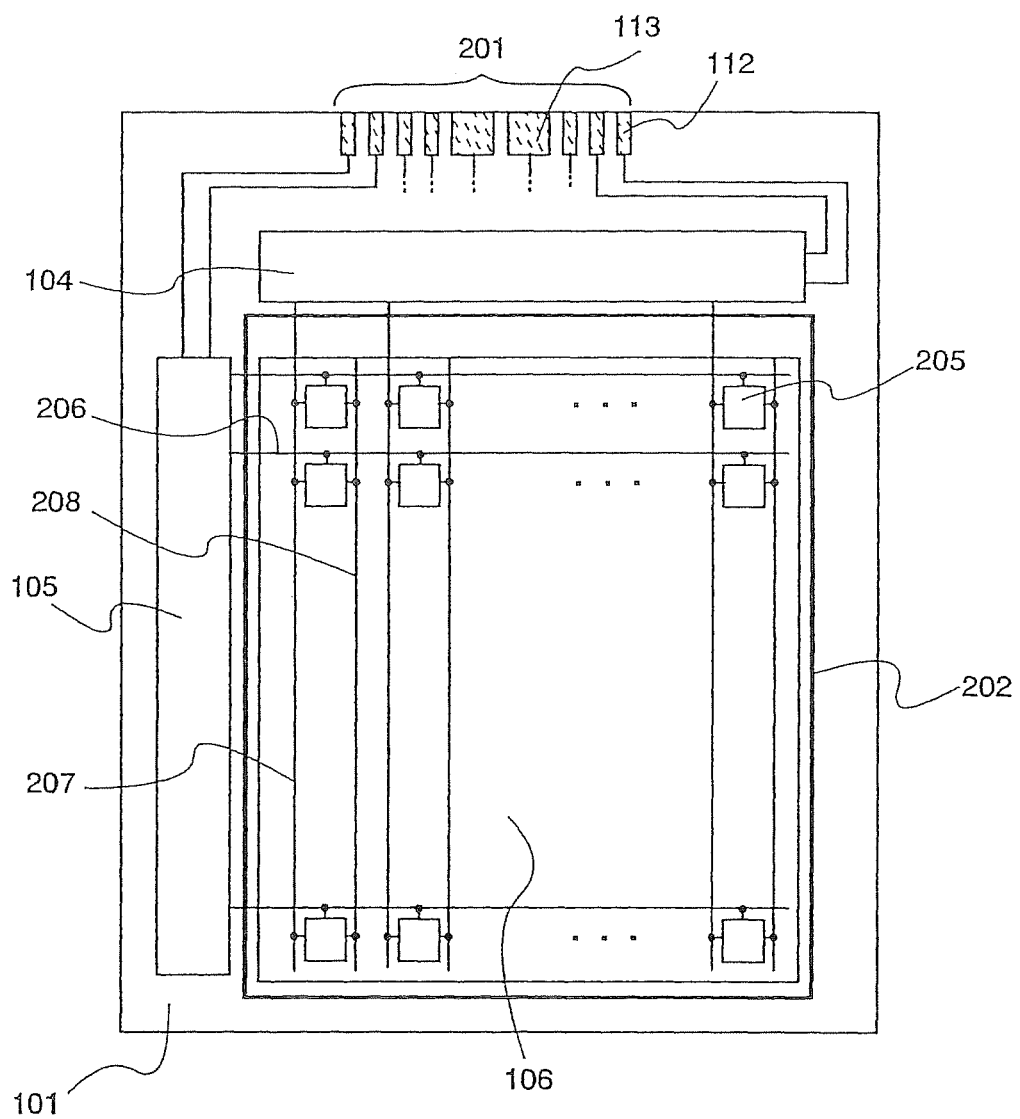
FIG. 3 is a schematic diagram of a display device of the present invention.
Figure 7:
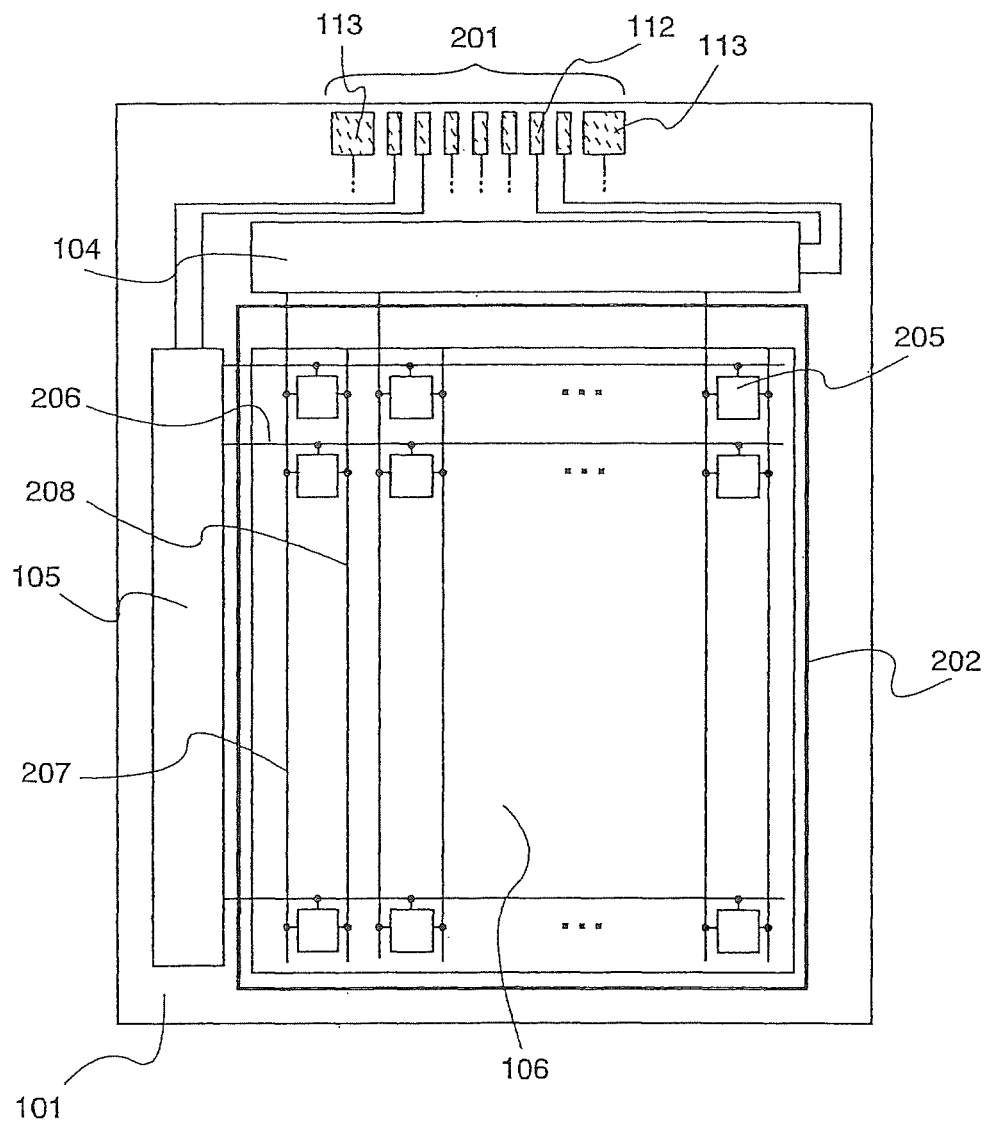
FIG. 7 is a schematic diagram of a display device of the present invention.
Figure 40:
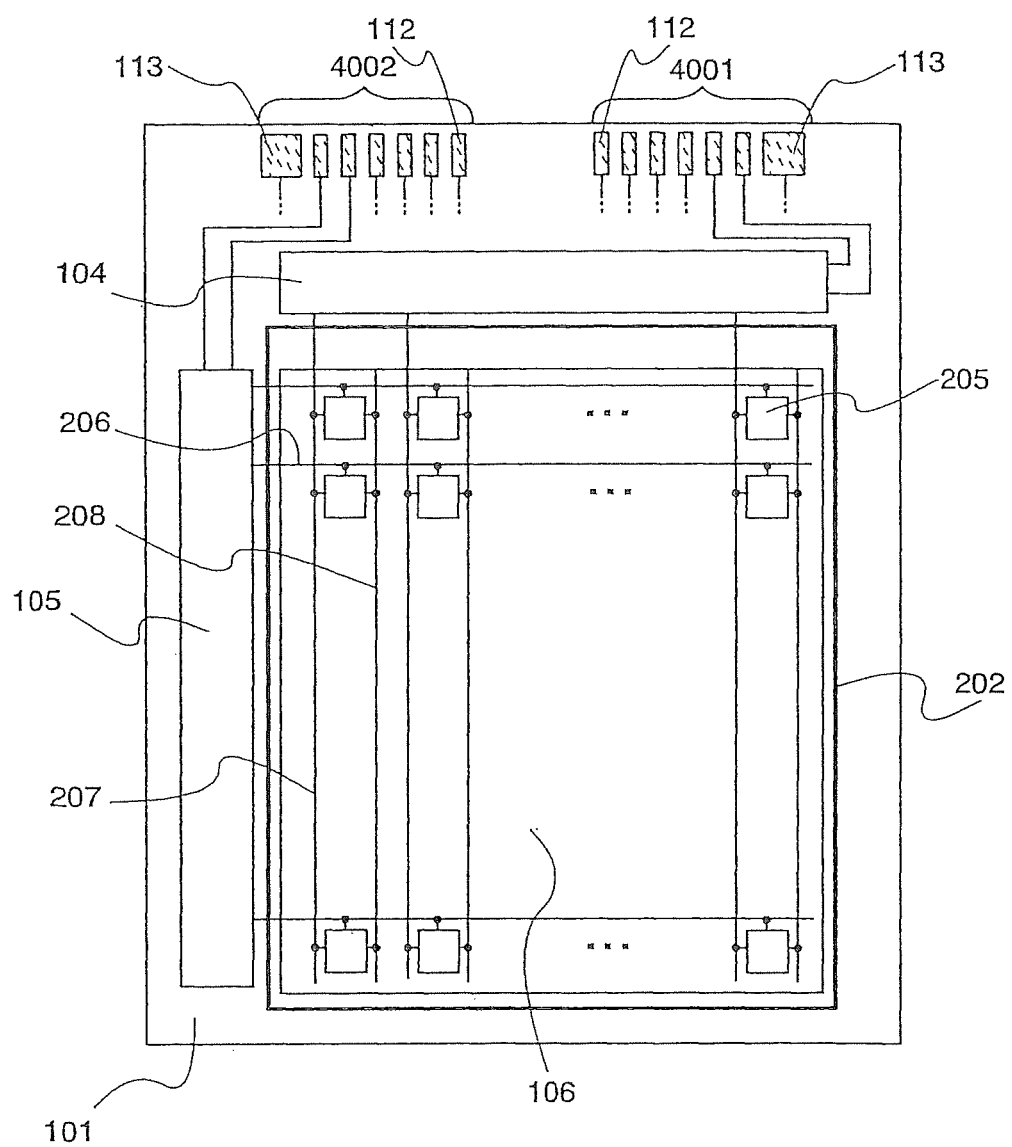
FIG. 40 is a schematic diagram of a display device of the present invention.

In the display panel of this embodiment mode, the connection terminal portion 201 may be formed inside the edge of the substrate 201 as shown in FIG. 2, or may be formed to be in contact with the edge of the substrate as shown in FIG. 3. In addition, the composite connection pads 113 may be provided on both ends of the connection terminal portion 201 as shown in FIG. 7. Furthermore, a plurality of connection terminal portions may be provided. For example, a connection terminal portion 4001 and a connection terminal portion 4002 may be provided as shown in FIG. 40. Note that different FPCs are separately connected to the connection terminal portion 4001 and the connection terminal portion 4002. Either or both of the connection terminal portions may include a composite connection pad.

Figure 8:
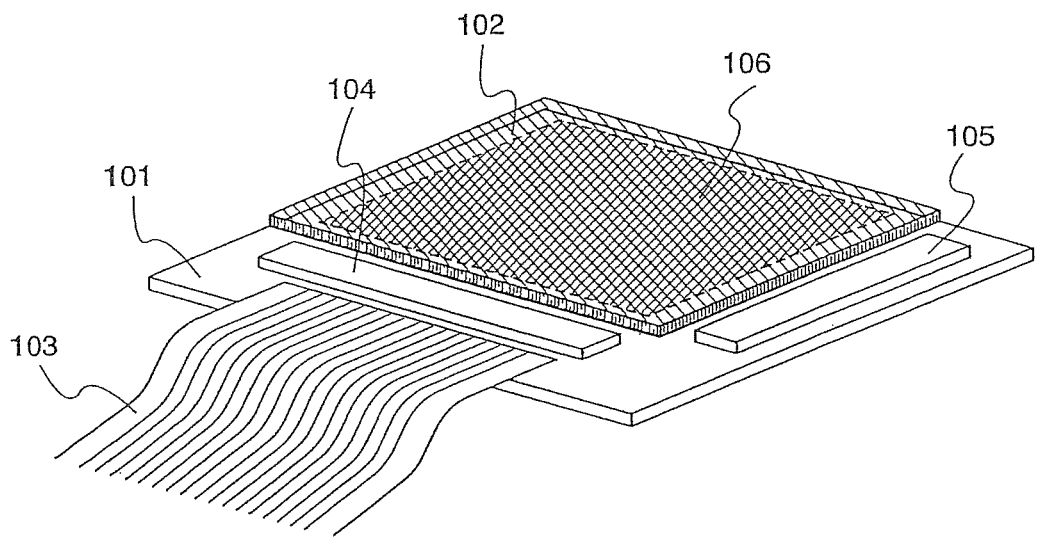
FIG. 8 is a diagram showing a display panel of the present invention.

FIGS. 1A and 1B show the structure in which the scan line driver circuit 105, the signal line driver circuit 104, and the pixel portion 106 are integrated over the substrate; however, the scan line driver circuit 105 and the signal line driver circuit 104 may be formed on an IC chip, which may be mounted by COG (Chip On Glass) or the like as shown in FIG. 8. Note that the IC chip means an integrated circuit formed over a substrate and separated into a chip. In particular, for the IC chip, a circuit which is formed by element separation or the like using a single-crystal silicon wafer as a substrate and separated into an arbitrary shape by cutting the single-crystal silicon wafer is suitable.

Figure 4A:
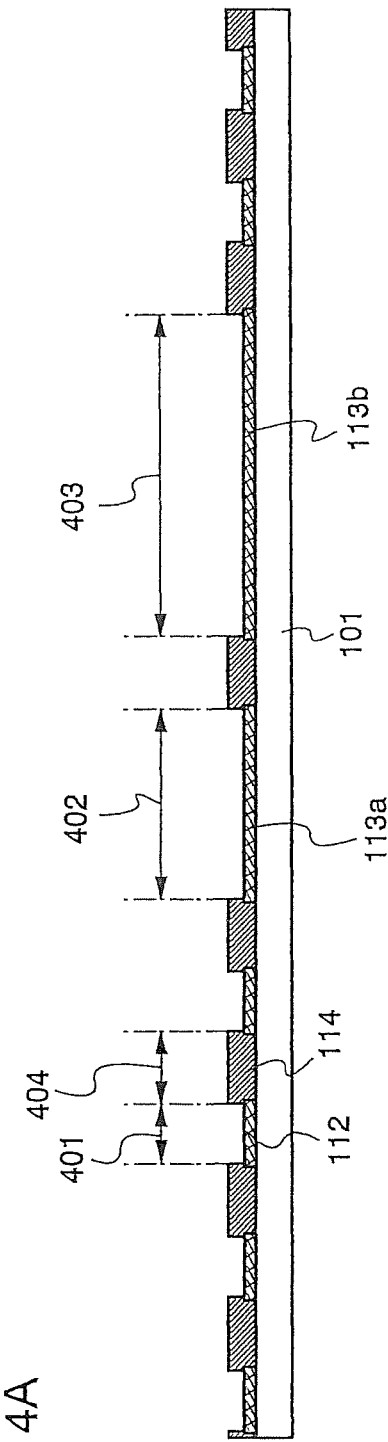
FIGS. 4A to 4C are diagrams explaining a connection terminal portion.
Figure 4B:
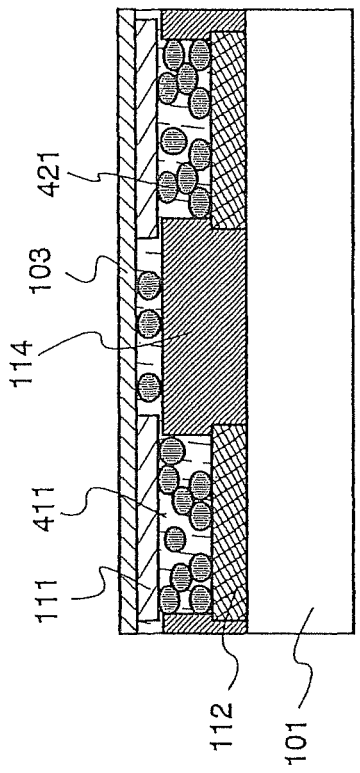
Figure 4C:
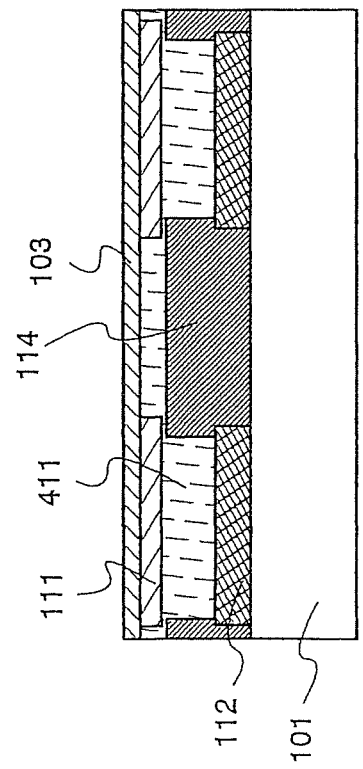

Furthermore, a connection structure between the connection pads (the reference connection pad 112 and the composite connection pad 113) and the FPC pads 111 is explained in detail with reference to FIGS. 4B and 4C. Electrical connection between the reference connection pad 112 and the FPC pad 111 is made by pressure bonding with the use of an anisotropic conductive film 411. Note that the anisotropic conductive film 411 may contain a conductive particle 421 as shown in FIG. 4C. The conductive particle 421 is a particle having a lower resistance than that of the anisotropic conductive film 411. Therefore, the contact resistance between the reference connection pad 112 and the FPC pad 111 can be decreased. Note that FIGS. 4B and 4C show a connection portion between the reference connection pad 112 and the FPC pad 111, and the same applies to the connection between the composite connection pad 113 and the FPC pad 111.

Moreover, characteristics of the connection terminal portion on the substrate 101 side is explained with reference to FIG. 4A. FIG. 4A is a cross-sectional view of the connection terminal portion of the substrate 101. Composite connection pads 113a and 113b each having different widths correspond to the composite connection pads 113 shown in FIG. 1B.

Then, assuming that the reference connection pad 112 has a line width 401, the composite connection pad 113a has a line width 402, the composite connection pad 113b has a line width 403, and the partition 114 provided between each connection pad (the reference connection pad 112 and the composite connection pads 113a and 113b) and an adjacent connection pad has a width (also referred to as a connection pitch) 404, the length of the line width 402 corresponds to a total length of two line widths 401 and the width 404. In addition, the line width 403 approximately corresponds to a total length of three line widths 401 and two widths 404. In other words, the length of the line width of the composite connection pad 113 in FIG. 1B corresponds to a total length of n (n is an integer more than 1) line widths of the reference connection pad 112 and (n−1) widths (also referred to as a connection pitch) of the partition.

Therefore, FIG. 1B shows the case where the composite connection, pad 113 is electrically connected to two FPC pads 111; however, it goes without saying that the invention is not limited thereto. In other words, the composite connection pad 113 may be electrically connected to three FPC pads 111, four FPC pads 111, or more than four PVC pads 111.

The case where the composite connection pad 113 is electrically connected to two FPC pads 111 is as shown in FIG. 5A. The composite connection pad 113a is connected to two FPC pads 111 through the anisotropic conductive film 411. In addition, the case where the composite connection pad 113b is electrically connected to three FPC pads 111 is as shown in FIG. 5B. The composite connection pad 113b is connected to three FPC pads 111 through the anisotropic conductive film 411. Note that the anisotropic conductive film 411 may contain the conductive particle 421 as shown in FIG. 4C.

Note that in the connection terminal portion of the display panel described in this embodiment mode, the contact resistance of the composite connection terminal can be made lower than the contact resistance of the reference connection terminal. Therefore, in the case of supplying a power supply potential serving as a power source or the like that consumes a large amount of power, it is preferably supplied to the display panel through a composite connection terminal connected to a plurality of FPC terminals. In other words, a connection terminal to which a power supply potential serving as a power source may be formed to be the composite connection terminal In accordance with that, the resistance of a power supply line can be decreased, a voltage drop in the power supply line can be suppressed, and defective display can be prevented.

When the composite connection terminal includes the composite connection pad, the contact resistance of the composite connection terminal is not increased even if misalignment of the connection terminal with the FPC terminal in a line width direction is caused in attachment of the display panel and the FPC. Hereinafter, explanation is made with reference to FIGS. 6A and 6B.

Figure 6A:
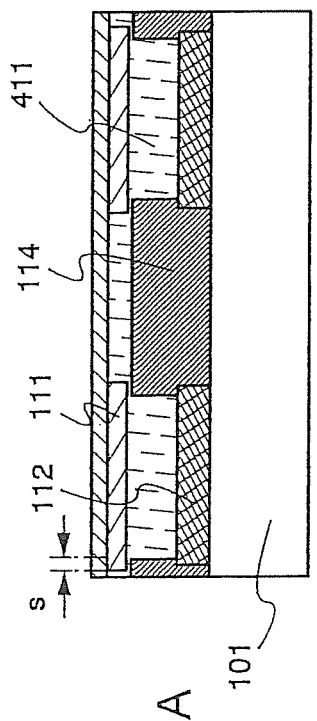
FIGS. 6A to 6F are diagrams explaining a connection terminal portion.

FIG. 6A is a cross-sectional view showing the reference connection pad and the FPC pad connected to each other through the anisotropic conductive film in the case where misalignment of the connection terminal with the FPC terminal in a line width direction is not caused in attachment of the display panel and the FPC. In other words, the center of the line width of the reference connection pad 112 is almost aligned with that of the FPC pad 111. Then, FIG. 6D corresponds to a top view of FIG. 6A. Note that a region of the FPC pad 111 which does not overlap the reference connection pad 112 has a width s.

Figure 6B:
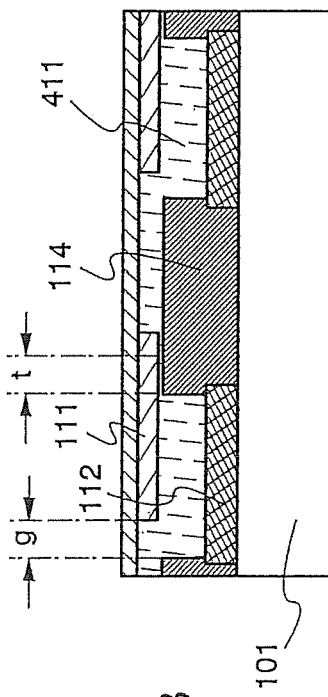

FIG. 6B is a cross-sectional view showing the reference connection pad and the FPC pad connected to each other through the anisotropic conductive film in the case where misalignment of the connection terminal with the FPC terminal in a line width direction is caused in attachment of the display panel and the FPC. Then, FIG. 6E corresponds to a top view of FIG. 6B. As shown in FIGS. 6B and 6E, the FPC pad 111 corresponding to the reference connection pad 112 as a pair is misaligned in a line width direction; therefore, a non-overlap region is generated in the connection pad 112, and the non-overlap region has a width g. Note that a non-overlap region which is enlarged in the FPC pad 111 has a width t. The width g and the width t are approximately equal to each other. Therefore, a connection area is reduced by the width g.

Figure 6C:
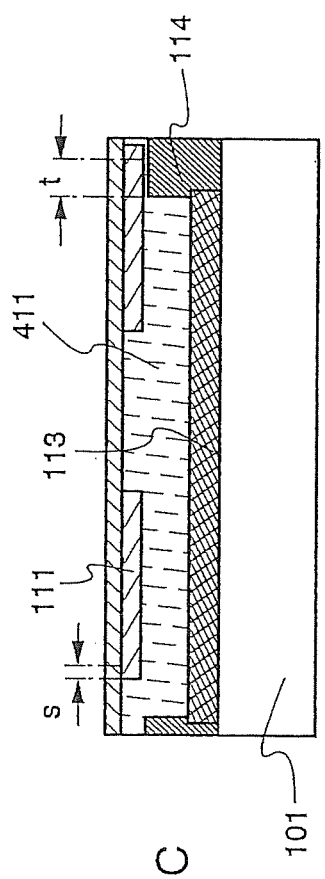
Figure 6D:
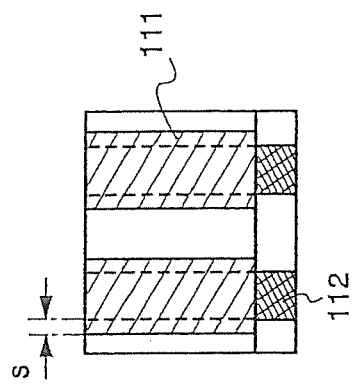
Figure 6E:
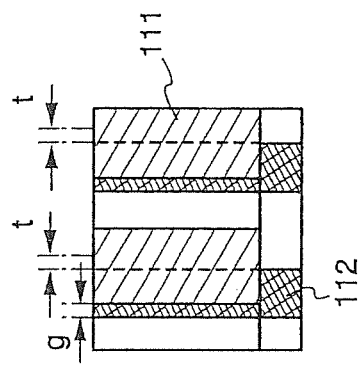
Figure 6F:
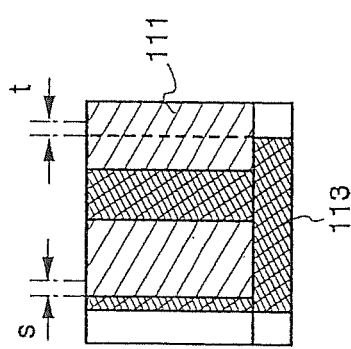

On the other hand, FIG. 6C is a cross-sectional view showing the composite connection pad and the FPC pads connected to each other through the anisotropic conductive film in the case where misalignment of the connection terminal with the FPC terminal in a line width direction is caused in attachment of the display panel and the FPC. Then, FIG. 6F corresponds to a top view of FIG. 6C. In the connection between the composite connection pad 113 and the FPC pads 111 shown in FIGS. 6C and 6F, a non-overlap region is only generated in one of the plurality of FPC pads 111 connected to the composite connection pad 113 even if misalignment is caused. Then, the non-overlap region has a width t. Furthermore, in the case where the FPC pad 111 is wider than the reference connection pad 112, the region s of the FPC pad 111, which overlaps the partition 114 when misalignment is not caused, overlaps the composite connection pad 113. Therefore, a connection area is enlarged. The enlarged area has a width s. As the number of FPC pads 111 connected to one composite connection pad 113 is increased, the influence of reduction in connection area due to the generation of the non-overlap region is lessened. In the composite connection pad 113, a connection area may be enlarged. Therefore, the contact resistance of the composite connection terminal with the FPC terminal can be decreased even if misalignment of the connection terminal with the FPC terminal in a line width direction is caused in attachment of the display panel and the FPC.

Accordingly, the contact resistance of the composite connection terminal and the plurality of FPC terminals described in this embodiment mode can be made 5Ω or less, preferably 1Ω or less.

Embodiment Mode 2

In this embodiment mode, structures of the connection pads (the reference connection pad 112 and the composite connection pad 113) which are part of the connection terminals (the reference connection terminal and the composite connection terminal) described in Embodiment Mode 1 and a wire extending from the connection pads into a sealing region are explained in detail.

Figure 9:
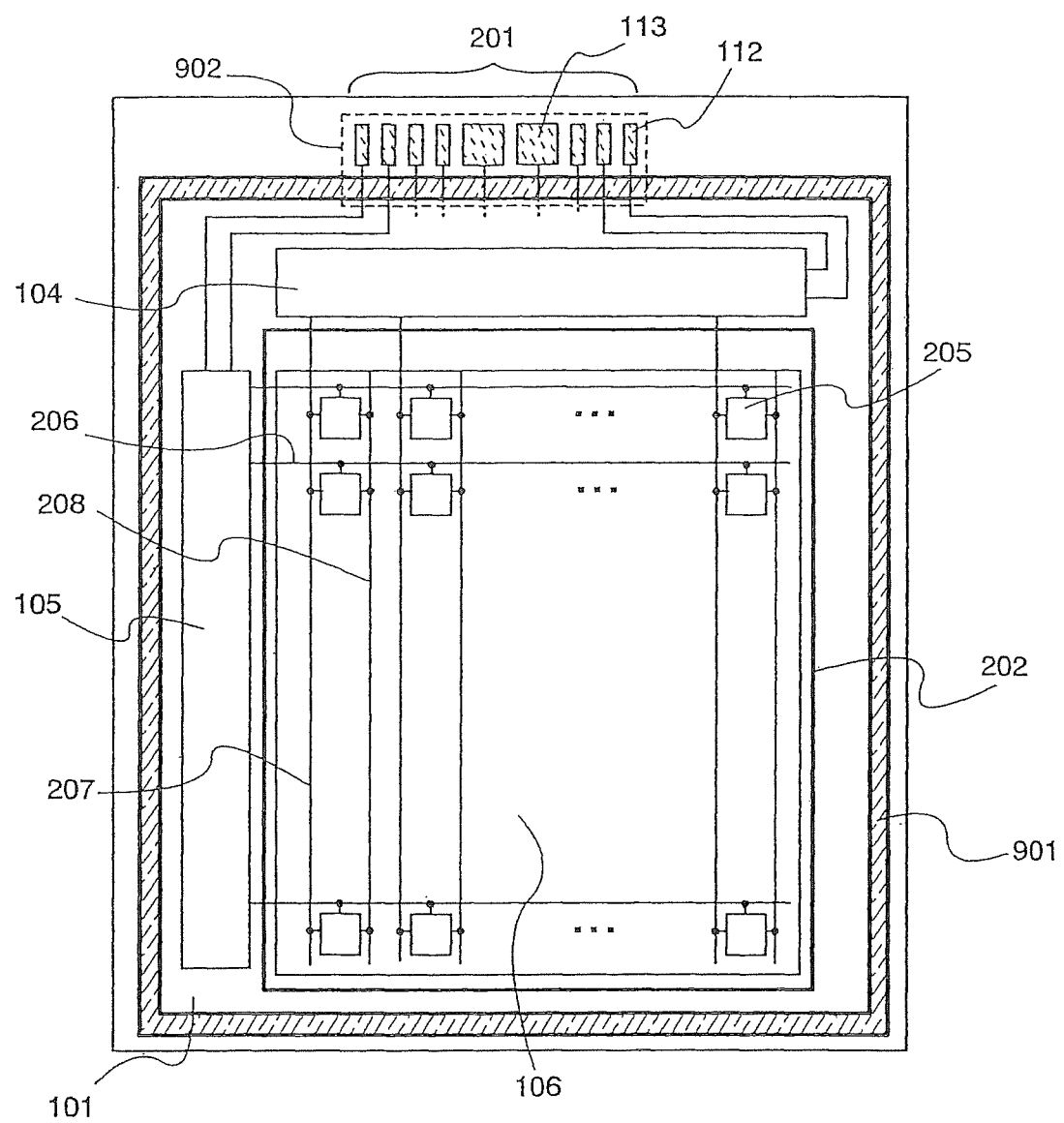
FIG. 9 is a schematic diagram of a display device of the present invention.

Note that the display panel to be described in this embodiment mode is particularly suitable for a display panel having a structure in which peripheral driver circuits (a scan line driver circuit and a signal line driver circuit) for driving a pixel are integrated with a pixel portion. In other words, the peripheral driver circuit includes a thin film transistor (also referred to as a TFT) and the like formed at the same time as the formation of a thin film transistor included in the pixel. A schematic diagram of a display panel having such a structure is shown in FIG. 9. Note that the connection terminal portion 201 is not necessarily formed inside the edge of the substrate 101 as in this structure, and may be formed in contact with the edge of the substrate 101 as shown in FIG. 3.

In the display panel of this structure, a pixel portion 106 and a peripheral driver circuit formed over the substrate 101 are sandwiched between the substrate 101 and an opposite substrate and are sealed in a sealing region 901. Note that the sealing may be performed by any of solid sealing, vacuum sealing, gas sealing, liquid sealing, and the like. For example, a resin or the like can be used for solid sealing. In addition, He (helium), Ar (argon), N (nitrogen), or the like can be used for gas sealing. Further, liquid paraffin, a silicon liquid, or the like can be used for liquid sealing.

Figure 10:
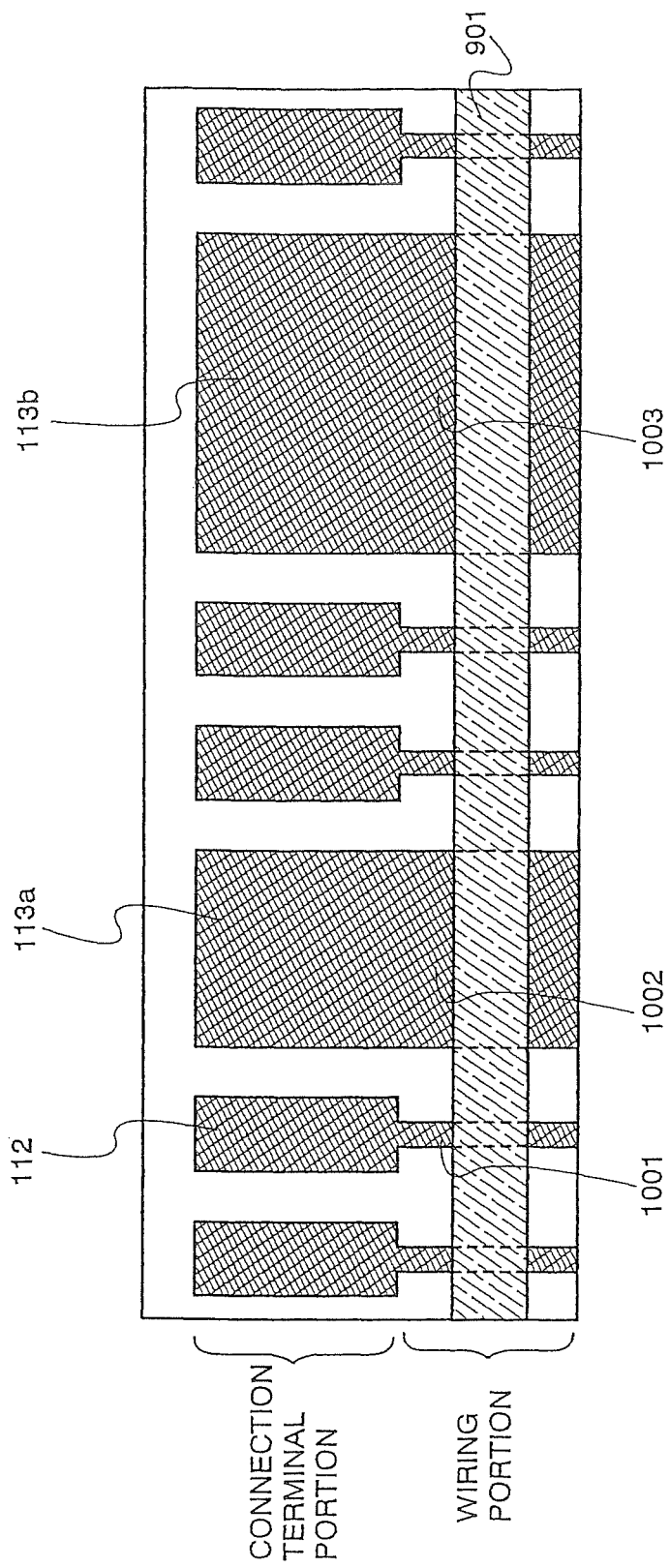
FIG. 10 is a diagram explaining a connection terminal portion.

Here, an enlarged view of a region surrounded by a dotted line 902 is shown in FIG. 10. The connection terminal portion includes the reference connection pad 112 and composite connection pads (the composite connection pad 113a and the composite connection pad 113b). The reference connection pad 112 and a wire 1001 are formed with a continuous conductive film. The line width of the wire 1001 is smaller than the line width of the reference connection pad 112. Specifically, the line width of the wire 1001 is half or less the line width of the reference connection pad 112, more preferably, one-third or less. In addition, the composite connection pad 113a and a wire 1002, and the composite connection pad 113b and a wire 1003 are also formed with respective continuous conductive films. Then, the wire 1002 and the wire 1003 have line widths approximately equal to those of the composite connection pad 113a and the composite connection pad 113b, respectively.

Note that the composite connection pad 113a has a total width of two line widths of the reference connection pad 112 and the width of one connection pitch; however, the invention is not limited thereto. In addition, the composite connection pad 113b has a total width of three line widths of the reference connection pad 112 and two widths of the connection pitch; however, the invention is not limited thereto. In addition, as shown in FIG. 10, the connection terminal portion may include composite connection pads having different widths, or may include a plurality of composite connection pads having the same width. In addition, the connection terminal portion may include one composite connection pad or more. The line widths of the wire 1001, the wire 1002, and the wire 1003 in a wiring portion are those in the vicinity of the sealing region 901, and they may have different line widths further inside the pixel portion. In addition, the number and the array order of the reference connection pad 112, the composite connection pad 113a, and the composite connection pad 113b are not limited to those described above.

In other words, in the structure shown in FIG. 10, the wire formed with a conductive film continuous with the reference connection pad is narrow in width in the sealing region. On the other hand, the wire formed with a conductive film continuous with the composite connection pad may have the same line width as the composite connection pad also in the sealing region.

Therefore, since the area of the wire formed with a conductive film continuous with the reference connection pad 112 becomes smaller in the sealing region, the adhesion between the substrate 101 and the opposite substrate attached thereto can be improved. In addition, the wires formed with layers continuous with the composite connection pads (the composite connection pad 113a and the composite connection pad 113b) have the same widths as those of the composite connection pads; therefore, the resistance of the wires can be decreased. Note that the number of the composite connection pads is preferably smaller than that of the reference connection pads 112 in order to further improve the adhesion.

Figure 11:
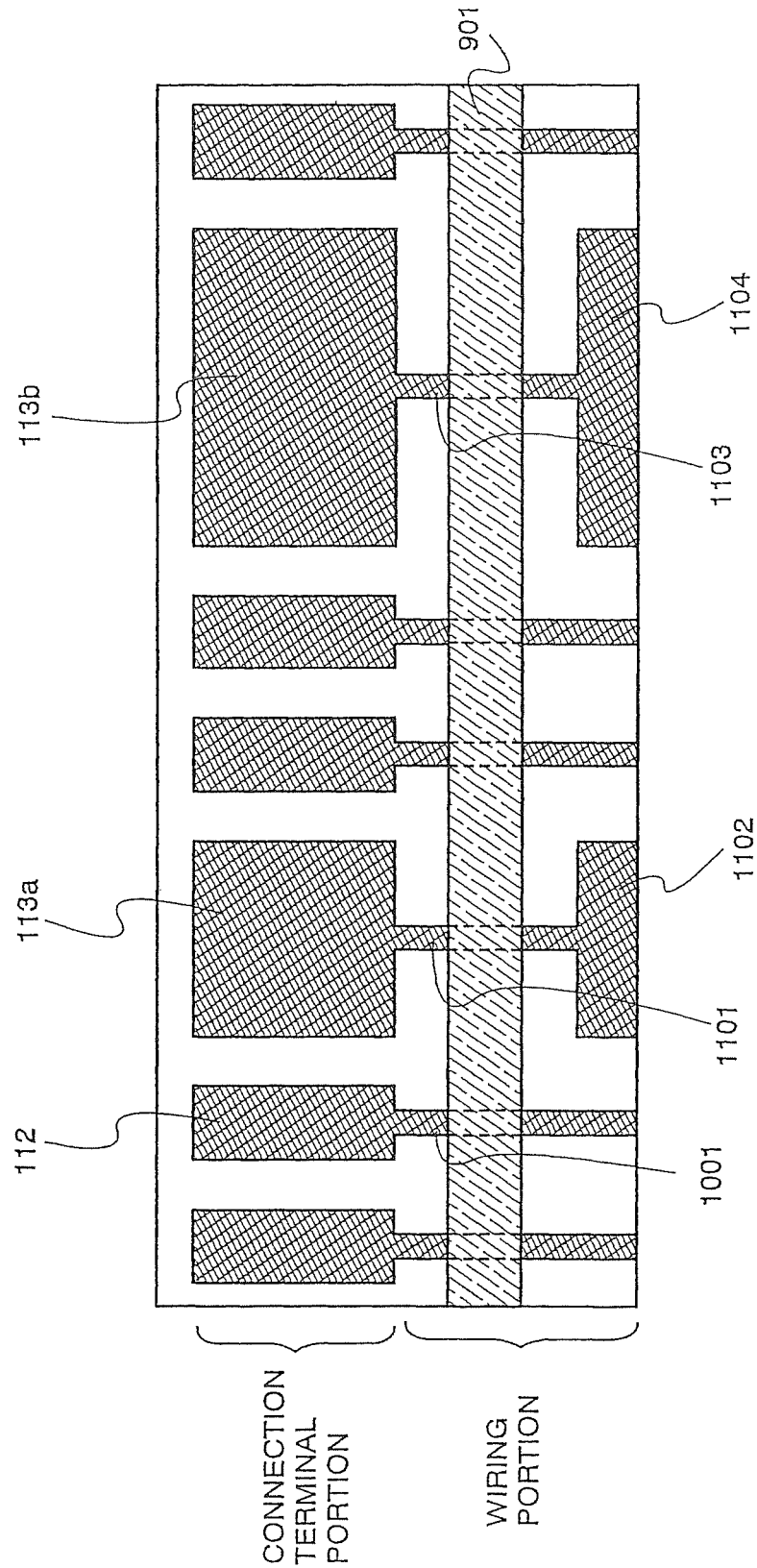
FIG. 11 is a diagram explaining a connection terminal portion.

In addition, an enlarged view of another structure of the region surrounded by the dotted line 902 is shown in FIG. 11. This structure can further improve the adhesion between the substrate 101 and the opposite substrate attached thereto.

In the structure of FIG. 11, the wire 1001 formed with a conductive film continuous with the reference connection pad 112 is the same as that shown in FIG. 10. Then, the composite connection pad 113a includes a narrow wire portion 1101 and a wide wire portion 1102 in the wiring portion. In addition, the composite connection pad 113*b* also includes a narrow wire portion 1103 and a wide wire portion 1104 in the wiring portion.

In other words, in each of the composite connection pads (the composite connection pad 113*a* and the composite connection pad 113*b*), a wire is formed with the same conductive film across the sealing region 901. The wire is narrow in the sealing region 901 and is wide within a region where the substrate and the opposite substrate are attached to each other. Preferably, the line width of the narrow wire is one third or less of the line width of the reference connection pad 112, and the line width of the wide wire is approximately equal to the line width of the composite connection pad. In addition, the length of the narrow wire is in the range of three times to ten times the width of the sealing region 901. Consequently, the adhesion between the substrate and the opposite substrate is improved. In addition, since the length of the narrow wire is short, an increase in resistance can be suppressed.

Figure 12:
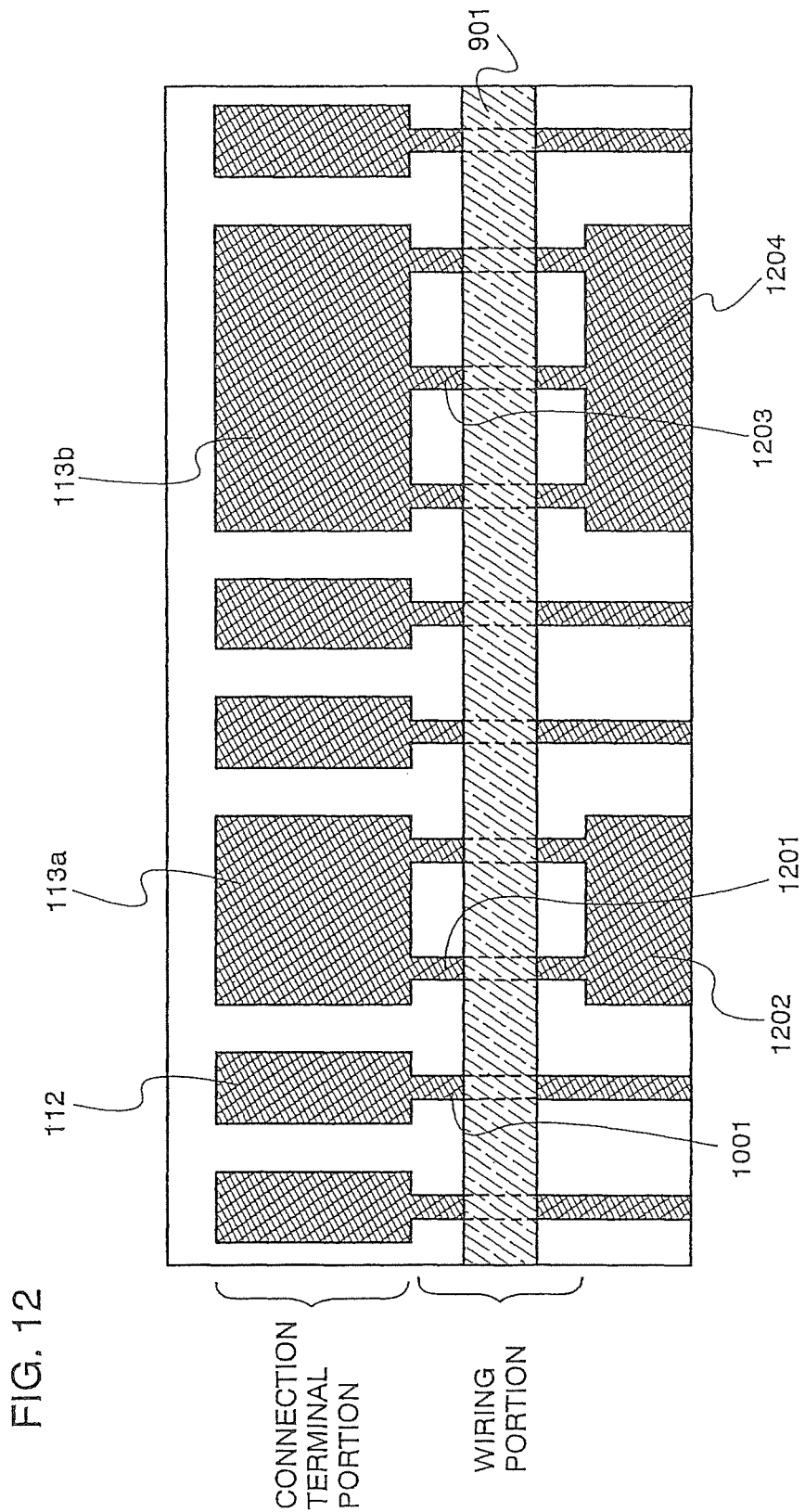
FIG. 12 is a diagram explaining a connection terminal portion.

An enlarged view of another structure of the region surrounded by the dotted line 902 is shown in FIG. 12. This structure can improve the adhesion between the substrate 101 and the opposite substrate attached thereto while suppressing an increase in wire resistance.

In the structure shown in FIG. 12, the wire 1001 formed with a conductive film continuous with the reference connection pad 112 is the same as that shown in FIG. 10. Then, the composite connection pad 113*a* includes a narrow wire portion 1201 and a wide wire portion 1202 in the wiring portion. In addition, the composite connection pad 113*b* also includes a narrow wire portion 1203 and a wide wire portion 1204 in the wiring portion.

In other words, in each of the composite connection pads (the composite connection pad 113*a* and the composite connection pad 113*b*), a wire is formed with the same conductive film across the sealing region 901. The wire is divided into a plurality of narrow wires in the sealing region 901, and the plurality of narrow wires converge and become a wide wire inside a region where the substrate and the opposite substrate are attached to each other. Preferably, the line width of each narrow wire is one third or less of the line width of the composite connection pad, and the line width of the wide wire is approximately equal to the line width of the composite connection pad. In addition, the length of the narrow wire is in the range of three times to ten times the width of the sealing region 901. Consequently, the adhesion between the substrate and the opposite substrate is improved. In addition, since the length of the narrow wire is short, an increase in resistance can be suppressed.

Figure 44:
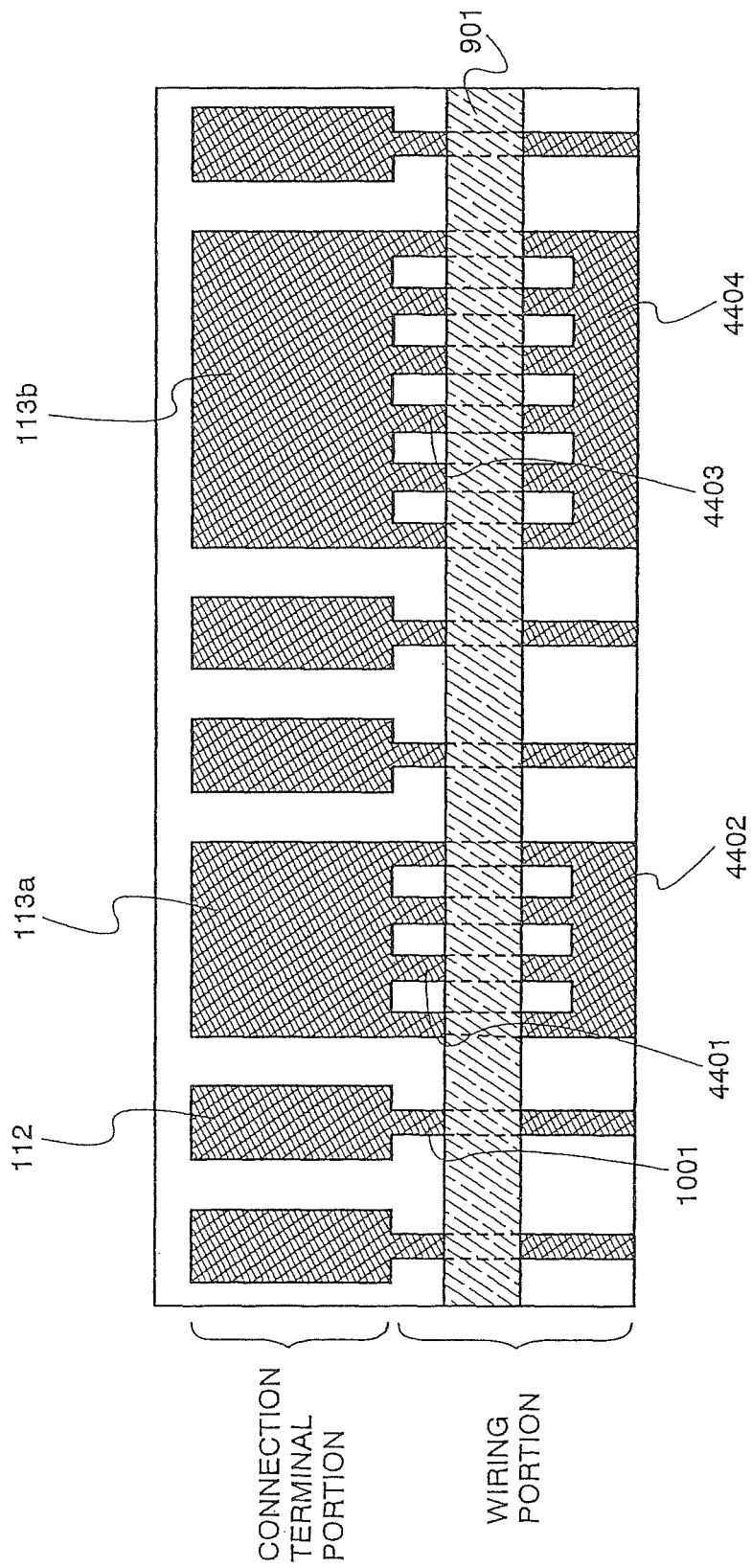
FIG. 44 is a diagram explaining a connection terminal portion.

Although the composite connection pad 113*a* having a total width of two line widths of the reference connection pad 112 and a width of one connection pitch is divided into two narrow wire portions 1201 in the sealing region 901 in the structure shown in FIG. 12, the invention is not limited thereto. Furthermore, the composite connection pad 113*b* having a total width of three line widths of the reference connection pad 112 and two widths of the connection pitch is divided into three narrow wire portions 1203 in the sealing region 901; however, the invention is not limited thereto. In addition, as shown in FIG. 44, in a wire portion having the same width as that of the composite connection pad 113*a*, part of the wire which intersects with the sealing region 901 may be removed to form a plurality of narrow wire portions 4101, and the wire may have a wide wire portion 4402 in a pixel portion. In the same manner, in the wire portion having the same width as that of the composite connection pad 113*b*, part of the wire which intersects with the sealing region 901 may be removed to form a plurality of narrow wire portions 4403, and the wire may have a wide wire portion 4404 in a pixel portion.

Figure 41:
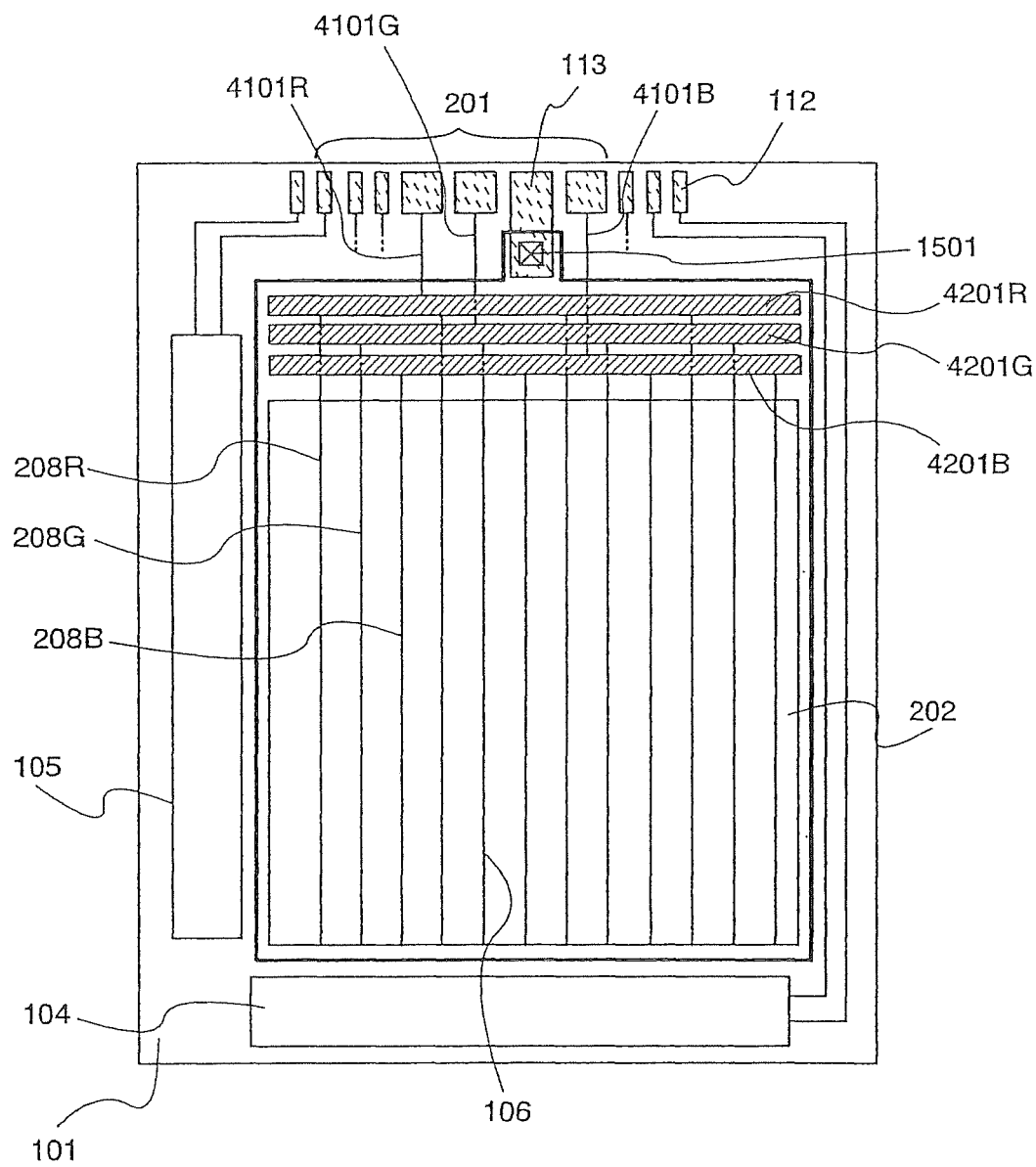
FIG. 41 is a schematic diagram of a display device of the present invention.

Note that power supply potentials may be different in the case where the display device performs full color display using RGB color elements. In that case, as shown in FIG. 41, a power supply potential of a color element R is supplied to a pixel through a wire 4101R connected to the composite connection pad 113, a wire 4201R connected to the wire 4101R, and a power supply line 208R connected to the wire 4201R. In addition, a power supply potential of a color element G is supplied to a pixel through a wire 4101G, a wire 4201G connected to the wire 4101G, and a power supply line 208G connected to the wire 4201G. A power supply potential of a color element B is supplied to a pixel through a wire 4101B, a wire 4201B connected to the wire 4101B, and a power supply line 208B connected to the wire 4201B.

Figure 47:
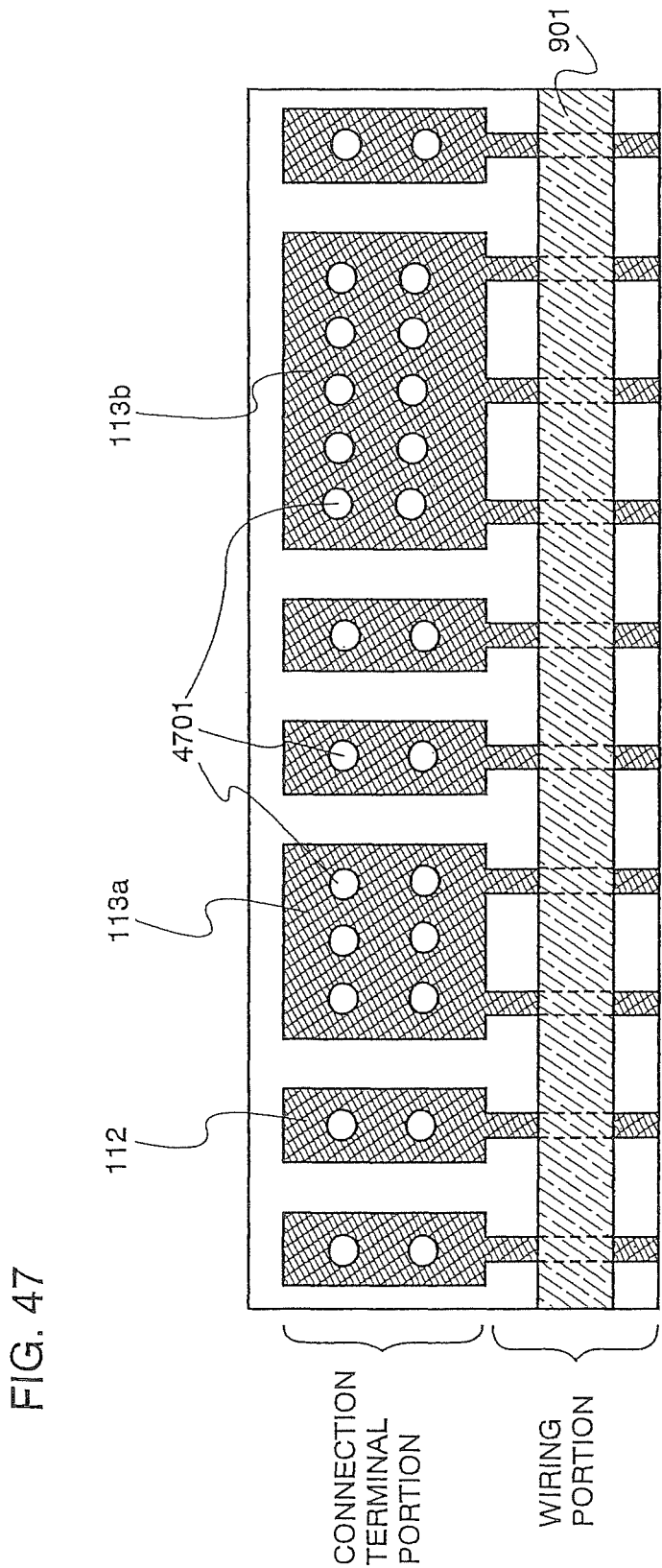
FIG. 47 is a diagram explaining a connection terminal portion.
Figure 50:
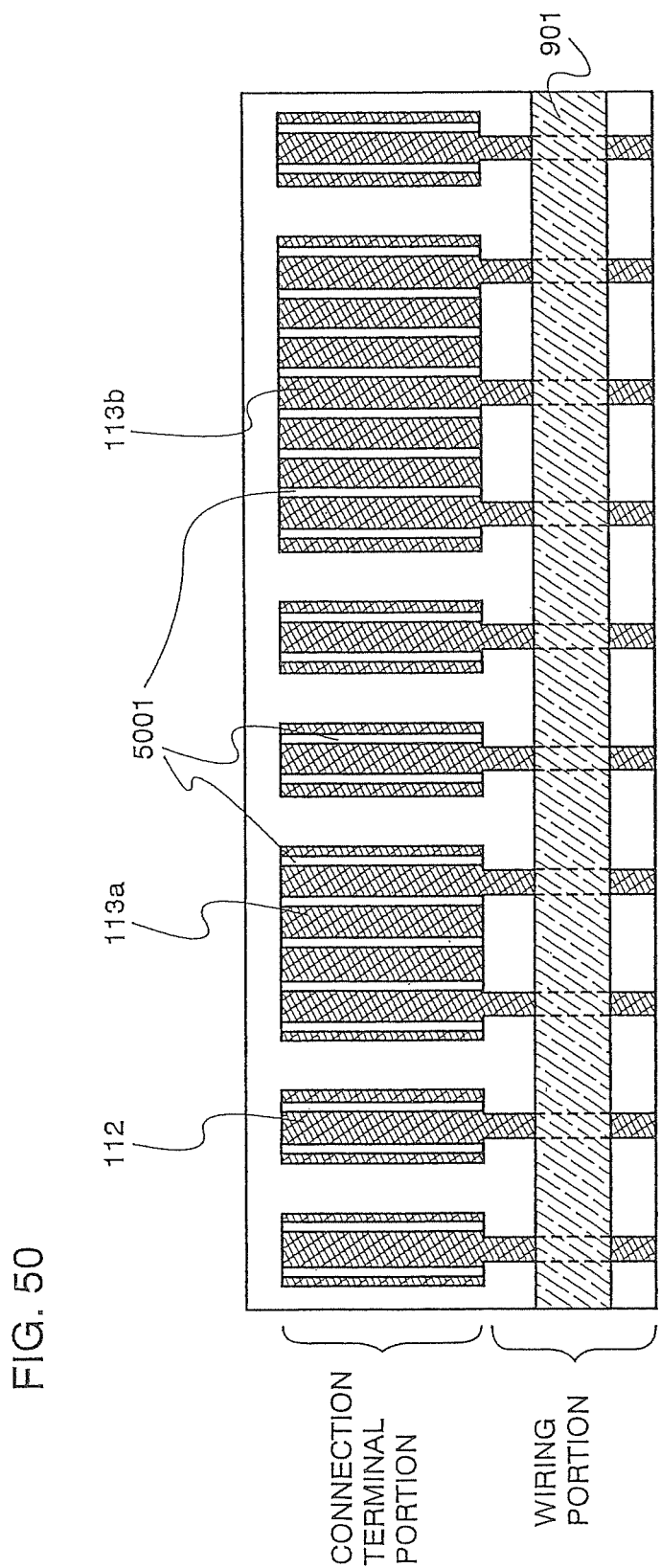
FIG. 50 is a diagram explaining a connection terminal portion.
Figure 51:
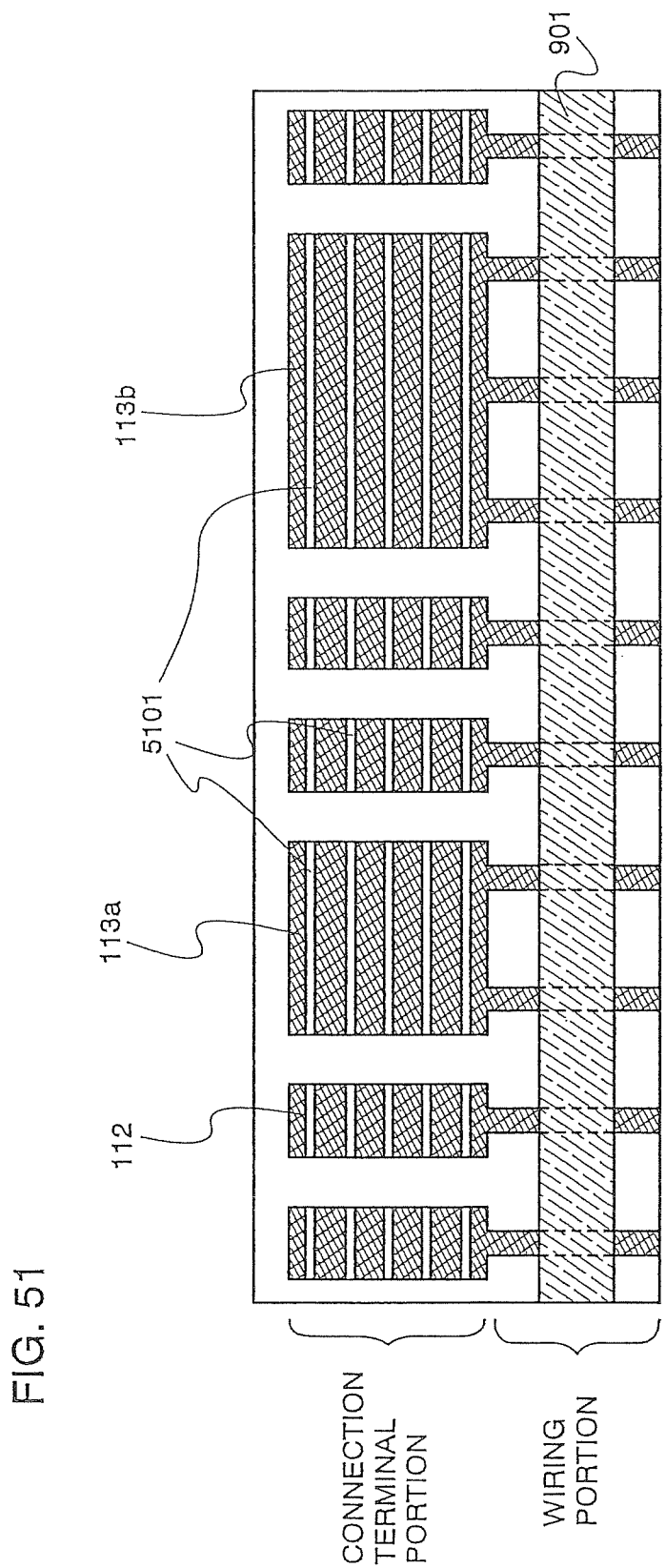
FIG. 51 is a diagram explaining a connection terminal portion.

In order to improve the adhesion with the FPC in the connection terminal portion, a depression 4701 may be provided in the connection pads (the reference connection pad 112, the composite connection pad 113*a*, and the composite connection pad 113*b*) as shown in FIG. 47. Note that a plurality of depressions 4701 are preferably provided for one connection pad. However, the number and the shape of the depressions 4701 are not limited to those shown in FIG. 47. Therefore, the depression may have not only such a circular shape as shown in FIG. 47 but also a square shape or a triangular shape. Alternatively, a depression 5001 formed in a stripe shape in a direction perpendicular to a line width direction of the connection pad may be provided as shown in FIG. 50, or a depression 5101 formed in a stripe shape in a line width direction of the connection pad may be provided as shown in FIG. 51.

Figure 36:
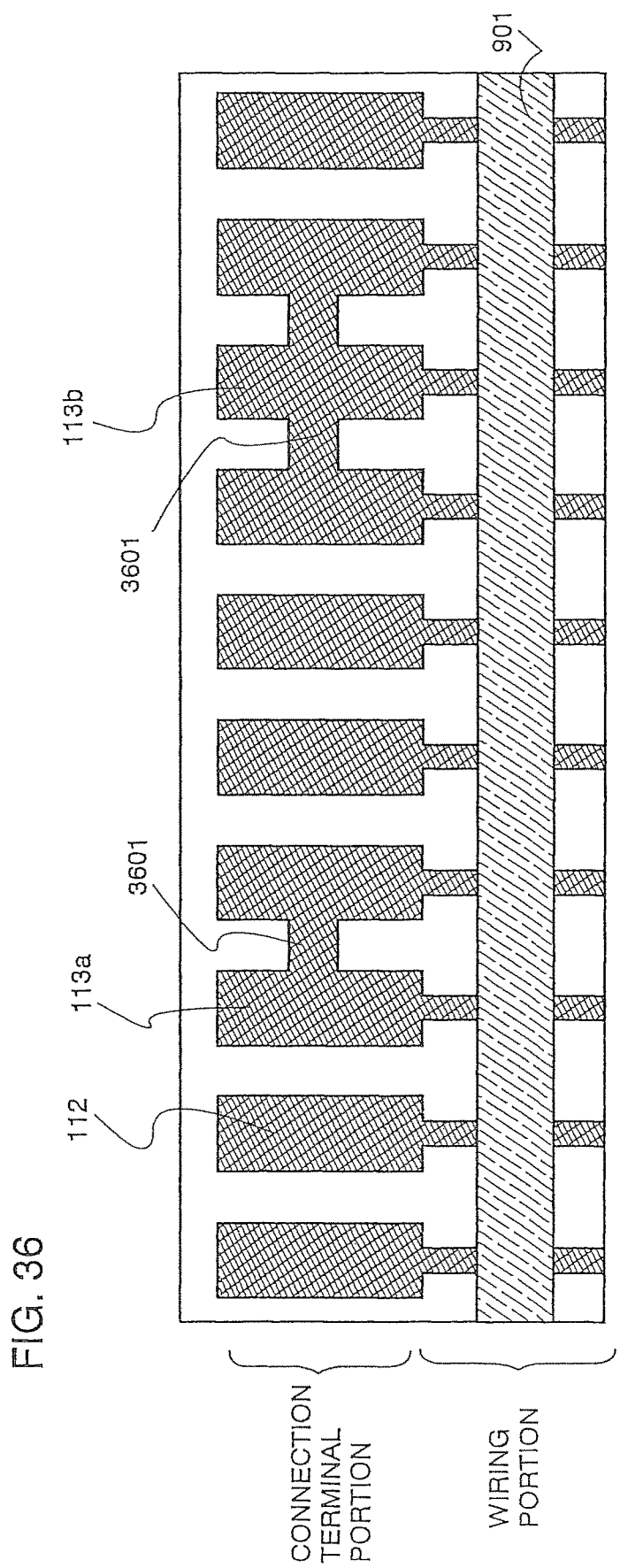
FIG. 36 is a diagram explaining a connection terminal portion.

In addition, the structure of the composite connection pad is also not limited to those described above. For example, the composite connection pad may have a structure where a plurality of electrodes having the same shape as the reference connection pad are joined at an electrode joint portion 3601 as shown in FIG. 36. In other words, two electrodes each having the same line width as the reference connection pad 112 are joined by the electrode joint portion 3601, thereby forming the composition connection pad 113*a*. In addition, three electrodes each having the same line width as the reference connection pad 112 are joined by the electrode joint portion 3601, thereby forming the composition connection pad 113*b*. Note that the composite connection pad may be formed to be continuous using one conductive film, or the electrodes and the electrode joint portion 3601 may be formed with different conductive films.

Figure 48:
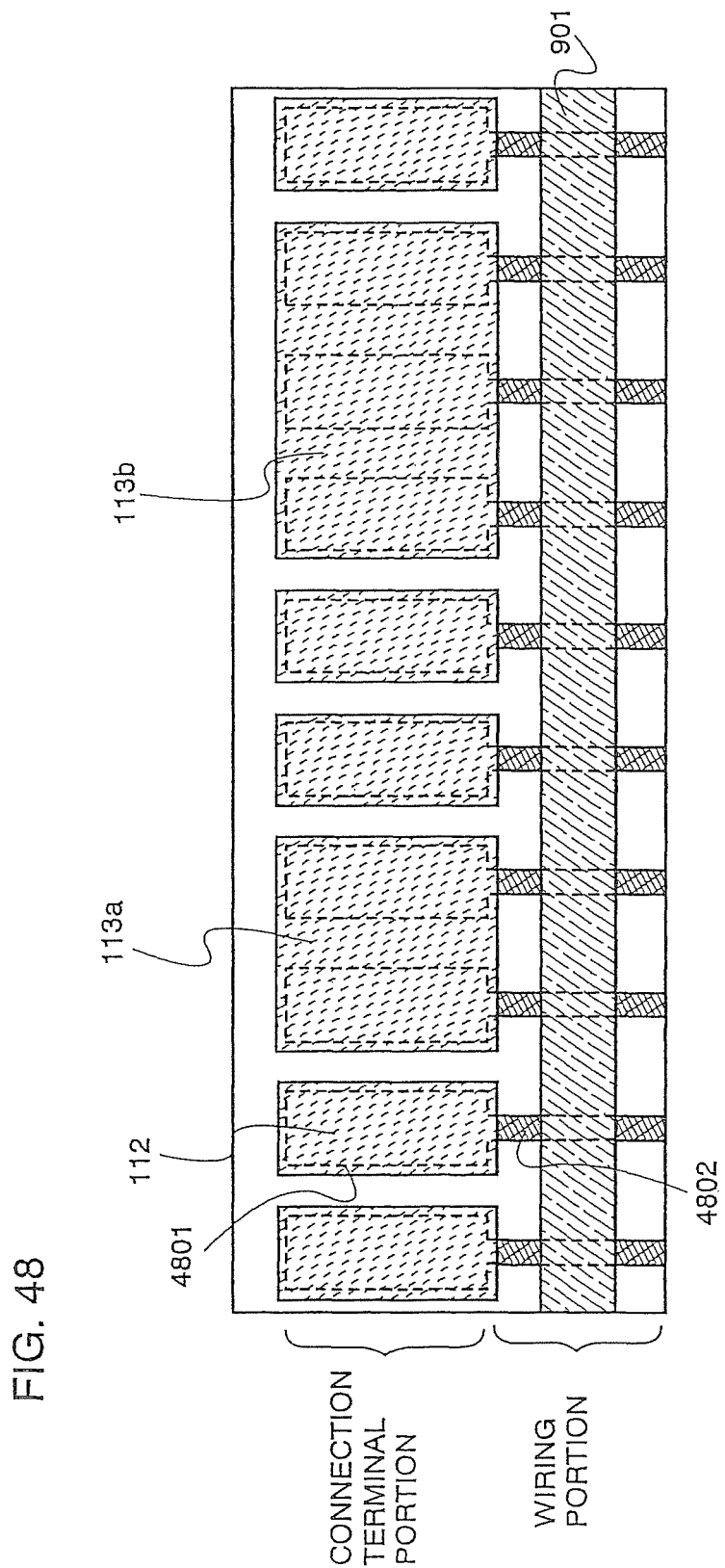
FIG. 48 is a diagram explaining a connection terminal portion.

In addition, electrodes serving as the connection pads (the reference connection pad 112, the composite connection pad 113*a*, and the composite connection pad 113*b*) forming the connection terminal may be formed with a different conductive film from that used for a wire extending from each connection terminal. For example, an electrode 4801 in the connection terminal portion is formed with a conductive film continuous with a wire 4802 extending into the sealing region as shown in FIG. 48. Then, an electrode serving as a pad is formed over the electrode 4801. In other words, the reference connection pad 112 is formed over the electrode 4801 forming the reference connection terminal, and each of the composite connection pad 113*a* and the composite connection pad 113*b* is formed over a plurality of electrodes 4801 serving as the composite connection terminal.

In such a structure, the connection pads (the reference connection pad 112, the composite connection pad 113*a*, and the composite connection pad 113*b*) are formed with a material of a transparent conductive film of a bottom emission display device, and the electrode 4801 and the wire 4802 are formed with a metal material. As an example of the transparent conductive film, ITO, TZO, CTO, or the like can be given.

Figure 49:
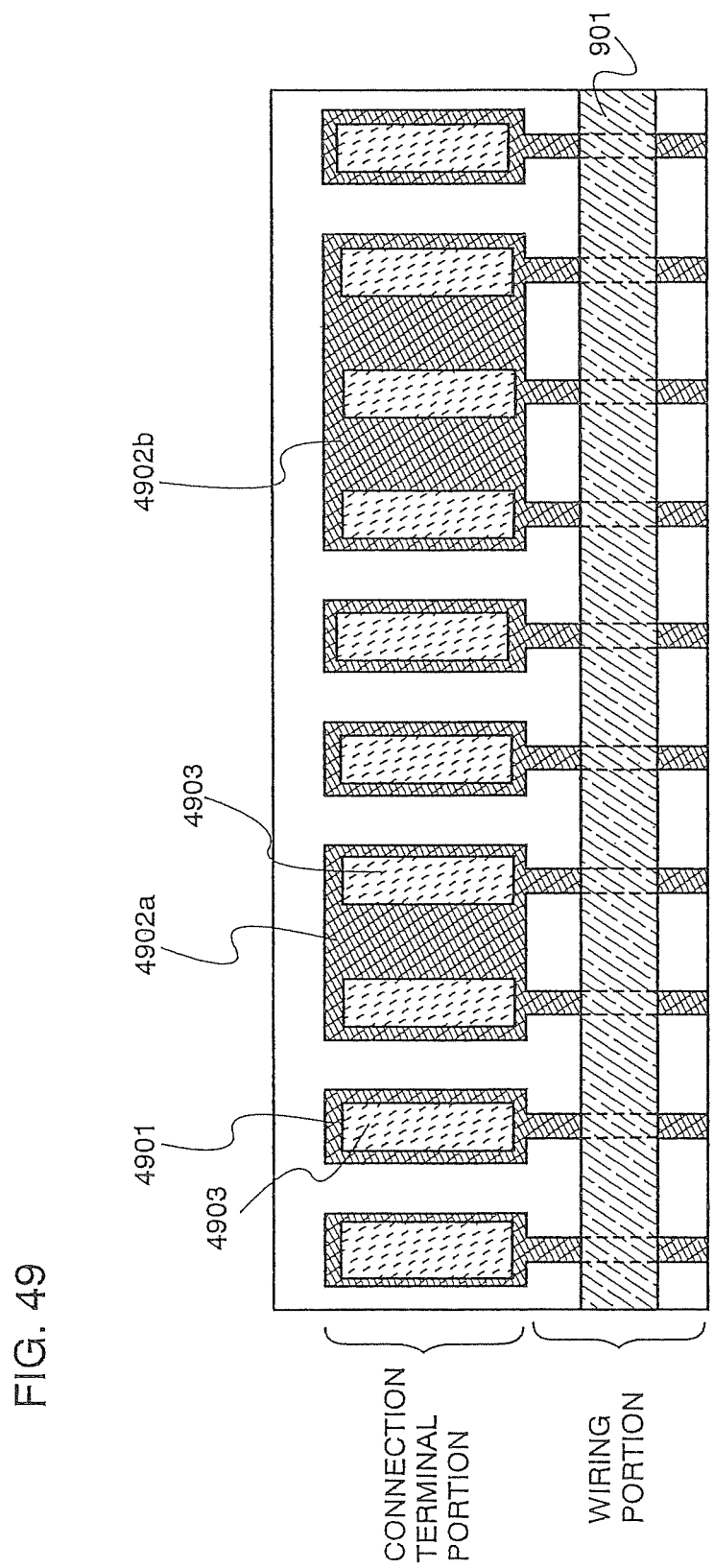
FIG. 49 is a diagram explaining a connection terminal portion.

Note that the connection pad is not limited to an electrode formed with one conductive film. In other words, other conductive films 4903 having a smaller area than an electrode 4901 may be formed over the electrode 4901, an electrode 4902*a*, and an electrode 4902*b* as shown in FIG. 49. In other words, the reference connection pad is formed with the electrode 4901 and the conductive film 4903. The composite connection pad is formed with the electrode 4902*a* and the conductive film 4903. The composite connection pad is formed with the electrode 4902*b* and the conductive film 4903. As described above, the connection pad also includes an exposed conductive region when the connection terminal portion is seen from above.

In such a structure, the electrode 4901, the electrode 4902*a*, and the electrode 4902*b* are formed with a material of a transparent conductive film of a top emission display device, and the conductive film 4903 is formed with a material of an auxiliary wire. As an example of the transparent conductive film, ITO, TZO, CTO, or the like can be given.

Note that the structures of a connection pad and a wire connected to the connection pad, which can be applied to the invention, are not limited to those described above. In addition, the above-described structures can be used in combination.

Embodiment Mode 3

In this embodiment mode, a structure of a display device is explained. In particular, explanation is made in this embodiment mode, focusing on the connection structure between a composite connection pad and an opposite electrode.

Figure 13:
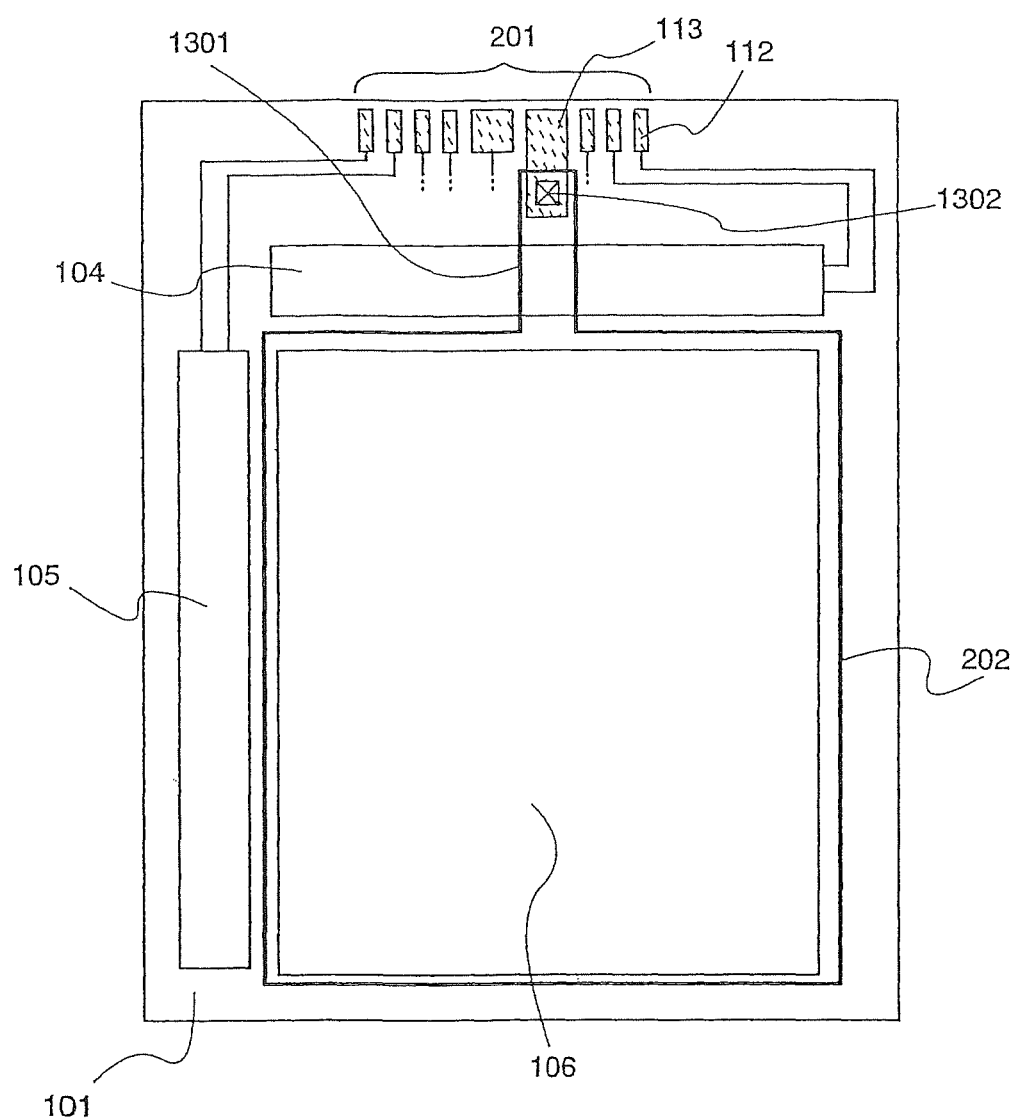
FIG. 13 is a schematic diagram of a display device of the present invention.
Figure 45:
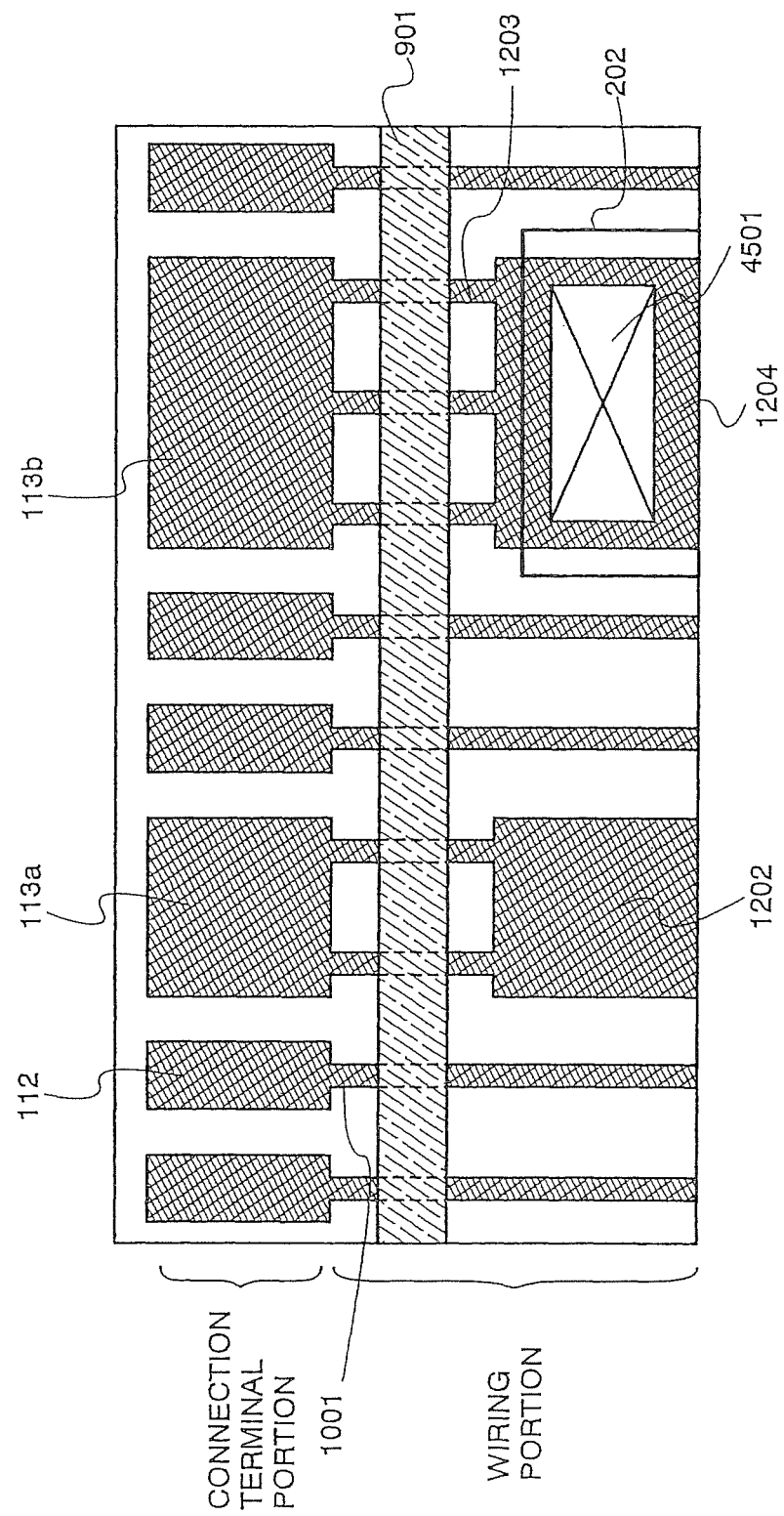
FIG. 45 is a diagram explaining a connection terminal portion.
Figure 46:
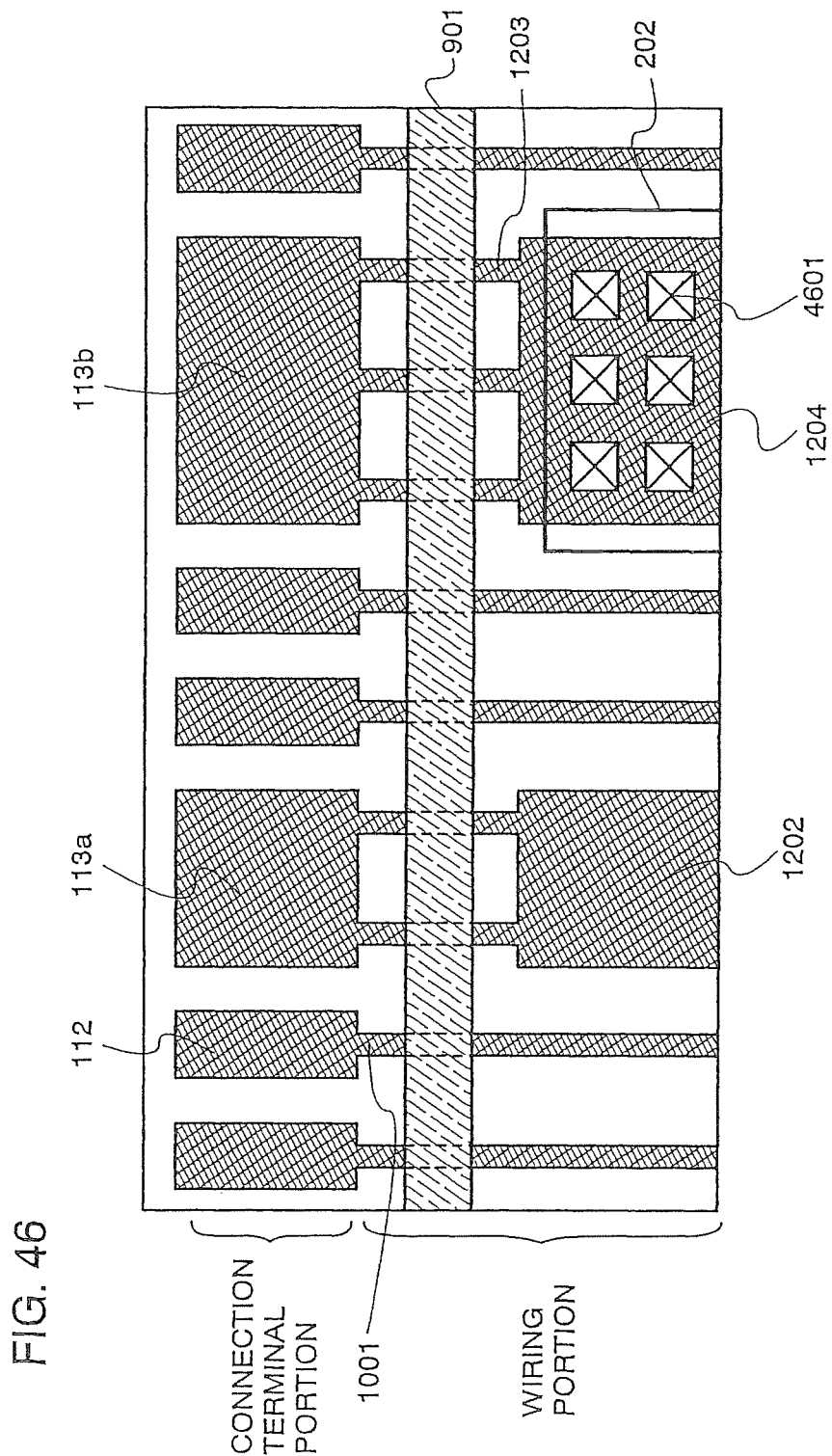
FIG. 46 is a diagram explaining a connection terminal portion.

First, a first structure of this embodiment mode is explained with reference to FIG. 13. Note that components in common with FIG. 2 are denoted by common reference numerals, and explanation thereof is omitted. In the first structure, a wide wire 1301 which is part of the opposite electrode 202 is formed across the signal line driver circuit 104, and is connected to a wire extending from the composite connection pad 113 through a contact hole 1302. In this case, the wide wire 1301 is preferably formed to be wider than the line width of the composite connection pad 113. Then, contact resistance can be decreased since the contact hole 1302 can be enlarged. In other words, as shown in FIG. 45, the wire 1204 extending from the composite connection pad 113*b* is connected to a wide wire 1301 which is part of the opposite electrode 202 through a contact hole 4501 within the pixel portion across the sealing region 901. In this case, the wire 1204 can be formed to have the same width as the line width of the composite connection pad 113*a*; therefore, the width of the contact hole 4501 can also be enlarged. In other words, the width of the contact hole 4501 can be made larger than the line width of the reference connection pad 112. Note that components in common with FIG. 12 are denoted by common reference numerals, and explanation thereof is omitted. Alternatively, the wire 1204 and the opposite electrode 202 may be connected to each other through not only one contact hole but a plurality of contact holes 4601 as shown in FIG. 46.

Figure 14:
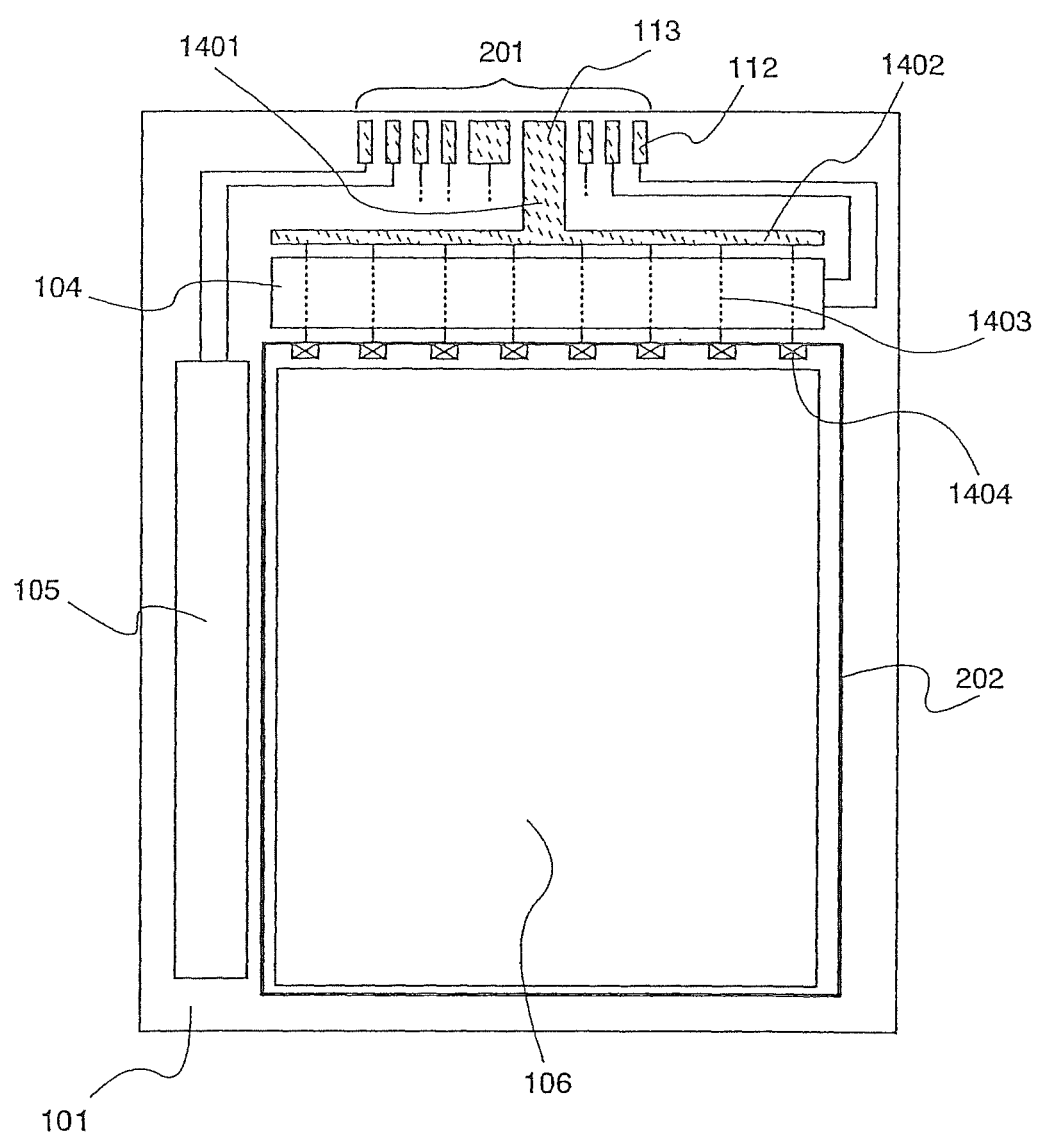
FIG. 14 is a schematic diagram of a display device of the present invention.

Subsequently, a second structure of this embodiment mode is explained with reference to FIG. 14. Note that components in common with FIG. 2 are denoted by common reference numerals, and explanation thereof is omitted. In the second structure, a wire 1401 extending from the composite connection pad 113 has approximately equal width to the composite connection pad 113 and further includes a wide wire 1402. The width of this wire 1402 is approximately equal to that of the signal line driver circuit 104. Then, a wire 1403 connected to the wire 1402 passes through the signal line driver circuit 104 and connected to the opposite electrode 202 through a contact hole 1404 by a multilayer wiring structure. Note that the contact hole 1404 is formed in a region between the pixel portion 106 and the signal line driver circuit 104. Thus, since the composite connection pad 113, and the wire 1401 and the wire 1402 having low wire resistance are formed with a continuous conductive film without a contact hole, resistance of line from the composite connection pad 113 to the opposite electrode 202 can be decreased.

Figure 15:
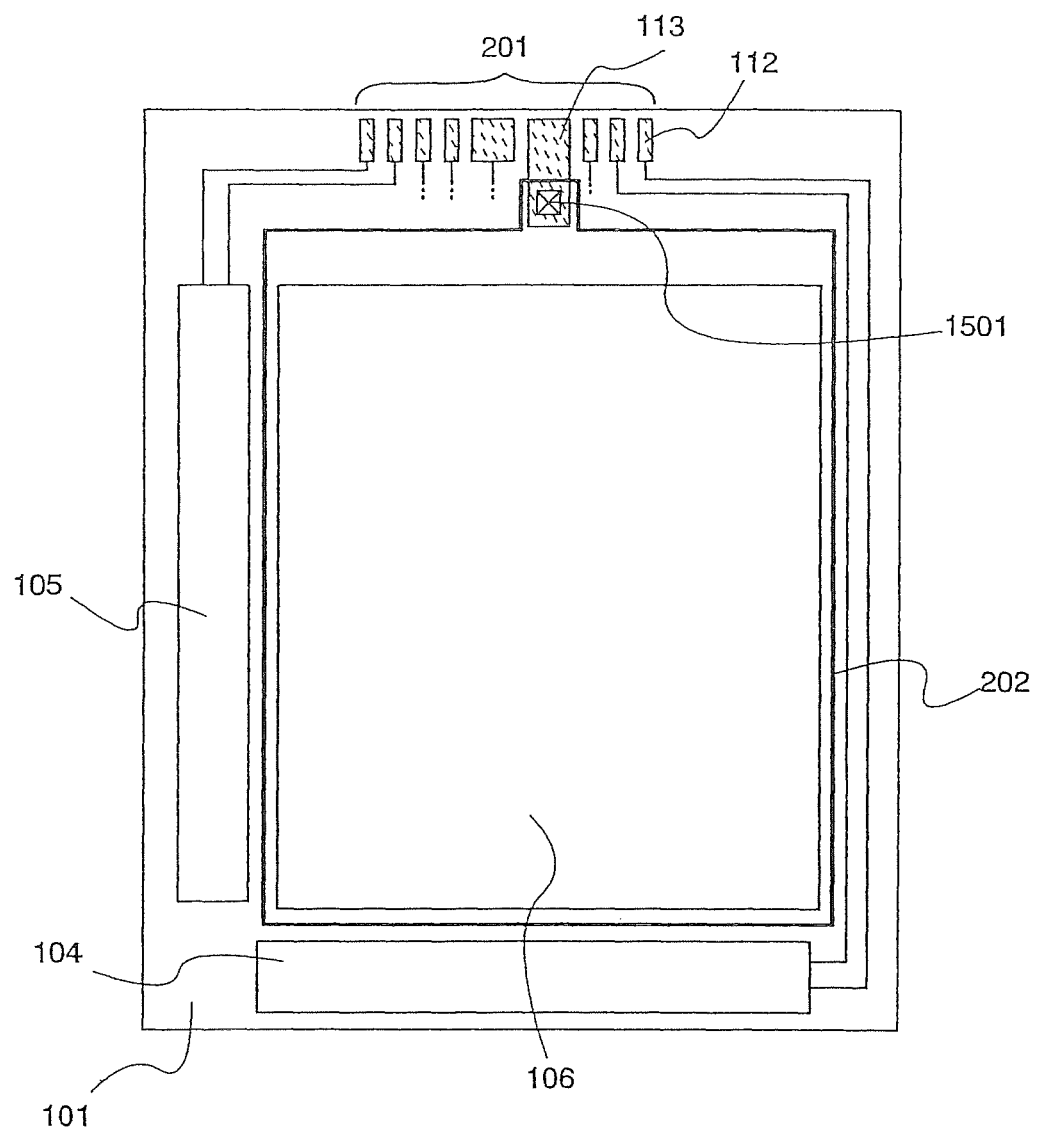
FIG. 15 is a schematic diagram of a display device of the present invention.

Subsequently, a third structure of this embodiment mode is explained with reference to FIG. 15. Note that components in common with FIG. 2 are denoted by common reference numerals, and explanation thereof is omitted. In the third structure, the signal line driver circuit 104 is formed on the side opposite to the connection terminal portion 201 with the pixel portion 106 therebetween. In such a structure, the opposite electrode 202 is connected to a wire extending from the composite connection pad 113 through a contact hole 1501 without extending across the signal line driver circuit 104. In addition, since the length of line from the composite connection pad 113 to the opposite electrode 202 is short, the resistance of this line can be decreased.

Figure 16:
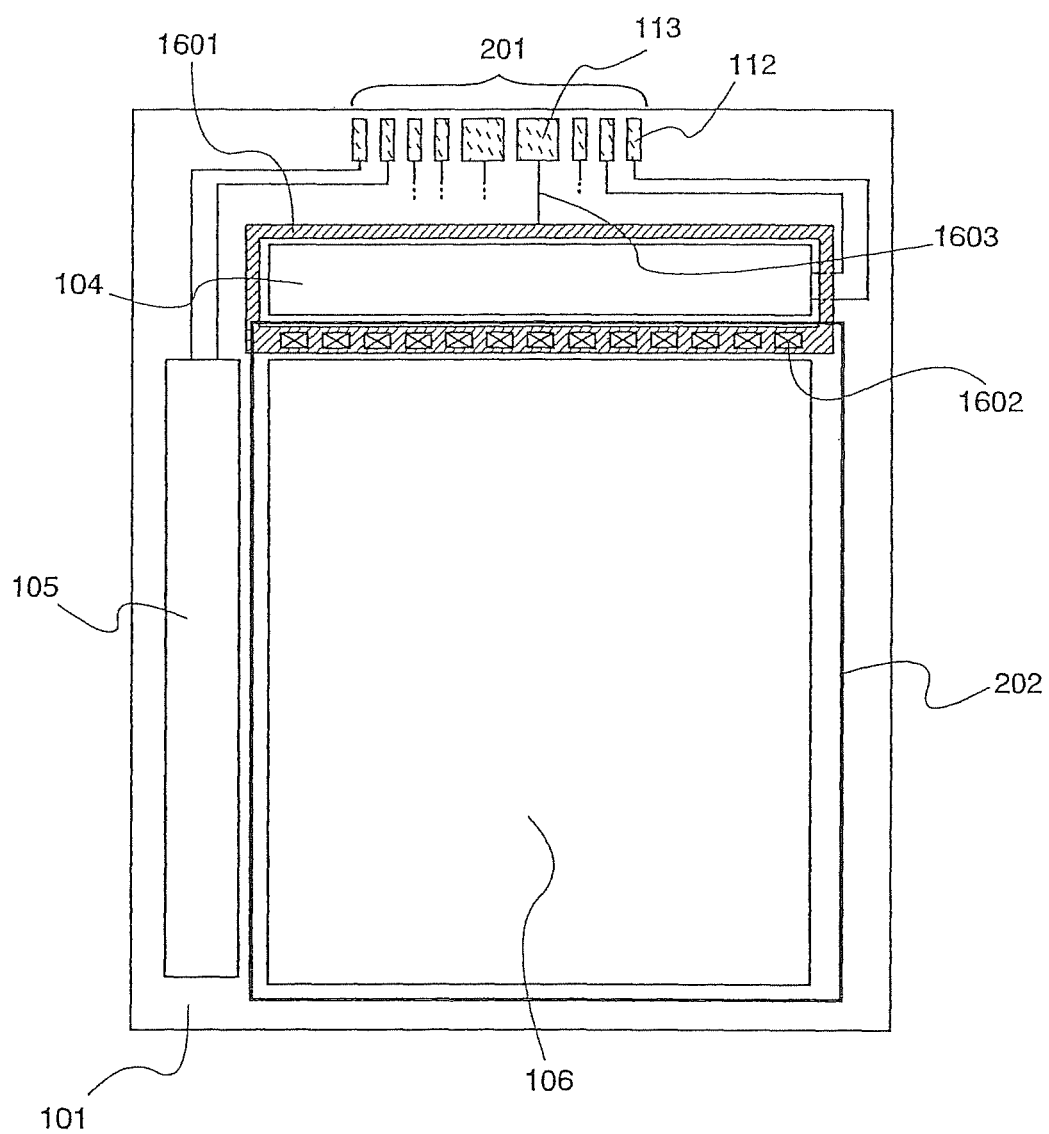
FIG. 16 is a schematic diagram of a display device of the present invention.

Subsequently, a fourth structure of this embodiment mode is explained with reference to FIG. 16. Note that components in common with FIG. 2 are denoted by common reference numerals, and explanation thereof is omitted. In the fourth structure, a wire 1603 connected to the composite connection pad 113 is connected to a wire 1601 arranged so as to surround the signal line driver circuit 104. The wire 1601 is wide at least in a region between the signal line driver circuit 104 and the pixel portion 106, where it is connected to the opposite electrode 202 through a contact hole 1602. Note that a further decrease in resistance can be achieved when the composite connection pad 113, the wire 1603, and the wire 1601 are formed with the same conductive film because a contact hole is not interposed.

Figure 17:
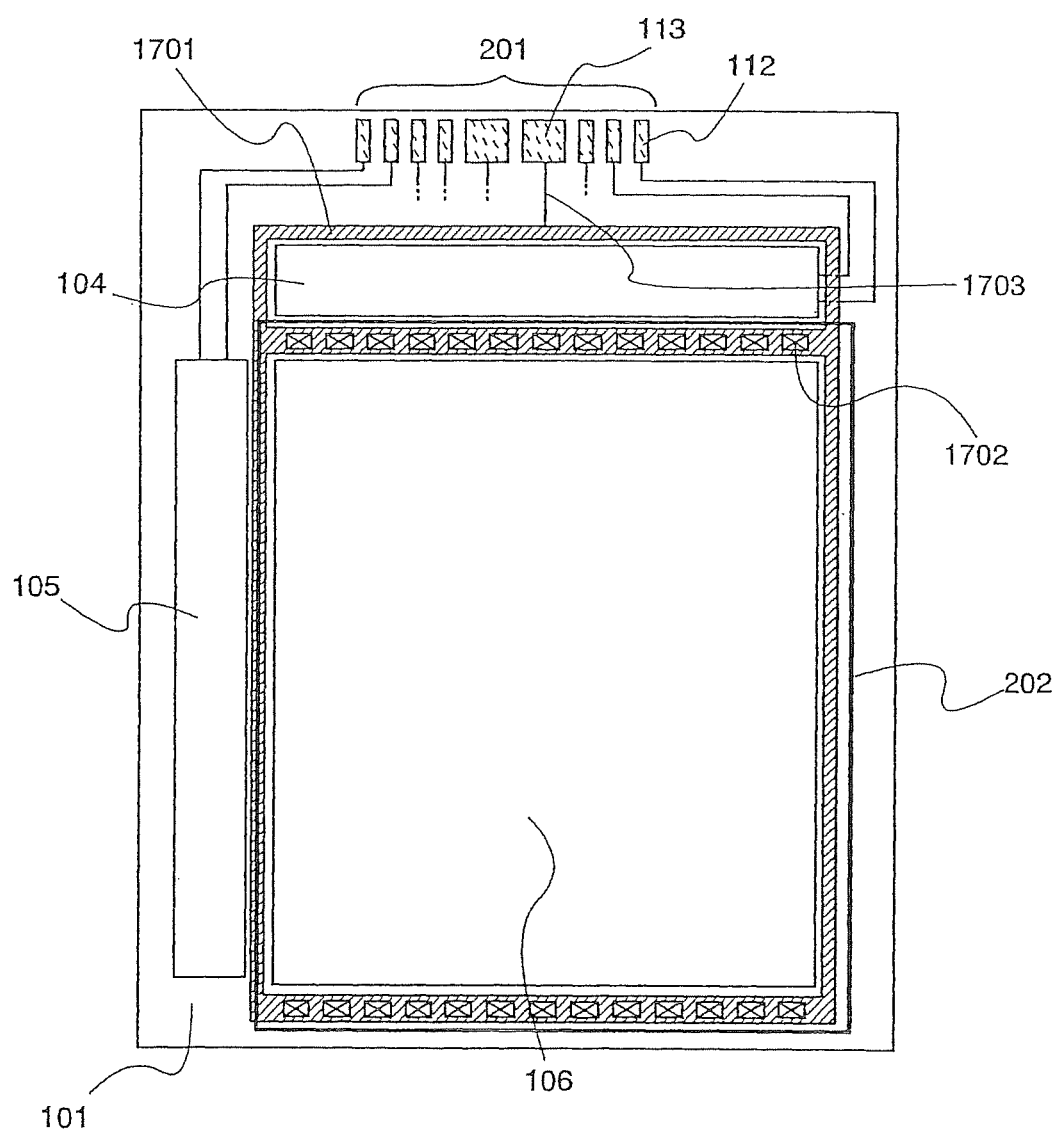
FIG. 17 is a schematic diagram of a display device of the present invention.
Figure 18:
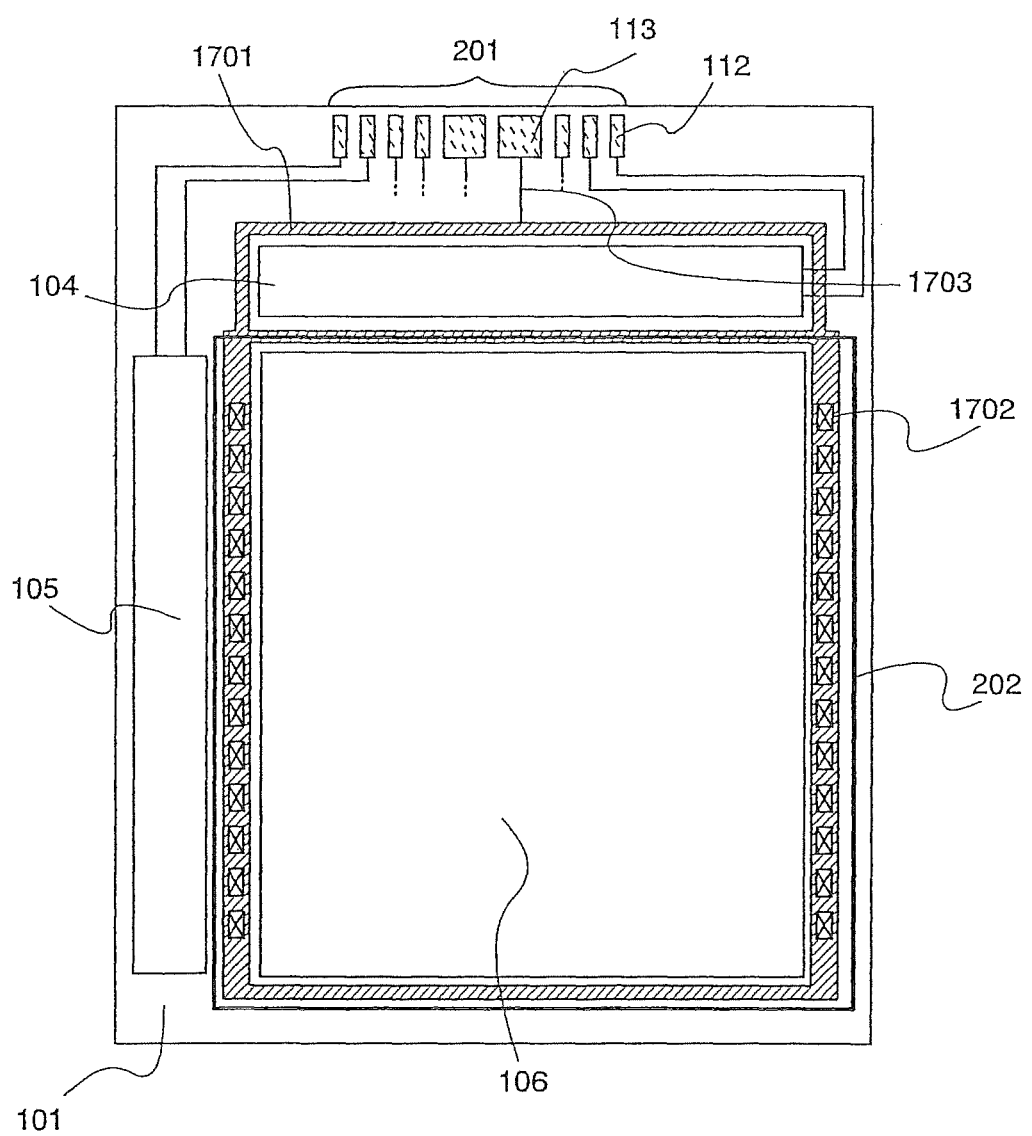
FIG. 18 is a schematic diagram of a display device of the present invention.

Subsequently, a fifth structure of this embodiment mode is explained with reference to FIG. 17. Note that components in common with FIG. 2 are denoted by common reference numerals, and explanation thereof is omitted. In the fifth structure, a wire 1703 connected to the composite connection pad 113 is connected to a wire 1701 arranged so as to surround the signal line driver circuit 104 and the pixel portion 106. The wire 1701 is wide at least in a region between the signal line driver circuit 104 and the pixel portion 106 and a region on the side opposite thereto with the pixel portion 106 therebetween, where it is connected to the opposite electrode 202 through a contact hole 1702. Note that a further decrease in resistance can be achieved when the composite connection pad 113, the wire 1703, and the wire 1701 are formed with the same conductive film because a contact hole is not interposed. According to this structure, the wire 1701 is led around the pixel portion 106. Therefore, by using a conductive film formed from a low-resistance material for the wire 1701, an in-plane potential of the opposite electrode 202 can be equalized. Note that the opposite electrode 202 and the wire 1701 may be connected to each other in another region. For example, as shown in FIG. 18, the wire 1701 is wide at least in a region between the scan line driver circuit 105 and the pixel portion 106 and a region on the side opposite thereto with the pixel portion 106 therebetween, where it may be connected to the opposite electrode 202 through the contact hole 1702.

Figure 19:
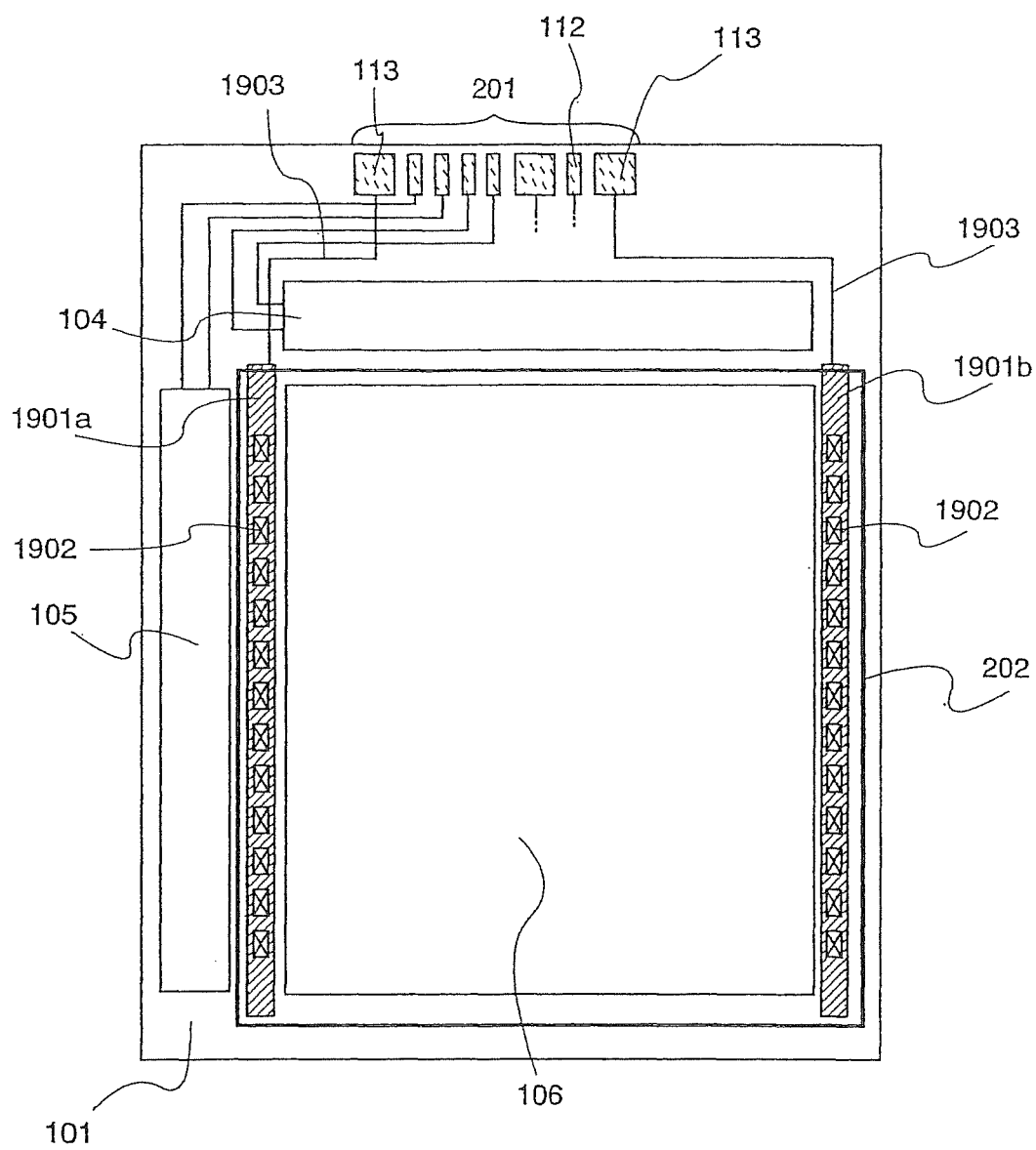
FIG. 19 is a schematic diagram of a display device of the present invention.

Subsequently, a sixth structure of this embodiment mode is explained with reference to FIG. 19. Note that components in common with FIG. 2 are denoted by common reference numerals, and explanation thereof is omitted. In the sixth structure, the composite connection pads 113 are arranged on both ends of the connection terminal portion 201. In addition, a wide wire 1901a is formed between the scan line driver circuit 105 and the pixel portion 106. In addition, a wide wire 1901b is formed on the side opposite to the wire 1901a with the pixel portion 106 therebetween.

Then, a wire 1903 connected to one of the composite connection pads 113 formed on both ends is connected to the wire 1901a. In addition, a wire 1903 connected to the other of the composite connection pads 113 formed on both ends is connected to the wire 1901b.

Figure 20:
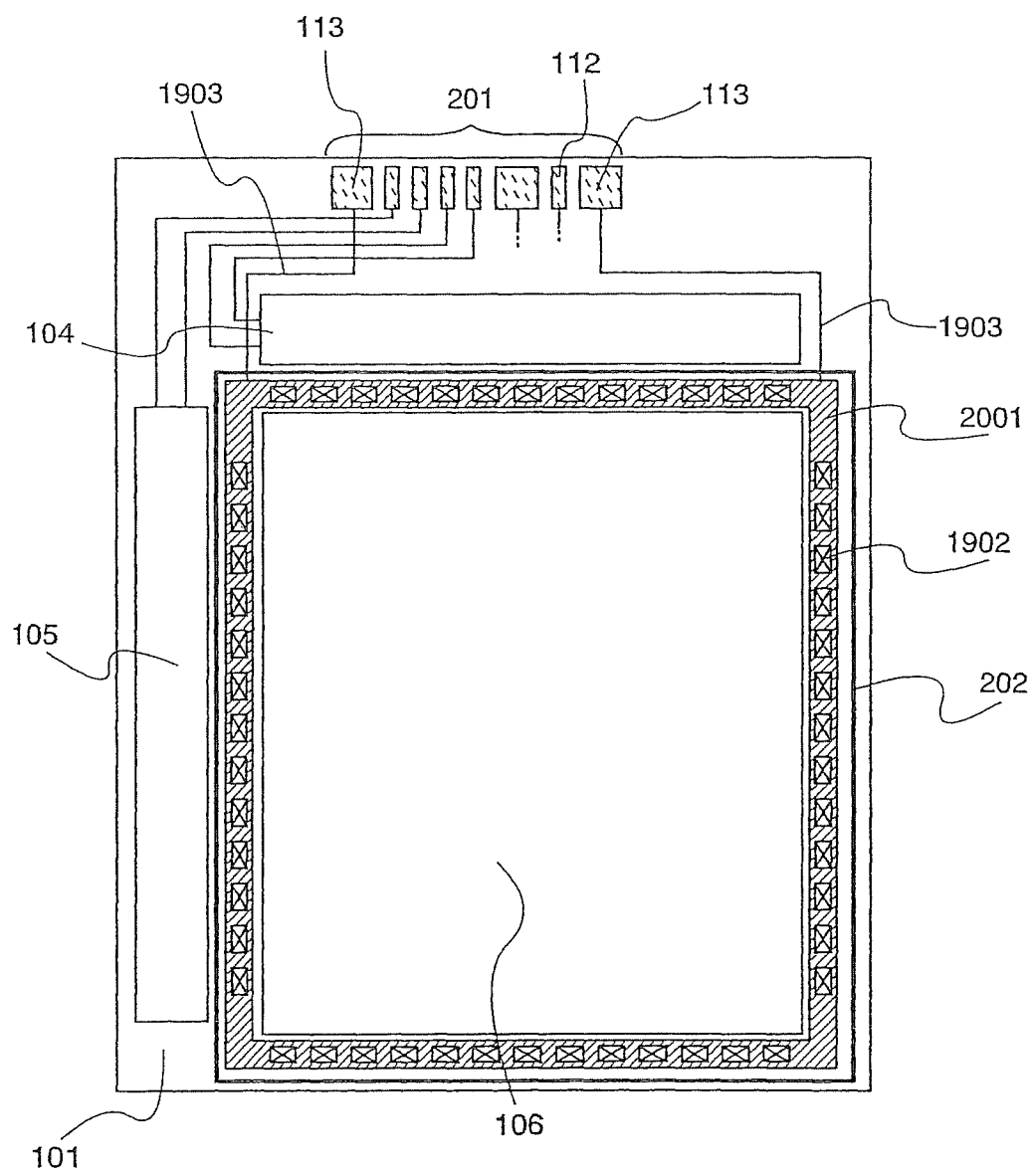
FIG. 20 is a schematic diagram of a display device of the present invention.

Then, the wire 1901a and the wire 1901b are connected to the opposite electrode 202 through a contact hole 1902. Note that the wire 1901a and the wire 1901b are preferably formed with a low-resistance conductive film. Then, an influence of voltage drop can be reduced, and an in-plane potential of the opposite electrode 202 can be equalized. In addition, either the wire 1901a or the wire 1901b may be provided; however, by arranging the wires on both sides of the pixel portion 106 as shown in FIG. 19, the influence of voltage drop can further be reduced. In addition, the invention is not limited to the case of providing wires on both sides like the wire 1901a and the wire 1901b, the wire may be arranged so as to surround the pixel portion 106. In this case, in a wire 2001 surrounding the pixel portion 106, at least one contact hole 1902 is provided in each of a region between the pixel portion 106 and the signal line driver circuit 104, a region on the side opposite to the signal line driver circuit 104 with the pixel portion 106 therebetween, a region between the scan line driver circuit 105 and the pixel portion 106, and a region on the side opposite to the scan line driver circuit 105 with the pixel portion 106 therebetween as shown in FIG. 20. Then, the wire 2001 and the opposite electrode 202 are connected to each other through the contact hole 1902.

Note that the structure of a display device to which the invention can be applied is not limited to those described above.

Embodiment Mode 4

In this embodiment mode, a structure of a display device is explained. In particular, explanation is made in this embodiment mode, focusing on a structure of connection between a composite connection pad and a pixel electrode.

Figure 21:
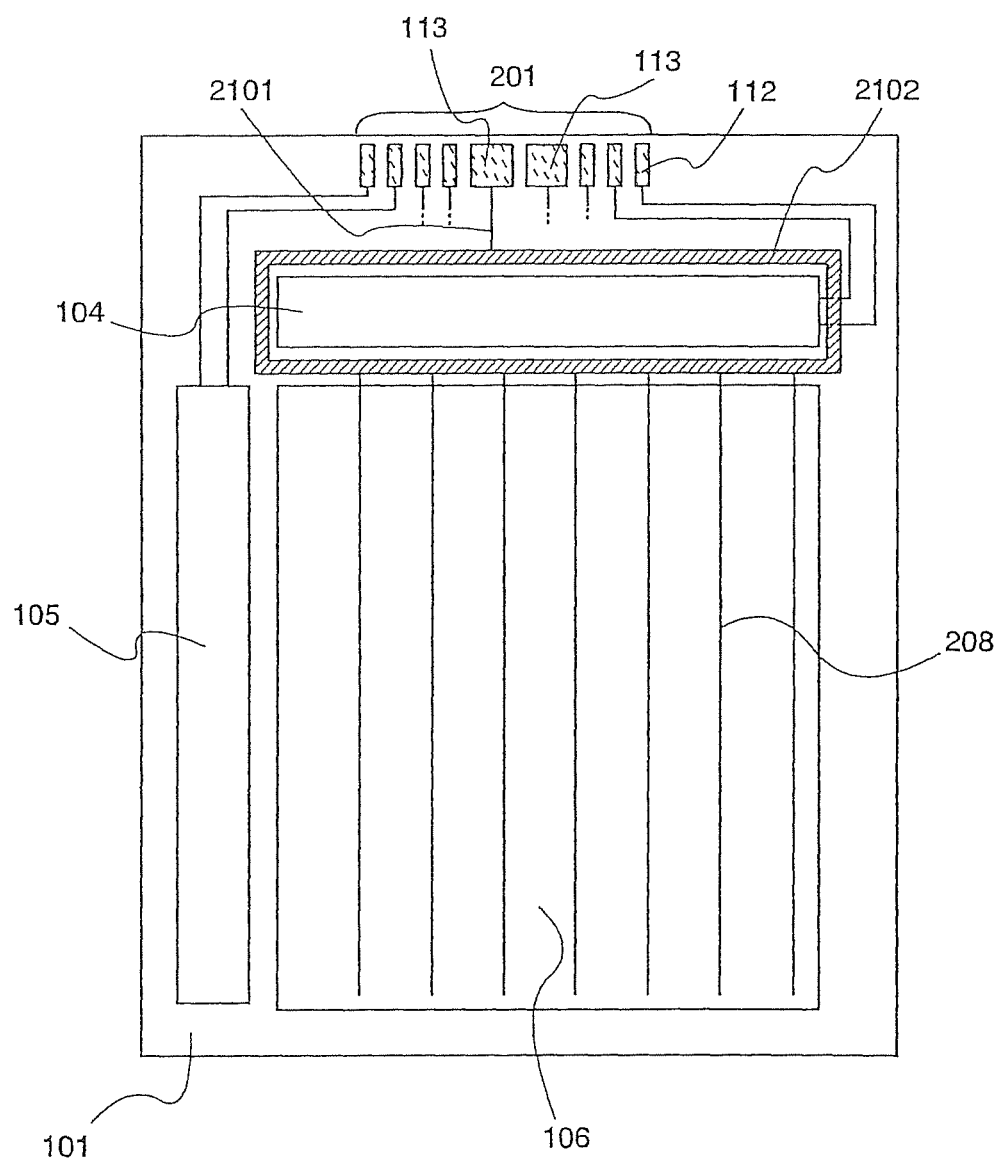
FIG. 21 is a schematic diagram of a display device of the present invention.
Figure 22:
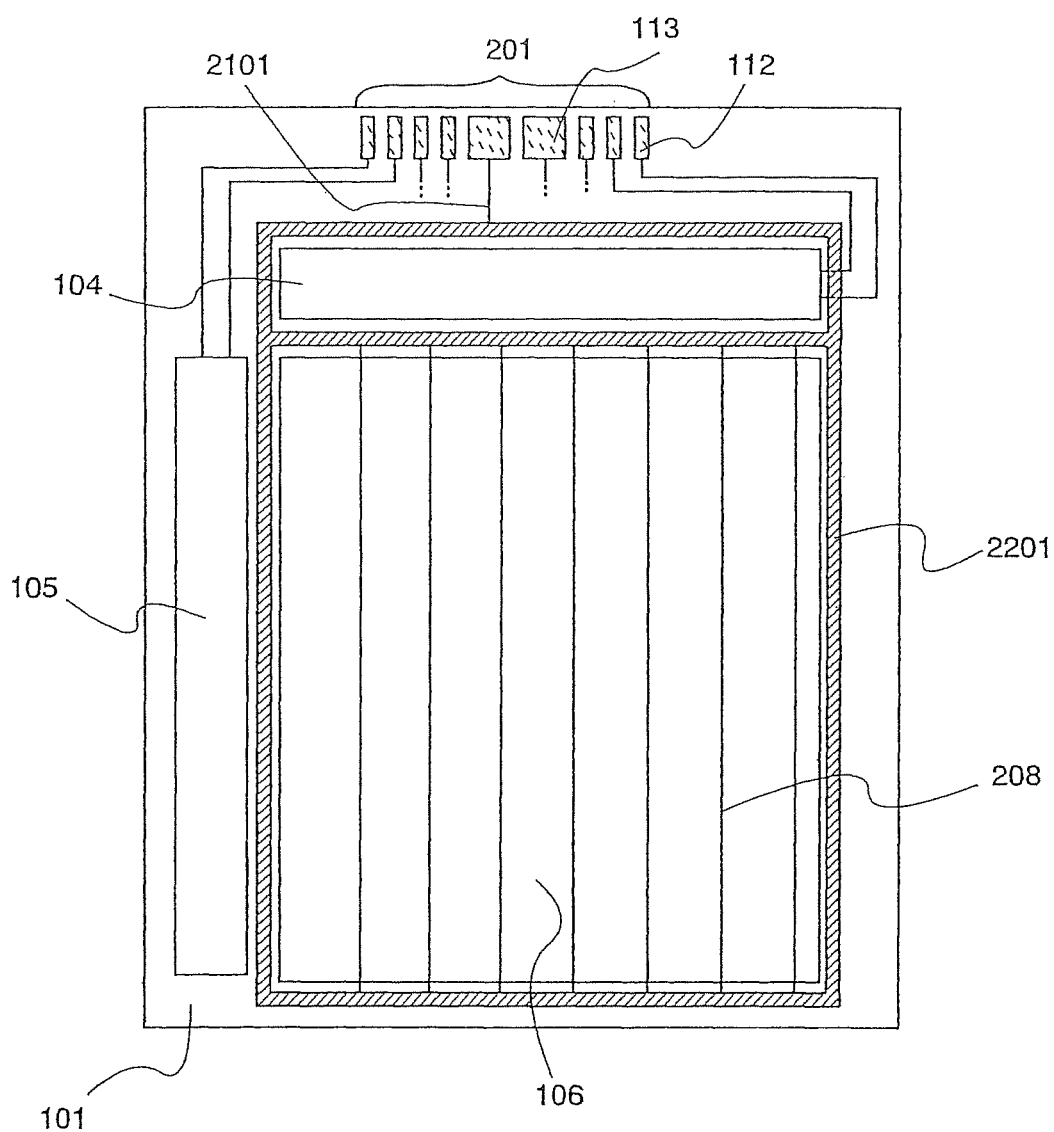
FIG. 22 is a schematic diagram of a display device of the present invention.

First, a first structure of this embodiment mode is explained with reference to FIG. 21. Note that components in common with FIG. 2 are denoted by common reference numerals, and explanation thereof is omitted. In the first structure, a wire 2102 is formed to surround the signal line driver circuit 104. Then, a wire 2101 connected to the composite connection pad 113 is further connected to the wire 2102. As for the wire 2102, a power supply line 208 extending to the pixel portion 106 is formed. With such a structure, an influence of voltage drop can be reduced, and a potential of each power supply line 208 can be equalized. Furthermore, by using a low-resistance conductive film for the wire 2102, the influence of voltage drop can further be reduced. In addition, in order to suppress variations in power supply potential supplied to each pixel in each row of the pixel portion 106, the wire 2102 may be led around the pixel portion 106. That case is as shown by a wire 2201 in FIG. 22. In this case, the wire 2201 and the power supply line 208 are connected to each other in a region between the pixel portion 106 and the signal line driver circuit 104, and the wire 2201 and the power supply line 208 are also connected on the side opposite to the signal line driver circuit 104 with the pixel portion 106 therebetween. Note that the wire 2201 is made wider than the line width of the power supply line 208. Alternatively, a material used for the wire 2201 is made to have lower resistance than that of a material used for the power supply line 208. Alternatively, these are combined. Accordingly, the influence of voltage drop can further be reduced.

Figure 23:
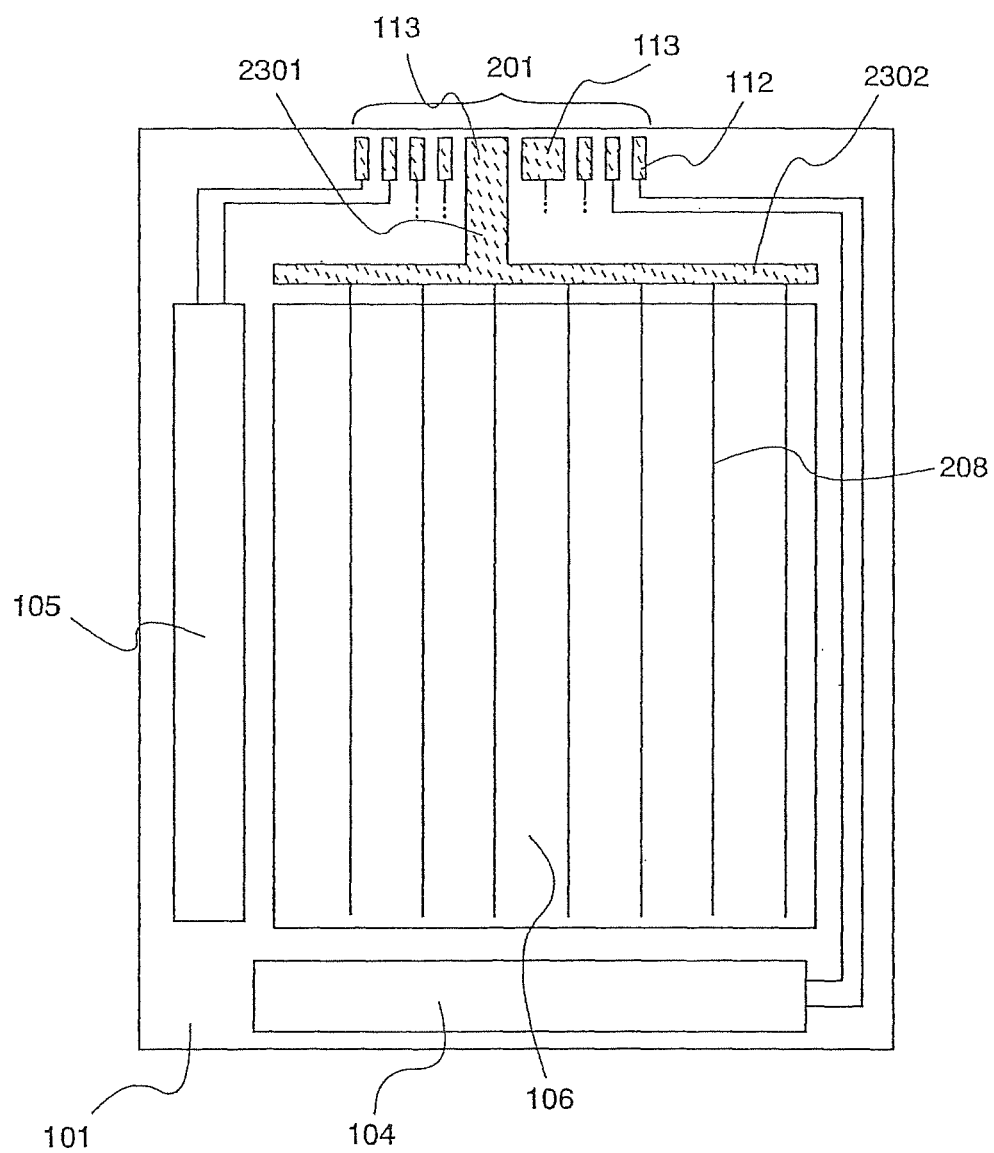
FIG. 23 is a schematic diagram of a display device of the present invention.

Subsequently, a second structure of this embodiment mode is explained with reference to FIG. 23. Note that components in common with FIG. 2 are denoted by common reference numerals, and explanation thereof is omitted. In the second structure, the signal line driver circuit 104 is formed on the side opposite to the connection terminal portion 201 with the pixel portion 106 therebetween. In addition, from the composite connection pad 113 to a wide wire 2301 and a wide wire 2302 are formed with one continuous conductive film. Furthermore, the line width of the wide wire 2301 is approximately equal to that of the composite connection pad 113, and the line width of the wide wire 2302 is approximately equal to the width of the pixel portion 106 in a row direction. Then, the power supply line 208 connected to the wide wire 2302 is formed to extend to the pixel portion 106. According to this structure, from the connection pad 113 to the power supply line 208 can be formed with one continuous wire without a contact hole; therefore, resistance can be decreased. Consequently, the influence of voltage drop can further be reduced.

Embodiment Mode 5

In this embodiment mode, a structure of a display device is explained. In particular, explanation is made in this embodiment mode, focusing on a structure of connection between a composite connection pad, and the pixel electrode and the opposite electrode.

Figure 24:
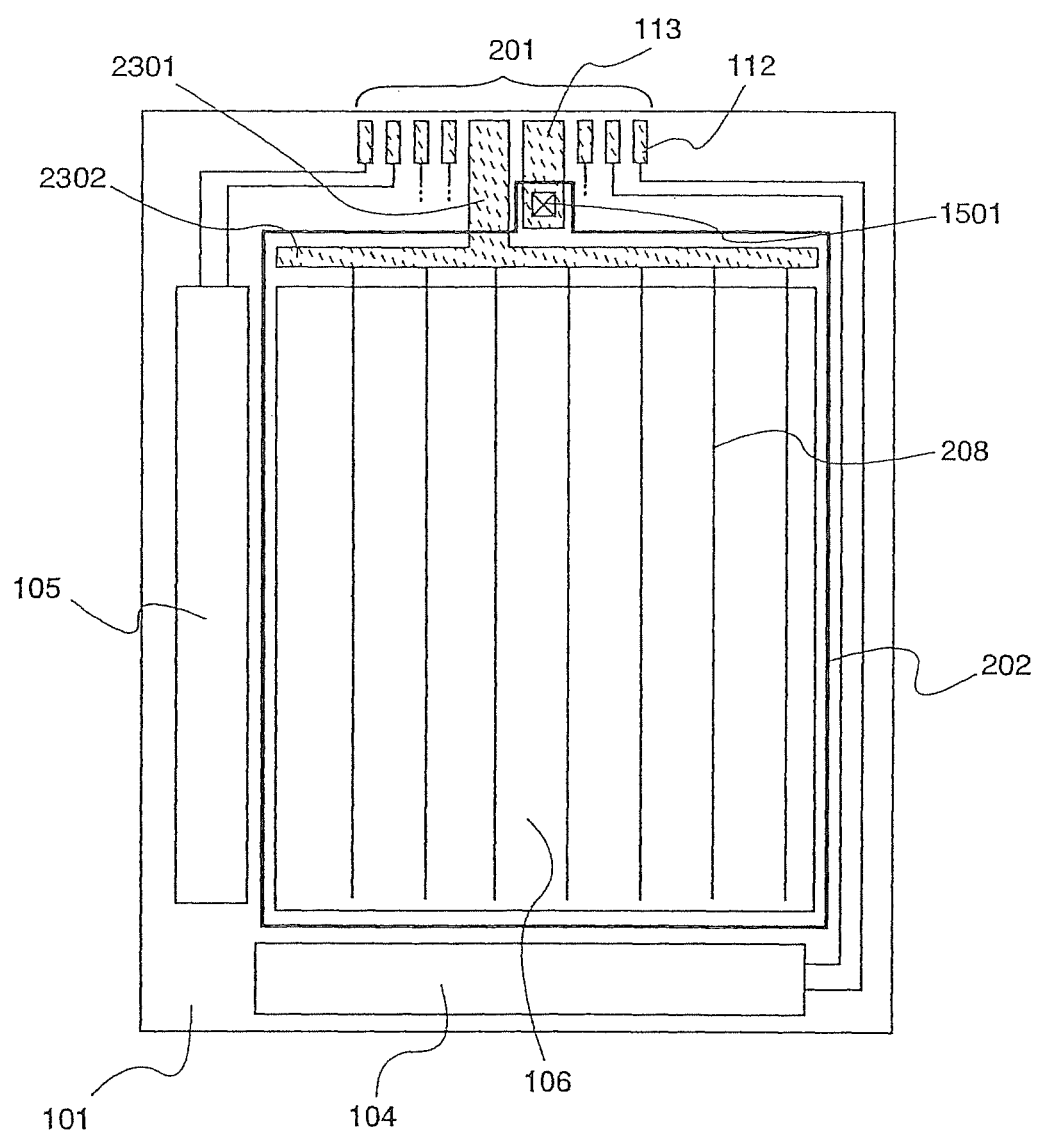
FIG. 24 is a schematic diagram of a display device of the present invention.

First, a first structure of this embodiment mode is explained with reference to FIG. 24. Note that components in common with FIG. 2 are denoted by common reference numerals, and explanation thereof is omitted. In the first structure, the signal line driver circuit 104 is formed on the side opposite to the connection terminal portion 201 with the pixel portion 106 therebetween. With such a structure, the opposite electrode 202 is connected to a wire extending from the composite connection pad 113 through a contact hole 1501 without extending across the signal line driver circuit 104. In addition, from the composite connection pad 113 to a wide wire 2301 and a wide wire 2302 are formed using one continuous conductive film. Then, the line width of the wide wire 2301 is approximately equal to that of the composite connection pad 113, and the line width of the wide wire 2302 is approximately equal to the width of the pixel portion 106 in a row direction. Then, the power supply line 208 connected to the wide wire 2302 is formed to extend to the pixel portion 106. According to this structure, from the composite connection pad 113 to the power supply line 208 can be formed with one continuous wire without a contact hole; therefore, resistance can be decreased.

Figure 25:
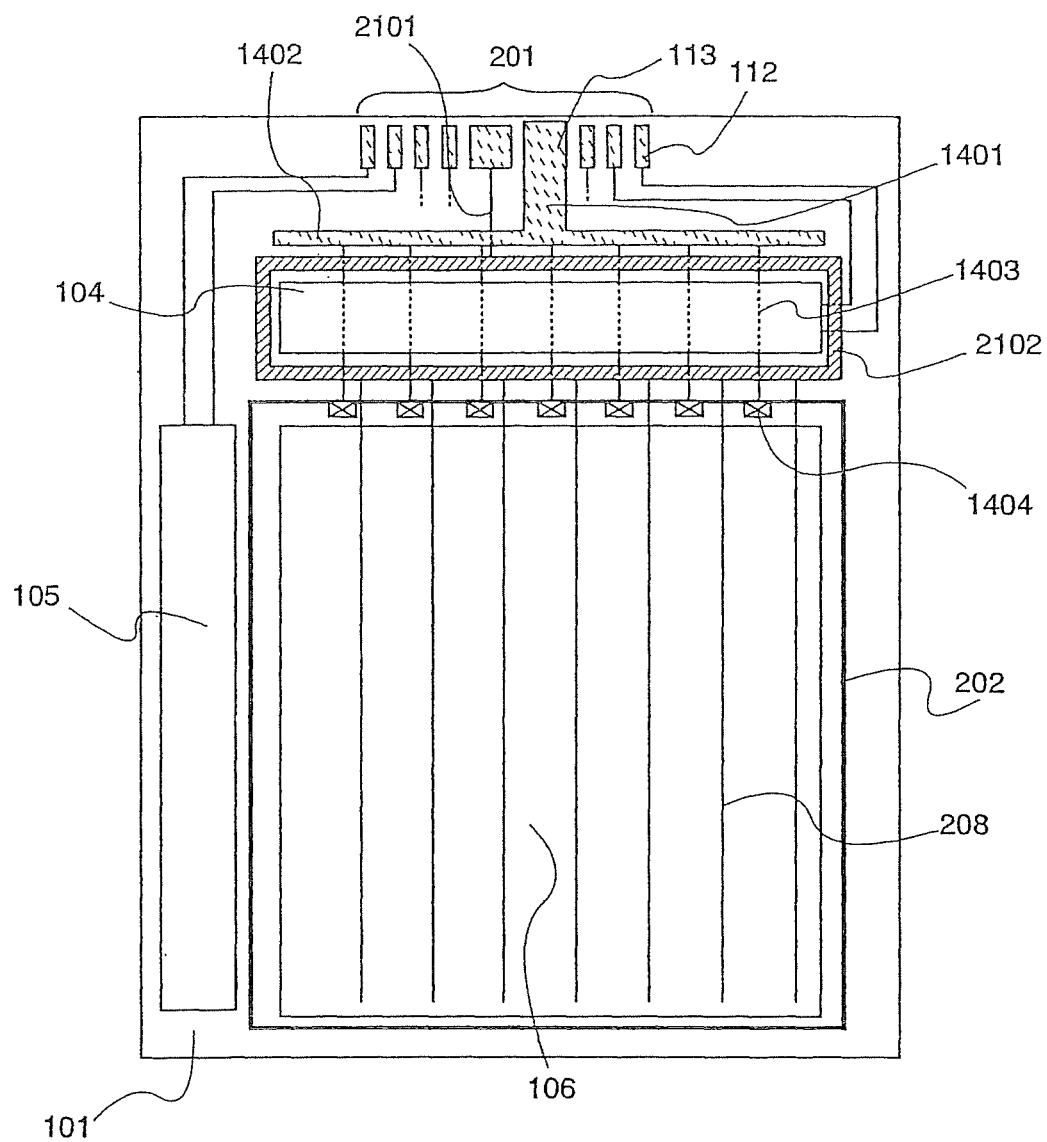
FIG. 25 is a schematic diagram of a display device of the present invention.

Subsequently, a second structure of this embodiment mode is explained with reference to FIG. 25. Note that components in common with FIG. 2 are denoted by common reference numerals, and explanation thereof is omitted. The second structure includes at least two composite connection pads 113. Then, from one of the composite connection pads 113 to a wide wire 1401 and a wide wire 1402 are formed with one continuous conductive film. Then, the line width of the wide wire 1401 is approximately equal to that of the composite connection pad 113, and the line width of the wide wire 1402 is approximately equal to the width of the pixel portion 106 in a row direction. In addition, a wire 2101 connected to the other composite connection pad 113 is connected to a wire 2102 formed to surround the signal line driver circuit 104. Then, the wide wire 1402 is connected to the opposite electrode 202 through a contact hole 1404 by a wire 1403 having a multilayer structure. This contact hole 1404 is formed between the signal line driver circuit 104 and the pixel portion 106. In addition, the power supply line 208 is formed from the wire 2102 to the pixel portion 106.

Figure 26:
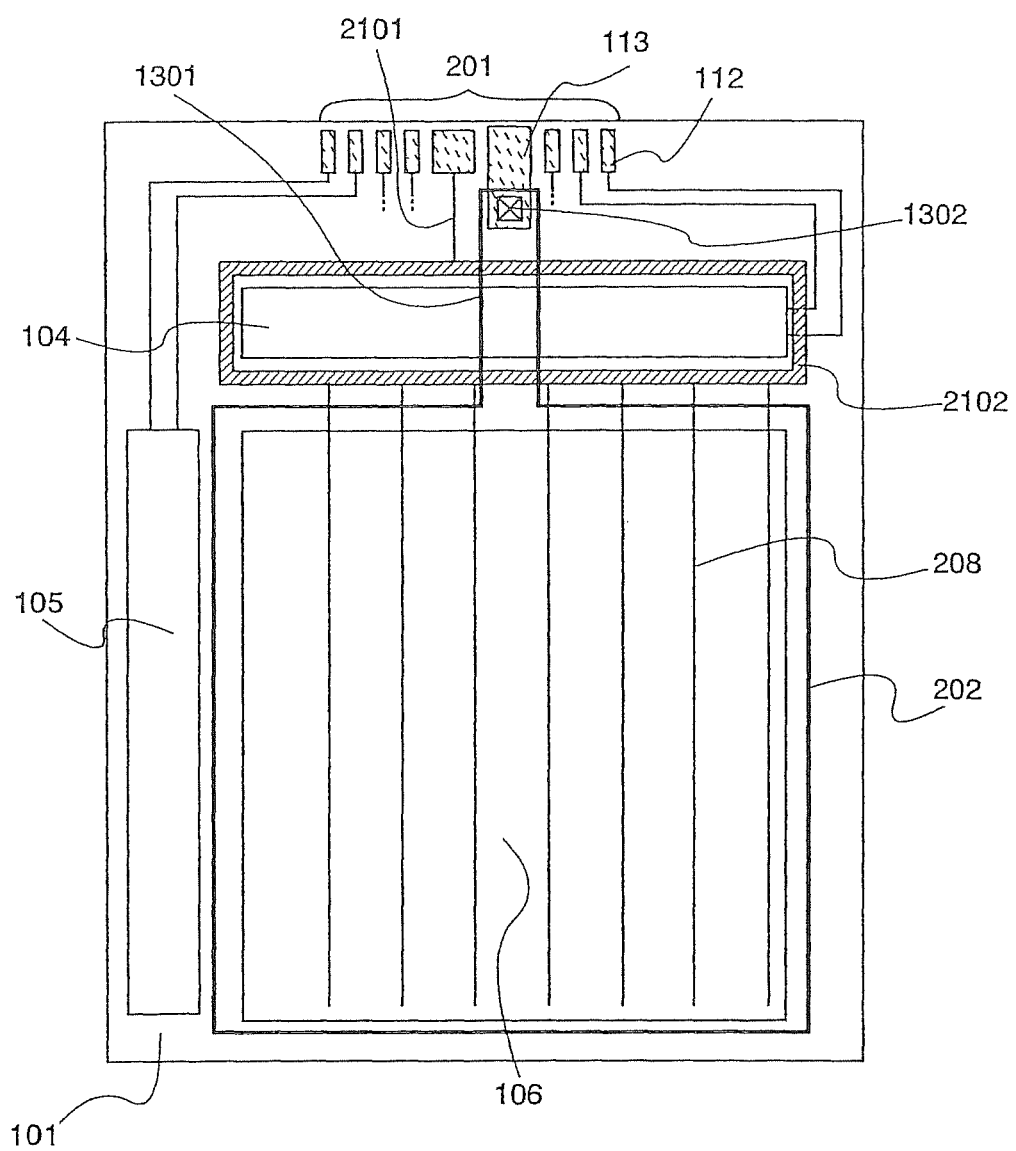
FIG. 26 is a schematic diagram of a display device of the present invention.

Subsequently, a third structure of this embodiment mode is explained with reference to FIG. 26. Note that components in common with FIG. 2 are denoted by common reference numerals, and explanation thereof is omitted. The third structure includes at least two composite connection pads 113. A wide wire 1301 which is part of the opposite electrode 202 is formed across the signal line driver circuit 104, and is connected to a wire extending from one of the composite connection pads 113 through a contact hole 1302. In this case, the wide wire 1301 is preferably formed to be wider than the line width of the composite connection pad 113. Then, contact resistance can be decreased since the contact hole 1302 can be enlarged. In addition, a wire 2101 connected to the other composite connection pad 113 is connected to a wire 2102 formed to surround the signal line driver circuit 104. In addition, the power supply line 208 is formed from the wire 2102 to the pixel portion 106.

Embodiment Mode 6

In this embodiment mode, a cross-sectional structure of a connection terminal is explained in more detail. Note that in this embodiment mode, a cross-sectional structure of a pixel portion and a connection terminal portion of a display device having an EL element in a pixel is described; however, a display device to which the present invention can be applied is not limited thereto.

In the display device to which the present invention can be applied, a semiconductor layer of a thin film transistor (also referred to as a TFT) incorporated in a display panel may be a crystalline semiconductor film or an amorphous semiconductor film. As the crystalline semiconductor film, a polysilicon (p-Si) film, for example, can be used. As the amorphous semiconductor film, an amorphous silicon (a-Si: H) film can be used. Furthermore, a so-called microcrystalline silicon film may be used. In addition, the thin film transistor can have a structure such as a top gate structure in which a gate electrode is provided over a semiconductor layer or a bottom gate structure in which a gate electrode is provided below a semiconductor layer.

First, in the case of employing a crystalline semiconductor film as the semiconductor layer, cross sections of a connection terminal portion and a pixel portion of a display panel having a top-gate transistor are shown in FIGS. 52A and 52B.

A base film 5202 is formed over a substrate 5201. An insulating substrate, a metal substrate, a semiconductor substrate, or the like such as a glass substrate, a quartz substrate, a plastic substrate, or a ceramics substrate can be used as the substrate 5201.

The base film 5202 can be formed by a CVD method or a sputtering method. For example, a silicon oxide film, a silicon nitride film, a silicon oxynitride film, or the like which is formed by a CVD method using $SiH_4$, $N_2O$, $NH_3$, or the like as a source material can be employed. Alternatively, a laminate thereof may be used. Note that the base film 5202 is provided to prevent an impurity from diffusing into the semiconductor layer from the substrate 5201, and the base film 5202 is not necessarily provided in the case of using a glass substrate or a quartz substrate as the substrate 5201.

An island-shaped semiconductor layer is formed over the base film 5202. In the semiconductor layer, a channel formation region 5203 where a channel is formed and an impurity region 5204 serving as a source region or a drain region are formed. Then, a gate electrode 5206 is formed over the channel formation region 5203 with a gate insulating film 5205 therebetween.

The gate insulating film 5205 can be formed using a silicon oxide film, a silicon nitride film, a silicon oxynitride film, or the like by a CVD method or a sputtering method. In addition, the gate electrode 5206 can be formed using an aluminum (Al) film, a copper (Cu) film, a thin film containing aluminum or copper as its main component, a chromium (Cr) film, a tantalum (Ta) film, a tantalum nitride (TaN) film, a titanium (Ti) film, a tungsten (W) film, a molybdenum (Mo) film, or the like.

Note that a sidewall may be formed on the side of the gate electrode 5206. The sidewall can be formed by forming a silicon compound such as a silicon oxide film, a silicon nitride film, or a silicon oxynitride film to cover the gate electrode 5206, and then etching back it.

A first interlayer insulating film 5207 is formed over the gate electrode 5206 and the gate insulating film 5205. The first interlayer insulating film 5207 may include an inorganic insulating film as a lower layer and a resin film as an upper layer. As the inorganic insulating film, a silicon nitride film, a silicon oxide film, a silicon oxynitride film, or a laminated film thereof can be used. As the resin film, polyimide, polyamide, acrylic, polyimide amide, epoxy, or the like can be used.

In addition, a wire 5208 is formed over the first interlayer insulating film 5207, and the wire 5208 is electrically connected to the impurity region 5204 through a contact hole. As the wire 5208, a titanium (Ti) film, an aluminum (Al) film, a copper (Cu) film, an aluminum film containing Ti, or the like can be used. Preferably, the wire 5208 has a three-layer structure, and has a structure including a titanium (Ti) film as a lower layer, an aluminum (Al) film thereover, and a titanium (Ti) film further thereover. With this structure, wire resistance, and contact resistance with the impurity region 5204 can be decreased.

A second interlayer insulating film 5209 is formed over the wire 5208 and the first interlayer insulating film 5207. As the second interlayer insulating film 5209, an inorganic insulating film, a resin film, or a laminated layer thereof can be used. As the inorganic insulating film, a silicon nitride film, a silicon oxide film, or a silicon oxynitride film, or a laminated layer thereof can be used. As the resin film, polyimide, polyamide, acrylic, polyimide amide, epoxy, or the like can be used. Note that the resin film is preferably used for planarization.

A pixel electrode 5210 is formed over the second interlayer insulating film 5209. A material having a high work function is preferably used for the pixel electrode 5210. Then, a transparent conductive film is used for the pixel electrode 5210 in the case of employing bottom emission in which light is extracted from the substrate 5201 side. Alternatively, a laminate of a transparent conductive film and such a thin metal film as to transmit light can be used. In addition, a light-reflecting metal film is preferably used for the pixel electrode 5210 in the case of employing top emission in which light is extracted from the side opposite to the substrate 5201.

For example, as a material of the transparent conductive film, indium tin oxide (ITO) in which tin oxide is added to indium oxide, indium zinc oxide (IZO), cadmium tin oxide (CTO), zinc oxide (ZnO), tin oxide (TO), or the like can be used. By using ITO, a low-resistance pixel electrode 5210 can be formed. In addition, by using IZO, a uniform film can be formed and minute processing can be performed.

For example, the light-reflecting metal film can be formed using a single-layer film such as a titanium nitride (TiN) film, a chromium (Cr) film, a tungsten (W) film, a zinc (Zn) film, or a platinum (Pt) film; a laminated layer of a titanium nitride film and a film containing aluminum as its main component; a three-layer structure of a titanium nitride film, a film containing aluminum as its main component, and a titanium nitride film; or the like. When the pixel electrode 5210 has a laminated structure, it can have low resistance as a wire and form a favorable ohmic contact. Further, the pixel electrode can function as an anode. By using the light-reflecting metal film, an anode which does not transmit light can be formed.

An insulator 5211 is formed to cover end portions of the pixel electrode 5210. For example, a positive type photosensitive acrylic resin film can be used as the insulator 5211.

A layer 5212 containing an organic compound is formed over the pixel electrode 5210. Further, an opposite electrode 5213 is formed over the layer 5212 containing an organic compound.

For the opposite electrode 5213, a material having a low work function is preferably used. For example, a metal thin film of aluminum (Al), silver (Ag), lithium (Li), calcium (Ca), an alloy thereof such as MgAg, MgIn, AlLi, CaF$_2$, or Ca$_3$N$_2$, or the like can be used.

In the case of employing bottom emission, the opposite electrode 5213 is formed using a metal thin film of aluminum (Al), silver (Ag), lithium (Li), calcium (Ca), an alloy thereof such as MgAg, MgIn, AlLi, CaF$_2$, or Ca$_3$N$_2$, or the like to have such a thickness as to reflect light. In addition, in the case of employing top emission, the opposite electrode may be formed using the above metal thin film to have such a thickness as to transmit light, or using a combination of the above metal thin film having such a thickness as to transmit light and a transparent conductive film. Thus, the opposite electrode 5213 which can transmit light can be formed.

A light emitting element 5215 is formed in a region where the layer 5212 containing an organic compound is sandwiched between the opposite electrode 5213 and the pixel electrode 5210.

In addition, a transistor 5214 having the gate electrode 5206, the impurity region 5204 serving as a source region or a drain region, and the channel formation region 5203 is formed.

Subsequently, a structure of a connection terminal portion is explained. Note that a cross-sectional view of a connection terminal portion shown in FIG. 52A shows a cross section of a connection terminal in a line width direction.

Also in the connection terminal portion, the base film 5202 is formed over the substrate 5201, and the gate insulating film 5205 is formed thereover. However, the base film 5202 and the gate insulating film 5205 are not necessarily formed in the connection terminal portion.

Furthermore, a first electrode 5221, a first electrode 5223, and a first electrode 5225 are formed over the gate insulating film 5205, and a second electrode 5222, a second electrode 5224, and a second electrode 5226 are formed over the first electrode 5221, the first electrode 5223, and the first electrode 5225, respectively.

Then, the first electrode 5221, the first electrode 5223, and the first electrode 5225, and the second electrode 5222, the second electrode 5224, and the second electrode 5226 are electrically insulated by partitions formed from the first interlayer insulating film 5207 and the second interlayer insulating film 5209.

Note that the first electrode 5221, the first electrode 5223, and the first electrode 5225 are formed from the same material as the gate electrode 5206. In addition, the second electrode 5222, the second electrode 5224, and the second electrode 5226 are formed from the same material as the wire 5208. Preferably, each of the second electrode 5222, the second electrode 5224, and the second electrode 5226 has a three-layer structure, which may include an aluminum film over a titanium film, and a titanium film thereover.

A reference connection terminal 5227 is formed with the first electrode 5221 and the second electrode 5222. In addition, a composite connection terminal 5228 is formed with the first electrode 5223 and the second electrode 5224. In addition, a reference connection terminal 5229 is formed with the first electrode 5225 and the second electrode 5226. Then, in the case of a structure as shown in FIG. 52A, the second electrode 5222 and the second electrode 5226 correspond to the reference connection pads, and the second electrode 5224 corresponds to the composite connection pad.

Note that a structure as shown in FIG. 52B may be employed which includes a third electrode 5231 over the second electrode 5222, a third electrode 5232 over the second electrode 5224, and a third electrode 5233 over the second electrode 5226 in the structure shown in FIG. 52A. In other words, a reference connection terminal 5234 is formed with the first electrode 5221, the second electrode 5222, and the third electrode 5231; a composite connection terminal 5235 is formed with the first electrode 5223, the second electrode 5224, and the third electrode 5232; and a reference connection terminal 5236 is formed with the first electrode 5225, the second electrode 5226, and the third electrode 5233. In the case of the structure shown in FIG. 52B, the third electrode 5231 and the third electrode 5232 correspond to the reference connection pads, and the third electrode 5233 corresponds to the composite connection pad.

Note that the third electrode 5231, the third electrode 5232, and the third electrode 5233 are formed from the same material as the pixel electrode 5210. Preferably, the third electrode 5231, the third electrode 5232, and the third electrode 5233 are formed from oxide such as indium tin oxide (ITO) in which tin oxide is added to indium oxide, indium zinc oxide (IZO), cadmium tin oxide (CTO), zinc oxide (ZnO), or tin oxide (TO). Since the above oxide is chemically stable, it can protect the electrode.

Alternatively, a structure as shown in FIG. 53B may be employed which has a semiconductor film 5311 below the first electrode 5222, a semiconductor film 5312 below the first electrode 5223, and a semiconductor film 5313 below the first electrode 5225 in the structure shown in FIG. 52A. In other words, a reference connection terminal 5314 is formed with the first electrode 5221, the second electrode 5222, and the semiconductor layer 5311; a composite connection terminal 5315 is formed with the first electrode 5223, the second electrode 5224, and the semiconductor layer 5312; and a reference connection terminal 5316 is formed with the first electrode 5225, the second electrode 5226, and the semiconductor layer 5313.

In addition, the connection terminal portion may have a structure as shown in FIG. 53A. In other words, a first electrode 5301, a first electrode 5303, and a first electrode 5305 are formed over the first interlayer insulating film 5207, and further, a second electrode 5302, a second electrode 5304, and a second electrode 5306 are formed over the first electrode 5301, the first electrode 5303, and the first electrode 5305, respectively.

In addition, the first electrode 5301, the first electrode 5303, and the first electrode 5305, and the second electrode 5302, the second electrode 5304, and the second electrode 5306 are electrically insulated by partitions formed from the second interlayer insulating film 5209.

Note that the first electrode 5301, the first electrode 5303, and the first electrode 5305 are formed from the same material as the wire 5208. In addition, the second electrode 5302, the second electrode 5304, and the second electrode 5306 are formed from the same material as the pixel electrode 5210. Preferably, the second electrode 5302, the second electrode 5304, and the second electrode 5036 are formed from oxide such as indium tin oxide (ITO) in which tin oxide is added to indium oxide, indium zinc oxide (IZO), cadmium tin oxide (CTO), zinc oxide (ZnO), or tin oxide (TO). Since the above oxide is chemically stable, it can protect the electrode.

A reference connection terminal 5307 is formed with the first electrode 5301 and the second electrode 5302. A composite connection terminal 5308 is formed with the first electrode 5303 and the second electrode 5304. A reference connection terminal 5309 is formed with the first electrode 5305 and the second electrode 5306. In the case of the structure as shown in FIG. 53A, the second electrode 5302 and the second electrode 5306 correspond to the reference connection pads, and the second electrode 5304 corresponds to the composite connection pad.

The second interlayer insulating film 5209 is not necessarily provided. First, a cross section of the pixel portion is explained with reference to FIG. 54A. Steps to formation of the wire 5208 over the first interlayer insulating film 5207 are similar to those shown in FIG. 52A.

In addition, an insulator 5402 is formed to cover end portions of a pixel electrode 5401. For example, a positive type photosensitive acrylic resin film can be used as the insulator 5402.

In addition, a layer 5403 containing an organic compound is formed over the pixel electrode 5401. In addition, an opposite electrode 5404 is formed over the layer 5403 containing an organic compound.

Subsequently, a structure of the connection terminal portion is explained. Note that a cross-sectional view of the connection terminal portion in FIG. 54A shows a section of a connection terminal in a line width direction.

Also in the connection terminal portion, the base film 5202 is formed over the substrate 5201, and the gate insulating film 5205 is formed thereover. However, in the connection terminal portion, the base film 5202 and the gate insulating film 5205 are not necessarily formed.

Furthermore, a first electrode 5411, a first electrode 5413, and a first electrode 5415 are formed over the gate insulating film 5205, and a second electrode 5412, a second electrode 5414, and a second electrode 5416 are formed over the first electrode 5411, the first electrode 5413, and the first electrode 5415, respectively.

In addition, the first electrode 5411, the first electrode 5413, and the first electrode 5415, and the second electrode 5412, the second electrode 5414, and second electrode 5416 are electrically insulated by the first interlayer insulating film 5207.

Note that the first electrode 5411, the first electrode 5413, and the first electrode 5415 are formed from the same material as the gate electrode 5206. In addition, the second electrode 5412, the second electrode 5414, and the second electrode 5416 are formed from the same material as the wire 5208. Preferably, each of the second electrode 5412, the second electrode 5414, and the second electrode 5416 has a three-layer structure, which may include an aluminum film over a titanium film, and a titanium film thereover.

A reference connection terminal 5421 is formed with the first electrode 5411 and the second electrode 5412. A composite connection terminal 5422 is formed with the first electrode 5413 and the second electrode 5414. A reference connection terminal 5423 is formed with the first electrode 5415 and the second electrode 5416. In the case of the structure as shown in FIG. 54A, the second electrode 5412 and the second electrode 5416 correspond to the reference connection pads, and the second electrode 5414 corresponds to the composite connection pad.

Note that a structure as shown in FIG. 54B may be employed which includes a third electrode 5431 over the second electrode 5412, a third electrode 5432 over the second electrode 5414, and a third electrode 5433 over the second electrode 5416 in the structure shown in FIG. 54A. In other words, a reference connection terminal 5111 is formed with the first electrode 5411, the second electrode 5412, and the third electrode 5431; a composite connection terminal 5112 is formed with the first electrode 5413, the second electrode 5414, and the third electrode 5432; and a reference connection terminal 5443 is formed with the first electrode 5415, the second electrode 5416, and the third electrode 5433. In the case of the structure shown in FIG. 54B, the third electrode 5431 and the third electrode 5432 correspond to the reference connection pads, and the third electrode 5433 corresponds to the composite connection pad.

Note that the third electrode 5431, the third electrode 5432, and the third electrode 5433 are formed from the same material as the pixel electrode 5401. Preferably, the third electrode 5431, the third electrode 5432, and the third electrode 5433 are formed from oxide such as indium tin oxide (ITO) in which tin oxide is added to indium oxide, indium zinc oxide (IZO), cadmium tin oxide (CTO), zinc oxide (ZnO), or tin oxide (TO). Since the above oxide is chemically stable, it can protect the electrode.

In addition, the connection terminal portion may have a structure as shown in FIG. 55A. In other words, a first electrode 5501, a first electrode 5503, and a first electrode 5505 are formed over the first interlayer insulating film 5207, and further, a second electrode 5502, a second electrode 5504, and a second electrode 5506 are formed over the first electrode 5501, the first electrode 5503, and the first electrode 5505, respectively.

The first electrode 5501, the first electrode 5503, and the first electrode 5505, and the second electrode 5502, the second electrode 5504, and second electrode 5506 are electrically insulated by the insulator 5402.

Note that the first electrode 5501, the first electrode 5503, and the first electrode 5505 are formed from the same material as the wire 5208. The second electrode 5502, the second electrode 5504, and the second electrode 5506 are formed from the same material as the pixel electrode 5401. Preferably, the second electrode 5502, the second electrode 5504, and the second electrode 5506 are formed from oxide such as indium tin oxide (ITO) in which tin oxide is added to indium oxide, indium zinc oxide (IZO), cadmium tin oxide (CTO), zinc oxide (ZnO), or tin oxide (TO). Since the above oxide is chemically stable, it can protect the electrode.

A reference connection terminal 5511 is formed with the first electrode 5501 and the second electrode 5502. A composite connection terminal 5512 is formed with the first electrode 5503 and the second electrode 5504. A reference connection terminal 5513 is formed with the first electrode 5505 and the second electrode 5506. In the case of the structure as shown in FIG. 55A, the second electrode 5502 and the second electrode 5506 correspond to the reference connection pads, and the second electrode 5504 corresponds to the composite connection pad.

Alternatively, a structure as shown in FIG. 55B may be employed in which the second electrode 5502, the second electrode 5504, and the second electrode 5506 are not provided in the structure of FIG. 55A. In other words, a reference connection terminal 5521 is formed with the first electrode 5501. A composite connection terminal 5522 is formed with the first electrode 5503. A reference connection terminal 5523 is formed with the first electrode 5505. In the case of the structure as shown in FIG. 55B, the first electrode 5501 and the first electrode 5505 correspond to the reference connection pads, and the first electrode 5503 corresponds to the composite connection pad.

FIGS. 56A and 56B are partial cross-sectional views of a display panel using a transistor having a structure in which a gate electrode is sandwiched between a substrate and a semiconductor layer, namely, a transistor having a bottom-gate structure in which a gate electrode is located below a semiconductor layer, as the structure of a transistor using polysilicon (p-Si) for its semiconductor layer.

A base film 5602 is formed over a substrate 5601. Then, a gate electrode 5603 is formed over the base film 5602. As a material of the gate electrode 5603, a metal film, or polycrystalline silicon to which phosphorus is added can be used. Other than polycrystalline silicon, silicide that is a compound of metal and silicon may be used as well.

Then, a gate insulating film 5604 is formed to cover the gate electrode 5603. The gate insulating film 5604 is formed using a silicon oxide film, a silicon nitride film, or the like.

Over the gate insulating film 5604, a semiconductor film is formed. The semiconductor film includes a channel formation region 5606 and an impurity region 5605. Note that channel doping may be performed on the channel formation region 5606.

As the substrate, a glass substrate, a quartz substrate, a ceramic substrate, or the like can be used. The base film 5602 can be formed using a single layer of aluminum nitride (AlN), silicon oxide ($SiO_2$), silicon oxynitride ($SiO_XN_Y$), or the like or a laminated layer thereof.

A first interlayer insulating film 5600 is formed to cover the semiconductor film. A contact hole is formed in the first interlayer insulating film 5600, through which a wire 5607 is in contact with the impurity region 5605.

In addition, an opening 5608 is formed in the first interlayer insulating film 5600.

A second interlayer insulating film 5609 is formed to cover the first interlayer insulating film 5600, the wire 5607, and the opening 5608. A pixel electrode 5610 is formed through a contact hole over the second interlayer insulating film 5609. Then, an insulator 5611 is formed to cover end portions of the pixel electrode 5610. For example, a positive type photosensitive acrylic resin film can be used. Subsequently, a layer 5612 containing an organic compound and an opposite electrode 5613 are formed over the pixel electrode 5610, and a light emitting element 5614 is formed in a region where the layer 5612 containing an organic compound is sandwiched between the pixel electrode 5610 and the opposite electrode 5613. The opening 5608 is located under the light emitting element 5614; accordingly, in the case where light emission of the light emitting element 5614 is extracted from the substrate side, transmittance can be improved due to the existence of the opening 5608.

Next, a structure of the connection terminal portion is explained. Note that a cross-sectional view of the connection terminal portion in FIG. 56A shows a section of a connection terminal in a line width direction.

Also in the connection terminal portion, the base film 5602 is formed over the substrate 5601, and the gate insulating film 5604 is formed thereover. However, in the connection terminal portion, the base film 5602 and the gate insulating film 5604 are not necessarily formed.

Furthermore, a semiconductor film 5615, a semiconductor film 5617, and a semiconductor film 5619 are formed over the gate insulating film 5604, and further, a first conductive film 5616, a first conductive film 5618, and a first conductive film 5620 are formed over the semiconductor film 5615, the semiconductor film 5617, and the semiconductor film 5619, respectively.

In addition, the semiconductor film 5615, the semiconductor film 5617, and the semiconductor film 5619, and the first conductive film 5616, the first conductive film 5618, and the first conductive film 5620 are electrically insulated by partitions formed from the first interlayer insulating film 5600 and the second interlayer insulating film 5609.

Note that the semiconductor film 5615, the semiconductor film 5617, and the semiconductor film 5619 are formed from the same material as the semiconductor layer of the transistor. In addition, the first conductive film 5616, the first conductive film 5618, and the first conductive film 5620 are formed from the same material as the wire 5607.

A reference connection terminal 5621 is formed with the semiconductor film 5615 and the first conductive film 5616. A composite connection terminal 5622 is formed with the semiconductor film 5617 and the first conductive film 5618. A reference connection terminal 5623 is formed with the semiconductor film 5619 and the first conductive film 5620. In the case of the structure as shown in FIG. 56A, the first conductive film 5616 and the first conductive film 5620 correspond to the reference connection pads, and the first conductive film 5618 corresponds to the composite connection pad.

Note that a structure as shown in FIG. 56B may be employed which includes a second conductive film 5631 over the first conductive film 5616, a second conductive film 5632 over the first conductive film 5618, and a second conductive film 5633 over the first conductive film 5620 in the structure shown in FIG. 56A. In other words, a reference connection terminal 5641 is formed with the semiconductor film 5615, the first conductive film 5616, and the second conductive film 5631; a composite connection terminal 5642 is formed with the semiconductor film 5617, the first conductive film 5618, and the second conductive film 5632; and a reference connection terminal 5643 is formed with the semiconductor film 5619, the first conductive film 5620, and the second conductive film 5633. In the case of the structure as shown in FIG. 56B, the second conductive film 5631 and the second conductive film 5632 correspond to the reference connection pads, and the second conductive film 5633 corresponds to the composite connection pad.

Note that the second conductive film 5631, the second conductive film 5632, and the second conductive film 5633 are formed from the same material as the pixel electrode 5610. Preferably, the second conductive film 5631, the second conductive film 5632, and the second conductive film 5633 are faulted from oxide such as indium tin oxide (ITO) in which tin oxide is added to indium oxide, indium zinc oxide (IZO), cadmium tin oxide (CTO), zinc oxide (ZnO), or tin oxide (TO). Since the above oxide is chemically stable, it can protect the electrode.

Alternatively, a structure as shown in FIG. 57B may be employed in which the semiconductor layer 5615, the semiconductor layer 5617, and the semiconductor layer 5619 are not provided in the structure of FIG. 56B. In other words, a reference connection terminal 5711 is formed with the first conductive film 5616 and the second conductive film 5631. A composite connection terminal 5712 is formed with the first conductive film 5618 and the second conductive film 5632. A reference connection terminal 5713 is fainted with the first conductive film 5620 and the second conductive film 5633. In the case of the structure as shown in FIG. 57B, the second conductive film 5631 and the second conductive film 5633 correspond to the reference connection pads, and the second conductive film 5632 corresponds to the composite connection pad.

In addition, the connection terminal portion may have a structure as shown in FIG. 57A. In other words, a first conductive film 5701, a first conductive film 5703, and a first conductive film 5705 are formed over the first interlayer insulating film 5600, and further, a second conductive film 5702, a second conductive film 5704, and a second conductive film 5706 are formed over the first conductive film 5701, the first conductive film 5703, and the first conductive film 5705, respectively.

In addition, the first conductive film 5701, the first conductive film 5703, and the first conductive film 5705, and the second conductive film 5702, the second conductive film 5704, and the second conductive film 5706 are electrically insulated by partitions formed from the second interlayer insulating film 5609.

Note that the first conductive film 5701, the first conductive film 5703, and the first conductive film 5705 are formed from the same material as the wire 5607. In addition, the second conductive film 5702, the second conductive film 5704, and the second conductive film 5706 are formed from the same material as the pixel electrode 5610. Preferably, the second conductive film 5702, the second conductive film 5704, and the second conductive film 5706 are formed from oxide such as indium tin oxide (ITO) in which tin oxide is added to indium oxide, indium zinc oxide (IZO), cadmium tin oxide (CTO), zinc oxide (ZnO), or tin oxide (TO). Since the above oxide is chemically stable, it can protect the electrode.

A reference connection terminal 5707 is formed with the first conductive film 5701 and the second conductive film 5702. A composite connection terminal 5708 is formed with the first conductive film 5703 and the second conductive film 5704. A reference connection terminal 5709 is formed with the first conductive film 5705 and the second conductive film 5706. In the case of the structure as shown in FIG. 57A, the second conductive film 5702 and the second conductive film 5706 correspond to the reference connection pads, and the second conductive film 5704 corresponds to the composite connection pad.

Subsequently, the case of using an amorphous silicon (a-Si:H) film as a semiconductor layer of a transistor is explained.

FIG. 58A is a cross-sectional view of a top-gate transistor using amorphous silicon for its semiconductor layer. As shown in FIG. 58A, a base film 5802 is formed over a substrate 5801. Further, a pixel electrode 5803 is formed over the base film 5802.

As the substrate, a glass substrate, a quartz substrate, a ceramic substrate, or the like can be used. The base film 5802 can be formed using a single layer of aluminum nitride (AlN), silicon oxide ($SiO_2$), silicon oxynitride ($SiO_xN_y$), or the like or a laminated layer thereof.

A wire 5804 is formed over the base film 5802, and an end portion of the pixel electrode 5803 is covered with the wire 5804. Over the wire 5804, an n-type semiconductor layer 5806 having n-type conductivity is formed. In addition, a semiconductor layer 5805 is formed over the n-type semiconductor layer 5806 and the base film 5802. Note that this semiconductor layer is formed using an amorphous semiconductor film such as amorphous silicon (a-Si:H) film or a microcrystalline semiconductor (μ-Si:H) film. Then, a gate insulating film 5807 is formed over the semiconductor layer 5805. Note that a silicon oxide film, a silicon nitride film, or the like is used as the gate insulating film 5807.

Over the gate insulating film 5807, a gate electrode 5808 is formed. In addition, an insulator 5809 is formed to cover end portions of the pixel electrode 5803 and a transistor 5812.

Over the insulator 5809 and the pixel electrode 5803 located in an opening of the insulator 5809, a layer 5810 containing an organic compound and an opposite electrode 5811 are formed. A light emitting element 5813 is formed in a region where the layer 5810 containing an organic compound is sandwiched between the pixel electrode 5803 and the opposite electrode 5811.

Next, a structure of a connection terminal portion is explained. Note that a cross-sectional view of a connection terminal portion in FIG. 58A shows a section of a connection terminal in a line width direction.

Also in the connection terminal portion, the base film 5802 is formed over the substrate 5801. However, in the connection terminal portion, the base film 5802 is not necessarily formed.

Furthermore, a first conductive film 5814, a first conductive film 5816, and a first conductive film 5818 are formed over the base film 5802, and further, a second conductive film 5815, a second conductive film 5817, and a second conductive film 5819 are formed over the first conductive film 5814, the first conductive film 5816, and the first conductive film 5818, respectively.

In addition, the first conductive film 5814, the first conductive film 5816, and the first conductive film 5818, and the second conductive film 5815, the second conductive film 5817, and the second conductive film 5819 are electrically insulated by the insulator 5809.

Note that the first conductive film 5814, the first conductive film 5816, and the first conductive film 5818 are formed from the same material as the wire 5804. The second conductive film 5815, the second conductive film 5817, and the second conductive film 5819 are formed from the same material as the gate electrode 5808.

A reference connection terminal 5820 is formed with the first conductive film 5814 and the second conductive film 5815. A composite connection terminal 5821 is formed with the first conductive film 5816 and the second conductive film 5817. A reference connection terminal 5822 is fainted with the first conductive film 5818 and the second conductive film 5819. In the case of the structure as shown in FIG. 58A, the second conductive film 5815 and the second conductive film 5819 correspond to the reference connection pads, and the second conductive film 5817 corresponds to the composite connection pad.

Alternatively, a structure as shown in FIG. 58B may be employed which includes a third conductive film 5823 below the first conductive film 5814, a third conductive film 5824 below the first conductive film 5816, and a third conductive film 5825 below the first conductive film 5818 in the structure of FIG. 58A. In other words, the reference connection terminal 5820 is formed with the first conductive film 5814, the second conductive film 5815, and the third conductive film 5823; the composite connection terminal 5821 is formed with the first conductive film 5816, the second conductive film 5817, and the third conductive film 5824; and the reference connection terminal 5822 is formed with the conductive film 5818, the second conductive film 5819, and the third conductive film 5825.

FIGS. 59A and 59B are partial cross-sectional views of a display panel provided with a bottom-gate transistor using amorphous silicon for its semiconductor layer.

A base film 5902 is formed over a substrate 5901. Over the base film 5902, a gate electrode 5903 is formed. As a material of the gate electrode 5903, polycrystalline silicon to which phosphorus is added can be used. Other than polycrystalline silicon, silicide that is a compound of metal and silicon may be used as well.

Then, a gate insulating film 5904 is formed to cover the gate electrode 5903. The gate insulating film 5904 is formed using a silicon oxide film, a silicon nitride film, or the like.

A semiconductor layer 5905 is formed over the gate insulating film 5904.

As the substrate, a glass substrate, a quartz substrate, a ceramic substrate, or the like can be used. The base film 5902 can be formed using a single layer of aluminum nitride (AlN), silicon oxide ($SiO_2$), silicon oxynitride ($SiO_XN_Y$), or the like or a laminated layer thereof.

An n-type semiconductor layer 5906 having n-type conductivity is formed over the semiconductor layer 5905.

A wire 5907 is formed over the n-type semiconductor layer 5906.

One end portion of the wire 5907 is extended, and a pixel electrode 5908 is formed on the extended wire 5907.

An insulator 5909 is formed to cover end portions of the pixel electrode 5908 and a transistor 5912.

Then, a layer 5910 containing an organic compound and an opposite electrode 5911 are formed over the pixel electrode 5908 and the insulator 5909. A light emitting element 5913 is formed in a region where the layer 5910 containing an organic compound is sandwiched between the pixel electrode 5908 and the opposite electrode 5911.

Next, a structure of a connection terminal portion is explained. Note that a cross-sectional view of a connection terminal portion in FIG. 59A shows a section of a connection terminal in a line width direction.

Also in the connection terminal portion, the base film 5902 is formed over the substrate 5901. However, in the connection terminal portion, the base film 5902 is not necessarily formed.

Furthermore, a first conductive film 5914, a first conductive film 5915, and a first conductive film 5916 are formed over the base film 5902.

In addition, the first conductive film 5914, the first conductive film 5915, and the first conductive film 5916 are electrically insulated by the insulator 5909.

Note that the first conductive film 5914, the first conductive film 5915, and the first conductive film 5916 are formed from the same material as the wire 5907.

A reference connection terminal 5917 is formed with the first conductive film 5914. A composite connection terminal 5918 is formed with the first conductive film 5915. A reference connection terminal 5919 is formed with the first conductive film 5916. In the case of the structure as shown in FIG. 59A, the first conductive film 5914 and the first conductive film 5916 correspond to the reference connection pads, and the first conductive film 5915 corresponds to the composite connection pad.

Alternatively, a structure as shown in FIG. 59B may be employed which includes a second conductive film 5920 over the first conductive film 5914, a second conductive film 5921 over the first conductive film 5915, and a second conductive film 5922 over the first conductive film 5916 in the structure shown in FIG. 59A. In other words, a reference connection terminal 5923 is formed with the first conductive film 5914 and the second conductive film 5920; a composite connection terminal 5924 is formed with the first conductive film 5915 and the second conductive film 5921; and a reference connection terminal 5925 is formed with the first conductive film 5916 and the second conductive film 5922.

Note that FIGS. 59A and 59B show inverted-staggered channel-etch type transistors; however, a channel protective type transistor may be used. The case of a channel protective type transistor is explained with reference to FIGS. 60A and 60B.

A channel protective type transistor 6002 shown in FIGS. 60A and 60B is different from the channel-etch type transistor 5912 shown in FIGS. 59A and 59B in that an insulator 6001 serving as an etching mask is provided over the channel formation region in the semiconductor layer 5905. The other common components are denoted by the common reference numerals.

By using an amorphous semiconductor film as a semiconductor layer (such as a channel formation region, a source region, and a drain region) of a transistor included in the pixel of the invention, manufacturing cost can be reduced.

Note that a display panel to which the present invention can be applied is not limited to those described above.

Embodiment Mode 7

In this embodiment mode, a structure of a composite connection terminal, which is different from that in Embodiment Mode 1, is explained.

First, a first structure of this embodiment mode is explained with reference to FIGS. 39A and 39B. A connection pad 3901*a*, a plurality of connection pads 3902, and a connection pad 3901*b* are arranged equally spaced in a connection terminal portion over a substrate 101. In addition, the line widths of these connection pads are also approximately equal to each other.

An electrode 3903 is formed below the connection pads 3902 with an insulating film therebetween. The electrode 3903 is formed from the connection pad 3901*a* to the connection pad 3901*b*. Then, the connection pad 3901*a* is electrically connected to the electrode 3903 through a contact hole 3904*a*, and the connection pad 3901*b* is electrically connected to the electrode 3903 through a contact hole 3904*b*. Thus, the connection pad 3901*a* and the connection pad 3901*b* are electrically connected to each other. A composite connection terminal is formed with the connection pad 3901*a*, the connection pad 3901*b*, and the electrode 3903. Further, a portion where the composite connection terminal is connected to an FPC terminal is the connection pad 3901*a* and the connection pad 3901*b*.

Note that in FIG. 39, connection pads on both ends of a connection terminal portion are electrically connected to each other, with which a composite connection terminal is formed; however, the present invention is not limited thereto. In other words, a composite connection terminal can be formed by electrically connecting any connection pads in the connection terminal portion to each other. Accordingly, the number of connection pads to be electrically connected is not limited to two, and it may be three or more. By increasing the number, a connection area with an FPC pad can be enlarged; therefore, contact resistance can be decreased.

In accordance with this structure, connection pads are electrically connected to each other in a lower layer of the connection terminal portion. Therefore, the connection between spaced-apart connection pads is allowed without extending a wire inside a portion surrounded by a sealing region 901.

Note that this structure can be combined with various structures of the connection terminal portions described in Embodiment Mode 2. An example is shown in FIG. 61.

Figure 61:
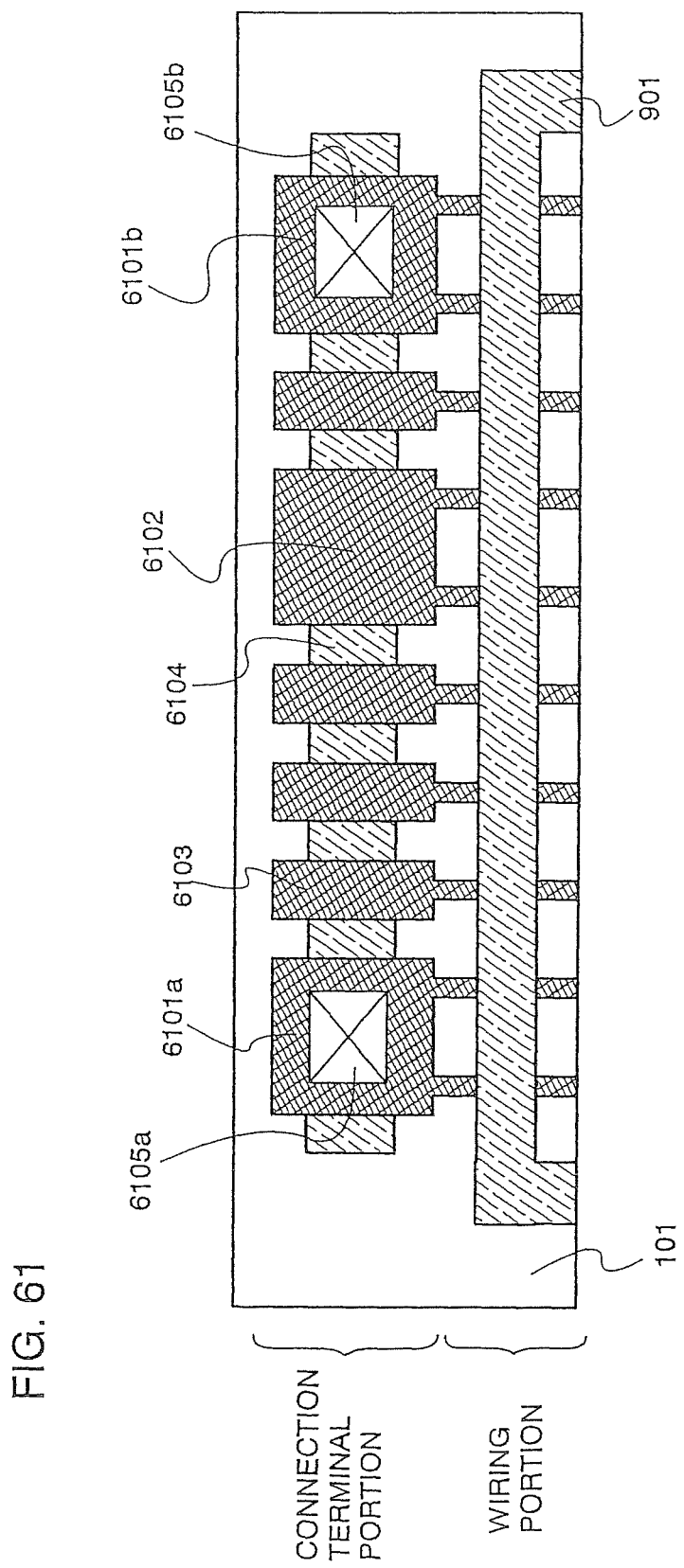
FIG. 61 is a diagram explaining a connection terminal portion.

In FIG. 61, a composite connection pad 6101*a*, a composite connection pad 6101*b*, a composite connection pad 6102, and a reference connection pad 6103 are arranged equally spaced in a connection terminal portion over a substrate 101.

An electrode 6104 is formed below the composite connection pad 6101*a* and the composite connection pad 6101*b* with an insulating film therebetween. The electrode 6104 is formed from the composite connection pad 6101*a* to the composite connection portion 6101*b*. Then, the composite connection pad 6101*a* is electrically connected to the electrode 6104 through a contact hole 6105*a*, and the composite connection pad 6101*b* is electrically connected to the electrode 6104 through a contact hole 6105*b*. Thus, the composite connection pad 6101*a* and the composite connection pad 6101*b* are electrically connected to each other. A composite connection terminal is formed with the composite connection pad 6101*a*, the composite connection pad 6101*b*, and the electrode 6104. Further, a portion where the composite connection terminal is connected to an FPC terminal is the composite connection pad 6101*a* and the composite connection pad 6101*b*.

Note that in this case, the width of the contact hole 6105*a* can be made larger than the line width of the reference connection pad 6103. Therefore, contact resistance can be decreased.

Note that in FIG. 61, composite connection pads on both ends of the connection terminal portion are electrically connected to each other, with which a composite connection terminal is formed; however, the present invention is not limited thereto. In other words, a composite connection terminal can be formed by electrically connecting any connection pads in the connection terminal portion to each other. Accordingly, the number of connection pads to be electrically connected is not limited to two, and it may be three or more. By increasing the number, a connection area with an FPC pad can be enlarged; therefore, contact resistance can be decreased.

Further, although composite connection pads are connected to each other, a composite connection terminal may be formed by electrically connecting a composite connection pad and a reference connection pad to each other.

In accordance with this structure, connection pads are electrically connected in a lower layer of a connection terminal portion. Therefore, the connection between spaced-apart connection pads is allowed without extending a wire inside a portion surrounded by a sealing region 901.

Subsequently, a second structure of this embodiment mode is explained with reference to FIG. 37. A connection pad 3701*a*, a plurality of connection pads 3702, and a connection pad 3701*b* are arranged equally spaced in a connection terminal portion over a substrate 101. In addition, the line widths of these connection pads are also approximately equal to each other.

The connection pad 3701*a* and the connection pad 3701*b* are connected by a wire 3703 formed at the periphery of the substrate 101 in the connection terminal portion. Note that the wire 3703 is formed of a conductive film continuous with the connection pad 3701*a* and the connection pad 3701*b*; therefore, the wire 3703, the connection pad 3701*a*, and the connection pad 3701*b* are electrically connected to each other without a contact hole. Accordingly, a composite connection terminal is formed with the connection pad 3701*a*, the connection pad 3701*b*, and the wire 3703. Further, a portion where the composite connection terminal is connected to an FPC terminal is the connection pad 3701*a* and the connection pad 3701*b*.

Figure 37:
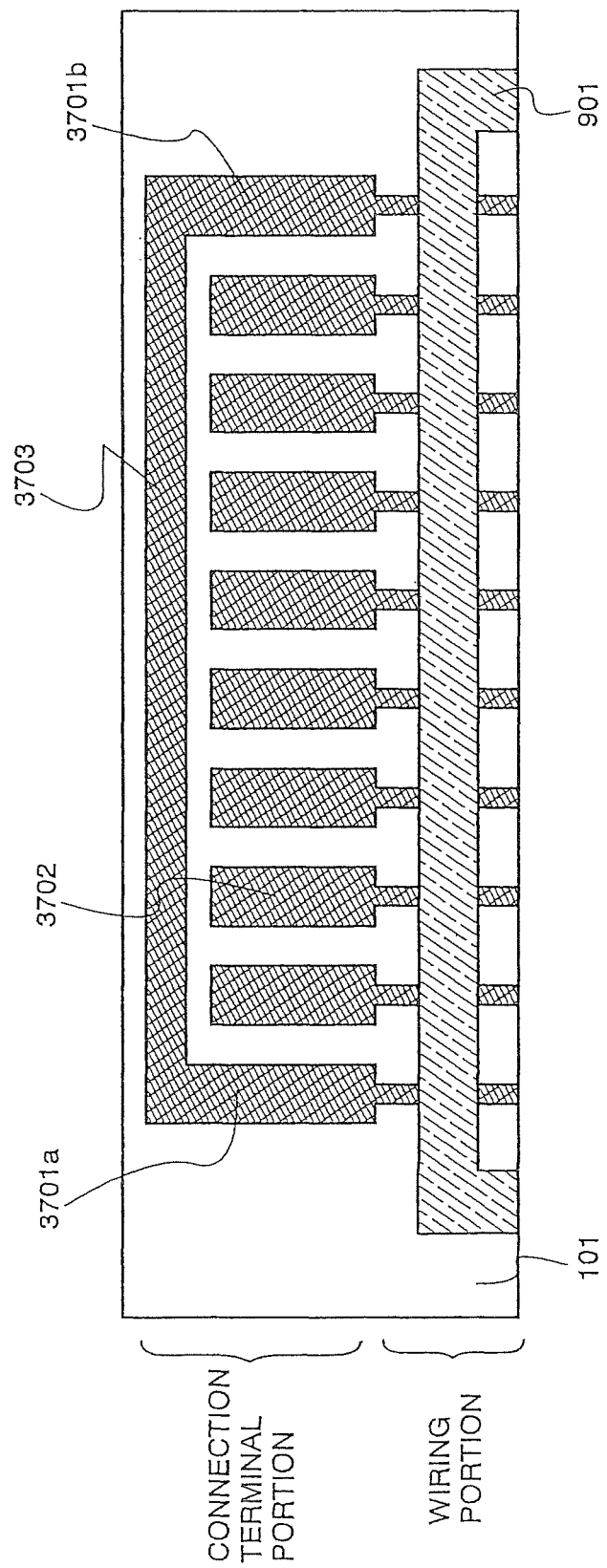
FIG. 37 is a diagram explaining a connection terminal portion.

Note that in FIG. 37, connection pads on both ends of a connection terminal portion are electrically connected to each other, with which a composite connection terminal is formed; however, the present invention is not limited thereto. In other words, a composite connection terminal can be formed by electrically connecting any connection pads in the connection terminal portion to each other. Accordingly, the number of connection pads to be electrically connected is not limited to two, and it may be three or more. By increasing the number, a connection area with an FPC pad can be enlarged; therefore, contact resistance can be decreased.

In accordance with this structure, connection pads are connected to each other without a contact hole; therefore, the connection between spaced-apart connection pads is allowed without causing an increase in contact resistance. Thus, resistance can be decreased.

Note that this structure can be combined with various structures of the connection terminal portions described in Embodiment Mode 2. An example is shown in FIG. 38.

Figure 38:
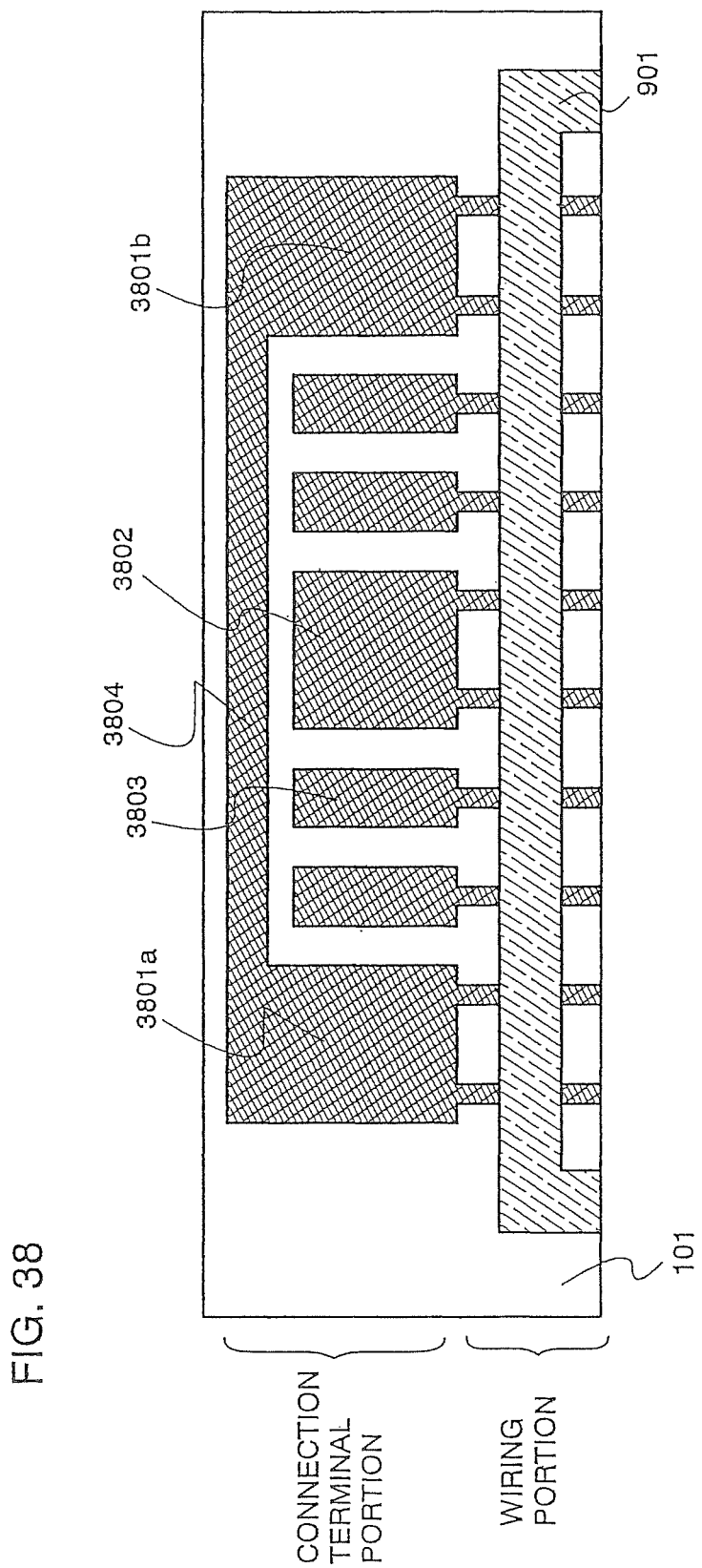
FIG. 38 is a diagram explaining a connection terminal portion.

In FIG. 38, a composite connection pad 3801*a*, a composite connection pad 3801*b*, a composite connection pad 3802, and a reference connection pad 3803 are arranged equally spaced in a connection terminal portion over a substrate 101.

The composite connection pad 3801*a* and the composite connection pad 3801*b* are connected to each other by a wire 3804 formed at the periphery of the substrate 101 in a connection terminal portion. Note that the wire 3804 is formed of a conductive film continuous with the composite connection pad 3801*a* and the composite connection pad 3801*b*; therefore, the wire 3804, the composite connection pad 3801*a*, and the composite connection pad 3801*b* are electrically connected to each other without a contact hole. Accordingly, a composite connection terminal is formed with the composite connection pad 3801*a*, the composite connection pad 3801*b*, and the wire 3804. Further, a portion where the composite connection terminal is connected to an FPC terminal is the composite connection pad 3801*a* and the composite connection pad 3801*b*.

Note that in FIG. 38, connection pads on both ends of the connection terminal portion are electrically connected to each other, with which a composite connection terminal is formed; however, the present invention is not limited thereto. In other words, a composite connection terminal can be formed by electrically connecting any composite connection pads in a connection terminal portion to each other. Accordingly, the number of connection pads to be electrically connected is not limited to two, and it may be three or more. Alternatively, a composite connection pad and a reference connection pad may be electrically connected to each other with a wire provided at the periphery of a substrate. Note that, by increasing the number, a connection area with an FPC pad can be enlarged; therefore, contact resistance can be decreased.

Embodiment Mode 8

In this embodiment mode, a structure which enables further improvement in defective display of a display device is explained.

In the structure of this embodiment mode, a current source circuit in peripheral driver circuits (a scan line driver circuit, a signal line driver circuit, and the like) and a wire connecting the current source circuit and a current source are not overlapped with an opposite electrode.

First, a first structure of this embodiment mode is shown in NG 27. Note that components in common with FIG. 13 are denoted by common reference numerals, and explanation thereof is omitted. In the structure shown in FIG. 27, the signal line driver circuit 104 includes a latch circuit 2701 and a shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including the current source, the current source circuit, the wire for connecting them, and the like is not overlapped with the opposite electrode 202.

With such a structure, defective display due to the influence of parasitic capacitance formed with the wire and the opposite electrode 202 can be prevented while effectively utilizing a display panel area.

This is because the time to hold a video signal inputted to the latch circuit 2701 in each stage of a latch circuit is shorter than the time to write a video signal to a pixel from the latch circuit 2701; therefore, if a signal current corresponding to the video signal is small, the influence of parasitic capacitance grows, and the video signal is not normally written to the latch circuit 2701.

Figure 42:
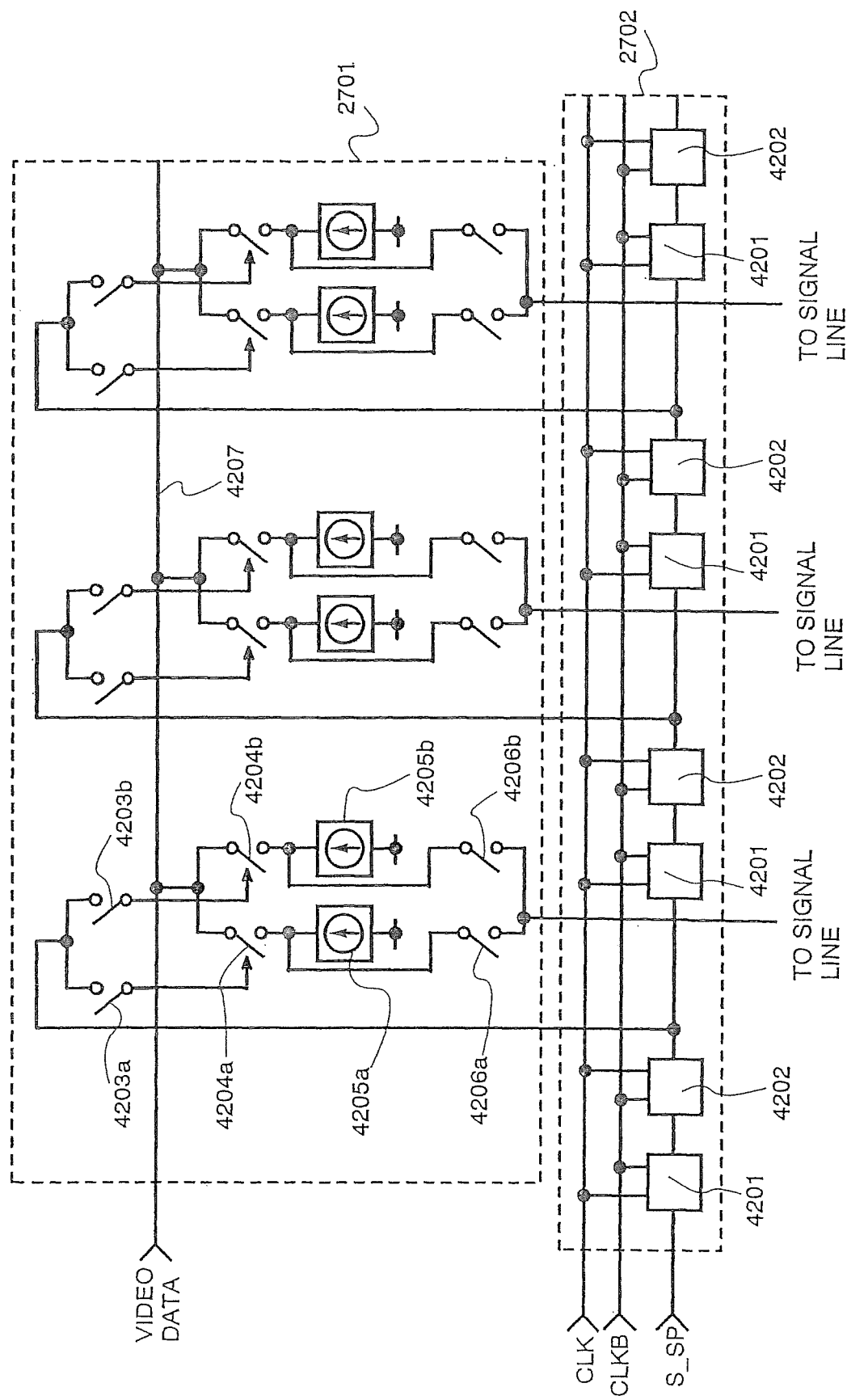
FIG. 42 is a diagram explaining a signal line driver circuit.

Here, an example of the configuration of the signal line driver circuit 104 is shown in FIG. 42. The shift register 2702 includes a plurality of flip-flops 4201 and flip-flops 4202. A clock signal (CLK) and an inverted clock signal (CLKB) are inputted to the shift register 2702. Then, a start pulse (S_SP) is inputted to the flip-flop 4201 of a first stage of the shift register 2702. Then, as for a pulse outputted from the flip-flop 4202 of a second stage, a start pulse is delayed for one pulse. In other words, a pulse inputted to the flip-flop 4201 is delayed for one pulse when outputted from the flip-flop 4202; therefore, each output from the flip-flop 4202 is delayed for one pulse. This serves as a sampling pulse determining the timing at which a video signal (Video Data) is held.

In addition, the latch circuit 2701 includes a write selection switch 4203*a*, a write selection switch 4203*b*, a sampling switch 4204*a*, a sampling switch 4204*b*, a current source circuit 4205*a*, a current source circuit 4205*b*, a read selection switch 4206*a*, and a read selection switch 4206*b* in accordance with each signal line.

One of the write selection switch 4203*a* and the write selection switch 4203*b* is turned on, and the other is turned off. When the write selection switch 4203*a* is turned on, the write selection switch 4203*b* is turned off and the current source circuit 4205*a* is selected as a current source circuit for writing a video signal. In other words, the sampling switch 4204*a* is turned on in accordance with the timing at which the sampling pulse is inputted to the latch circuit 2701, and a current corresponding to the video signal is written to the current source circuit 4205*a*. In the same manner, when the write selection switch 4203*b* is turned on, the write selection switch 4203*a* is turned off and the current source circuit 4205*b* is selected as a current source circuit for writing a video signal. In other words, the sampling switch 4204*b* is turned on in accordance with the timing at which the sampling pulse is inputted to the latch circuit 2701, and a current corresponding to the video signal is written to the current source circuit 4205*b*.

In addition, when the write selection switch 4203*a* is turned on, the read selection switch 4206*b* is turned on and the read selection switch 4206*a* is turned off. Then, the current corresponding to the video signal written to the current source circuit 4205*b* is outputted to the signal line. In the same manner, when the write selection switch 4203*b* is turned on, the read selecting switch 4206*a* is turned on and the read selection switch 4206*b* is turned off. Then, the current corresponding to the video signal written to the current source circuit 4205*a* is outputted to the signal line.

Here, parasitic capacitance is generated when a video line 4207 to which the video signal (Video Data) is inputted is overlapped with the opposite electrode. When a current value corresponding to the video signal is small, current flows to the parasitic capacitance, which results in insufficient video signal writing to the current source circuit. Consequently, defective display is caused.

Figure 27:
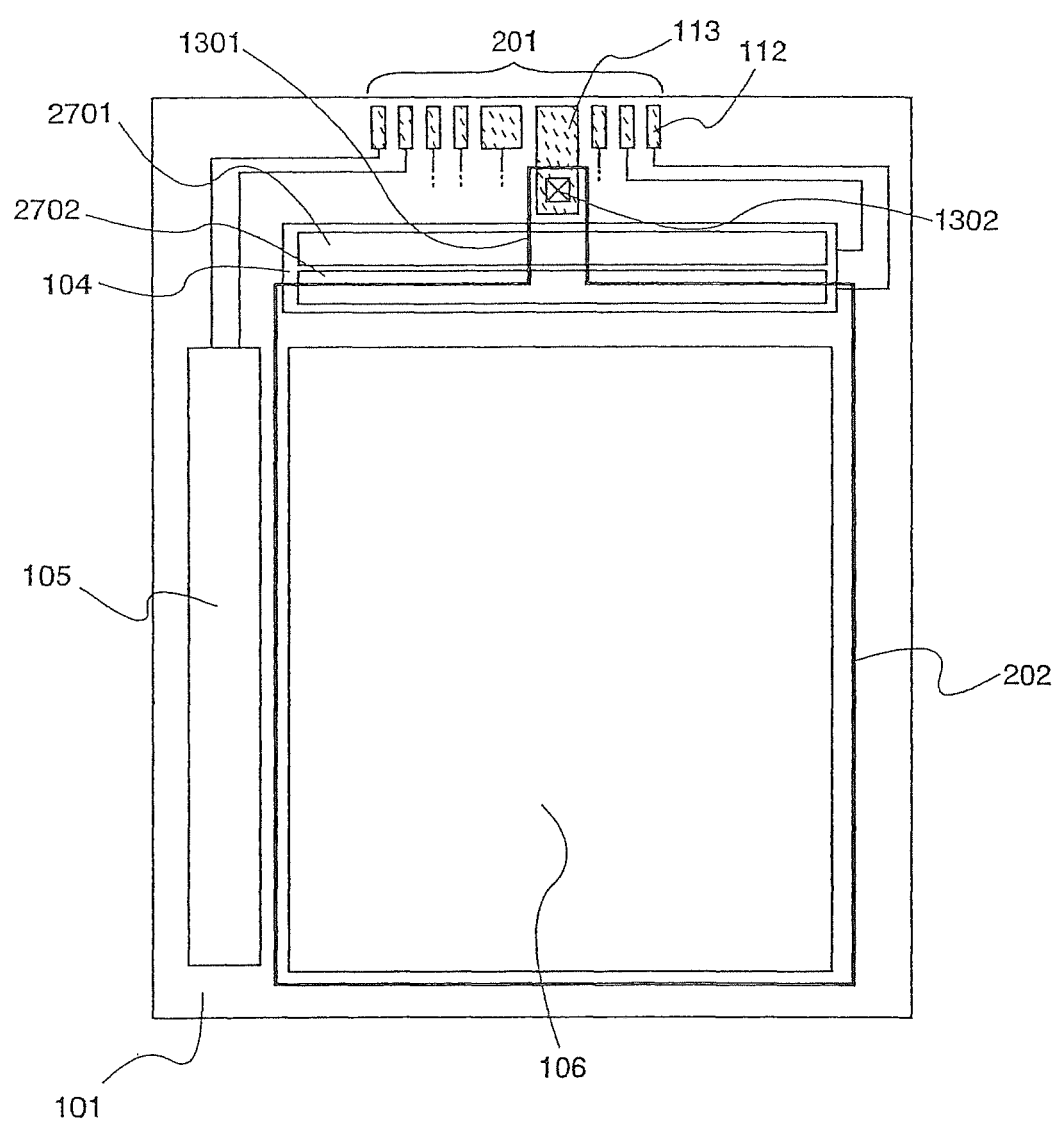
FIG. 27 is a schematic diagram of a display device of the present invention.

However, defective display can be prevented by employing the structure of this embodiment mode as shown in FIG. 27 because the opposite electrode 202 does not overlap the latch circuit 2701 even if effective use of the display panel area is attempted.

Note that any of the structures as shown in FIGS. 43A to 43C can be applied to the current source circuit. A current source circuit of FIG. 43A includes a switch 4304, a transistor 4302, and a capacitor 4303. In addition, writing to the current source circuit is performed by a current source 4301. A current source circuit of FIG. 43B includes a switch 4313, a transistor 4311, and a capacitor 4312. In addition, writing to the current source circuit is performed by the current source 4301. A current source circuit of FIG. 43C includes a switch 4324, a transistor 4321, a transistor 4322, a capacitor 4323, and a switch 4325. In addition, writing to the current source circuit is performed by the current source 4301.

Figure 28:
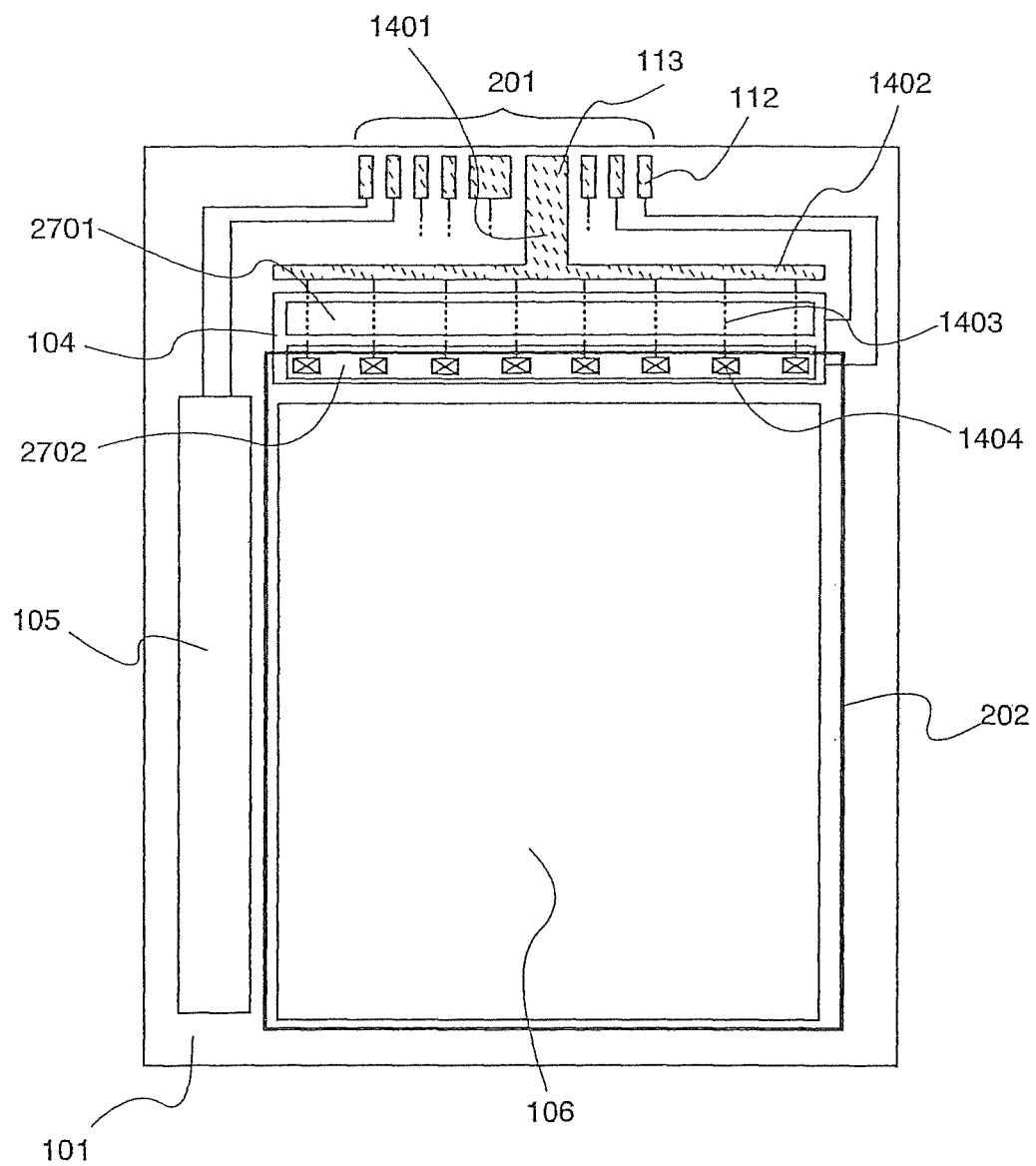
FIG. 28 is a schematic diagram of a display device of the present invention.

Next, a second structure of this embodiment mode is shown in FIG. 28. Note that components in common with FIG. 14 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202.

In this structure, the wire 1403 is connected to the opposite electrode 202 through the contact hole 1404 in the shift register 2702.

Figure 29:
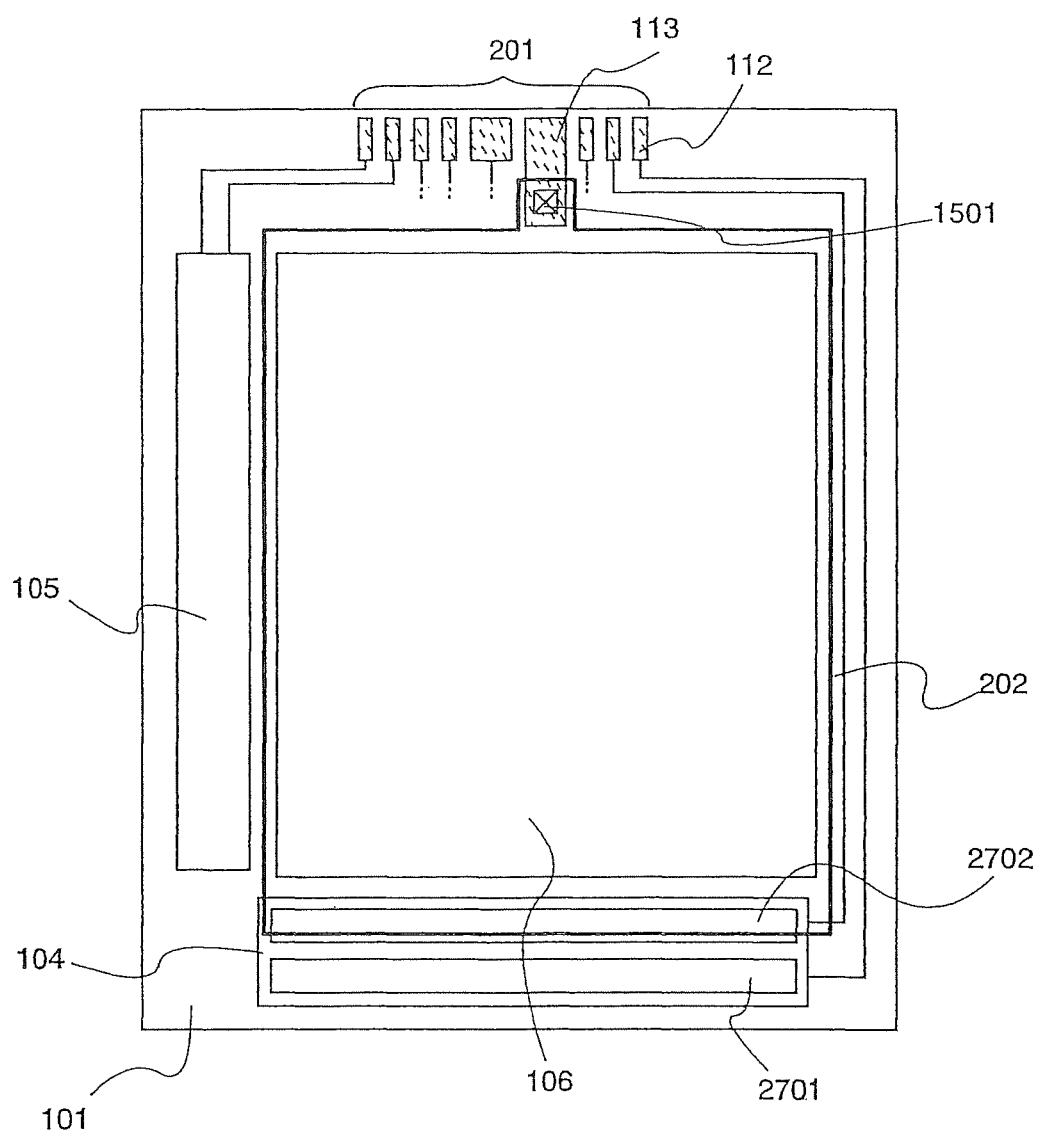
FIG. 29 is a schematic diagram of a display device of the present invention.

Next, a third structure of this embodiment mode is shown in FIG. 29. Note that components in common with FIG. 15 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202.

In this structure, the latch circuit 2701 is arranged on the side opposite to the connection terminal 201 to which a signal or power is supplied, with the pixel portion 106 therebetween; thus, a wire that is a cause of parasitic capacitance generation does not extend across the latch circuit 2701. Therefore, defective display can further be prevented.

Figure 30:
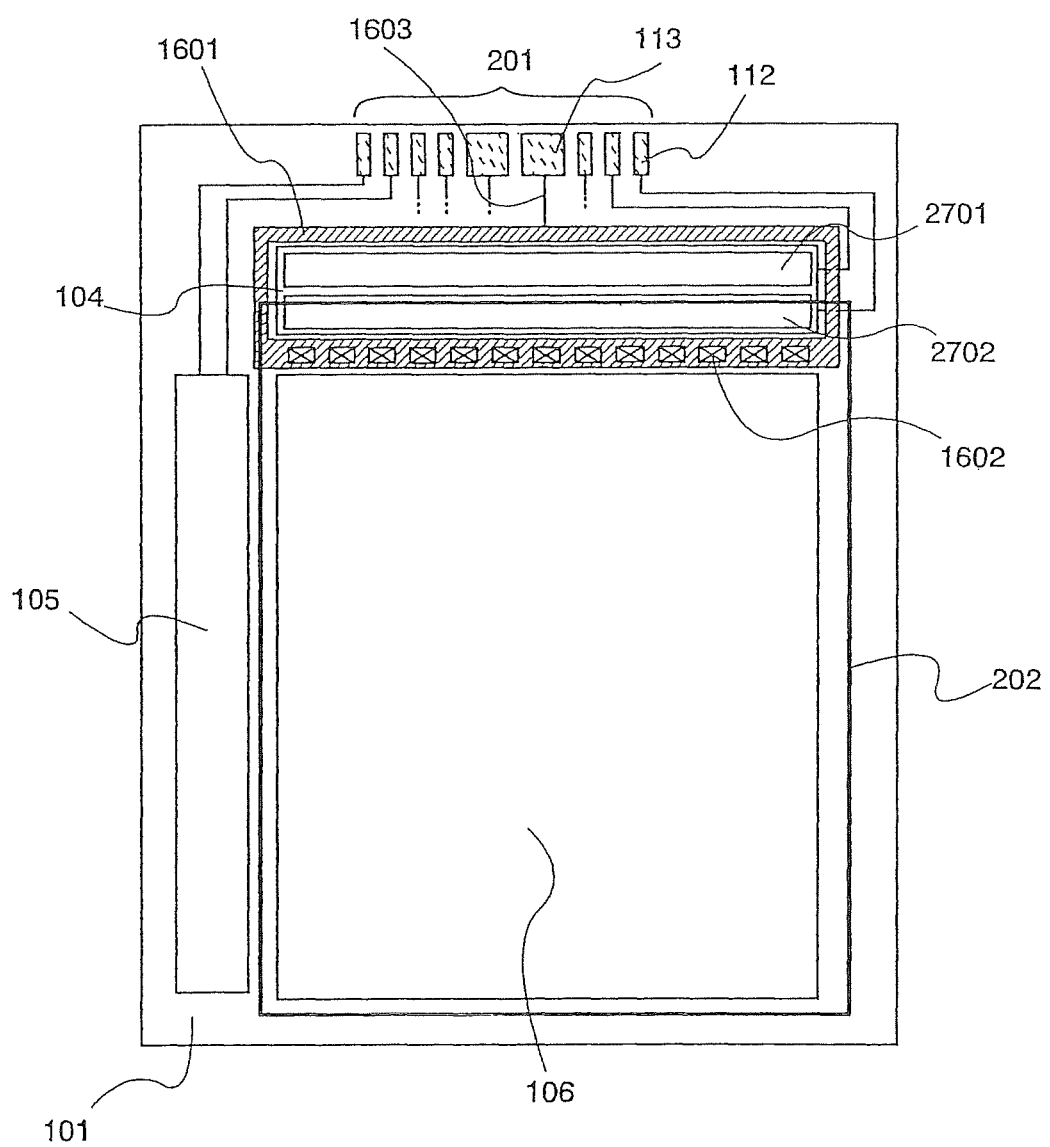
FIG. 30 is a schematic diagram of a display device of the present invention.

Subsequently, a fourth structure of this embodiment mode is shown in FIG. 30. Note that components in common with FIG. 16 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202. Therefore, defective display can be prevented.

Figure 31:
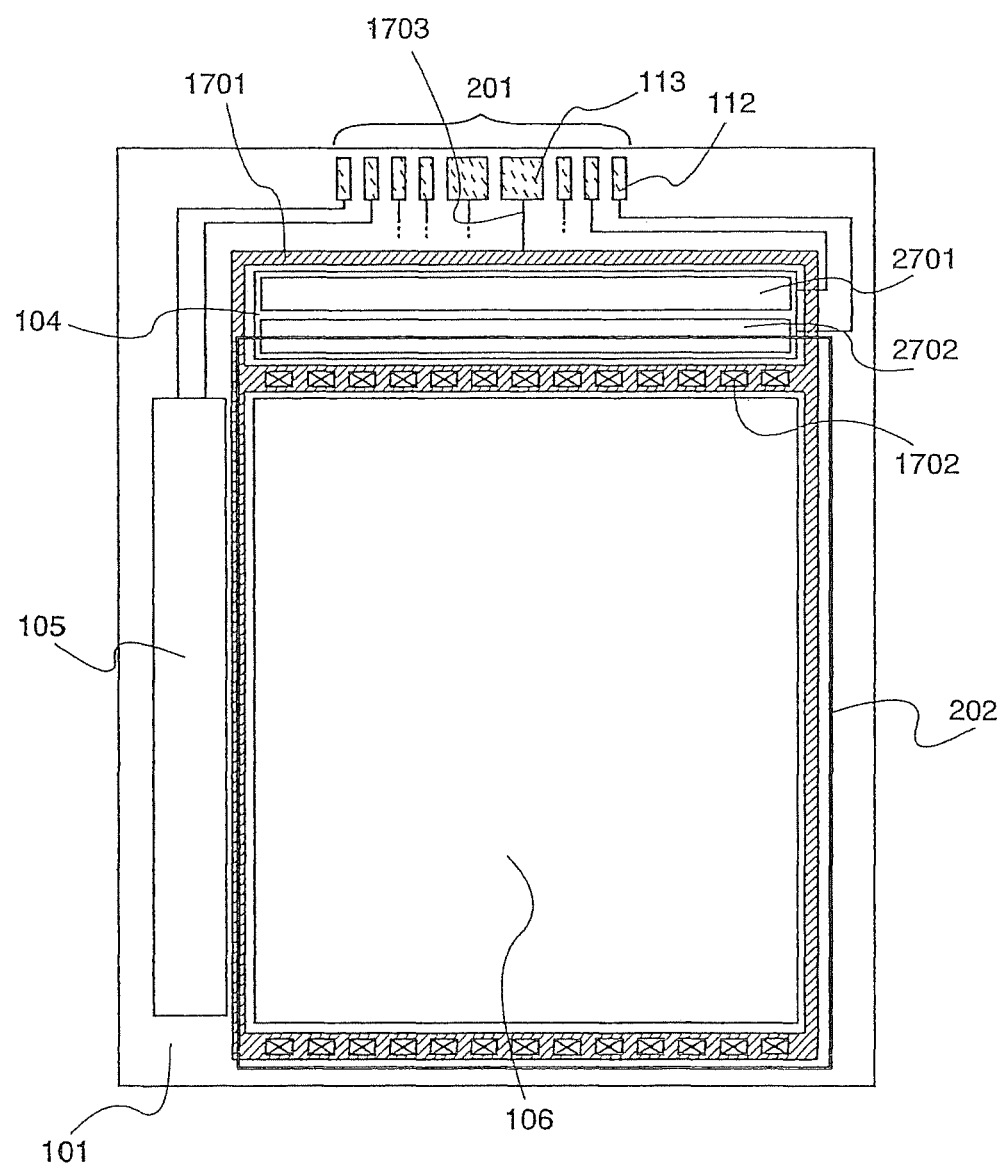
FIG. 31 is a schematic diagram of a display device of the present invention.

Subsequently, a fifth structure of this embodiment mode is shown in FIG. 31. Note that components in common with FIG. 17 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202. Therefore, defective display can be prevented.

Figure 32:
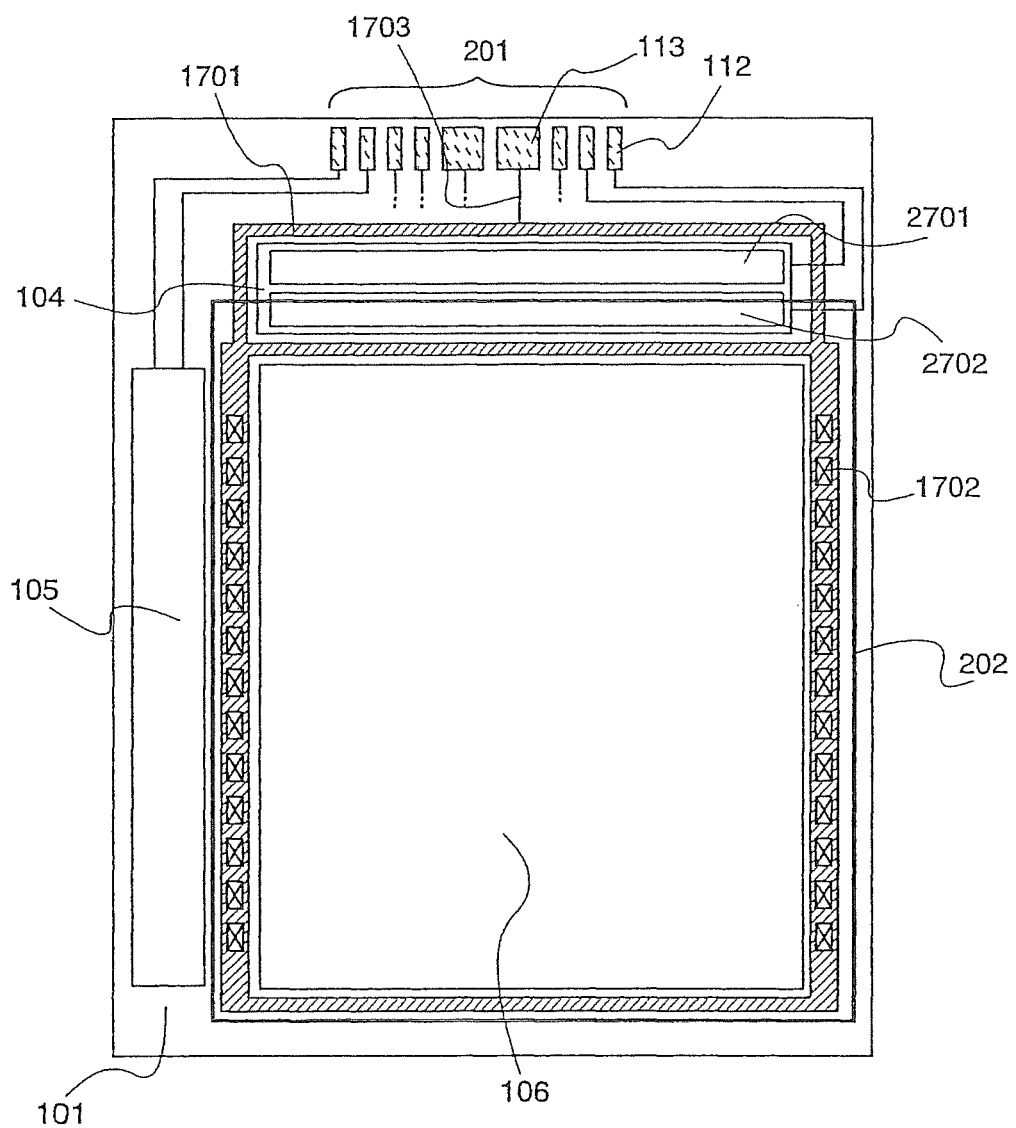
FIG. 32 is a schematic diagram of a display device of the present invention.

Subsequently, a sixth structure of this embodiment mode is shown in FIG. 32. Note that components in common with FIG. 18 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202. Therefore, defective display can be prevented.

Figure 33:
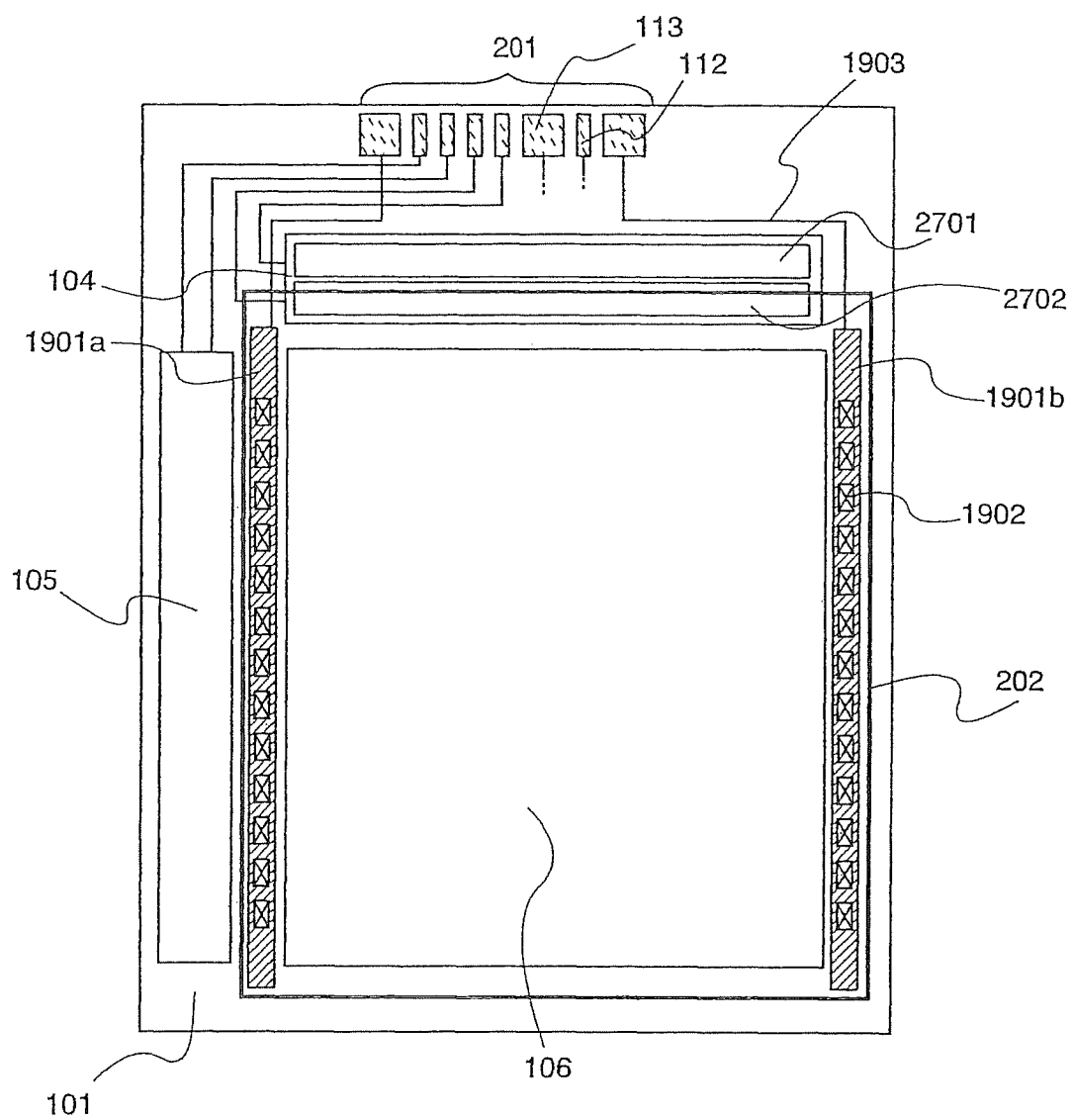
FIG. 33 is a schematic diagram of a display device of the present invention.

Subsequently, a seventh structure of this embodiment mode is shown in FIG. 33. Note that components in common with FIG. 19 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202. Therefore, defective display can be prevented.

Figure 34:
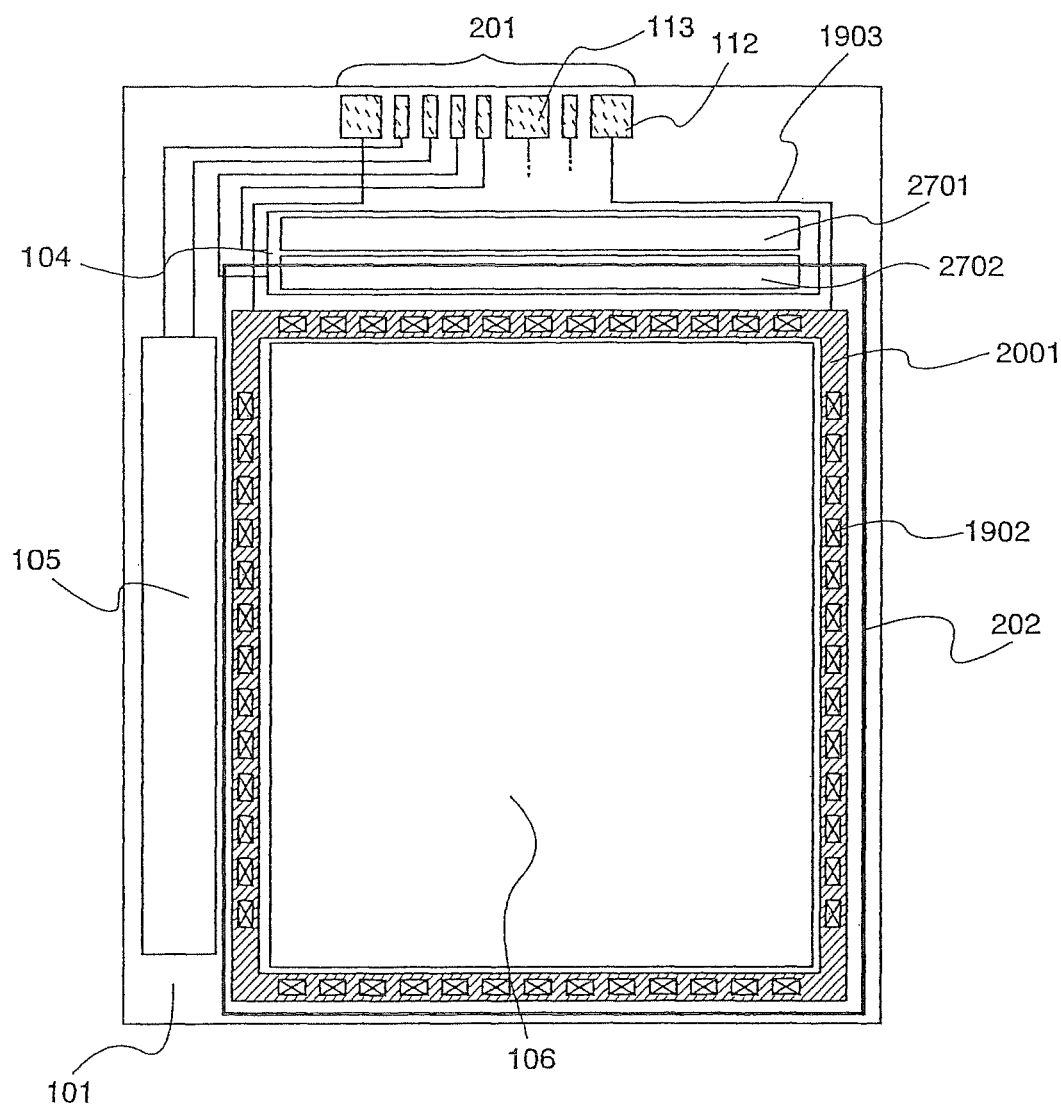
FIG. 34 is a schematic diagram of a display device of the present invention.

Subsequently, an eighth structure of this embodiment mode is shown in FIG. 34. Note that components in common with FIG. 20 are denoted by common reference numerals, and explanation thereof is omitted. Also in this structure, the signal line driver circuit 104 includes the latch circuit 2701 and the shift register 2702. The latch circuit 2701 is arranged at a more distant location from the pixel portion 106 than the shift register 2702. For effective use of a display panel area, the distance between the signal line driver circuit 104 and the pixel portion 106 is short. Therefore, the opposite electrode 202 which extends out of the pixel portion 106 partially overlaps the shift register 2702. However, the latch circuit 2701 including a current source, a current source circuit, a wire for connecting them, and the like is not overlapped with the opposite electrode 202. Therefore, defective display can be prevented.

Embodiment 1

In the embodiment, a favorable magnitude relation between the line width of a reference connection pad, the line width of a composite connection pad, the connection pitch, the line width of an FPC pad, and the FPC pitch described in Embodiment Mode 1 is explained with reference to FIGS. 35A to 35C.

Figure 35:
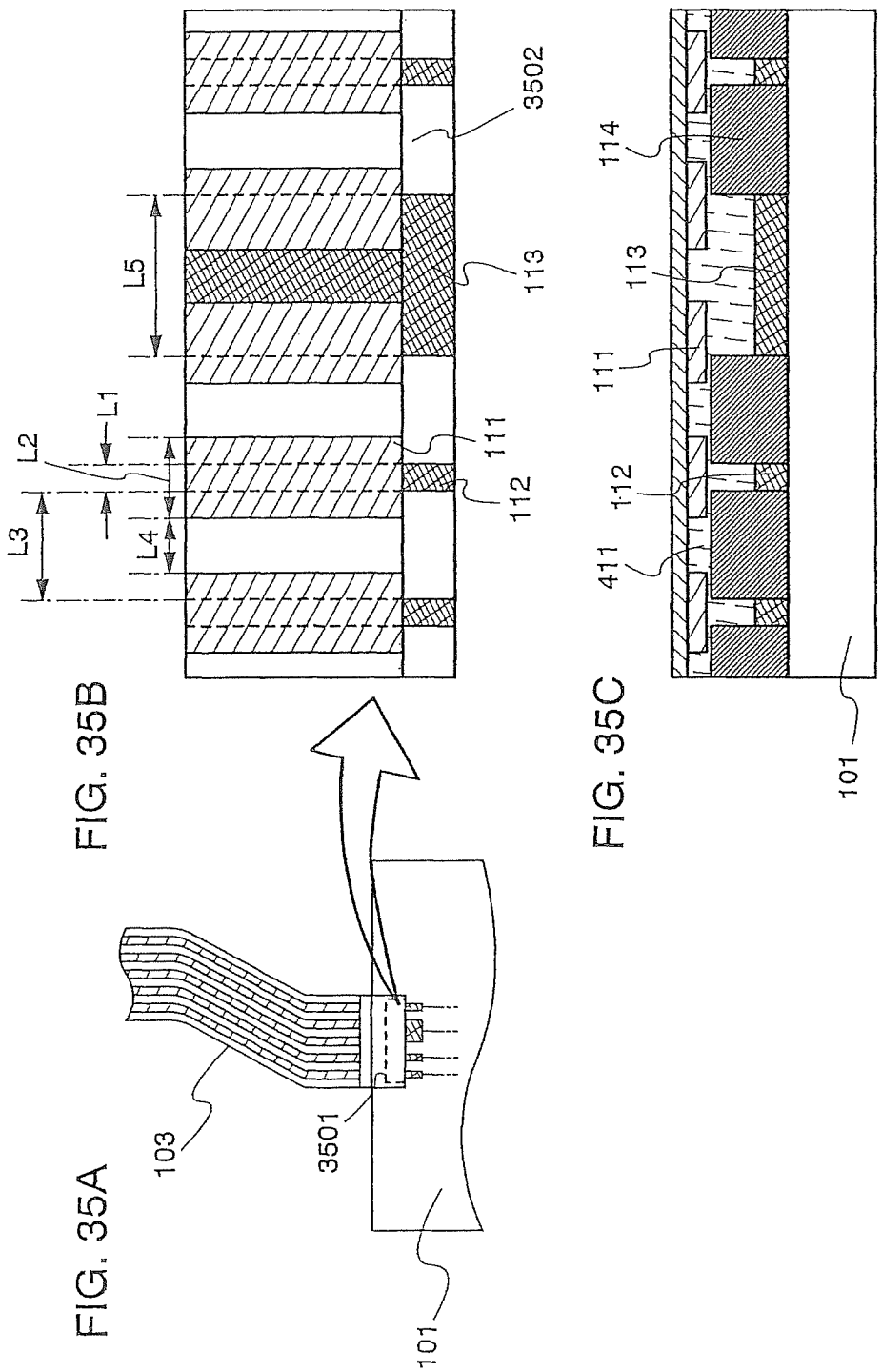
FIGS. 35A to 35C are diagrams explaining a connection terminal portion.

FIG. 35A shows that a substrate 101 provided with a circuit is connected to an FPC 103. A partial enlarged diagram of a region surrounded by a dotted line 3501 is shown in FIG. 35B. In addition, a cross section thereof is shown in FIG. 35C.

First, explanation is made with reference to FIG. 35C. Connection pads (a reference connection pad 112 and a composite connection pad 113) are formed over the substrate 101, and a partition 114 is formed each between the connection pads. The partition 114 has an insulating property and maintains the insulation between the connection pads. The connection pads (the reference connection pad 112 and the composite connection pad 113) are connected to respective corresponding FPC pads 111 through an anisotropic conductive film 411. Note that the structure in the case where the composite connection pad 113 is connected to two ITC pads 111 is described here; however, the invention is not limited thereto. In addition, a conductive particle 421 may be mixed in the anisotropic conductive film 411. According to this, contact resistance can be decreased.

In the case where misalignment in a line width direction of the pad is not caused in attachment of the FPC 103 and the substrate 101, the central axis of the reference connection pad 112 is aligned with the central axis of the FPC pad 111, which is as shown in FIGS. 35B and 35C.

Subsequently, explanation is made with reference to FIG. 35B. A line 3502 indicates an edge of the FPC.

A line width L1 of the reference connection pad 112 is formed to be smaller than a connection pitch L3. A line width L2 of the FPC pad 111 is formed to be larger than an FPC pitch L4. Furthermore, the line width L1 of the reference connection pad 112 is formed to be smaller than the line width L2 of the FPC pad 111. In other words, by forming each pad to satisfy the conditions L1<L3, L2>L4, and L1<L2, electrical connection between corresponding pads is allowed and generation of a short circuit with an adjacent pad can be reduced, even if slight misalignment in a line width direction of the pad is caused in attachment of the FPC 103 and the substrate 101.

Furthermore, according to this structure, a line width L5 of the composite connection pad 113 is approximately equal to the total of the line width L2 of the PFC pad 111, the line width L1 of the reference connection pad 112, and the FPC pitch L4. In other words, L5=L2+L1+L4 is satisfied. In addition, the line width of a connection region between the composite connection pad 113 and two FPC pads 111 is L2+L1. Then, L2 is larger than L1; therefore, the connection area between the composite connection pad 113 and the two FPC pads 111 is twice or more the connection area between the reference connection pad 112 and the FPC pad 111. Accordingly, contact resistance of the composite connection pad 113 can be decreased drastically. Note that, also in the case of connecting the composite connection pad 113 to three or more FPC pads 111, a connection area is drastically enlarged in the same manner; thus, contact resistance can be decreased.

Embodiment 2

In this embodiment, a structure of a display panel in the case of using a light emitting element as a display element is explained.

In this embodiment, a display panel applicable to a display device of the present invention is explained with reference to FIGS. 66A and 66B. Note that FIG. 66A is a top view showing a display panel, and FIG. 66B is a cross-sectional view of FIG. 66A taken along line a-a'. The display panel includes a signal line driver circuit 6601, a pixel portion 6602, a second scan line driver circuit 6603, and a first scan line driver circuit 6606 which are indicated by dotted lines. It also includes a sealing substrate 6604 and a sealant 6605, and a portion surrounded by the sealant 6605 is a space 6607.

Note that a wire 6608 is a wire for transmitting a signal to be inputted to the second scan line driver circuit 6603, the first scan line driver circuit 6606, and the signal line driver circuit 6601 and receives a video signal, a clock signal, a start signal, and the like through an FPC (flexible printed circuit) 6609 that serves as an external input terminal. An IC chip (a semiconductor chip provided with a memory circuit, a buffer circuit, or the like) 6619 is mounted by COG (Chip On Glass) or the like at the junction of the FPC 6609 and the display panel. Note that only the FPC is shown here; however, a printed wiring board (PWB) may be attached to the FPC. The display device in this specification includes not only a display panel itself but also a display panel with an FPC or a PWB attached thereto. In addition, it also includes a display panel on which an IC chip or the like is mounted.

Next, a cross-sectional structure is explained with reference to FIG. 66B. The pixel portion 6602 and its peripheral driver circuits (the second scan line driver circuit 6603, the first scan line driver circuit 6606, and the signal line driver circuit 6601) are formed over a substrate 6610; here, the signal line driver circuit 6601 and the pixel portion 6602 are shown.

Note that as the signal line driver circuit 6601, a CMOS circuit is formed using an n-channel TFT 6620 and a p-channel TET 6621. In this embodiment, the display panel in which the peripheral driver circuits are integrated over the substrate is described; however, the invention is not limited to this. All or part of the peripheral driver circuits may be formed on an IC chip or the like and mounted by COG or the like.

The pixel portion 6602 includes a plurality of circuits each forming a pixel which includes a TFT 6611 and a TFT 6612. Note that a source electrode of the TFT 6612 is connected to a first electrode 6613. An insulator 6614 is formed to cover end portions of the first electrode 6613. Here, a positive type photosensitive acrylic resin film is used.

The insulator 6614 is formed to have a curved surface with a curvature at an upper end portion or a lower end portion thereof in order to make the coverage favorable. For example, in the case of using positive type photosensitive acrylic as a material of the insulator 6614, the insulator 6614 is preferably formed to have a curved surface with a curvature radius (0.2 μm to 3 μm) only at the upper end portion. Either a negative type which becomes insoluble in an etchant by light irradiation or a positive type which becomes soluble in an etchant by light irradiation can be used as the insulator 6614.

A layer 6616 containing an organic compound and a second electrode 6617 are formed over the first electrode 6613. Here, a material having a high work function is preferably used as a material used for the first electrode 6613 which functions as an anode. For example, the first electrode 6613 can be formed using a single-layer film such as an ITO (indium tin oxide) film, an indium zinc oxide film (IZO) film, a titanium nitride film, a chromium film, a tungsten film, a Zn film, or a Pt film; a laminated layer of a titanium nitride film and a film containing aluminum as its main component; a three-layer structure of a titanium nitride film, a film containing aluminum as its main component, and a titanium nitride film; or the like. When the first electrode 6613 has a laminated structure, it can have low resistance as a wire and form a favorable ohmic contact. Further, the first electrode can function as an anode.

In addition, the layer 6616 containing an organic compound is formed by an evaporation method using an evaporation mask or an ink-jet method. A metal complex belonging to Group 4 of the Periodic Table is used for part of the layer 6616 containing an organic compound, and besides, a material which can be used in combination may be either a low molecular material or a high molecular material. In addition, as a material used for the layer containing an organic compound, a single layer or a laminated layer of an organic compound is often used generally. In addition, this embodiment also includes a structure in which an inorganic compound is used for part of the film formed of an organic compound. Moreover, a known triplet material can also be used.

As a material used for the second electrode (cathode) 6617 which is formed over the layer 6616 containing an organic compound, a material having a low work function (Al, Ag, Li, Ca, or an alloy thereof such as MgAg, MgIn, AlLi, $CaF_2$, or $Ca_3N_2$) may be used. In the case where light generated in the layer 6616 containing an organic compound is transmitted through the second electrode 6617, a laminated layer of a metal thin film with a thin thickness and a transparent conductive film (an alloy of indium oxide and tin oxide (ITO), an alloy of indium oxide and zinc oxide ($In_2O_3$—ZnO), zinc oxide (ZnO), or the like) is preferably used as the second electrode (cathode) 6617.

By attaching the sealing substrate 6604 to the substrate 6610 with the sealant 6605, a structure is obtained in which a light emitting element 6618 is provided in the space 6607 surrounded by the substrate 6610, the sealing substrate 6604, and the sealant 6605. Note that there is also a case where the space 6607 is filled with the sealant 6605 as well as an inert gas (such as nitrogen or argon).

Note that an epoxy-based resin is preferably used as the sealant 6605. The material preferably allows as little moisture and oxygen as possible to penetrate. As the sealing substrate 6604, a plastic substrate formed of FRP (Fiberglass-Reinforced Plastics), PVF (polyvinyl fluoride), Myler, polyester, acrylic, or the like can be used besides a glass substrate or a quartz substrate.

The display panel can be obtained as described above.

Figure 72A:
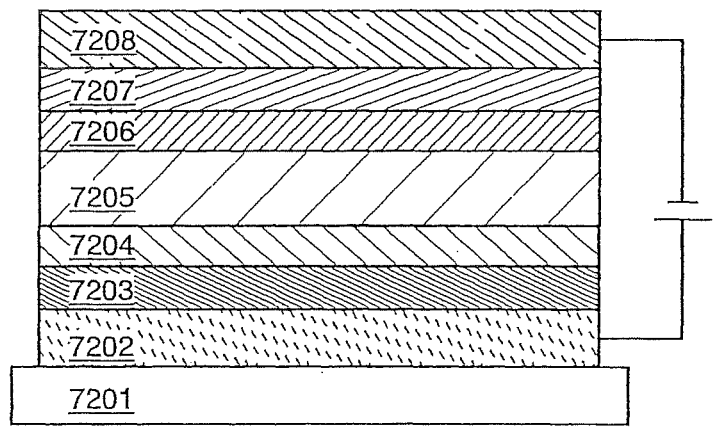
FIGS. 72A and 72B are diagrams showing a light emitting element.
Figure 72B:
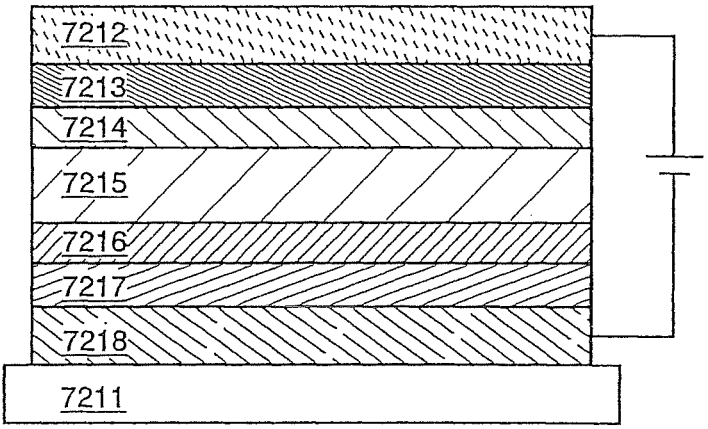

Furthermore, an example of an EL element applicable to the light emitting element 6618 is shown in FIGS. 72A and 72B.

The EL element has an element structure in which an anode 7202, a hole injecting layer 7203 formed of a hole injecting material, a hole transporting layer 7204 formed of a hole transporting material, a light emitting layer 7205, an electron transporting layer 7206 formed of an electron transporting material, an electron injecting layer 7207 formed of an electron injecting material, and a cathode 7208 are laminated over a substrate 7201. Here, the light emitting layer 7205 may be formed of only one kind of a light emitting material; however, it may be formed of two or more kinds of materials. In addition, an element structure of the invention is not limited to this structure.

In addition to the laminated structure of respective functional layers shown in FIG. 72A, there is a wide range of variation in element structure, such as an element using a high molecular compound or a high-efficiency element in which a light emitting layer is formed using a triplet light emitting material that emits light from a triplet excited state. In addition, the element structure of the invention is also applicable to a white display element realized by controlling a carrier recombination region with a hole blocking layer to divide a light emitting region into two regions, or the like.

In a manufacturing method of the element of the invention shown in FIG. 72A, a hole injecting material, a hole transporting material, and a light emitting material are evaporated in this order over the substrate 7201 provided with the anode 7202. Then, an electron transporting material and an electron injecting material are evaporated, and the cathode 7208 is lastly formed by evaporation.

Suitable materials for the hole injecting material, the hole transporting material, the electron transporting material, the electron injecting material, and the light emitting material are listed below.

As the hole injecting material, a porphyrin compound, phthalocyanine (hereinafter referred to as "$H_2Pc$"), copper phthalocyanine (hereinafter referred to as "CuPc"), or the like is effective among organic compounds. In addition, a material which has a smaller value of an ionization potential than that of the hole transporting material to be used and has a hole transporting function can also be used as the hole injecting material. There is also a chemically-doped conductive high molecular compound, which includes polyethylenedioxythiophene (hereinafter referred to as "PEDOT") doped with polystyrene sulfonate (hereinafter referred to as "PSS"), polyaniline, and the like. In addition, an insulating high molecular compound is also effective in planarization of the anode, and polyimide (hereinafter referred to as "PI") is often used. Further, an inorganic compound is also used, which includes an ultrathin film of aluminum oxide (hereinafter referred to as "alumina") as well as a thin film of metal such as gold or platinum.

A material that is most widely used as the hole transporting material is an aromatic amine-based compound (in other words, a compound having a bond of benzene ring-nitrogen). A widely-used material includes 4,4'-bis(diphenylamino)-biphenyl (hereinafter referred to as "TAD"), a derivative thereof such as 4,4'-bis[N-(3-methylphenyl)-N-phenyl-amino]-biphenyl (hereinafter referred to as or 4,4'-bis[N-(1-naphthyl)-N-phenyl-amino]-biphenyl (hereinafter referred to as "α-NPD"), and besides, a star burst aromatic amine compound such as 4,4',4"-tris(N,N-diphenyl-amino)-triphenylamine (hereinafter referred to as "TDATA") or 4,4',4"-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as $Alq_3$, BAlq, tris(4-methyl-8-quinolinolato)aluminum (hereinafter referred to as "Almq"), or bis(10-hydroxybenzo[h]-quinolinato)beryllium (hereinafter referred to as "Bebq"), and besides, a metal complex having an oxazole-based or a triazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, other than the metal complex, an oxadiazole derivative such as 2-(4-biphenylyl)-5-(4-tert-butylphenyl)-1,3,4-oxadiazole (hereinafter referred to as "PBD") or OXD-7, a triazole derivative such as TAZ or 3-(4-tert-butylphenyl)-4-(4-ethylphenyl)-5-(4-biphenylyl)-1,2,4-triazole (hereinafter referred to as "p-EtTAZ"), and a phenanthroline derivative such as bathophenanthroline (hereinafter referred to as "BPhen") or BCP have an electron transporting property.

As the electron injecting material, the above-described electron transporting materials can be used. In addition, an ultrathin film of an insulator such as metal halide including calcium fluoride, lithium fluoride, cesium fluoride, and the like, or alkali metal oxide including lithium oxide, and the like is often used. Further, an alkali metal complex such as lithium acetyl acetonate (hereinafter referred to as "Li(acac)") or 8-quinolinolato-lithium (hereinafter referred to as "Liq") is also effective.

As the light emitting material, other than the above-described metal complex such as $Alq_3$, Almq, BeBq, BAlq, $Zn(BOX)_2$, or $Zn(BTZ)_2$, various fluorescent pigments are effective. The fluorescent pigments include 4,4'-bis(2,2-diphenyl-vinyl)-biphenyl which is blue, 4-(dicyanomethylene)-2-methyl-6-(p-dimethylaminostyryl)-4H-pyran which is red-orange, and the like. In addition, a triplet light emitting material is also possible, which is mainly a complex with platinum or iridium as central metal. As the triplet light emitting material, tris(2-phenylpyridine)iridium, bis(2-(4'-tryl)pyridinato-N,$C^2$)acetylacetonato iridium (hereinafter referred to as "acacIr(tpy)$_2$"), 2,3,7,8,12,13,17,18-octaethyl-21H,23H-porphyrin-platinum, and the like are known.

By combining the above-described materials that have respective functions, a highly reliable display element can be manufactured.

In addition, a display element having layers laminated in reverse order of that in FIG. 72A can also be used as shown in FIG. 72B. In other words, in an element structure, the cathode 7208, the electron injecting layer 7207 formed of an electron injecting material, the electron transporting layer 7206 formed of an electron transporting material, the light emitting layer 7205, the hole transporting layer 7204 formed of a hole transporting material, the hole injecting layer 7203 formed of a hole injecting material, and the anode 7202 are sequentially laminated over the substrate 7201.

In addition, in order to extract light emission of a light emitting element, at least one of the anode and the cathode may be transparent. Then, a TFT and a display element are formed over a substrate. There are light emitting elements having a top emission structure in which light emission is extracted through the surface opposite to the substrate, having a bottom emission structure in which light emission is extracted through the surface on the substrate side, and having a dual emission structure in which light emission is extracted through the surface opposite to the substrate and the surface on the substrate side. The pixel configuration of the invention can be applied to a display element having any of the emission structures.

Figure 73A:
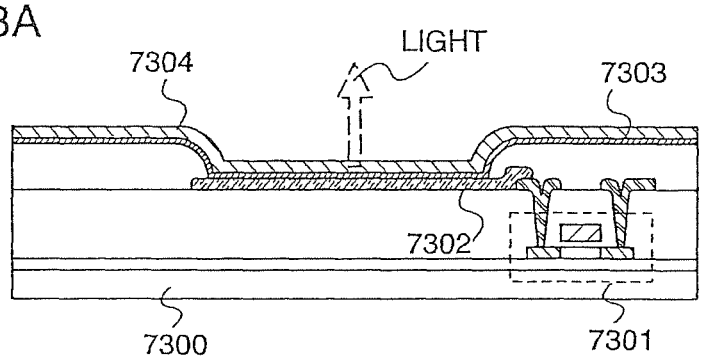
FIGS. 73A to 73C are cross-sectional views of a display device.

A light emitting element having the top emission structure is described with reference to FIG. 73A.

Over a substrate 7300, a TFT 7301 is formed, and a first electrode 7302 is formed in contact with a source electrode of the TFT 7301. A layer 7303 containing an organic compound and a second electrode 7304 are formed thereover.

Note that the first electrode 7302 is an anode of the light emitting element, and the second electrode 7304 is a cathode of the light emitting element. In other words, the light emitting element is formed in a region where the layer 7303 containing an organic compound is sandwiched between the first electrode 7302 and the second electrode 7304.

Here, the first electrode 7302 which functions as an anode is preferably formed using a material having a high work function. For example, a single-layer film such as a titanium nitride film, a chromium film, a tungsten film, a Zn film, or a Pt film, a laminated layer of a titanium nitride film and a film containing aluminum as its main component, or a three-layer structure of a titanium nitride film, a film containing aluminum as its main component, and a titanium nitride film, or the like can be used. Note that when the first electrode 7302 has a laminated structure, it can have low resistance as a wire, form a good ohmic contact, and function as an anode. By using a light-reflective metal film, an anode which does not transmit light can be formed.

The second electrode 7304 which functions as a cathode is preferably formed using a laminated layer of a metal thin film formed of a material having a low work function (Al, Ag, Li, Ca, or an alloy thereof such as MgAg, MgIn, AlLi, $CaF_2$, or $Ca_3N_2$) and a transparent conductive film (indium tin oxide (ITO), indium zinc oxide (IZO), zinc oxide (ZnO), or the like). By using the thin metal film and the transparent conductive film as described above, a cathode which can transmit light can be formed.

Thus, light of the light emitting element can be extracted from a top surface as indicated by an arrow in EEG. 73A. In other words, in the case of applying the light emitting element to the display panel shown in FIGS. 71A and 71B, light is emitted toward the substrate 7145 side. Therefore, when a light emitting element having a top emission structure is used for the display device, a substrate which transmits light is used as the substrate 7145.

In addition, in the case of providing an optical film, the optical film may be provided over the substrate 7145.

Note that the first electrode 7302 can be formed using a metal film formed of a material having a low work function such as MgAg, MgIn, or AlLi to function as a cathode in the case of the pixel structure described in Embodiment Mode 7. In this case, the second electrode 7304 can be formed using a transparent conductive film such as an indium tin oxide (ITO) film or an indium zinc oxide (IZO) film. Consequently, with this structure, the transmittance of the top emission can be improved.

A light emitting element having the bottom emission structure is described with reference to FIG. 73B. Description is made using the same reference numerals as those in FIG. 73A since a structure except for its emission structure is identical.

Here, the first electrode 7302 which functions as an anode is preferably formed using a material having a high work function. For example, a transparent conductive film such as an indium tin oxide (ITO) film or an indium zinc oxide (IZO) film can be used. By using a transparent conductive film, an anode which can transmit light can be formed.

The second electrode 7304 which functions as a cathode can be formed using a metal film formed of a material having a low work function (Al, Ag, Li, Ca, or an alloy thereof such as MgAg, MgIn, AlLi, $CaF_2$, or $Ca_3N_2$). By using a light-reflective metal film as described above, a cathode which does not transmit light can be formed.

Figure 73B:
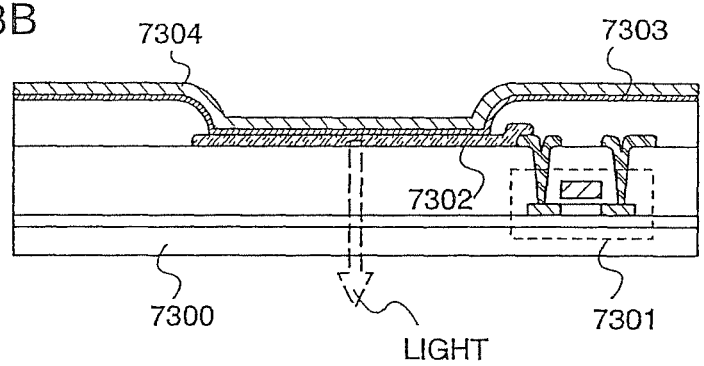

Thus, light of the light emitting element can be extracted from a bottom surface as indicated by an arrow in FIG. 73B. In other words, in the case of applying the light emitting element to the display panel shown in FIGS. 71A and 71B, light is emitted toward the substrate 7100 side. Therefore, when the light emitting element having a bottom emission structure is used for the display device, a substrate which transmits light is used as the substrate 7100.

In addition, in the case of providing an optical film, the optical film may be provided over the substrate 7100.

A light emitting element having the dual emission structure is explained with reference to FIG. 73C. Description is made using the same reference numerals as those in FIG. 73A since a structure except for its emission structure is identical.

Here, the first electrode 7302 which functions as an anode is preferably formed using a material having a high work function. For example, a transparent conductive film such as an indium tin oxide (ITO) film or an indium zinc oxide (IZO) film can be used. By using a transparent conductive film, an anode which can transmit light can be formed.

The second electrode 7304 which functions as a cathode is preferably formed using a laminated layer of a metal thin film formed of a material having a low work function (Al, Ag, Li, Ca, or an alloy thereof such as MgAg, MgIn, AlLi, CaF$_2$, or Ca$_3$N$_2$) and a transparent conductive film (indium tin oxide (ITO), an alloy of indium oxide and zinc oxide (In$_2$O$_3$—ZnO), zinc oxide (ZnO), or the like). By using the thin metal film and the transparent conductive film as described above, a cathode which can transmit light can be formed.

Figure 73C:
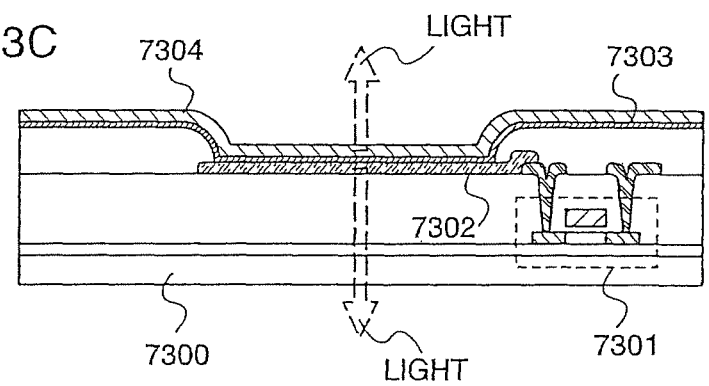

Thus, light of the light emitting element can be extracted from both surfaces as indicated by arrows in FIG. 73C. In other words, in the case of applying the light emitting element to the display panel shown in FIGS. 71A and 71B, light is emitted toward the substrate 7100 side and the substrate 7145 side. Therefore, when the light emitting element having a dual emission structure is used for the display device, substrates which transmit light are used as both the substrate 7100 and the substrate 7145.

In addition, in the case of providing an optical film, the optical film may be provided over both the substrate 7100 and the substrate 7145.

In addition, the invention can be applied to a display device which achieves full-color display by using a white light emitting element and a color filter.

Figure 74:
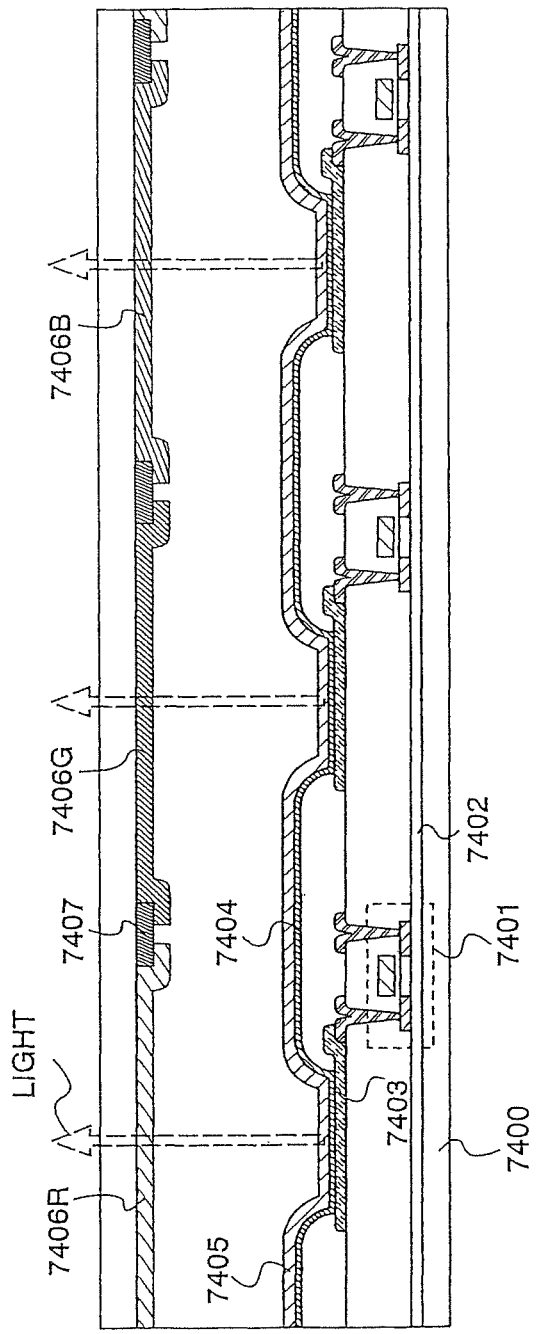
FIG. 74 is a cross-sectional view of a display device.

As shown in FIG. 74, a TFT 7401 is formed over a substrate 7400, and a first electrode 7403 is formed in contact with a source electrode of the TFT 7401. A layer 7404 containing an organic compound and a second electrode 7405 are formed thereover.

Note that the first electrode 7403 is an anode of the light emitting element, and the second electrode 7405 is a cathode of the light emitting element. In other words, the light emitting element is formed in a region where the layer 7404 containing an organic compound is sandwiched between the first electrode 7403 and the second electrode 7405. White light is emitted with the structure shown in FIG. 74. A red color filter 7406R, a green color filter 7406G, and a blue color filter 7406B are provided above the light emitting elements respectively to achieve full-color display. In addition, a black matrix (also referred to as a "BM") 7407 which separates these color filters is provided.

The above-described structures of the light emitting element can be used in combination and can be appropriately applied to the display panel of the invention. Note that the light emitting elements described above are merely examples, and a display device having another structure can also be applied.

Embodiment 3

A display panel of the present invention can be applied to various electronic devices. Specifically, it can be applied to a display portion of an electronic device. Examples of such an electronic device are as follows: a camera such as a video camera or a digital camera, a goggle type display (a head-mounted display), a navigation system, a sound reproducing device (such as a car audio or an audio component), a computer, a game machine, a portable information terminal (such as a mobile computer, a mobile phone, a portable game machine, or an electronic book), an image reproducing device provided with a recording medium reading portion (specifically, a device which can reproduce a recording medium such as a digital versatile disc (DVD) and includes a light emitting device capable of displaying images thereof), and the like.

Figure 65A:
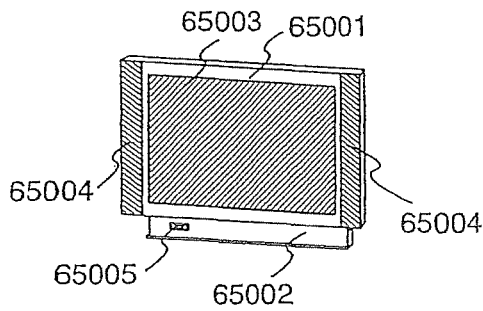
FIGS. 65A to 65H show an example of an electronic device.

FIG. 65A shows a light emitting device, which includes a chassis 65001, a support 65002, a display portion 65003, a speaker portion 65004, a video input terminal 65005, and the like. The display device of the present invention can be used for the display portion 65003. Note that the light emitting device includes in its category all light emitting devices used for displaying information, for example, for a personal computer, for TV broadcast reception, or for advertisement display. The light emitting device using the display panel of the present invention for the display portion 65003 can prevent defective display.

Figure 65B:
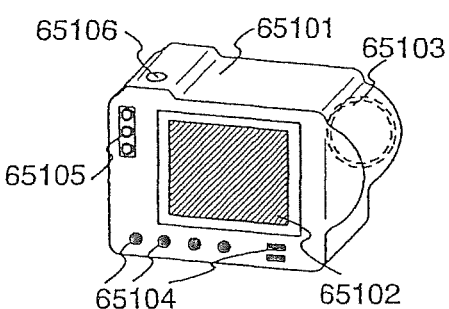

FIG. 65B shows a camera, which includes a main body 65101, a display portion 65102, an image receiving portion 65013, an operation key 65104, an external connection port 65105, a shutter 65106, and the like.

The camera using the display panel of the present invention for the display portion 65102 can prevent defective display.

Figure 65C:
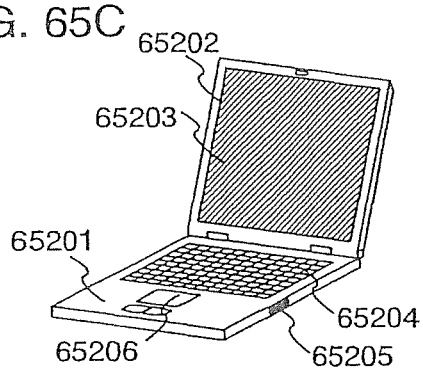

FIG. 65C shows a computer, which includes a main body 65201, a chassis 65202, a display portion 65203, a keyboard 65204, an external connection port 65205, a pointing mouse 65206, and the like. The computer using the display panel of the present invention for the display portion 65203 can prevent defective display.

Figure 65D:
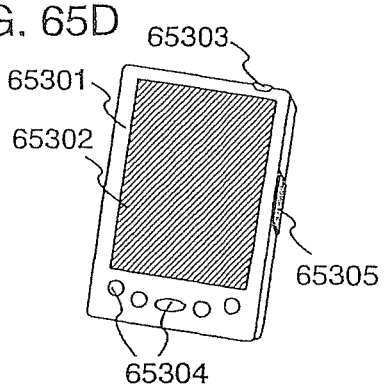

FIG. 65D shows a mobile computer, which includes a main body 65301, a display portion 65302, a switch 65303, an operation key 65304, an infrared port 65305, and the like. The mobile computer using the display panel of the present invention for the display portion 65302 can prevent defective display.

Figure 65E:
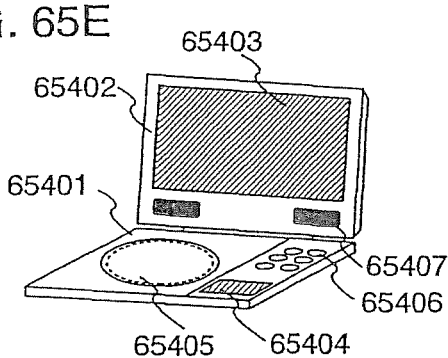

FIG. 65E shows a portable image reproducing device provided with a recording medium reading portion (specifically, a DVD reproducing device), which includes a main body 65401, a chassis 65402, a display portion A 65403, a display portion B 65404, a recording medium (DVD or the like) reading portion 65405, an operation key 65406, a speaker portion 65407, and the like. The display portion A 65403 mainly displays image information, and the display portion B 65404 mainly displays character information. The image reproducing device using the display panel of the present invention for the display portion A 65403 and the display portion B 65404 can prevent defective display.

Figure 65F:
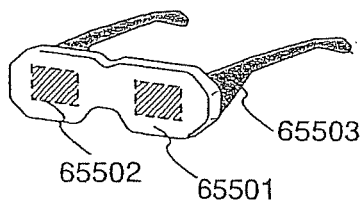

FIG. 65F shows a goggle type display, which includes a main body 65501, a display portion 65502, an arm portion 65503, and the like. The goggle type display using the display panel of the present invention for the display portion 65502 can prevent defective display.

Figure 65G:
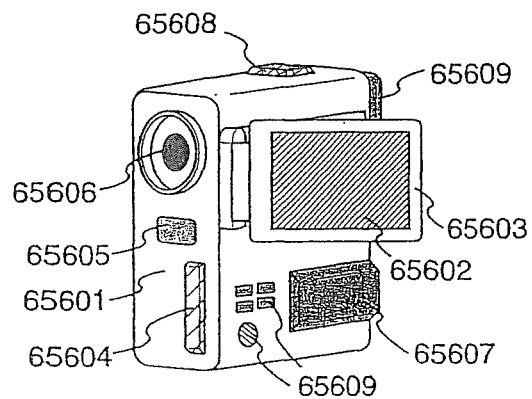

FIG. 65G shows a video camera, which includes a main body 652001, a display portion 652002, a chassis 652003, an external connection port 652004, a remote control receiving portion 652005, an image receiving portion 652006, a battery 652007, an audio input portion 652008, an operation key 652009, and the like. The video camera using the display panel of the present invention for the display portion 652002 can prevent defective display.

Figure 65H:
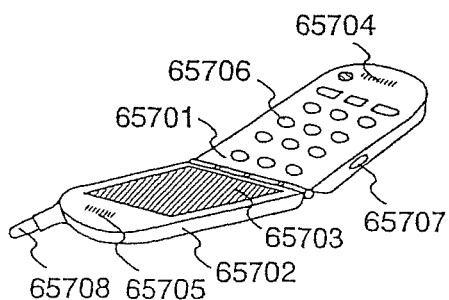

FIG. 65H shows a mobile phone, which includes a main body 65701, a chassis 65702, a display portion 65703, an audio input portion 65704, an audio output portion 65705, an operation key 65706, an external connection port 65707, an antenna 65708, and the like. The mobile phone using the display panel of the present invention for the display portion 65703 can prevent defective display.

As described above, the display panel of the present invention can be applied to all electronic devices.

Embodiment 4

Figure 64:
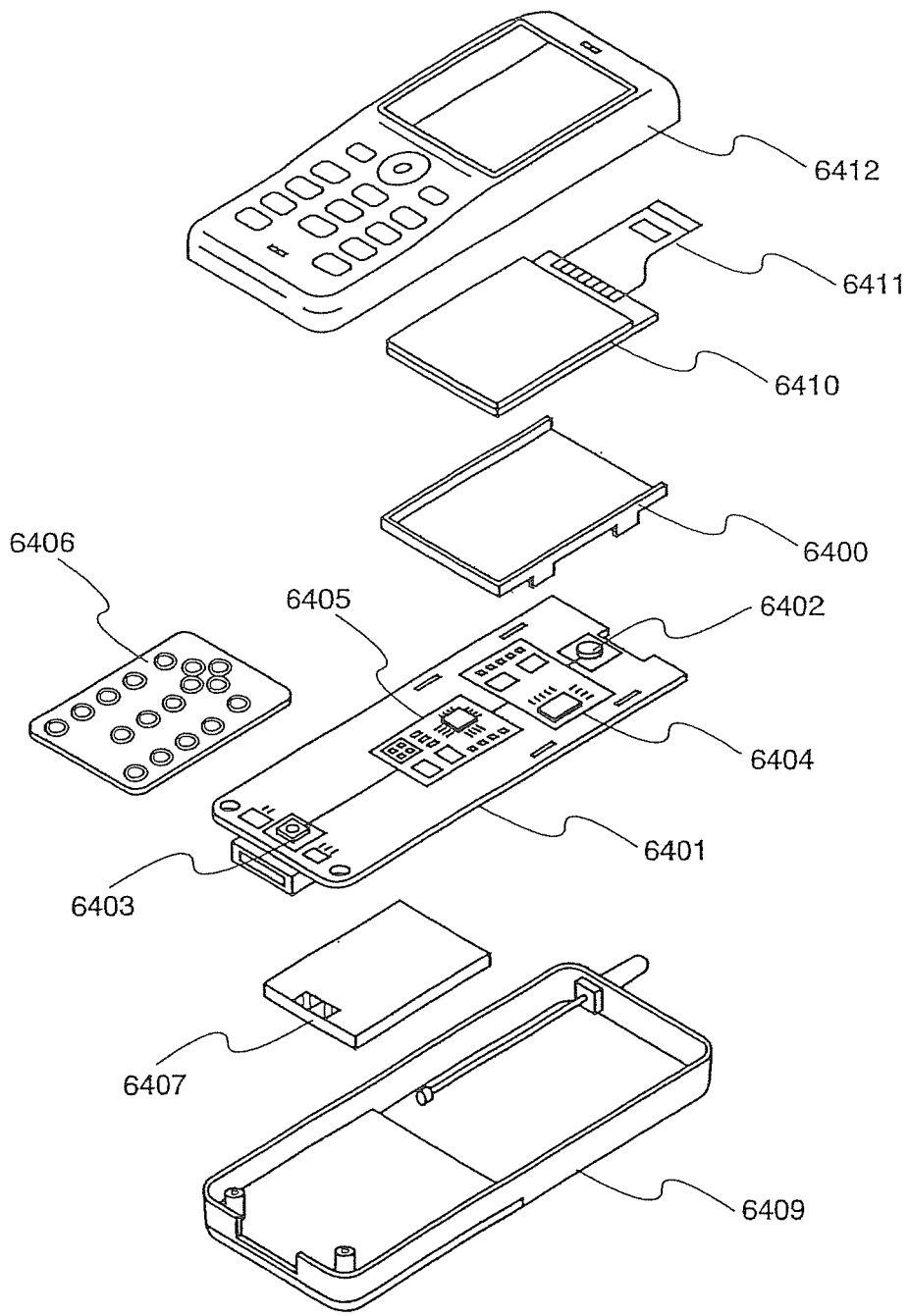
FIG. 64 shows an example of a mobile phone to which the present invention can be applied.

In this embodiment, an example of a structure of a mobile phone which has the display panel of the invention in a display portion is explained with reference to FIG. 64.

A display panel 6410 is incorporated in a housing 6400 so as to be detachable. The shape and size of the housing 6400 can be appropriately changed in accordance with the size of the display panel 6410. The housing 6400 to which the display panel 6410 is fixed is fitted in a printed circuit board 6401 to be assembled as a module.

The display panel 6410 is connected to the printed circuit board 6401 via an FPC 6411. Over the printed circuit board 6401, a speaker 6402, a microphone 6403, a transmitting and receiving circuit 6404, and a signal processing circuit 6405 including a CPU, a controller, and the like are formed. Such a module, an input means 6406, and a battery 6407 are combined and stored in a chassis 6409. A pixel portion of the display panel 6410 is arranged so as to be seen from a window formed in the chassis 6409.

Note that the structure described in this embodiment is an example of a mobile phone, and the display device of the invention can be applied not only to the mobile phone having the above-described structure but also to mobile phones having various kinds of structures.

Embodiment 5

Figure 62:
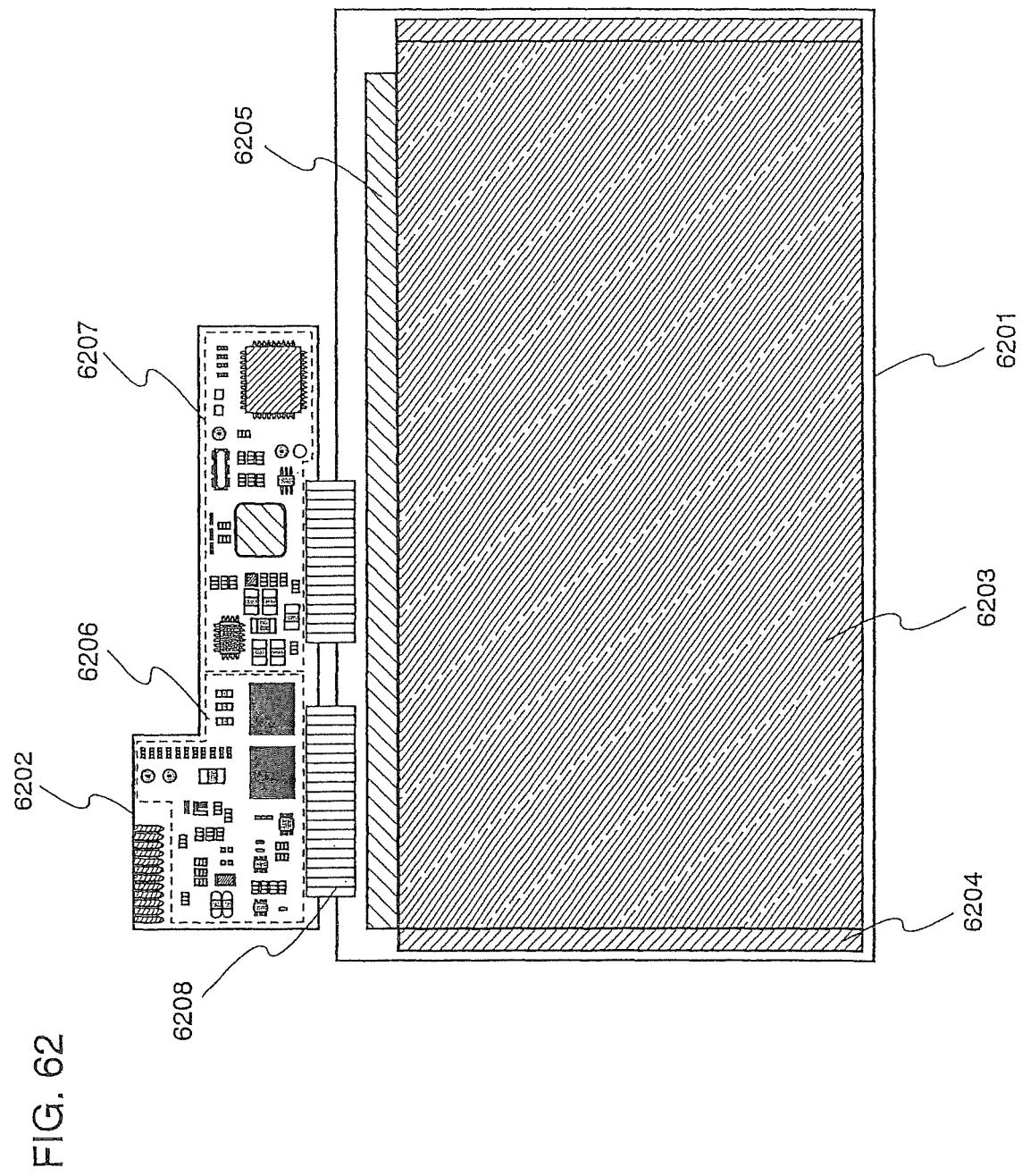
FIG. 62 shows an example of an EL module.

FIG. 62 shows an EL module in which a display panel 6201 and a circuit board 6202 are combined. The display panel 6201 includes a pixel portion 6203, a scan line driver circuit 6204, and a signal line driver circuit 6205. Over the circuit board 6202, for example, a control circuit 6206, a signal dividing circuit 6207, and the like are formed. The display panel 6201 and the circuit board 6202 are connected to each other by a connection wiring 6208. As the connection wiring, an FPC or the like can be used.

Figure 63:
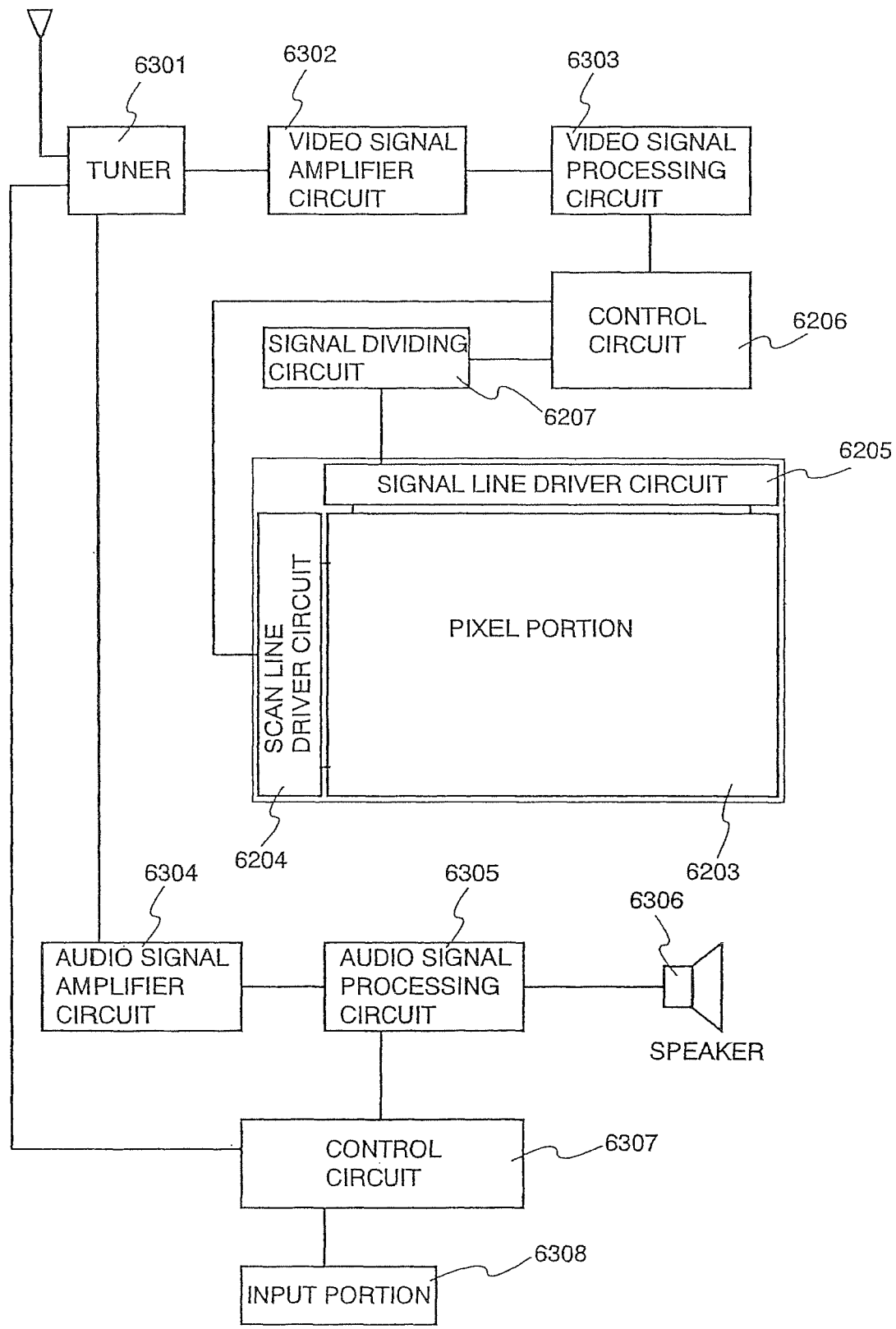
FIG. 63 is a block diagram showing a main structure of an EL television receiver.

An EL television receiver can be completed with this EL module. FIG. 63 is a block diagram showing main constitution of the EL television receiver. A tuner 6301 receives a video signal and an audio signal. The video signal is processed by a video signal amplifier circuit 6302, a video signal processing circuit 6303 for converting a signal output from the video signal amplifier circuit 6302 into a color signal corresponding to each color of red, green and blue, and a control circuit 6206 for converting the video signal into the input specification of a driver circuit. The control circuit 6206 outputs a signal to each of the scan line side and the signal line side. In the case of digital drive, constitution in which the signal dividing circuit 6207 is provided on the signal line side to supply an input digital signal divided into m pieces may be adopted.

An audio signal among signals received by the tuner 6301 is transmitted to an audio signal amplifier circuit 6304, an output of which is supplied to a speaker 6306 through an audio signal processing circuit 6305. A control circuit 6307 receives control information of a receiving station (reception frequency) or sound volume from an input portion 6308 and transmits signals to the tuner 6301 and the audio signal processing circuit 6305.

By incorporating the EL module shown in FIG. 62 into a chassis 65001, a TV receiver can be completed as shown in FIG. 65A. A display portion 65003 is formed with the EL module. In addition, a speaker 65004, a video input terminal 65005, and the like are provided appropriately.

Naturally, the invention is not limited to the TV receiver, and can be applied to various use applications particularly as a large-sized display medium such as an information display board at a train station, an airport, or the like, or an advertisement display board on the street, as well as a monitor of a personal computer.

Embodiment 6

In this embodiment, a favorable structure of a display panel including a composite connection pad in a connection terminal portion is explained.

First, a structure of connection pads (a reference connection pad and a composite connection pad) in a connection terminal portion of a display panel is explained with reference to FIG. 67.

A continuous conductive film is formed over a substrate 6701, the conductive film within a region of the connection terminal portion functions as a connection pad, and the conductive film within a region of a wiring portion functions as a wire. In FIG. 67, a reference connection pad 6703 and a wire 6706 are formed with one continuous conductive film. In addition, a composite connection pad 6704, a wire 6707, and a wire 6708 are formed with one continuous conductive film. Further, a composite connection pad 6705, a wire 6709, a wire 6710, and a wire 6711 are formed with one continuous conductive film.

In a sealing region 6702, an opposite substrate provided opposite to the substrate 6701 is attached with a sealant.

Note that the composite connection pad 6704 is connected to two FPC pads and the composite connection pad 6705 is connected to three FPC pads.

Here, the line width of the reference connection pad 6703 is denoted by W, the line width of the composite connection pad 6704 is denoted by W', and the line width of the composite connection pad 6705 is denoted by W". In addition, the distance between line-width centers of adjacent reference connection pads is denoted by L.

Here, the distance between the line-width center of the composite connection pad 6704 and the line-width center of the reference connection pad is 1.5 times of L, and the distance between the line-width center of the composite connection pad 6705 and the line-width center of the reference connection pad is twice of L. Therefore, an FPC terminal array does not need to be changed, and an FPC can be used without any change in the specification.

Note that the line-width W' of the composite connection pad 6704 is preferably larger than the distance L between the line-width centers of adjacent reference connection pads. In addition, the line-width W" of the composite connection pad 6705 is preferably more than twice as large as L. This can decrease the contact resistance between the connection pad and the FPC pad.

Subsequently, the role of a plurality of wires electrically connected to a composite connection pad in a display panel is explained.

Figure 67:
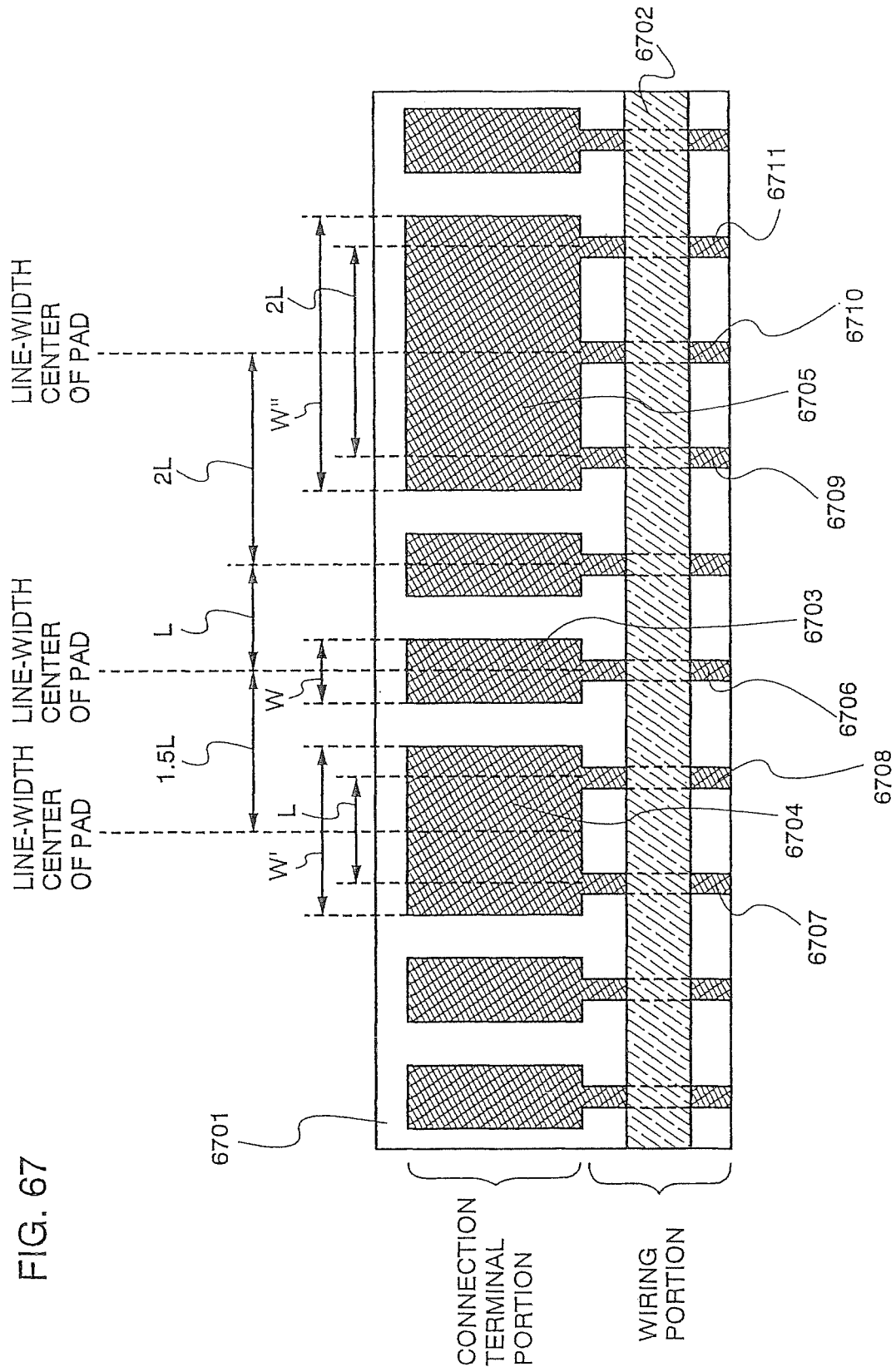
FIG. 67 is a diagram explaining a connection terminal portion.

In a display panel including, for example, two scan line driver circuits, a wire 6707 in FIG. 67 is electrically connected to one of the scan line driver circuits, and a wire 6708 in FIG. 67 is electrically connected to the other scan line driver circuit. In other words, respective wires for supplying common signals or common power to two scan line driver circuits are electrically connected to one connection pad. Thus, malfunctions of two scan line driver circuits can be prevented.

Figure 68:
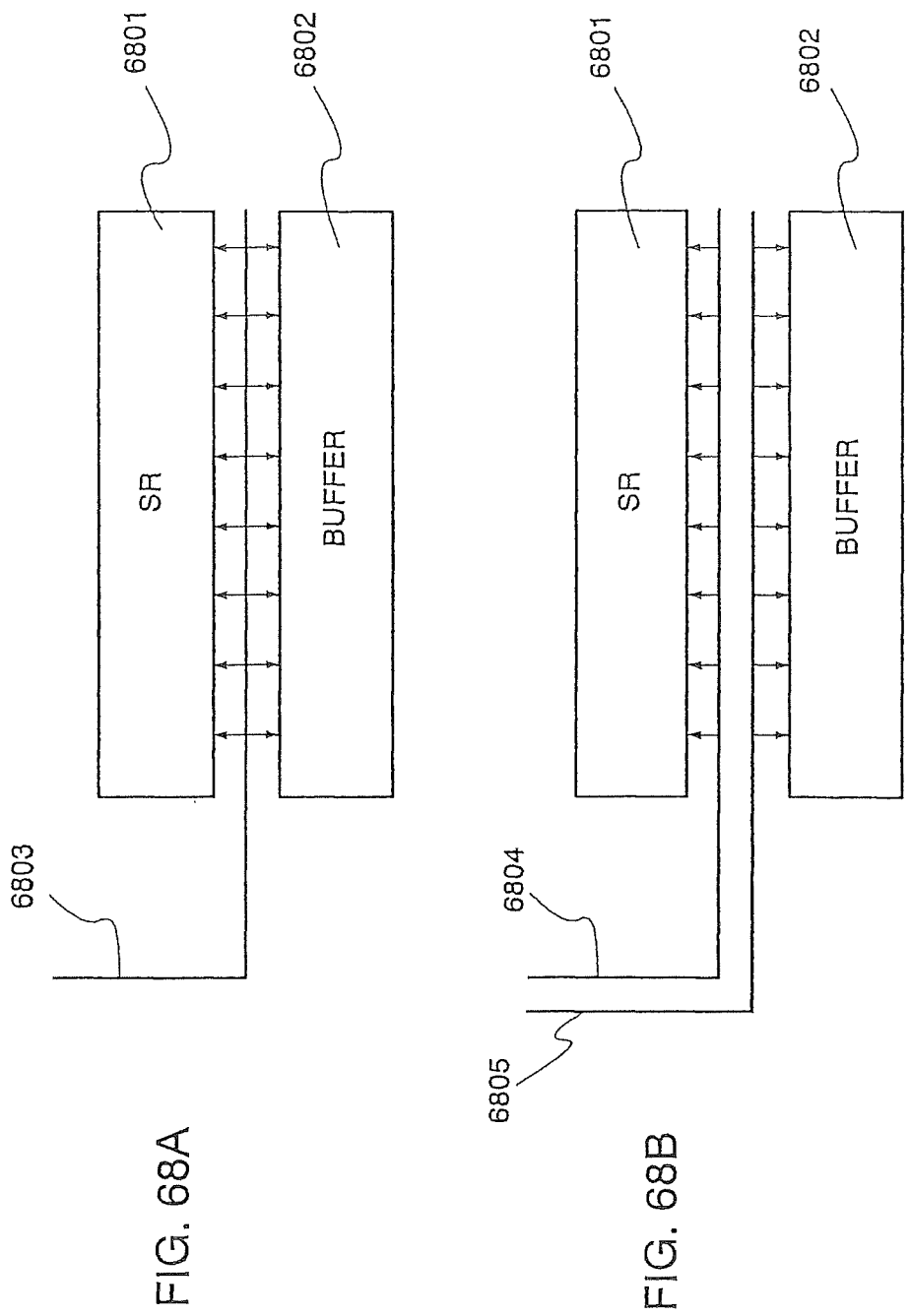
FIGS. 68A and 68B are diagrams explaining power supply to a shift register and a buffer circuit.

As another structure, in a display panel including a pixel portion and a peripheral driver circuit for driving a pixel, in which the peripheral driver circuit includes a shift register and a buffer circuit, the wire 6707 in FIG. 67 is electrically connected to the shift register and the wire 6708 in FIG. 67 is electrically connected to the buffer circuit. In other words, respective wires for supplying common power to the shift register and the buffer circuit are electrically connected to one connection pad. In other words, as shown in FIG. 68B, a wire 6804 is a wire for supplying power of a shift register 6801 and is electrically connected to the wire 6707 in FIG. 67. In addition, a wire 6805 is a wire for supplying power of a buffer circuit 6802 and is electrically connected to the wire 6708 in FIG. 67. Here, if power is supplied to the shift register 6801 and the buffer circuit 6802 through a wire 6803 as shown in FIG. 68A, a power supply potential of the wire 6803 is decreased when the buffer circuit 6802 is to output a large current. Consequently, the shift register 6801 does not operate normally. Thus, by employing the structure shown in FIG. 68B, a malfunction of the shift register 6801 can be prevented.

As another structure, in a liquid crystal display panel including a liquid crystal element in a pixel, the wire 6707 and the wire 6708 in FIG. 67 are electrically connected to an opposite electrode. In other words, respective wires for supplying a power supply potential serving as a power source to the opposite electrode are electrically connected to one connection pad. Particularly in the liquid crystal display panel, a potential of the opposite electrode is changed in order to achieve longer life of the liquid crystal element by reversing the polarity of a voltage applied to the liquid crystal element. By decreasing the resistance of a power supply line as in this structure, power consumption can be reduced.

As another structure, in an EL display panel having an EL element in a pixel, the wire 6707 and the wire 6708 in FIG. 67 are electrically connected to a power supply line or an opposite electrode. In other words, respective wires for supplying a power supply potential serving as a power source to the opposite electrode or the power supply line are electrically connected to one connection pad. Particularly in the EL display panel, a large amount of current flows to the EL element. Therefore, when the power supply line has high resistance, a desired power supply potential cannot be obtained due to a voltage drop. By decreasing the resistance of the power supply line as in this structure, defective display can be prevented.

As another structure, in a display panel including a light emitting element in a pixel, the wire 6707 in FIG. 67 is electrically connected to an opposite electrode and the wire 6708 in FIG. 67 is electrically connected to a wire (referred to as an auxiliary wire) provided in contact with the opposite electrode. In other words, respective wires for supplying common power to the opposite electrode and the auxiliary wire are electrically connected to one connection pad. Note that a cross-sectional structure of the display panel in this case is explained with reference to FIG. 75.

A base film 7502 is formed over a substrate 7501. An insulating substrate, a metal substrate, a semiconductor substrate, or the like such as a glass substrate, a quartz substrate, a plastic substrate, or a ceramics substrate can be used as the substrate 7501. The base film 7502 can be formed by a CVD method or a sputtering method. For example, a silicon oxide film, a silicon nitride film, a silicon oxynitride film, or the like which is formed by a CVD method using $SiH_4$, $N_2O$, $NH_3$, or the like as a source material can be employed. Alternatively, a laminate thereof may be used. Note that the base film 7502 is provided to prevent an impurity from diffusing into a semiconductor layer from the substrate 7501, and the base film 7502 is not necessarily provided in the case of using a glass substrate or a quartz substrate as the substrate 7501.

An island-shaped semiconductor layer is formed over the base film 7502. In the semiconductor layer, a channel formation region 7505, an impurity region 7506 serving as a source region or a drain region, and a low-concentration impurity region (LDD region) 7507 of a transistor 7503 and a channel formation region 7508, an impurity region 7509 serving as a source region or a drain region, and a low-concentration impurity region (LDD region) 7510 of a transistor 7504 are formed. Then, a gate electrode 7512 and a gate electrode 7513 are formed over the channel formation region 7505 and the channel formation region 7508 with a gate insulating film 7511 therebetween. The gate insulating film 7511 can be formed using a silicon oxide film, a silicon nitride film, a silicon oxynitride film, or the like by a CVD method or a sputtering method. In addition, the gate electrode 7512 and the gate electrode 7513 can be formed using an aluminum (Al) film, a copper (Cu) film, a thin film containing aluminum or copper as its main component, a chromium (Cr) film, a tantalum (Ta) film, a tantalum nitride (TaN) film, a titanium (Ti) film, a tungsten (W) film, a molybdenum (Mo) film, or the like.

A sidewall 7514 is formed on the side of the gate electrode 7512, and a sidewall 7515 is formed on the side of the gate electrode 7513. The sidewall 7514 and the sidewall 7515 can be formed by forming a silicon compound such as a silicon oxide film, a silicon nitride film, or a silicon oxynitride film to cover the gate electrode 7512 and the gate electrode 7513, and then etching back it.

Note that the low-concentration impurity region 7507 and the low-concentration impurity region 7510 are located below the sidewall 7514 and the sidewall 7515, respectively. In other words, the low-concentration impurity region 7507 and the low-concentration impurity region 7510 are formed in a self-aligned manner. Note that the sidewall 7514 and the sidewall 7515 are provided to form the low-concentration impurity region 7507 and the low-concentration impurity region 7510 in a self-aligned manner, and the sidewalls are not necessarily provided.

A first interlayer insulating film is formed over the gate electrode 7512, the gate electrode 7513, the sidewall 7514, the sidewall 7515, and the gate insulating film 7511. The first interlayer insulating film includes an inorganic insulating film 7516 as a lower layer and a resin film 7517 as an upper layer. As the inorganic insulating film 7516, a silicon nitride film, a silicon oxide film, a silicon oxynitride film, or a laminated film thereof can be used. As the resin film 7517, polyimide, polyamide, acrylic, polyimide amide, epoxy, or the like can be used.

A wire 7518, a wire 7519, and a wire 7520 are formed over the first interlayer insulating film, and the wire 7518 is electrically connected to the impurity region 7506 through a contact hole; the wire 7519 is electrically connected to the impurity region 7506 and the impurity region 7509 through contact holes; and the wire 7520 is electrically connected to the impurity region 7509 through a contact hole. The wire 7518, the wire 7519, and the wire 7520 can be formed using a titanium (Ti) film, an aluminum (Al) film, a copper (Cu) film, an aluminum film containing Ti, or the like. Note that in the case where a wire such as a signal line is provided in the same layer as the wire 7518, the wire 7519, and the wire 7520, copper which has low resistance is preferably used.

A second interlayer insulating film 7521 is formed over the wire 7518, the wire 7519, the wire 7520, and the first interlayer insulating film. The second interlayer insulating film 7521 can be formed using an inorganic insulating film, a resin film, or a laminated layer thereof. As the inorganic insulating film, a silicon nitride film, a silicon oxide film, a silicon oxynitride film, or a laminated layer thereof can be used. As the resin film, polyimide, polyamide, acrylic, polyimide amide, epoxy, or the like can be used.

A pixel electrode 7522 and a wire 7523 are formed over the second interlayer insulating film 7521. The pixel electrode 7522 and the wire 7523 are formed from the same material. In other words, they are formed in the same layer simultaneously. A material having a high work function is preferably used for the pixel electrode 7522 and the wire 7523. For example, a single-layer film such as a titanium nitride (TiN) film, a chromium (Cr) film, a tungsten (W) film, a zinc (Zn) film, or a platinum (Pt) film; a laminated layer of a titanium nitride film and a film containing aluminum as its main component; a three-layer structure of a titanium nitride film, a film containing aluminum as its main component, and a titanium nitride film; or the like can be used. When the pixel electrode 7522 and the wire 7523 have laminated structures, they can have low resistance as a wire and form a favorable ohmic contact. Further, the pixel electrode and the wire can function as an anode. By using a light-reflecting metal film, an anode which does not transmit light can be formed.

An insulator 7524 is formed to cover end portions of the pixel electrode 7522 and the wire 7523. For example, a positive type photosensitive acrylic resin film can be used as the insulator 7524.

A layer 7525 containing an organic compound is formed over the pixel electrode 7522, and part of the layer 7525 containing an organic compound overlaps the insulator 7524. Note that the layer 7525 containing an organic compound is not formed over the wire 7523.

An opposite electrode 7526 is formed over the layer 7525 containing an organic compound, the insulator 7524, and the wire 7523. For the opposite electrode 7526, a material having a low work function is preferably used. For example, a metal thin film of aluminum (Al), silver (Ag), lithium (Li), calcium (Ca), an alloy thereof such as MgAg, MgIn, AlLi, $CaF_2$, or $Ca_3N_2$, or the like can be used. By using a thin metal film in this manner, a cathode which can transmit light can be formed.

A light emitting element 7527 is formed in a region where the layer 7525 containing an organic compound is sandwiched between the opposite electrode 7526 and the pixel electrode 7522.

In a region where the layer 7525 containing an organic compound is separated by the insulator 7524, a junction portion 7528 is formed, in which the opposite electrode 7526 and the wire 7523 are in contact with each other. Therefore, the wire 7523 functions as an auxiliary electrode of the opposite electrode 7526, and the resistance of the opposite electrode 7526 can be decreased. Consequently, the thickness of the opposite electrode 7526 can be thinned and the transmission thereof can be increased. Accordingly, in a display panel having a structure in which light obtained from the light emitting element 7527 is extracted from the top surface, higher luminance can be obtained.

Note that the opposite electrode 7526 may be formed using a laminated layer of a thin metal film and a transparent conductive film (indium tin oxide (ITO), indium zinc oxide (IZO), zinc oxide (ZnO), or the like) in order to further decrease the resistance thereof. By using the thin metal film and the transparent conductive film as described above, a cathode which can transmit light can also be formed.

Note that the impurity region 7506 and the impurity region 7509 are doped with an n-type impurity. Therefore, the transistor 7503 and the transistor 7504 are n-channel transistors.

Figure 75:
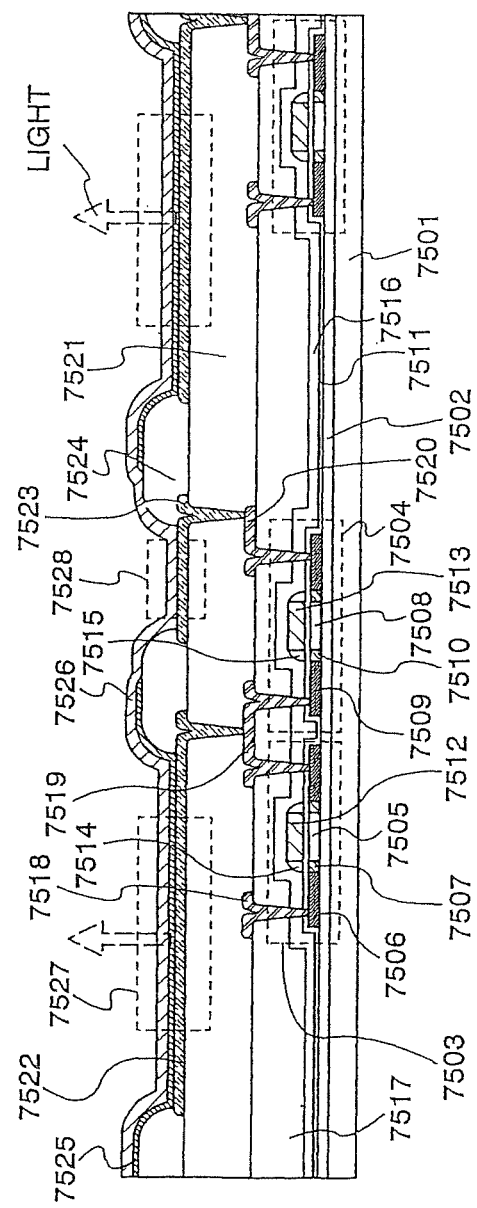
FIG. 75 is a cross-sectional view of a display device.

Note that the display panel explained with FIG. 75, in which the opposite electrode 7526 can be thinned, exhibits a high light-transmitting property with respect to light to be emitted from the top surface. Accordingly, the luminance of the top emission can be increased. In addition, by connecting the wire 7523 to the opposite electrode 7526, the resistance of the opposite electrode 7526 can be decreased. Accordingly, power consumption can be reduced. Note that the wire 7523 is an auxiliary wire.

Next, a structure of a display panel is explained with reference to schematic top views thereof shown in FIGS. 76A and 76B. A signal line driver circuit 7601, a scan line driver circuit 7602, and a pixel portion 7603 are formed over a substrate 7600. Note that the substrate 7600 is connected to an FPC (Flexible Printed Circuit) 7604, and signals such as a video signal, a clock signal, and a start signal to be inputted to the signal line driver circuit 7601 and the scan line driver circuit 7602 are supplied through the FPC 7604. On the junction of the FPC 7604 and the substrate 7600, an IC chip (a semiconductor chip provided with a memory circuit, a buffer circuit, or the like) 7605 is mounted by COG (Chip On Glass) or the like. Although only the FPC 7604 is illustrated here, a printed wiring board (PWB) may be attached to the FPC 7604. The display device in this specification includes not only a main body of a display panel but also a display panel provided with an FPC or a PWB, and besides, a display panel mounted with an IC chip or the like.

Figure 76A:
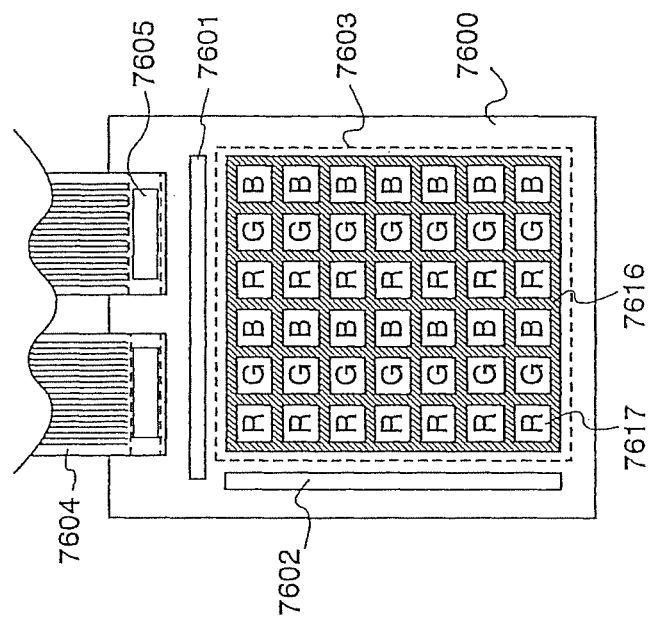
FIGS. 76A and 76B are diagrams showing a display panel of the present invention.

Pixels are arranged in matrix in the pixel portion 7603 of the display panel shown in FIG. 76A to form a pixel column for each color element. A layer 7607 containing an organic compound is provided over pixels of one column for each color. In addition, in the pixel portion, a junction portion of a wire formed of the same material as a pixel electrode and an opposite electrode is formed in a region 7606 other than the region where the layer 7607 containing an organic compound is provided. In other words, the junction portion 7528 shown in the cross-sectional view of FIG. 75 is formed in the region 7606 in FIG. 76B. A schematic top view of the pixel portion is shown in, FIG. 77. In FIG. 77, a wire 7702 is formed of the same material as a pixel electrode 7701. In addition, the pixel electrode 7701 corresponds to the pixel electrode 7522 in FIG. 75 and the wire 7702 corresponds to the wire 7523 in FIG. 75. A layer containing an organic compound is formed over the pixel electrode 7701 of one column, and a light emitting element is formed in a region where the layer containing an organic compound is sandwiched between the pixel electrode 7701 and an opposite electrode. Since the wire 7702 is in contact with the opposite electrode in the junction portion, the resistance of the opposite electrode can be decreased. In other words, the wire 7702 functions as an auxiliary electrode of the opposite electrode. Note that by employing the structure of the pixel portion as shown in FIG. 77, a display panel having a high aperture ratio, in which the resistance of the opposite electrode is decreased, can be provided.

Figure 76B:
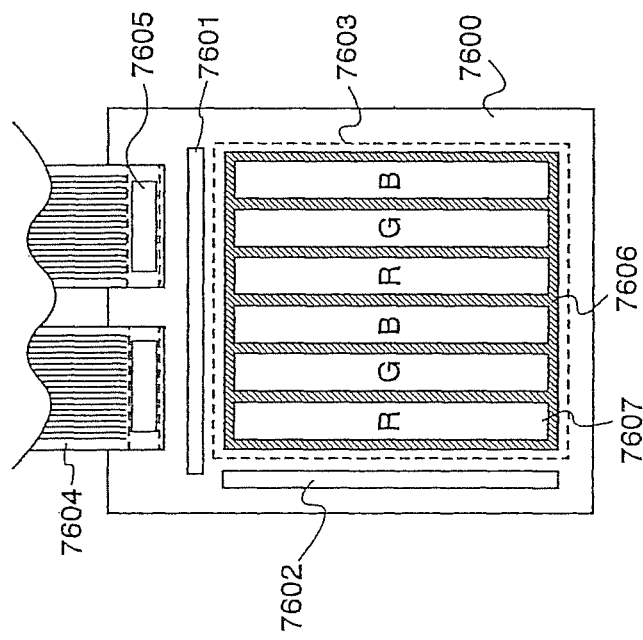
Figure 77:
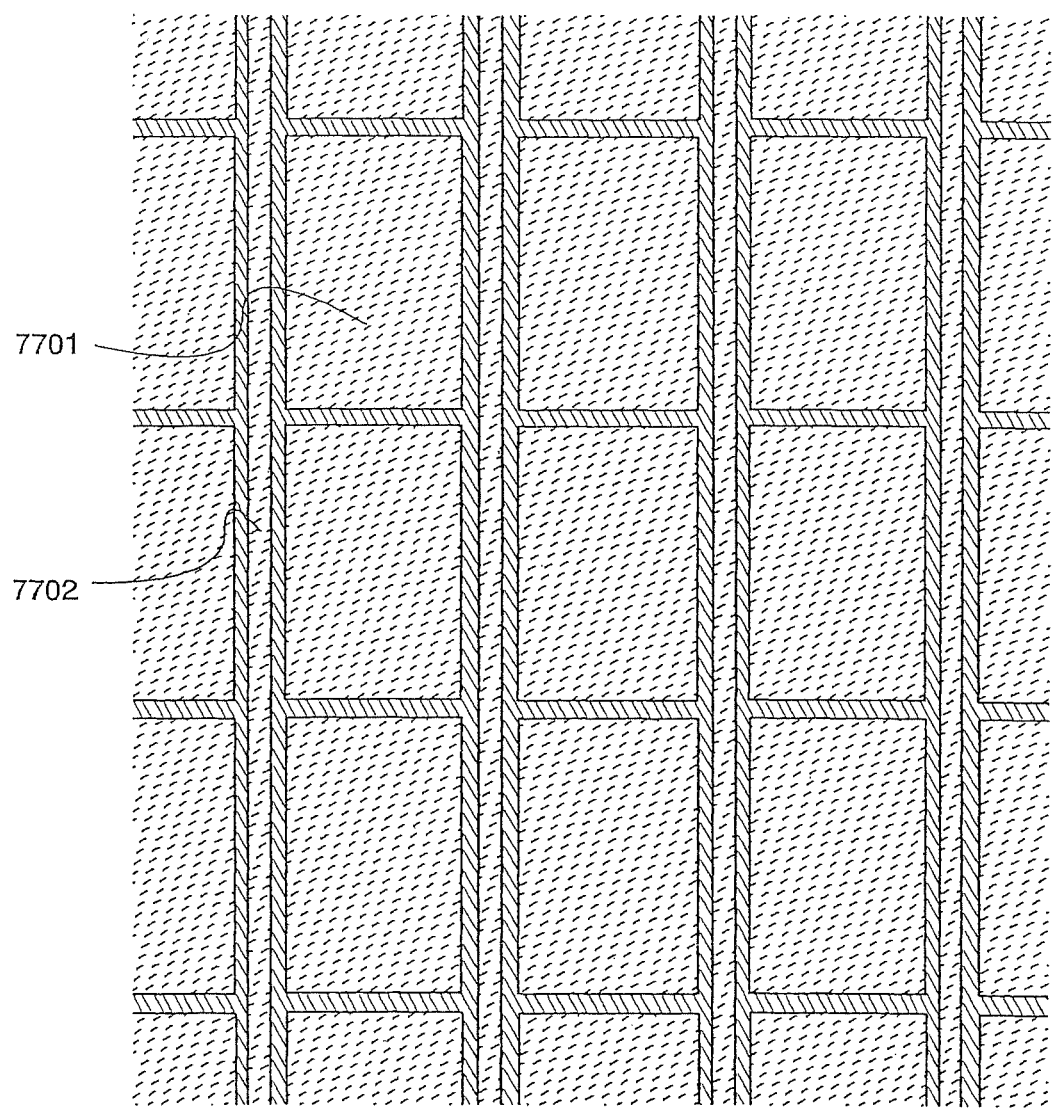
FIG. 77 is a partial enlarged view of a display panel of the present invention.
Figure 78:
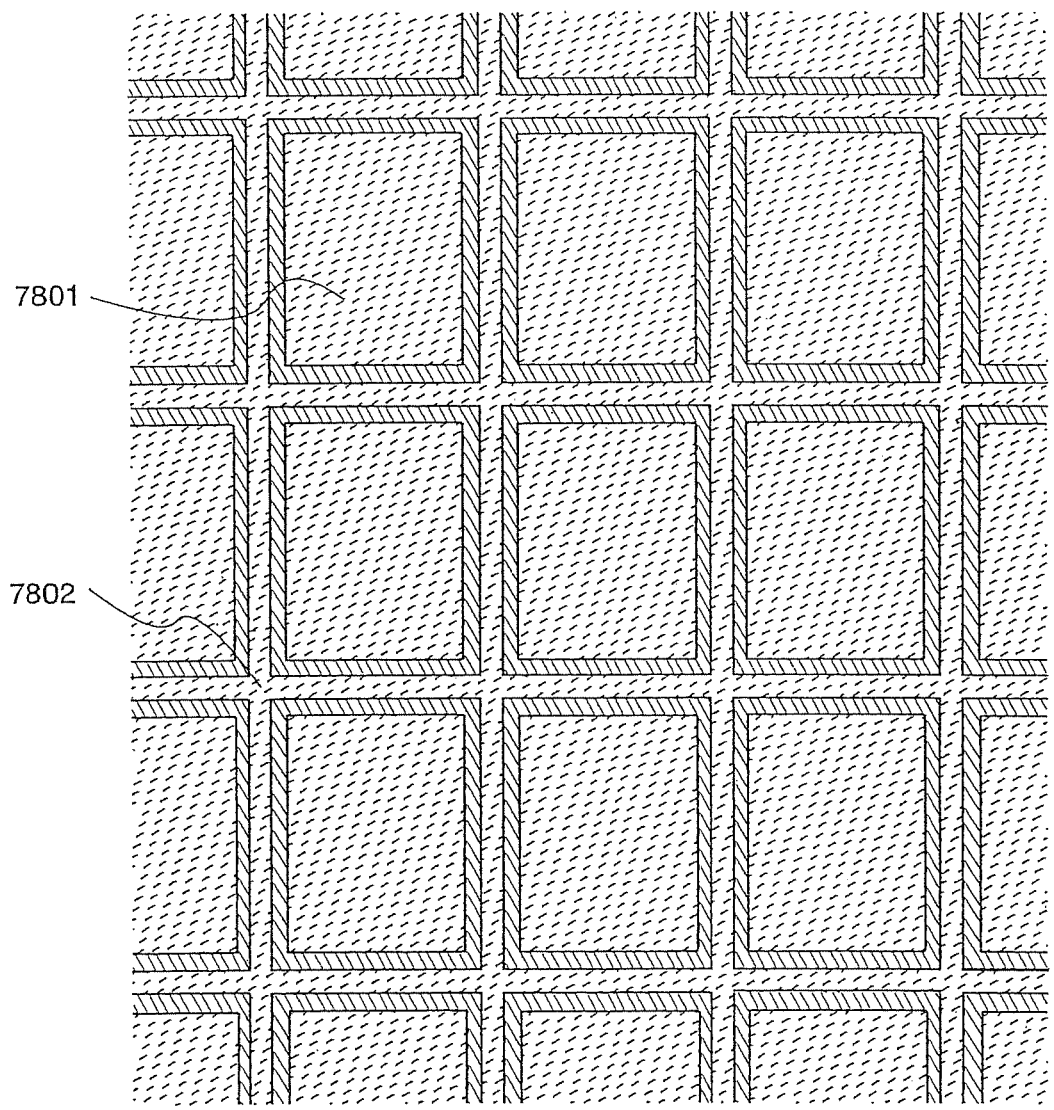
FIG. 78 is a partial enlarged view of a display panel of the present invention.

Pixels are arranged in matrix in the pixel portion 7603 of the display panel shown in FIG. 76B to form a pixel column for each color element. A layer 7617 containing an organic compound is provided for pixels of one column for each color. In addition, in the pixel portion, a junction portion of a wire formed of the same material as a pixel electrode and an opposite electrode is formed in a region 7616 other than the region where the layer 7617 containing an organic compound is provided. In other words, the junction portion 7528 shown in the cross-sectional view of FIG. 75 is formed in the region 7616 in FIG. 76B. A schematic top view of the pixel portion is shown in FIG. 78. In FIG. 78, a wire 7802 is formed of the same material as a pixel electrode 7801. In addition, the pixel electrode 7801 corresponds to the pixel electrode 7522 in FIG. 75 and the wire 7802 corresponds to the wire 7523 in FIG. 75. A layer containing an organic compound is formed over each pixel electrode 7801, and a light emitting element is formed in a region where the layer containing an organic compound is sandwiched between the pixel electrode 7801 and an opposite electrode. Since the wire 7802 is in contact with the opposite electrode in the junction portion, the resistance of the opposite electrode can be decreased. In other words, the wire 7802 functions as an auxiliary electrode of the opposite electrode. Note that by employing the structure of the pixel portion as shown in FIG. 78, a display panel in which the resistance of the opposite electrode is decreased can be provided.

The display panel described in this embodiment, in which the opposite electrode has a high light-transmitting property, has a high pixel aperture ratio. Therefore, necessary light intensity can be obtained even when luminance is decreased. Accordingly, the reliability of the light emitting element can be improved. In addition, the resistance of the opposite electrode can be decreased; thus, power consumption can also be reduced.

Further, the display panel is explained using a schematic diagram.

Figure 69:
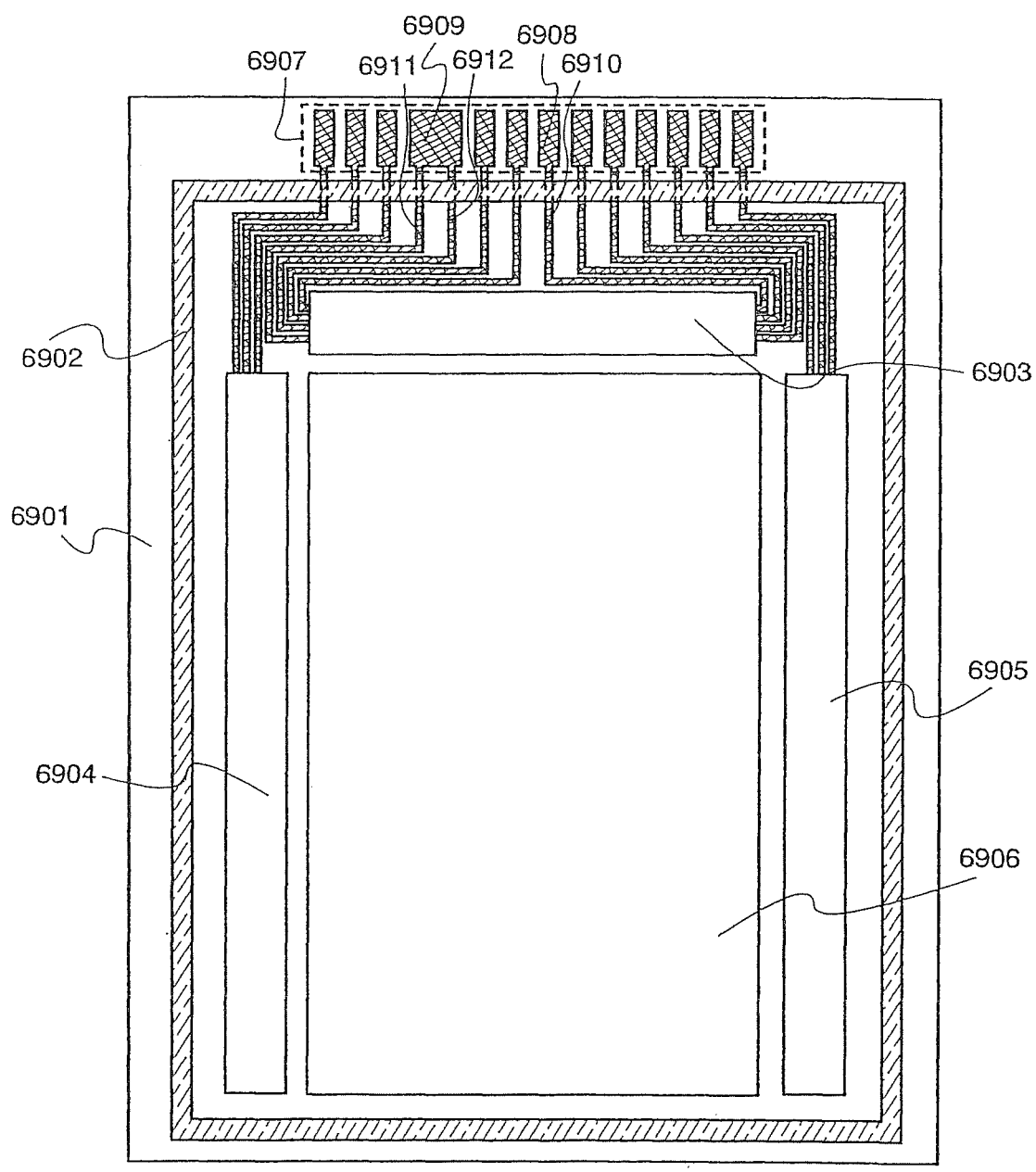
FIG. 69 is a diagram showing a display panel of the present invention.

A display panel in FIG. 69 includes, over a substrate 6901, a signal line driver circuit 6903, a first scan line driver circuit 6904, a second scan line driver circuit 6905, a pixel portion 6906, and a connection terminal portion 6907. The substrate 6901 and an opposite substrate are attached to each other in a sealing region 6902, and the signal line driver circuit 6903, the first scan line driver circuit 6904, and the second scan line driver circuit 6905 are sealed.

The connection terminal portion 6907 includes a plurality of connection pads. Among the plurality of connection pads, a reference connection pad 6908 is electrically connected to a wire 6910. A composite connection pad 6909 is electrically connected to a wire 6911 and a wire 6912. The wire 6911 and the wire 6912 are electrically connected to the signal line driver circuit 6903. For example, as shown in FIG. 68B, one of the wire 6911 and the wire 6912 is electrically connected to a wire for supplying power of a shift register in the signal line driver circuit 6903, and the other is electrically connected to a wire for supplying power of a buffer circuit in the signal line driver circuit 6903.

Figure 70:
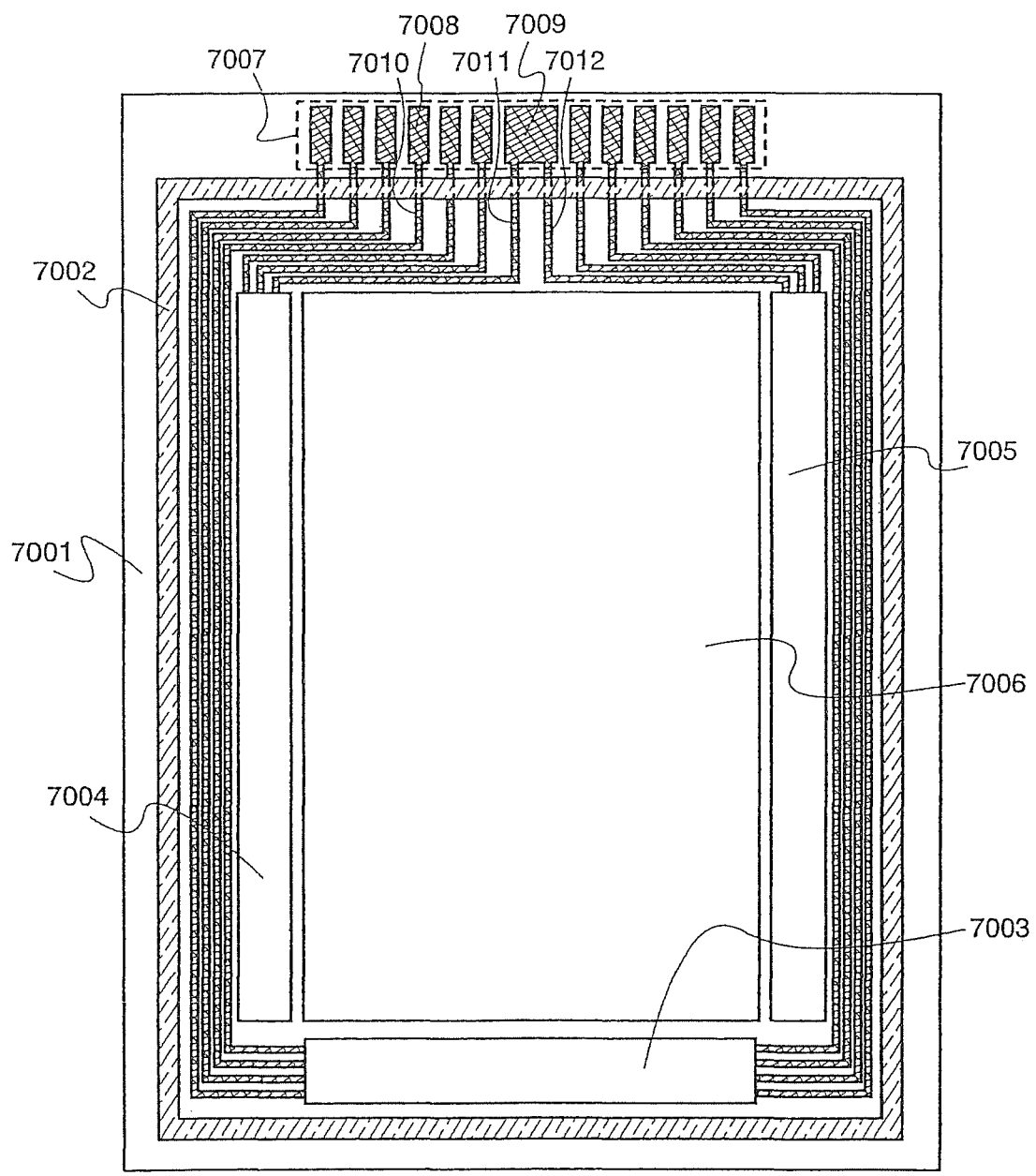
FIG. 70 is a diagram showing a display panel of the present invention.

A display panel in FIG. 70 includes, over a substrate 7001, a signal line driver circuit 7003, a first scan line driver circuit 7004, a second scan line driver circuit 7005, a pixel portion 7006, and a connection terminal portion 7007. The substrate 7001 and an opposite substrate are attached to each other in a sealing region 7002, and the signal line driver circuit 7003, the first scan line driver circuit 7004, and the second scan line driver circuit 7005 are sealed.

The connection terminal portion 7007 includes a plurality of connection pads. Among the plurality of connection pads, a reference connection pad 7008 is electrically connected to a wire 7010. A composite connection pad 7009 is electrically connected to a wire 7011 and a wire 7012. The wire 7011 is electrically connected to the first scan line driver circuit 7004, and the wire 7012 is electrically connected to the second scan line driver circuit 7005.

Embodiment 7

In this embodiment, another structure applicable to the light emitting element of the invention is explained with reference to FIGS. 79A to 79C and FIGS. 80A to 80C.

Light emitting elements utilizing electroluminescence are classified according to whether a light emitting element is an organic compound or an inorganic compound. In general, the former is referred to as an organic EL element, and the latter is referred to as an inorganic EL element.

The inorganic EL elements are classified according to their element structures into a dispersed inorganic EL element and a thin-film inorganic EL element. They are different in that the former includes an electroluminescent layer in which particles of a light emitting material are dispersed in a binder and the latter includes an electroluminescent layer formed from a thin film of a light emitting material; however, they are common in that electrons accelerated by a high electric field are required. Note that a mechanism for obtainable light emission includes a donor-acceptor recombination light emission which utilizes a donor level and an acceptor level and a localized light emission which utilizes inner-shell electron transition of metal ions. In general, it is often the case that the dispersed inorganic EL element performs the donor-acceptor recombination light emission and the thin-film inorganic EL element performs the localized light emission.

A light emitting material which can be used in the present invention includes a base material and an impurity element serving as a light emitting center. Light emission of various colors can be obtained by changing impurity elements to be contained. As a method for producing a light emitting material, various methods such as a solid phase method and a liquid phase method (co-precipitation method) can be used. In addition, a liquid phase method such as a spray pyrolysis method, a double decomposition method, a method by precursor pyrolysis, a reverse micelle method, a combined method of these methods and high-temperature baking, or a freeze-drying method can be used.

The solid phase method is a method in which a base material and an impurity element or a compound containing an impurity element are weighed, mixed in a mortar, and reacted by heating and baking in an electric furnace to make the impurity element contained in the base material. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form. The method requires baking at a relatively high temperature; however, it is a simple method. Therefore, the method has good productivity and is suitable for mass production.

The liquid phase method (co-precipitation method) is a method in which a base material or a compound containing a base material is reacted in a solution with an impurity element or a compound containing an impurity element and the reactant is baked after being dried. Particles of the light emitting material are uniformly distributed, a particle size is small, and the reaction proceeds even at a low baking temperature.

As the base material used for a light emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like can also be used. It may be ternary mixed crystal such as calcium gallium sulfide ($CaGa_2S_4$), strontium gallium sulfide ($SrGa_2S_4$), barium gallium sulfide ($BaGa_2S_4$), or the like.

As the light emitting center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as a charge compensation.

On the other hand, as the light emitting center of donor-acceptor recombination light emission, a light emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In the case of synthesizing the light emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element or the compound containing the first impurity element, fluorine (F), chlorine (Cl), aluminum sulfate ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light emitting material can be obtained. Furthermore, a high-purity light emitting element can be obtained since an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 atomic % to 10 atomic %, preferably 0.05 atomic % to 5 atomic %.

As the light emitting material having the light emitting center of donor-acceptor recombination light emission, a light emitting material containing a third impurity element may alternatively be used. In this case, the concentration of the third impurity element to the base material is preferably in the range of 0.05 atomic % to 5 atomic %. The light emitting material having such a structure enables light emission at low voltage. Accordingly, a light emitting element which can emit light at low drive voltage can be obtained, and a light emitting element of which power consumption is reduced can be obtained. In addition, an impurity element serving as the above-described light emitting center of localized light emission may further be included.

As such a light emitting material, a light emitting material containing ZnS as the base material, Cl as the first impurity element, Cu as the second impurity element, Ga and As as the third impurity element, and Mn as the light emitting center of localized light emission, can be used. The following method can be used to form such a light emitting material. Mn is added to a light emitting material (ZnS:Cu, Cl), which is baked in a vacuum for two to four hours. The baking temperature is preferably in the range of 700° C. to 1500° C. This baked material is crushed to a particle size of 5 μm to 20 μm, GaAs having a particle size of 1 μm to 3 μm is added thereto, and the mixture is stirred. The mixture is baked under a nitrogen stream including a sulfur gas at approximately 500° C. to 800° C. for two to four hours to obtain a light emitting material. By forming a thin film using this light emitting material by an evaporation method or the like, the thin film can be used as a light emitting layer of a light emitting element.

In the case of the thin-film inorganic EL, the electroluminescent layer is a layer containing the above-described light emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transfer low pressure CVD, an atomic layer epitaxy (ALE) method, or the like.

Figure 79A:
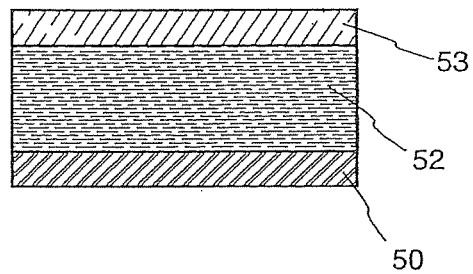
FIGS. 79A to 79C show an example of a light emitting element.
Figure 79B:
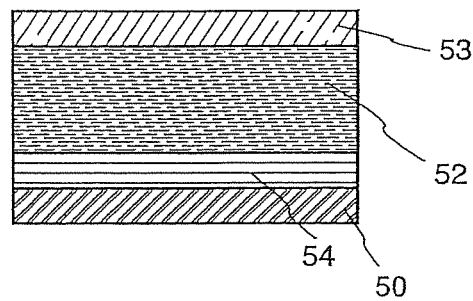
Figure 79C:
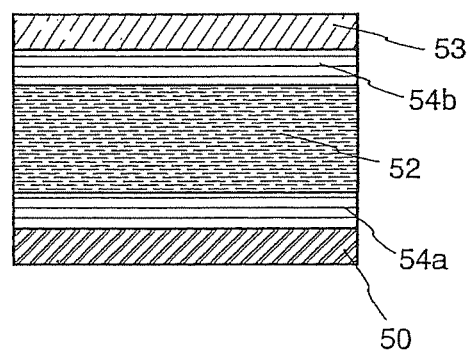

FIGS. 79A to 79C show examples of a thin-film inorganic EL element which can be used as a light emitting element. In FIGS. 79A to 79C, each light emitting element includes a first electrode layer 50, an electroluminescent layer 51, and a second electrode layer 53.

Each of the light emitting elements shown in FIGS. 79B and 79C has a structure in which an insulating layer is provided between the electrode layer and the electroluminescent layer in the light emitting element in FIG. 79A. The light emitting element shown in FIG. 79B includes an insulating layer 54 between the first electrode layer 50 and the electroluminescent layer 52. The light emitting element shown in FIG. 79C includes an insulating layer 54a between the first electrode layer 50 and the electroluminescent layer 52 and an insulating layer 54b between the second electrode layer 53 and the electroluminescent layer 52. As described above; the insulating layer may be provided between the electroluminescent layer and either or both of the pair of electrodes sandwiching the electroluminescent layer. The insulating layer may be a single layer or a laminate of a plurality of layers.

In FIG. 79B, the insulating layer 54 is provided to be in contact with the first electrode layer 50. However, the insulating layer 54 may be provided to be in contact with the second electrode layer 53 by reversing the order of the insulating layer and the electroluminescent layer.

In the case of the dispersed inorganic EL element, a particulate light emitting material is dispersed in a binder to form a film electroluminescent layer. In the case where a particle having a desired size cannot be sufficiently obtained by a production method of a light emitting material, the material may be processed into particles by crushing in a mortar or the like. The binder is a substance for fixing a particulate light emitting material in a dispersed manner and holding the material in shape as the electroluminescent layer. The light emitting material is uniformly dispersed and fixed in the electroluminescent layer by the binder.

In the case of the dispersed inorganic EL element, the electroluminescent layer can be, formed by a droplet discharge method which can selectively form the electroluminescent layer, a printing method (such as screen printing or off-set printing), a coating method such as a spin-coating method, a dipping method, a dispenser method, or the like. The thickness is not particularly limited, but it is preferably in the range of 10 nm to 1000 nm. In addition, in the electroluminescent layer containing the light emitting material and the binder, the proportion of the light emitting material is preferably in the range of 50 wt % to 80 wt %.

Figure 80A:
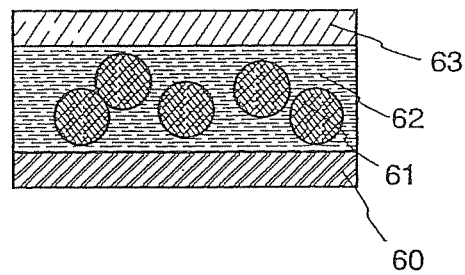
FIGS. 80A to 80C show an example of a light emitting element.
Figure 80B:
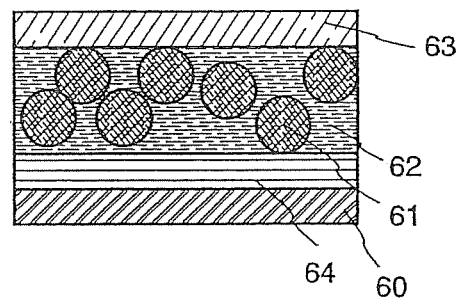
Figure 80C:
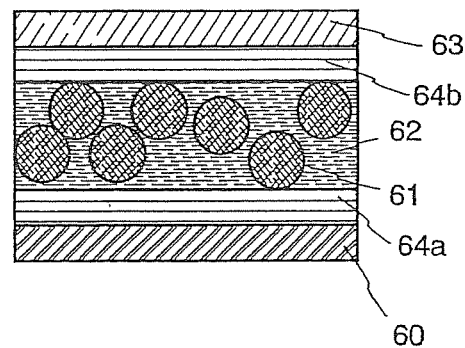

FIGS. 80A to 80C show examples of a dispersed inorganic EL element which can be used as a light emitting element. A light emitting element in FIG. 80A has a laminated structure of a first electrode layer 60, an electroluminescent layer 62, and a second electrode layer 63, and contains a light emitting material 61 held by a binder in the electroluminescent layer 62.

As the binder which can be used in this embodiment, an insulating material, an organic material or an inorganic material, or a mixed material of an organic material and an inorganic material can be used. As an organic insulating material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high molecular compound such as aromatic polyamide or polybenzimidazole, or a siloxane resin may be used. Note that the siloxane resin corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin of polyvinyl alcohol, polyvinylbutyral, or the like, a phenol resin, a novolac resin, an acrylic resin, a melamine resin, a urethane resin, or an oxazole resin (polybenzoxazole) may be used. In addition, for example, a photo-curing type resin or the like can be used. A dielectric constant can be adjusted by appropriately mixing high dielectric constant fine particles such as barium titanate ($BaTiO_3$) or strontium titanate ($SrTiO_3$) in the above resin.

As an inorganic insulating material included in the binder, a material selected from substances containing inorganic insulating materials can be used, such as silicon oxide ($SiO_X$), silicon nitride ($SiN_X$), silicon containing oxygen and nitrogen, aluminum nitride (AlN), aluminum containing oxygen and nitrogen, aluminium oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), or ZnS. A dielectric constant of the electroluminescent layer including the light emitting material and the binder can be controlled by making an organic material to contain a high dielectric constant inorganic material, so that a dielectric constant can be increased.

In a producing process, a light emitting material is dispersed in a solution including a binder. As a solvent of the solution including the binder that can be used in this embodiment, a solvent in which a binder material is soluble and which can produce a solution having a viscosity suitable for a method for forming the electroluminescent layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

Each of the light emitting elements shown in FIGS. 80B and 80C has a structure in which an insulating layer is provided between the electrode layer and the electroluminescent layer in the light emitting element in FIG. 80A. The light emitting element shown in FIG. 80B includes an insulating layer 64 between the first electrode layer 60 and the electroluminescent layer 62. The light emitting element shown in FIG. 80C includes an insulating layer 64a between the first electrode layer 60 and the electroluminescent layer 62 and an insulating layer 64b between the second electrode layer 63 and the electroluminescent layer 62. As described above, the insulating layer may be provided between the electroluminescent layer and either or both of the pair of electrodes sandwiching the electroluminescent layer. In addition, the insulating layer may be a single layer or a laminate of a plurality of layers.

In FIG. 80B, the insulating layer 64 is provided to be in contact with the first electrode layer 60. However, the insulating layer 64 may be provided to be in contact with the second electrode layer 63 by reversing the order of the insulating layer and the electroluminescent layer.

An insulating layer such as the insulating layer 54 in FIGS. 79A to 79C or the insulating layer 64 in FIGS. 80A to 80C is not particularly limited, but it preferably has high insulation resistance and dense film quality. Furthermore, it preferably has a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a laminated film of two or more kinds can be used. These insulating films can be faulted by sputtering, evaporation, CVD, or the like. Alternatively, the insulating layer may be formed by dispersing particles of the insulating material in a binder. A binder material may be formed using a material and a method similar to those of the binder included in the electroluminescent layer. The thickness is not particularly limited, but it is preferably in the range of 10 nm to 1000 nm.

The light emitting element described in this embodiment, which can provide light emission by applying voltage between a pair of electrode layers sandwiching the electroluminescent layer, can be operated by either DC drive or AC drive.

Note that the light emitting element described in this embodiment can be applied to the light emitting element of this specification and can be applied, for example, to the light emitting element of the display panel in Embodiment 2. In that case, the electroluminescent layer of this embodiment corresponds to the layer 6616 containing an organic compound of Embodiment 2 shown in FIGS. 66A and 66B.

Embodiment 8

In this embodiment, a structure of a display panel in the case of using a liquid crystal element as a display element is explained.

Figure 71A:
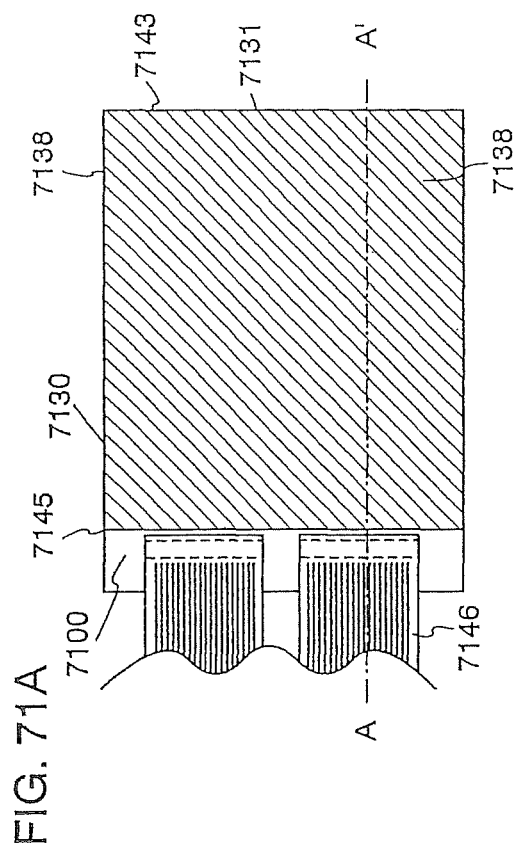
FIGS. 71A and 71B are diagrams showing a display panel of the present invention.

FIG. 71A shows a liquid crystal display panel in which a signal line driver circuit 7130, a scan line driver circuit 7138, and a pixel portion 7131 are formed over a first substrate 7100.

Figure 71B:
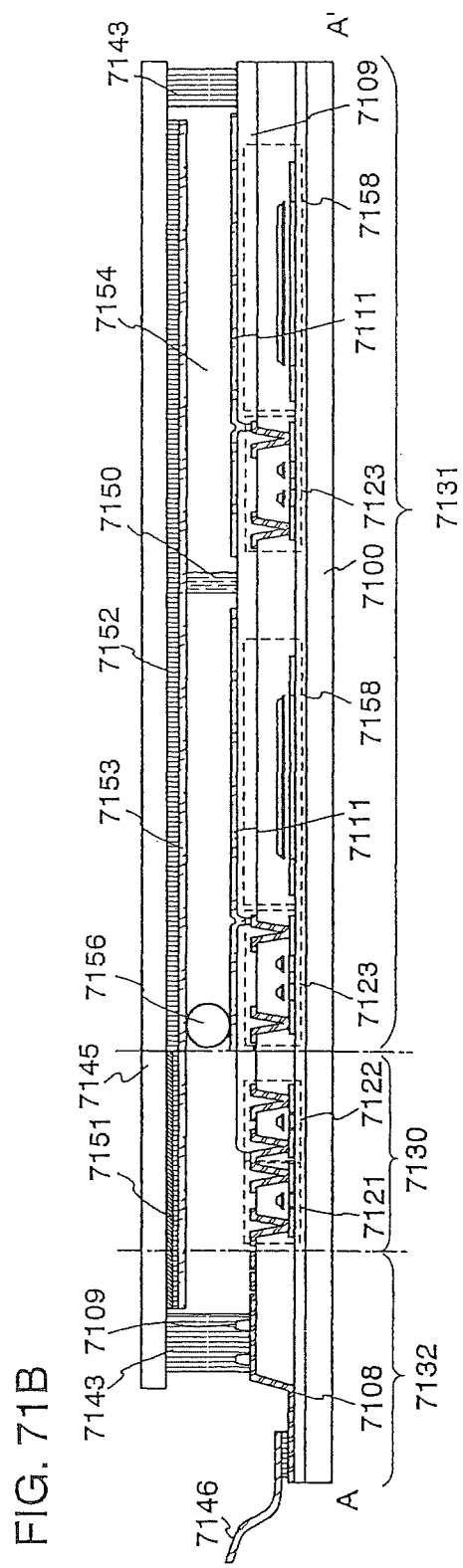

FIG. 71B is a cross-sectional view of the liquid crystal display panel along a line A-A', which shows the signal line driver circuit 7130 provided with a CMOS circuit including an n-channel TFT 7121 and a p-channel TFT 7122 over the first substrate 7100. The n-channel TFT 7121 and the p-channel TFT 7122 may be formed to include a crystalline semiconductor film. A TFT forming the signal line driver circuit 7130 or the scan line driver circuit 7138 may be formed with a CMOS circuit, a PMOS circuit, or an NMOS circuit.

The pixel portion 7131 includes a TFT 7123 and a capacitor 7158. The TFT 7123 may be formed to include a crystalline semiconductor film. The capacitor 7158 includes a semiconductor film to which an impurity is added and a gate insulating film sandwiched between the semiconductor film and a gate electrode.

Note that the TFT 7123 of the pixel portion 7131 does not need to have high crystallinity as compared to the signal line driver circuit 7130 and the scan line driver circuit 7138.

In addition, the pixel portion 7131 includes a pixel electrode 7111 connected to one electrode of the TFT 7123. Then, a third insulating film 7109 is provided so as to cover the n-channel TFT 7121, the p-channel TFT 7122, the pixel electrode 7111, the TFT 7123, and the like.

Further, a second substrate 7145 serving as an opposite substrate is prepared. The second substrate 7145 is provided with a black matrix 7151 in a position corresponding to at least the signal line driver circuit 7130, provided with a color filter 7152 in a position corresponding to at least the pixel portion, and further provided with an opposite electrode 7153. In the invention, the black matrix, the color filter, or the opposite electrode is not necessarily provided over the second substrate 7145, and may be provided on the first substrate 7100 side. Thereafter, a spacer 7156 for keeping a substrate interval may be formed. In addition, a projection 7150 for preventing convection of a liquid crystal material in order to prevent distribution bias of organic ferroelectric fine particles mixed in a liquid crystal material may be formed simultaneously. As the spacer 7156, a spherical spacer may be used, or a so-called columnar spacer formed by etching an insulating film may be used. Furthermore, the projection 7150 may be formed to have a height equal to the thickness of a liquid crystal layer 7154 so as to have the same function as the space 7156. Whether both the spacer 7156 and the projection 7150 are separately formed or the spacer 7156 is substituted by the projection 7150, is appropriately selected.

Subsequently, the second substrate 7145 is subjected to orientation treatment and attached to the first substrate 7100 with a sealant 7143. As the sealant 7143, an epoxy resin is preferably used. In addition, part of the third insulating film 7109 may be left in a position where the sealant 7143 is to be formed. As a result, an attachment area is enlarged, and attachment strength can be increased. Note that the spacer 7156 for keeping a substrate interval may be formed after performing orientation treatment on an orientation film.

A liquid crystal layer 7154 is injected between the first substrate 7100 and the second substrate 7145. The injection of the liquid crystal layer 7154 is preferably performed in a vacuum. Alternatively, after dropping a liquid crystal layer onto the first substrate 7100, the second substrate 7145 may be attached. Particularly in the case of using a large-sized substrate, a liquid crystal layer is preferably dropped rather than being injected.

Furthermore, the first substrate 7100 or the second substrate 7145 may be appropriately provided with a polarizing plate or a circularly polarizing plate to enhance contrast.

A flexible printed circuit (FPC) 7146 is connected to a conductive film 7108 provided in a first attachment region 7132 with an anisotropic conductive film (ACF). Then, a video signal and a clock signal which are external input signals are supplied through the FPC 7146. Note that only the FPC is shown here; however, a printed wiring board (PWB) is attached through this FPC. In addition, an external signal generation circuit is mounted on the printed wiring board.

In attaching the ACF by pressurization or heating, attention needs to be paid so as to prevent a crack from generating due to flexibility of the substrate or softening by heating. For example, a substrate having high rigidity may be provided at least below the first attachment region 7132.

In this embodiment, a driver-integrated type light emitting device provided with the signal line driver circuit 7130 and the scan line driver circuit 7138 over the first substrate 7100 is described. However, the signal line driver circuit and the scan line driver circuit may be formed with ICs and may be connected to a signal line, a scan line, or the like by a SOG method or a TAB method.

As described above, the liquid crystal display panel can be manufactured.

This application is based on Japanese Patent Application serial no. 2005-133741 filed in Japan Patent Office on Apr. 28, 2005, the entire contents of which are hereby incorporated by reference.

What is claimed is:

1. A semiconductor device comprising:
a sealing material;
a plurality of scan line driver circuits;
a connection terminal portion, comprising a plurality of connection pads, over a first substrate;
a plurality of wirings electrically connected to each of the plurality of connection pads; and
a pixel portion including a transistor and a display element, the transistor comprising:
a gate electrode over the first substrate;
a semiconductor layer over and overlapping with the gate electrode; and
a first conductive layer and a second conductive layer electrically connected to the semiconductor layer,
wherein the second conductive layer is electrically connected to a first pixel electrode of the display element,
wherein a color filter overlapping with the display element is provided on the first substrate side,
wherein a spacer is provided over the color filter and the first pixel electrode,
wherein the plurality of connection pads have a similar width,
wherein the plurality of wirings are arranged at substantially regular intervals,
wherein the plurality of scan line driver circuits is provided over the first substrate,
wherein the sealing material surrounds the pixel portion and the plurality of scan line driver circuits,
wherein the sealing material does not surround the plurality of connection pads,
wherein the plurality of wirings comprises a first region not overlapping the sealing material, wherein the plurality of wirings comprises a second region overlapping the sealing material,
wherein the first conductive layer and the second conductive layer comprise copper,
wherein the first substrate comprises glass,
wherein the gate electrode comprises copper,
wherein the first pixel electrode comprises indium, tin, and oxygen, and
wherein the semiconductor layer comprises amorphous silicon.

2. A semiconductor device comprising:
a sealing material;
a plurality of scan line driver circuits;
a connection terminal portion, comprising a plurality of connection pads, over a first substrate;
a plurality of wirings electrically connected to each of the plurality of connection pads; and
a pixel portion including a transistor and a liquid crystal element, the transistor comprising:
   a gate electrode over the first substrate;
   a semiconductor layer over and overlapping with the gate electrode; and
   a first conductive layer and a second conductive layer electrically connected to the semiconductor layer,
wherein the second conductive layer is electrically connected to a first pixel electrode of the liquid crystal element,
wherein a color filter overlapping with the liquid crystal element is provided over the first substrate,
wherein a spacer is provided over the color filter and the first pixel electrode,
wherein the plurality of connection pads have a similar width,
wherein the plurality of wirings are arranged at regular intervals,
wherein the plurality of scan line driver circuits is provided over the first substrate,
wherein the sealing material surrounds the pixel portion and the plurality of scan line driver circuits,
wherein the plurality of wirings comprises a first region not overlapping the sealing material,
wherein the plurality of wirings comprises a second region overlapping the sealing material,
wherein the first conductive layer and the second conductive layer comprise copper,
wherein the first substrate comprises glass,
wherein the gate electrode comprises copper,
wherein the first pixel electrode comprises indium, tin, and oxygen, and
wherein the semiconductor layer comprises amorphous silicon.

3. A semiconductor device comprising:
a sealing material;
a plurality of scan line driver circuits;
a connection terminal portion, comprising a plurality of connection pads, over a first substrate;
a plurality of wirings electrically connected to each of the plurality of connection pads; and
a pixel portion including a transistor and a liquid crystal element, the transistor comprising:
   a gate electrode over the first substrate;
   a semiconductor layer overlapping with the gate electrode; and
   a first conductive layer and a second conductive layer electrically connected to the semiconductor layer,
wherein the second conductive layer is electrically connected to a first pixel electrode of the liquid crystal element,
wherein a color filter overlapping with the liquid crystal element is provided over the first substrate,
wherein a spacer is provided over the color filter and the first pixel electrode,
wherein the semiconductor layer extends beyond an end portion of the second conductive layer,
wherein the plurality of connection pads have a similar width,
wherein the plurality of wirings are arranged at regular or substantially regular intervals,
wherein the plurality of scan line driver circuits is provided over the first substrate,
wherein the sealing material surrounds the pixel portion and the plurality of scan line driver circuits,
wherein the plurality of wirings comprises a first region not overlapping the sealing material,
wherein the plurality of wirings comprises a second region overlapping the sealing material,
wherein one of the plurality of wirings has a third region extending in a first direction and a fourth region extending in a second direction perpendicular to the first direction,
wherein a length of the third region is smaller than a length of the fourth region,
wherein the first substrate comprises glass,
wherein the first conductive layer and the second conductive layer comprise copper,
wherein the gate electrode comprises copper,
wherein the first pixel electrode comprises indium, tin, and oxygen, and
wherein the semiconductor layer comprises amorphous silicon.

* * * * *